US011515888B2

(12) United States Patent
Chan

(10) Patent No.: US 11,515,888 B2
(45) Date of Patent: Nov. 29, 2022

(54) CHAN FRAMEWORK, CHAN CODING AND CHAN CODE

(71) Applicant: Kam Fu Chan, Hong Kong (CN)

(72) Inventor: Kam Fu Chan, Hong Kong (CN)

(73) Assignee: Kam Fu Chan, Hong Kong (CN)

( * ) Notice: Subject to any disclaimer, the term of this patent is extended or adjusted under 35 U.S.C. 154(b) by 488 days.

(21) Appl. No.: 16/067,412

(22) PCT Filed: Jul. 25, 2017

(86) PCT No.: PCT/IB2017/054500
§ 371 (c)(1),
(2) Date: Jun. 29, 2018

(87) PCT Pub. No.: WO2018/020414
PCT Pub. Date: Feb. 1, 2018

(65) Prior Publication Data
US 2019/0013825 A1    Jan. 10, 2019

(30) Foreign Application Priority Data

Jul. 29, 2016    (WO) .................. PCT/IB2016/054562
Aug. 5, 2016    (WO) .................. PCT/IB2016/054732
(Continued)

(51) Int. Cl.
*H03M 7/30*    (2006.01)
*G06F 11/10*    (2006.01)

(52) U.S. Cl.
CPC ............... *H03M 7/55* (2013.01); *G06F 11/10* (2013.01); *H03M 7/30* (2013.01); *H03M 7/3077* (2013.01);
(Continued)

(58) Field of Classification Search
CPC .... H03M 7/6005; H03M 7/30; H03M 7/6035; H03M 7/3077; H03M 7/55;
(Continued)

(56) References Cited

U.S. PATENT DOCUMENTS 5,260,693 A * 11/1993 Horsley .................. H03M 7/30
341/63
6,094,454 A    7/2000 Mitchell et al.
(Continued)

FOREIGN PATENT DOCUMENTS

CN    1317882 A    10/2001
CN    1477879 A    2/2004
(Continued)

OTHER PUBLICATIONS

"International Application No. PCT/IB2017/054500, International Search Report dated Dec. 5, 2017", (dated Dec. 5, 2017), 4 pgs.
(Continued)

*Primary Examiner* — Irete F Ehichioya
*Assistant Examiner* — Ken Hoang
(74) *Attorney, Agent, or Firm* — Schwegman Lundberg & Woessner, P.A.

(57) ABSTRACT

A framework and the associated method, schema and design for processing digital data, whether random or not, through encoding and decoding losslessly and correctly for purposes including the purposes of encryption/decryption or compression/decompression or both. There is no assumption of the digital information to be processed before processing. An universal coder is invented and now pigeonhole meets blackhole.

9 Claims, 12 Drawing Sheets

Diagram 1

(30) Foreign Application Priority Data

Feb. 22, 2017 (WO) .................. PCT/IB2017/050985
Jul. 1, 2017 (WO) .................. PCT/IB2017/053993

(52) U.S. Cl.
CPC ....... *H03M 7/3084* (2013.01); *H03M 7/6005* (2013.01); *H03M 7/6011* (2013.01); *H03M 7/6064* (2013.01)

(58) Field of Classification Search
CPC ... H03M 7/6064; H03M 7/3084; G06F 11/10; H04N 19/90; H04N 19/176
See application file for complete search history.

(56) References Cited

U.S. PATENT DOCUMENTS

| | | | |
|---|---|---|---|
| 6,876,814 | B1 | 4/2005 | Le |
| 10,628,255 | B1* | 4/2020 | Steiner ................ H03M 13/093 |
| 2006/0218201 | A1 | 9/2006 | Hsu et al. |
| 2008/0018502 | A1 | 1/2008 | Wegener |
| 2009/0158112 | A1 | 6/2009 | Oh |
| 2010/0043024 | A1 | 2/2010 | Huang et al. |
| 2010/0251075 | A1 | 9/2010 | Takahashi et al. |
| 2017/0250707 | A1* | 8/2017 | Willner ............... H03M 7/4031 |

FOREIGN PATENT DOCUMENTS

| | | |
|---|---|---|
| CN | 1845065 A | 10/2006 |
| CN | 101008890 A | 8/2007 |
| CN | 101252694 A | 8/2008 |
| CN | 102948145 A | 2/2013 |
| CN | 105594209 A | 5/2016 |
| WO | WO-2009151893 A2 | 12/2009 |

OTHER PUBLICATIONS

"International Application No. PCT/IB2017/054500, Written Opinion dated Dec. 5, 2017", (dated Dec. 5, 2017), 4 pgs.
"International Application No. PCT/IB2017/050985, International Search Report dated Jun. 15, 2017", (dated Jun. 15, 2017), 5 pgs.
"International Application No. PCT/IB2017/050985, Written Opinion dated Jun. 15, 2017", (dated Jun. 15, 2017), 5 pgs.
"International Application No. PCT/IB2017/053993, International Search Report dated Nov. 13, 2017", (dated Nov. 13, 2017), 3 pgs.
"International Application No. PCT/IB2017/053993, Written Opinion dated Nov. 13, 2017", (dated Nov. 13, 2017), 5 pgs.
"International Application No. PCT/IB2017/054562, International Search Report dated Jun. 9, 2017", (dated Jun. 9, 2017), 3 pgs.
"International Application No. PCT/IB2017/054562, Written Opinion dated Jun. 9, 2017", (dated Jun. 9, 2017), 5 pgs.
"International Application No. PCT/IB2017/054732, International Search Report dated Jun. 9, 2017", (dated Jun. 9, 2017), 3 pgs.
"International Application No. PCT/IB2017/054732, Written Opinion dated Jun. 9, 2017", (dated Jun. 9, 2017), 5 pgs.

* cited by examiner

Diagram 1

Diagram 2

Diagram 3

CHAN LINE 1:

$$\leftarrow [1]+[2] = [1]+[3]$$
$$= [1]+[4]$$

$$\leftarrow [3]+[4] = [2]+[4]$$
$$= [2]+[3]$$

CHAN LINE 2:

$$\leftarrow [1]+[2] = [1]+[3]$$
$$= [2]+[3]$$

$$\leftarrow [3]+[4] = [2]+[4]$$
$$= [1]+[4]$$

FIG. 4

CHAN RECTANGLE 1

| a | b | c | d |
|---|---|---|---|

CHAN RECTANGLE 2

| a=B | b=C | c=A | d=D |
|-----|-----|-----|-----|

FIG. 6

Diagram 8

CHAN RECTANGLE 3

| a=B (64 bit) | b=C (64 bit) | c=A (64 bit) | d=D (64 bit) |
|---|---|---|---|

CHAN RECTANGLE 4

| RP Piece: <br><br> RP bit (either 4 bits or 5 bits) | CV Piece: <br> containing 4 sub-pieces with different bit sizes <br><br> Sub-piece One + Two + Three + Four (each with varying bits) |
|---|---|

FIG. 13

CHAN FRAMEWORK, CHAN CODING AND CHAN CODE

TECHNICAL FIELD

Let him that hath understanding count the number . . . .

This application is a U.S. National Stage Filing under 35 U.S.C. 371 from International Application No. PCT/IB2017/054500, filed on Jul. 25, 2017, and published as WO2018/020414 on Feb. 1, 2018, which claims priority of four earlier PCT Applications, PCT/IB2016/054562 filed on 29 Jul. 2016, PCT/IB2016/054732 filed on 5 Aug. 2016, PCT/IB2017/050985 filed on 22 Feb. 2017, and PCT/IB2017/053993 filed on 1 Jul. 2017; the benefit of priority of each of which is hereby claimed herein, and which applications and publication are hereby incorporated herein by reference in their entirety. This invention relates to the use of the concept and techniques revealed in the aforesaid four PCT Applications and improved on in the present Application, presenting a framework for ordering, organizing and describing digital data whether random or not for encoding and decoding purposes, including compression and decompression as well as encryption and decryption. The unity of invention lies in the description of the present Application revealing the invention of a framework CHAN FRAMEWORK for ordering, organizing and describing digital data that enables the development and use of coding schemes, methods and techniques under CHAN FRAMEWORK for the purpose of processing digital data for all kinds of use, including in particular the use in encryption/decryption and compression/decompression of digital data for all kinds of activities. One way of ordering and organizing digital data could be found in the present invention when revealing the relationship between different components of CHAN SHAPES (including CHAN RECTANGLES, CHAN TRAPESIA, CHAN SQUARES, CHAN TRIANGLE, CHAN LINE, CHAN DOT AND CHAN BARS or other shapes which describe the relations and characteristics of the basic components of the Processing Unit, a processing unit consisting of digital data in the form of binary bits) and the respective techniques in making coding (including encoding and decoding) of digital information for the use and protection of intellectual property, expressed in the form of digital information, including digital data as well executable code for use in device(s), including computer system(s) or computer-controlled device(s) or operating-system-controlled device(s) or system(s) that is/are capable of running executable code or using digital data. Such device(s) is/are mentioned hereafter as Device(s).

In particular, this invention relates to the framework and method as well as its application in processing, storing, distribution and use in Device(s) of digital information, including digital data as well as executable code, such as boot code, programs, applications, device drivers, or a collection of such executables constituting an operating system in the form of executable code embedded or stored into hardware, such as embedded or stored in all types of storage medium, including read-only or rewritable or volatile or non-volatile storage medium (referred hereafter as the Storage Medium) such as physical memory or internal DRAM (Dynamic Random Access Memory) or hard disk or solid state disk (SSD) or ROM (Read Only Memory), or read-only or rewritable CD/DVD/HD-DVD/Blu-Ray DVD or hardware chip or chipset etc. The method of coding revealed, i.e. CHAN CODING, when implemented produces an encoded code, CHAN CODE that could be decoded and restored losslessly back into the original code; and if such coding is meant for compression, such compressed code could also be re-compressed time and again until it reaches its limit.

In essence, this invention reveals a framework for creating an order for digital data so that digital data could be described and its characteristics could be investigated for the purpose of making compression/decompression or encryption/decryption of digital information. In this relation, it makes possible the processing, storing, distribution and use of digital information in Device(s) connected over local clouds or internet clouds for the purpose of using and protecting intellectual property. As with the use of other compression methods, without proper decompression using the corresponding methods, the compressed code could not be restored correctly. If not used for compression purposes, the encoded code could be considered an encrypted code and using the correct corresponding decoding methods, such encrypted code could also be restored to the original code losslessly. CHAN CODING AND CHAN CODE (CHAN CODING AND CHAN CODE including the concepts, methods, i.e. a combination of techniques, and techniques and the resultant code so produced as revealed in the aforesaid PCT Applications and in the present Application) could also be used in other scientific, industrial and commercial endeavors in various kinds of applications to be explored. The use of it in the Compression Field demonstrates vividly its tremendous use.

However, the framework, the associated schema, design and method as well as its application revealed in this invention are not limited to delivery or exchange of digital information over clouds, i.e. local area network or internet, but could be used in other modes of delivery or exchange of information.

BACKGROUND ART

In the field of Compression Science, there are many methods and algorithms published for compressing digital information and introduction to commonly used data compression methods and algorithms could be found at http://en.wikipedia.org/wiki/Data_compression.

The present invention describes a novel method that could be used for making lossless data compression (besides also being suitable for use for the purpose of making encryption and losslessly decryption) and its restoration.

Relevant part of the aforesaid wiki on lossless compression is reproduced here for easy reference:

"Lossless data compression algorithms usually exploit statistical redundancy to represent data more concisely without losing information, so that the process is reversible. Lossless compression is possible because most real-world data has statistical redundancy. For example, an image may have areas of colour that do not change over several pixels; instead of coding "red pixel, red pixel, . . . " the data may be encoded as "279 red pixels". This is a basic example of run-length encoding; there are many schemes to reduce file size by eliminating redundancy.

The Lempel-Ziv (LZ) compression methods are among the most popular algorithms for lossless storage.[6] DEFLATE is a variation on LZ optimized for decompression speed and compression ratio, but compression can be slow. DEFLATE is used in PKZIP, Gzip and PNG. LZW (Lempel-Ziv-Welch) is used in GIF images. Also noteworthy is the LZR (Lempel-Ziv-Renau) algorithm, which serves as the basis for the Zip method. LZ methods use a table-based compression model where table entries are substituted for repeated strings of data. For most LZ methods, this table is generated dynamically from earlier data in the input. The table itself is often Huffman encoded (e.g. SHRI, LZX). A current LZ-based coding scheme that performs well is LZX, used in Microsoft's CAB format.

The best modern lossless compressors use probabilistic models, such as prediction by partial matching. The Burrows-Wheeler transform can also be viewed as an indirect form of statistical modelling.[7]

The class of grammar-based codes are gaining popularity because they can compress highly repetitive text, extremely effectively, for instance, biological data collection of same or related species, huge versioned document collection, internet archives, etc. The basic task of grammar-based codes is constructing a context-free grammar deriving a single string. Sequitur and Re-Pair are practical grammar compression algorithms for which public codes are available.

In a further refinement of these techniques, statistical predictions can be coupled to an algorithm called arithmetic coding. Arithmetic coding, invented by Jorma Rissanen, and turned into a practical method by Witten, Neal, and Cleary, achieves superior compression to the better-known Huffman algorithm and lends itself especially well to adaptive data compression tasks where the predictions are strongly context-dependent. Arithmetic coding is used in the bi-level image compression standard JBIG, and the document compression standard DjVu. The text entry system Dasher is an inverse arithmetic coder.[8]"

In the aforesaid wiki, it says that "LZ methods use a table-based compression model where table entries are substituted for repeated strings of data". The use of table for translation, encryption, compression and expansion is common but how the use of table for such purposes are various and could be novel in one way or the other.

The present invention presents a novel method, CHAN CODING that produces amazing result that has never been revealed elsewhere. This represents a successful challenge and a revolutionary ending to the myth of Pigeonhole Principle in Information Theory. CHAN CODING demonstrates how the technical problems described in the following section are being approached and solved.

BRIEF DESCRIPTION OF THE DRAWINGS

FIG. 4 shows an example of CHAN LINES.
FIG. 6 shows an example of CHAN RECTANGLES.
FIG. 13 is a diagram showing examples of CHAN RECTANGLES.

DISCLOSURE OF INVENTION

Technical Problem

Figure 1:
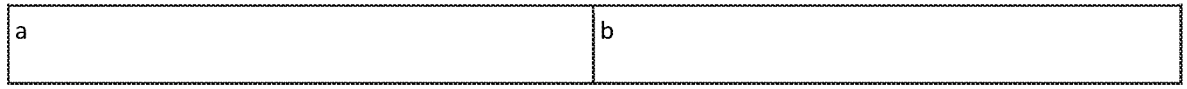
FIG. 1 is a diagram of a CHAN FRAMEWORK AND LEGEND.

The technical problem presented in the challenge of lossless data compression is how longer entries of digital data code could be represented in shorter entries of code and yet could be recoverable. While shorter entries could be used for substituting longer data entries, it seems inevitable that some other information, in digital form, has to be added in order to make it possible or tell how it is to recover the original longer entries from the shortened entries. If too much such digital information has to be added, it makes the compression efforts futile and sometimes, the result is expansion rather than compression.

The way of storing such additional information presents another challenge to the compression process. If the additional information for one or more entries of the digital information is stored interspersed with the compressed data entries, how to differentiate the additional information from the original entries of the digital information is a problem and the separation of the compressed entries of the digital information during recovery presents another challenge, especially where the original entries of the digital information are to be compressed into different lengths and the additional information may also vary in length accordingly.

This is especially problematic if the additional information and the compressed digital entries are to be recoverable after re-compression again and again. More often than not, compressed data could not be re-compressed and even if re-compression is attempted, not much gain could be obtained and very often the result is an expansion rather than compression.

The digital information to be compressed also varies in nature; some are text files, others are graphic, music, audio or video files, etc. Text files usually have to be compressed losslessly, otherwise its content becomes lost or scrambled and thus unrecognizable.

And some text files are ASCII based while others UNICODE based. Text files of different languages also have different characteristics as expressed in the frequency and combination of the digital codes used for representation. This means a framework and method which has little adaptive power (i.e. not being capable for catering for all possible cases) could not work best for all such scenarios. Providing a more adaptive and flexible or an all embracing framework and method for data compression is therefore a challenge.

Technical Solution

Disclosed herein is a framework, schema, and computer-implemented method for processing digital data, including random data, through encoding and decoding the data losslessly. The framework and method processes data correctly for the purposes of encryption/decryption or compression/decompression. The framework and method can be used for lossless data compression, lossless data encryption, and lossless decryption and restoration of the data. The framework makes no assumptions regarding digital data to be processed before processing the data It has long been held in the data compression field that pure random binary numbers could not be shown to be definitely subject to compression until the present invention. By providing a framework and method for lossless compression that suits to digital information, whether random or not, of different types and of different language characteristics, the present invention enables one to compress random digital information and to recover it successfully. The framework as revealed in this invention, CHAN FRAMEWORK, makes possible the description and creation of order of digital information, whether random or not, in an organized manner so that the characteristics of any digital information could be found out, described, investigated and analyzed so that such characteristics and the content of the digital information could be used to develop techniques and methods for the purposes of lossless encryption/decryption and compression/decompression in cycles. This puts an end to the myth of Pigeonhole Principle in Information Theory. Of course, there is a limit. This is obvious that one could not further compress a digital information of only 1 bit. The limit of compressing digital information as revealed by the present invention varies with the schema and method chosen by the relevant implementation in making compression, as determined by the size of the header used, the size of Processing Unit (containing a certain number of Code Units) or the size of Super Processing Units (containing a certain number of Processing Units) used as well as the size of un-encoded binary bits, which do not make up to a Processing Unit or Super Processing Unit. So this limit of compressing any digital information could be kept to just thousands of binary bits or even less depending on design and the nature of the relevant data distribution itself.

Using CHAN FRAMEWORK AND CHAN CODING, the random digital information to be compressed and recovered need not be known beforehand. CHAN FRAMEWORK will be defined in the course of the following description where appropriate. For instance, for a conventional data coder samples digital data using fixed bit size of 2 bits, it could always presents digital data in 2-bit format, having a maximum of 4 values, being 00, 01, 10 and 11, thus contrasting with the data coder under CHAN FRAMEWORK which uses the maximum number of data values that a data coder is designed to hold as the primary factor or criterion of data differentiation and bit size as non-primary factor or criterion amongst other criteria for data differentiation as well. This means that the conventional data coders could be just one variant of data coder under CHAN FRAMEWORK; using the aforesaid conventional data coder using 2-bit format as an example, it could be put under CHAN FRAMEWORK, being a data coder having maximum number of values as 4 values (max4 class). So max4 class data coder under CHAN FRAMEWORK could have other variants such as being defined by the number of total bits used for all the unique 4 values as Bit Groups as well as further defined by the Head Type being used such as represented in Diagram 0 below:

Diagram 0
Conventional Data Coder grouped under CHAN FRAMEWORK
Max4 Class = Primary Factor or Criterion for data differentiation

|  |  | 9 bit Group = Non-Primary Factor or Criterion |
| --- | --- | --- |
| 8 bit Group | 0 Head | 1 Head = Non-Primary Factor or Criterion |
| 00 | 0 | 1 |
| 01 | 10 | 01 |
| 10 | 110 | 001 |
| 11 | 111 | 000 |

What is noteworthy of the 3 variants of data coder of Max4 Class is that besides equal bit size code units, such as the 8 bit Group where all 4 unique code unit values having the same number of binary bit representation, the bit size of the code units of the other two variants of the 9 bit Group is all different. It is this rich and flexible classification scheme of digital data under CHAN FRAMEWORK which makes it possible for developing novel methods and techniques for manipulating or representing data for the purposes of encoding and decoding that leads to breaking the myth of Pigeonhole Principle in Information Theory.

Figure 2:
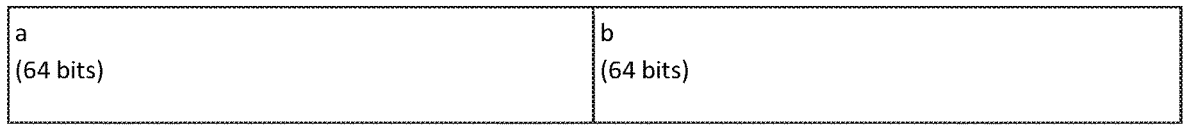
FIG. 2 is a diagram of another CHAN FRAMEWORK.
Figure 3:
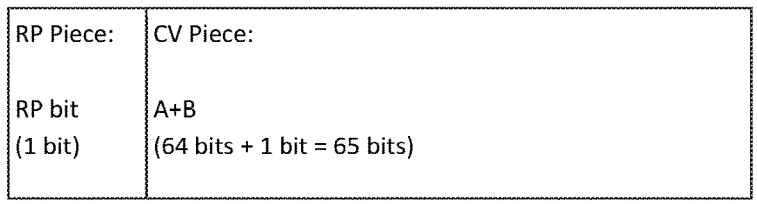
FIG. 3 is a diagram of CHAN CODE.

The following diagram is used to explain the features of CHAN FRAMEWORK as revealed in the present disclosure for encoding and decoding (i.e. including the purposes of compression/decompression and encryption/decryption), using data coder having the same maximum possible number of unique values held as that defined by the conventional data coder, for instance using Max4 8 bit Group as equivalent to the 2-bit fixed size conventional data coder, or Max8 24 bit Group as equivalent to the 3-bit fixed size conventional data coder. This is for the sake of simplicity for illustrating the concept of Processing Unit components for those not used to using data coder under CHAN FRAMEWORK for the time being:

FIG. 1 shows Diagram 1 of a CHAN FRAMEWORK AND LEGEND illustrating the concept of Processing Unit Components where a and b are two pieces of digital information, each representing a unit of code, Code Unit (being the basic unit of code of a certain number of binary bits of 0s and 1s). The content or the value of Code Units, represented by a certain number of binary bits of 0s and 1s, is read one after another, for instance a is read as the first Code Unit, and b the second;

a piece of digital information constitutes a Code Unit, and two such Code Units in FIG. 1 constitute a Processing Unit (the number of Code Units a Processing Unit contains could vary, depending on the schema and techniques used in the coding design, which is decided by the code designer and which could therefore be different from the case used in the present illustration using FIG. 1);

for convenience and ease of computation, each Code Unit is best of equal definition, such as in terms of bit size for one cycle of coding process, using the same number scale without having to do scale conversion; consistency and regularity in encoding and decoding is significant to successfully recovery of digital information losslessly after encoding. Consistency and regularity in encoding and decoding means that the handling of digital information follows certain rules so that logical deduction could be employed in encoding and decoding in such ways that digital information could be translated or transformed, making possible alteration of data distribution such as changing the ratio of binary bits 0 and binary bits 1 of the digital information, and dynamic code adjustment (including code promotion, code demotion, code omission, and code restoration). Such rules for encoding and decoding are determined by the traits and contents of the Code Units or Processing Units or Super Processing Units and the associated schema, design and method of encoding and decoding used. Such rules or logic of encoding and decoding could be recorded as binary code inside the main header (for the whole digital data input) or inside a section header (of a section of the whole digital data input, which is divided into sections of binary bits) using binary bit(s) as indicators; and such binary code being indicators could also be embedded into the encoder and decoder where consistency and regularity of the schema, design and method of encoding and decoding allows;

the Code Unit could be expressed and represented on any appropriate number scale of choice, including binary scale, octary, hexidecimal, etc.;

the size of Code Unit, Code Unit Size, could be of any appropriate choice of size, for instance on binary scale, such as 4 bits or 8 bits or 16 bits or 32 bits or 64 bits or any bit size convenient for computation could be used as Code Unit Size (the definition of Code Unit will be improved upon under CHAN FRAMEWORK beginning from Paragraph [54]);

the digital number or value of each Code Unit represents the digital content of the Code Unit, the digital number signifying the bit signs of all the bits of the Code Unit; and the relations between the Code Units used could be designed, found out and described; to show how CHAN CODING works using two Code Units as a demonstration of the concept and the techniques used, it is to be defined using mathematical formula(e) as follows:

where a and b are the two Code Units making up one Processing Unit in CHAN CODING applied in the present schema in FIG. 1, each being the digital number representing the content or values of the digital information conveyed in the respective Code Units; a being read before b;

where a could be a bigger or lesser value than b, and one could use another two variable names to denote the ranking in value of these two Code Units:

A, being the bigger value of the two Code Units;
B, being the smaller value of the two Code Units;
and where a and b are equal in value, then the one read first is to be A and the second one B; so A is bigger or equal in value than B; and so a could be A or B, depending its value in relation to b.

where, in view of the above, a bit, the RP Bit (i.e. the Rank and Position Bit), has to be used to indicate whether the first Code Unit has bigger/equal or smaller value than the second one; this bit of code therefore signifying the relation between the position and ranking of the values of the two Code Units read;

where, to encode a and b, one could simply add the values of a and b together into one single value, using a bit size of the Code Unit Size plus one bit as follows:

FIG. 2 shows Diagram 2 of another CHAN FRAMEWORK. Before encoding, the data of Diagram 2 is as in Diagram 1, assuming Code Unit Size of 64 bits, having a Processing Unit with two Code Units:

FIG. 3 shows Diagram 3. After encoding, the resultant Code, the CHAN CODE, consisting of RP Piece and CV Piece:

where the RP Bit (1 bit), the first piece, the RP Piece of CHAN CODE and the combined value of a and b, A+B, (65 bits, i.e. 64 bits plus one, being bit size of the Code Unit Size plus one bit), i.e. the second piece, the Coded Value Piece or Content Value Piece (the CV Piece), of CHAN CODE makes up the resultant coded CHAN CODE, which also includes the associated header information, necessary for indicating the number of encoding cycles that has been carried out for the original digital information as well as necessary for remainder code processing. Such header information formation and processing has been mentioned in another PCT Patent Application, PCT/IB2015/056562, dated Aug. 29, 2015 that has also been filed by the present inventor and therefore it is not repeated here.

People skilled in the Art could easily make use of header processing mentioned in the aforesaid PCT Patent Application or in other designs together with the resultant CHAN CODE, i.e. the RP Piece and the CV Piece of the CHAN CODE, for decoding purpose. As to be revealed later in the present invention, the CV piece could be further sub-divided into sub-pieces when more Code Units are to be used according to schema and method of encoding and decoding so designed;

RP Piece is a piece of code that represent certain trait(s) or characteristic(s) of the corresponding Code Units, representing the characteristics of Rank and Position between the two corresponding Code Units of a Processing Unit here. And RP Piece is a subset of code to a broader category of code, which is named as Traits Code or Characteristics Code or Classification Code (so called because of the traits or the characteristics concerned being used to classify or group Code Units with similar traits or characteristics). The CV Piece represents the encoded code of the content of one or more Code Units. Sometimes, depending on the schema and method of encoding and decoding, part of the content of the Code Units is extracted to become the Classification Code, so that what is left in the CV Piece is just the remaining part of content of the corresponding Code Units. The CV Piece constitutes the Content Code of CHAN CODE. So depending on schema and method of encoding and decoding, CHAN CODE therefore includes at least Content Code, and where appropriate plus Classification Code, and where appropriate or necessary plus other Indicator Code as contained in or mixed inside with the Content Code itself or contained in the Header, such as indicating for instance the Coding method or Code mapping table being used in processing a Super Processing Unit. This will be apparent in the description of the present invention in due course; up to here, CHAN FRAMEWORK contains the following elements: Code Unit, Processing Unit, Super Processing Unit, Un-encoded Code Unit (containing un-encoded Code), Header Unit (containing indicators used in the Header of the digital information file, applied to the whole digital data file), Content Code Unit, Section and Section Header (where the whole digital data file or stream is to be divided into sections for processing) and where appropriate plus Classification Code Unit (used hereafter meaning the aforesaid Traits Code or Characteristics Code Unit), and Indicator Code mixed inside with Content Code (for instance, specific to the respective Super Processing Unit). This framework will be further refined and elaborated in due course.

After finding out the relations of the components, the two basic Code Units of the Processing Unit, i.e. the Rank and Position as well as the sum listed out in Paragraph [14] above, such relations are represented in the RP Piece and the CV Piece of CHAN CODE using the simplest mathematical formula, A+B in the CV Piece. The RP Piece simply contains 1 bit, either 0 or 1, indicating Bigger/Equal and Smaller in value of the first value a in relation to the second value b of the two Code Units read in one Processing Unit.

Using the previous example, and on the 64 bit personal computers prevalent in the market today, if each Code Unit of 64 bits on binary scale uses 64 bits to represent, there could be no compression or encryption possible. So more than 1 Code Unit has to be used as the Processing Unit for each encoding step made. A digital file of digital information or a section of the digital file (if the digital file is further divided into sections for processing) has to be broken down into one or more Processing Units or Super Processing Units for making each of the encoding steps, and the encoded code of each of the Processing Units or Super Processing Units thus made are elements of CHAN CODE, consisting of one RP Piece and one CV Piece for each Processing Unit, a unit of CHAN CODE in the present case of illustration. The digital file (or the sections into which the digital file is divided) of the digital information after compression or encryption using CHAN CODING therefore consists of one or more units of CHAN CODE, being the CHAN CODE FILE. The CHAN CODE FILE, besides including CHAN CODE, may also include, but not necessarily, any remaining un-encoded bits of original digital information, the Un-encoded Code Unit, which does not make up to one Processing Unit or one Super Processing Unit, together with other added digital information representing the header or the footer which is usually used for identifying the digital information, including the check-sum and the signature or indicator as to when the decoding has to stop, or how many cycles of encoding or re-encoding made, or how many bits of the original un-encoded digital information present in the beginning or at the end or somewhere as indicated by the identifier or indicator in the header or footer. Such digital information left not encoded in the present encoding cycle could be further encoded during the next encoding cycle if required. This invention does not mandate how such additional digital information is to be designed, to be placed and used. As long as such additional digital information could be made available for use in the encoding and decoding process, one is free to make their own design according to their own purposes. The use of such additional digital information will be mentioned where appropriate for the purpose of clarifying how it is to be used. This invention therefore mainly covers the CHAN CODE produced by the techniques and methods used in encoding and decoding, i.e. CHAN CODING within CHAN FRAMEWORK. CHAN CODE could also be divided into two or more parts to be stored, for instance, sub-pieces of CHAN CODE may be separately stored into separate digital data files for the use in decoding or for delivery for convenience or for security sake. The CHAN CODE Header or Footer could also be stored in another separate digital data file and delivered for the same purposes. Files consisting such CHAN CODE and CHAN CODE Header and Footer files whether with or without other additional digital information are all CHAN CODE FILES, which is another element added to CHAN FRAMEWORK defined in Paragraph [14].

CHAN CODE is the encoded code using CHAN CODING. CHAN CODING produces encoded code or derived code out of the original code. If used in making compression, CHAN CODE represents the compressed code (if compression is made possible under the schema and method used), which is less than the number of bits used in the original code, whether random or not in data distribution. Random data over a certain size tends to be even, i.e. the ratio between bits 0 and bits 1 being one to one. CHAN CODE represents the result of CHAN CODING, and in the present example produced by using the operation specified by the corresponding mathematical formula(e), i.e. the value of the RP Piece and the addition operation for making calculation and encoding, the mathematical formula(e) expressing the relations between the basic components, the Code Units, of the Processing Unit and producing a derived component, i.e. A+B in the CV Piece in Diagram 3. Using the rules and logic of encoding described above, the original code could be restored to. The RP Piece represents the indicator information, indicating the Rank and Position Characteristics of the two Code Units of a Processing Unit, produced by the encoder for the recovery of the original code to be done by the decoder. This indicator, specifying the rule of operation to be followed by the decoder upon decoding, is included in the resultant encoded code. The rule of operation represented by the mathematical formula, A+B, however could be embedded in the encoder and decoder because of its consistency and regularity of application in encoding and decoding. Derived components are components made up by one or more basic components or together with other derived component(s) after being operated on by certain rule(s) of operation such as represented by mathematical formula(e), for instance including addition, subtraction, multiplication or division operation.

CHAN CODE, as described above, obtained after the processing through using CHAN CODING, includes the digital bits of digital information, organized in one unit or broken down into sub-pieces, representing the content of the original digital information, whether random or not in data distribution, that could be recovered correctly and losslessly. The above example of course does not allow for correct lossless recovery of the original digital information. It requires, for instance, another mathematical formula, such as A minus B and/or one of the corresponding piece of Content Code to be present before the original digital information could be restored to. The above example is just used for the purpose of describing and defining CHAN FRAMEWORK and its elements so far. After the decision being made on the selection of the number scale used for computation, the bit size of the Code Unit and the components for the Processing Unit (i.e. the number of the Code Units for one Processing Unit; the simplest case, being using just two Code Units for one Processing Unit as described above) and their relations being defined in mathematical formula(e) and being implemented in executable code used in digital computer when employed, what CHAN CODING does for encoding when using mathematical formula(e) as rules of operation (there being other techniques to be used as will be revealed in due course) includes the following steps: (1) read in the original digital information, (2) analyze the digital information to obtain its characteristics, i.e. the components of the Compression Unit and their relations, (3) compute, through applying mathematical formula or formulae designed, which describe the characteristics of or the relations between the components of the original digital information so obtained after the analysis of CHAN CODING, that the characteristics of the original digital data are represented in the CHAN CODE; if compression is made possible, the number of digital bits of CHAN CODE is less than the number of digital bits used in the original code, whether in random data distribution or not; the CHAN CODE being a lossless encoded code that could be restored to the original code lossless on decoding [using mathematical formula(e) and the associated mathematical operations in encoding does not necessarily make compression possible, which for instance depends very much on the formula(e) designed together with the schema and method used, such as the Code Unit Definition and the technique of Code Placement]; and (4) produce the corresponding CHAN CODE related to the original digital information read in step (1).

What the CHAN CODING does for decoding the corresponding CHAN CODE back into the digital original code includes the following steps: (5) read in the corresponding CHAN CODE, (6) obtain the characteristics of the corresponding CHAN CODE, (7) apply in a reverse manner mathematical formula(e) so designed, which describe the characteristics of or the relations between the components of the original digital information so obtained after the analysis of CHAN CODING, to the CHAN CODE, including the use of normal mathematics and COMPLEMENTARY MATHEMATICS; (8) produce after using step (7) the original code of the original digital information lossless, whether the original digital information is random or not in data distribution. So on decoding, the CHAN CODE in Diagram 3 is restored correctly and losslessly to the original digital data code in Diagram 2. This could be done because of using another inventive feature, broadening the definition of Code Unit to provide a more flexible and novel framework, CHAN FRAMEWORK, for ordering, organizing and describing digital data as introduced in Paragraph [14] and to be further refined and elaborated, later beginning at Paragraph [54]. Of course, up to now before further revealing this inventive feature, it is not the case (i.e. the formula being used in the case being not sufficient to correctly restore the original data code) as another CV sub-piece representing A minus B, for instance, is missing in the above Diagrams; even if this CV sub-piece is present, using the existing Code Unit definition (Code Unit being defined in terms of unified bit sizes or same bit sizes), the resultant CHAN CODE is not guaranteed to be less in size than the original code, depending on the schema and method used, such as the Code Unit Definition and the technique of Code Placement, as well as the original data distribution. But with the presence of the CV sub-piece representing the result of the operation of the mathematical formula, A minus B, together with the corresponding missing formula or the missing piece of Processing Unit component, the resultant CHAN CODE could be regarded an encrypted code that could be used to recover the original digital code correctly and losslessly; the encrypted CHAN CODE so produced however may be an expanded code, not necessarily a compressed code. The method and the associated techniques for producing compressed code out of digital data whether random or not in distribution, putting an end to the myth of Pigeonhole Principle in Information Theory, will be revealed in due course later after discussing the inventive feature of novel Code Unit definition and other techniques used in implementing the novel features of CHAN FRAMEWORK.

To path the way of understanding the concept of range and its use in applying the technique of Absolute Address Branching, the use of which could help compressing random data together with the use of the inventive features of CHAN FRAMEWORK, an explanation of how COMPLEMENTARY MATHEMATICS does is given below in the following Diagram:

Diagram 4
Complementary Mathematics $$CC - A = A^c$$

and $$A^c + A = CC$$

or $$B^c + B = CC$$

and $$(A^c + B) = (CC - A) + B$$

where CC is Complementary Constant or Variable, being a Constant Value or Variable Value chosen for the operation of COMPLEMENTARY MATHEMATICS, which is defined as using the Complementary Constant or Variable (it could be a variable when different Code Unit Size is used in different cycles of encoding and decoding) that is used in mathematical calculation or operation having addition and subtraction logic as explained in the present invention. Depending on situation more than one Complementary Constant or Variable could be designed and use for different operations or purposes where necessary or appropriate;

A is the value being operated on, the example used here is the Rank Value A, A being bigger or equivalent in value to B in the present case of using two Code Unit Values only; so in the first formula:

$$CC - A = A^c$$

where CC minus A is equal to A Complement, i.e. denoted by $A^c$, which is the Complementary Value of A, or a mirror value, using the respective Complementary Constant or Variable; for instance, let CC be a constant of the maximum value of the Code Unit Size, such as 8 bits having 256 values; then CC is 256 in value; and let A be 100 in value, then $A^c$ is equivalent to 256 minus 100=156; and the reverse operation is therefore $A^c + A = CC$, representing the operation of 100+156=256; and in the fourth formula, $(A^c + B) = (CC - A) + B$; and let B be 50, then $A^c + B = (256 - 100) + 50 = 156 + 50 = 206$.

Diagram 4 gives the logic of the basic operations of the COMPLEMENTARY MATHEMATICS invented by the present inventor that is sufficient for making the decoding process to be introduced later. However, for more complete illustration of the addition and subtraction operations of COMPLEMENTARY MATHEMATICS, such logic is defined and explained in Diagram 5 below:

Diagram 5
More Logic of COMPLEMENTARY MATHEMATICS Defined:

$$CC - (A+B) = (A+B)^c \text{ or } = CC - A - B;$$

and $$CC - (A-B) = A^c + B$$

and

CC−A+B may be confusing; this should better be represented clearly as:

either $$(CC-A) + B = A^c + B$$

or $$(CC-B) + A = B^c + A$$

or $$CC - (A+B) = CC - A - B;$$

so to further illustrate the above logic of the subtraction operations of COMPLEMENTARY MATHEMATICS, let CC be 256, Abe 100 and B be 50, then $$CC - (A+B) = (A+B)^c \text{ or } = A^c - B \text{ or } = B^c - A$$

i.e. $256 - (100+50) = (100+50)^c = 256 - 150 = 106 = A^c - B = 156 - 50 = 106$ or $$= B^c - A = 206 - 100 = 106$$

and $$CC - (A-B) = A^c + B$$

i.e. $256 - (100 - 50) = 256 - (50) = 206 = 156 + 50 = 206$ and $$(CC - A) + B = A^c + B$$

i.e. $(256 - 100) + 50 = 156 + 50 = 206$ or $$(CC - B) + A = B^c + A$$

i.e. $(256 - 50) + 100 = 206 + 100 = 306$

Using the above logic of the addition and subtraction operations of COMPLEMENTARY MATHEMATICS, one could therefore proceed with showing more details about how COMPLEMENTARY MATHEMATICS work in following Diagram 6:

Diagram 6
Operation on Data Values or Data Ranges using COMPLEMENTARY MATHEMATICS
Let CC be 256, A be 100 and B be 50
(1) normal mathematical processing:
divide 150 by 2, i.e. get the average of A and B:

$=(A+B)/2=½A+½B=75$; and since $A$ is the bigger value in $A+B$;

therefore $=A-½(A-B)=100-½(100-50)=100-½(50)=100-25=75$;

$=B+½(A-B)=50+½(100-50)=50+½(50)=50+25=75$;

(2) COMPLEMENTARY MATHEMATICS processing:
make an operation of (CC−A)+B, i.e. operating CC on A, not B:

$=(CC-A)+B=A^c+B=(256-100)+50=156+50=206$;

noting that to do the operation in this step, A and B must be separated first; the step is meant to illustrate the operation of COMPLEMENTARY MATHEMATICS here (3) CHAN CODING using CHAN MATHEMATICS (normal mathematical processing and COMPLEMENTARY MATHEMATICS processing): add the result of Step (1) to the result of Step (2), using A−½(A−B):

$$= A^c + B + A - 1/2(A - B) = A^c + A + B - 1/2(A - B)$$
$$= CC + B - 1/2(A - B) = 256 + 50 - 1/2(100 - 50)$$
$$= 256 + 50 + 25$$
$$= 256 + 25;$$

(4) CHAN CODING using CHAN MATHEMATICS:
subtract CC from the result of Step (3):

$$= [CC + B - 1/2(A - B)] - CC = B - 1/2(A - B)$$
$$= [256 + 50 - 25] - 256$$
$$= [50 - 25];$$

(5) CHAN CODING using CHAN MATHEMATICS:
add the result of Step (1) to Step (4), using B+½(A−B):

$$= [B - 1/2(A - B)] + [B + 1/2(A - B)]$$
$$= 2B$$
$$= [50 - 25] + [50 + 25]$$
$$= 25 + 75$$
$$= 100$$

(6) normal mathematical processing:
divide 2B by 2 to get the value of B:

$$= 2B/2 = B$$
$$= 100/2 = 50$$

(7) normal mathematical processing:
get the value of A by subtracting B from A+B:

$$= A + B - B$$
$$= 150 - 50$$
$$= 100$$

The above serves to show the differences amongst normal mathematical processing, COMPLEMENTARY MATHEMATICS processing, and CHAN CODING using CHAN MATHEMATICS.

COMPLEMENTARY MATHEMATICS performed in Step (2) above could only be made only after A and B are separated and known beforehand, therefore another piece of data information, i.e. (A−B) has to be added (i.e. before the novel Code Unit Definition being invented, which is to be revealed later), so that A and B could be separated using the formulae (A+B)+(A−B)=2*A and 2*A/2=A as well as (A+B)+(A−B)=2*B and 2*B/2=B. Using the RP Bit, A and B after separation could be restored correctly to the position of first value and the second value read as a and b. And Step (2) just shows how COMPLEMENTARY MATHEMATICS works when operating on such basic components.

COMPLEMENTARY MATHEMATICS does not directly help to meet the challenge of the Pigeonhole Principle in Information Theory. However it does highlight the concept of using range for addition and subtraction of data values and the concept of a mirror value given a Complementary Constant or Value. It is with this insight of range that the challenge of Pigeonhole Principle in Information Theory is met with successful result as range is essential in the operation of using Absolute Address Branching or latent in the way how data value or number is to be represented and defined.

Before confirming the end to the myth of the Pigeonhole Principle in Information Theory, the present invention reveals in greater detail about how using mathematical formula(e) under CHAN FRAMEWORK could produce countless algorithms for encoding and decoding. The illustration begins with Diagram 7, in which four Code Units, four basic components, makes up one Processing Units:

In most cases, the four basic components of a Processing Unit could be arranged into 3 Arms, i.e. the Long Arm, the Middle Arm and the Short Arms, with 2 pairs of basic components, representing the Upper Corner (being the pair of the two basic components with a bigger sum) and the Lower Corner (being the pair of the two basic components with a smaller sum) of the respective arms. However, in rare cases the values of these pairs happen to have same values in one way or anther, so that there may be less than 3 arms, such as only 2 arms or 1 arm or even becoming a dot shape. Therefore the distribution of the values of the four basic components of a Processing Unit could be represented in different CHAN SHAPES as follows:

Diagram 7
CHAN SHAPES
CHAN DOT •
This is where all four basic components have the same value;
CHAN LINES
There are 2 CHAN LINES as follows:
FIG. 4 shows CHAN LINES 1 and 2. CHAN LINE 1: The three arms all overlap together with the Short Arm having values [1]+[4] being the Upper Corner and [2]+[3] being the Lower Corner.

CHAN LINE 2: The three arms all overlap together with the Short Arm having values [2]+[3] being the Upper Corner and [1]+[4] being the Lower Corner.

Figure 5:
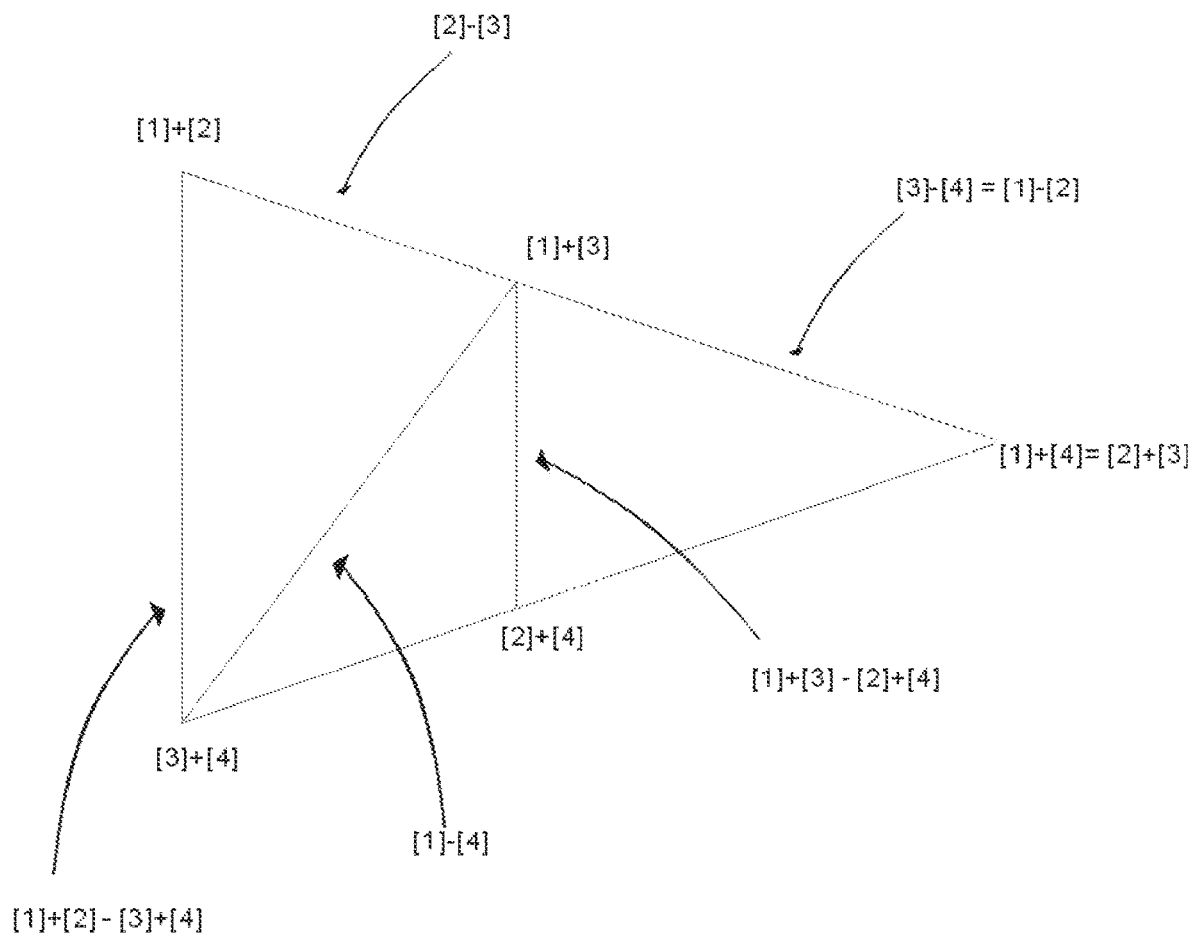
FIG. 5 shows an example of a CHAN TRIANGLE.

FIG. 5 shows a CHAN TRIANGLE.

There are 2 arms, the Long Arm and the Middle Arm, and the Short Arm becomes a dot as its pairs of values [1]+[4] and [2]+[3] are equal.

CHAN RECTANGLES AND TRAPEZIA AND SQUARES

FIG. 6 shows CHAN RECTANGLES 1 and 2. CHAN RECTANGLE 1 shows the incoming stream of data values of 4 Code Units one after the other in sequence CHAN RECTANGLE 2 showing the Ranking and Position of incoming stream of data values of 4 Code Units CHAN RECTANGLE 2 shows the first Code Unit Value a, of the Processing Unit is B, the second in ranking amongst the four Code Units; the second Code Unit Value b is C, the third in ranking; the third Code Unit Value c is A, the first in ranking; the fourth Code Unit Value d is D, the last in ranking.

Figure 7:
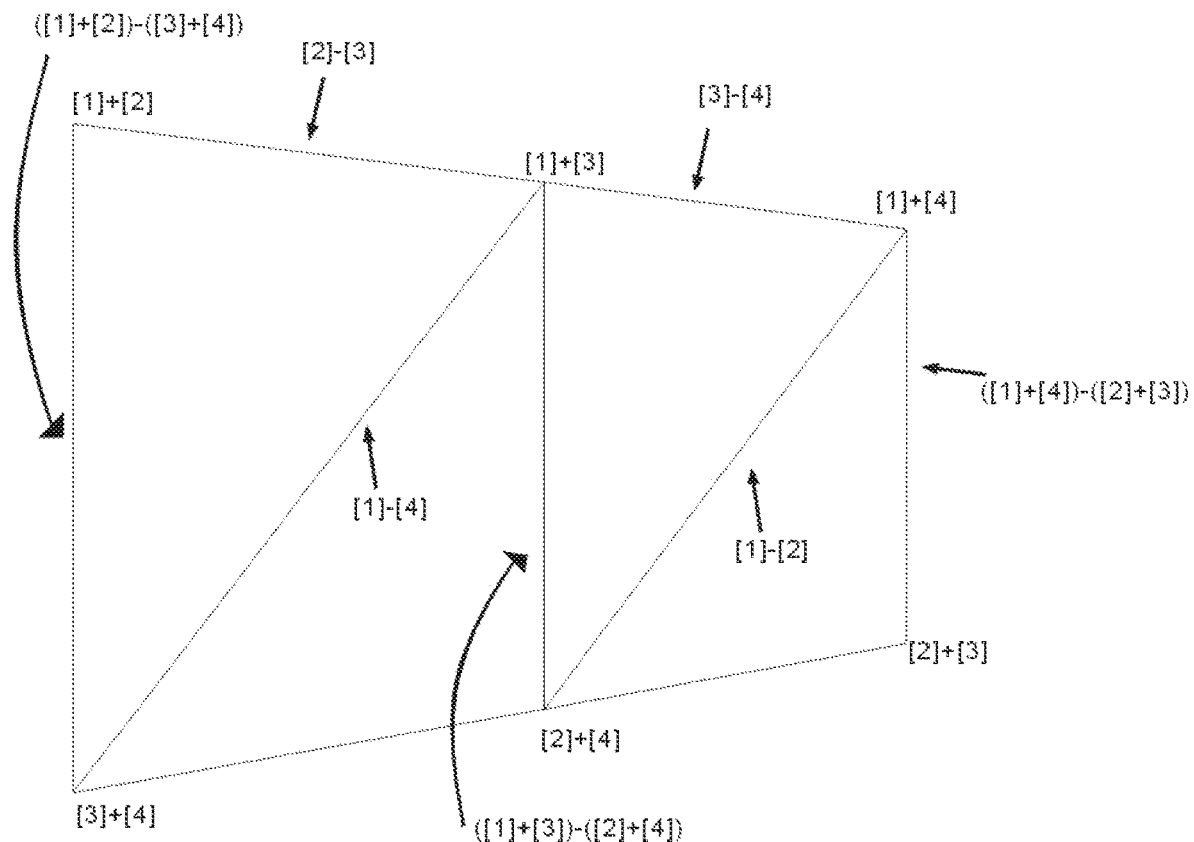
FIGS. 7-12 show examples of CHAN TRAPEZIA.

CHAN TRAPEZIA showing the relationship between the four basic components of the CHAN RECTANGLES FIG. 7 shows CHAN TRAPEZIUM 1

Upper Corners of the 3 arms are [1]+[2], [1]+[3] and [1]+[4] and

Lower Corners of the 3 arms are [3]+[4], [2]+[4] and [2]+[3].

CHAN TRAPEZIUM 1 shows the relationship amongst the four basic components, the four values of the four Code Units shown in CHAN RECTANGLE 2 where A is re-denoted by [1], B [2], C [3] and D [4]; and (A+B)=[1]+[2], (A−B)=[1]−[2], and the like in the same way. It could be seen that the values of the four basic components of the Processing Unit [1], [2], [3] and [4] could be arranged into three arms, being ([1]+[2])−([3]+[4]) i.e. the Long Arm, ([1]+[3])−([2]+[4]) the Middle Arm and ([1]+[4])−([2]+[3]) the Short Arm. The sum of the values of [1]+[2]+[3]+[4] is always the same for all the three arms. The differences amongst the three arms is reflected in their lengths, i.e. the differences in values between the upper corners and lower corners, of the three arms.

Figure 8:
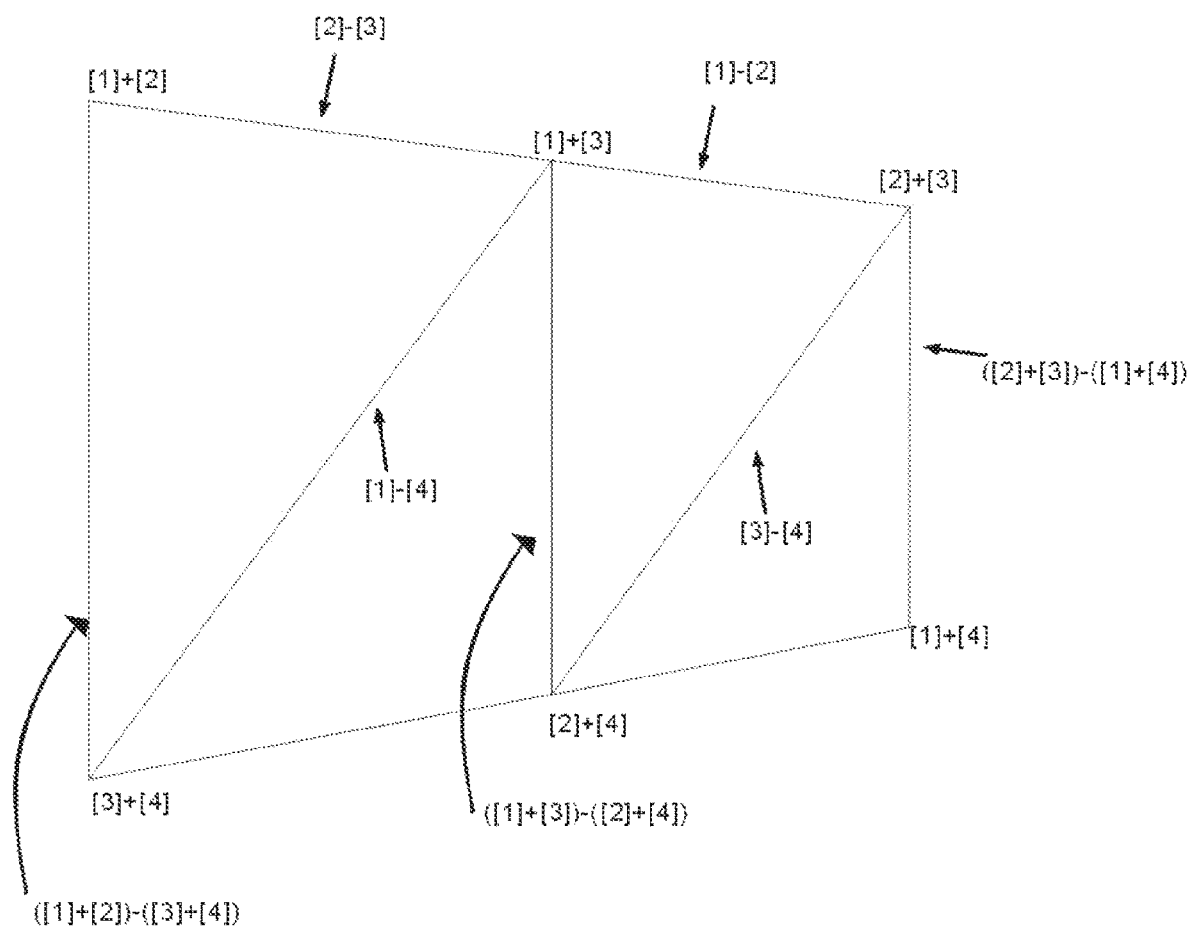

The Long Arm and Middle Arm always stay the same way in ranked value arrangement. The Upper Corner and Lower Corner of the Short Arm however would swap depending on the value distribution of the four basic components. So there are two scenarios, either [1]+[4] is bigger in value the [2]+[3] as in CHAN TRAPEZIUM 1 or the other way round, which is represented in CHAN TRAPEZIUM 2 in FIG. 8 as follows:

Upper Corners of the 3 arms are [1]+[2], [1]+[3] and [1]+[4] and in CHAN TRAPEZIUM 1, Lower Corners of the 3 arms are [3]+[4], [2]+[4] and [2]+[3].

In CHAN TRAPEZIUM 1, the values of the Long Arm, the Middle Arm and the Short Arm could be redistributed as follows:

Long Arm=([1]+[2])−([3]+[4])=([1]−[4])+([2]−[3])= ([1]−[3])+([2]−[4]);

Middle Arm=([1]+[3])−([2]+[4])=([1]−[4])−([2]− [3])=([1]−[2])+([3]−[4]);

and

Short Arm=([1]+[4])−([2]+[3])=([1]−[3])−([2]−[4])= ([1]−[2])−([3]−[4]).

In CHAN TRAPEZIUM 2, the values of the Long Arm, the Middle Arm and the Short Arm could also be redistributed as follows:

Long Arm=([1]+[2])−([3]+[4])=([1]−[4])+([2]−[3])= ([2]−[4])+([1]−[3]);

Middle Arm=([1]+[3])−([2]+[4])=([1]−[4])−([2]− [3])= ([3]−[4])+([1]−[2]);

and

Short Arm=([2]+[3])−([1]+[4])=([2]−[4])−([1]−[3])= ([3]−[4])−([1]−[2]).

So in CHAN TRAPEZIUM 1 and 2, the Long Arm is always equal to or bigger than the Middle Arm by 2*([2]−[3]).

But because of the two possible scenarios of swapping in values of the Upper Corner and Lower Corner of the Short Arm, in CHAN TRAPEZIUM 1, the Long Arm is always equal to or bigger than the Short Arm by 2*([2]−[4]) and the Middle Arm is always equal to or bigger than the Short Arm by 2*([3]−[4]).

And in CHAN TRAPEZIUM 2, the Long Arm is always equal to or bigger than the Short Arm by 2*([1]−[3]) and the Middle Arm is always equal to or bigger than the Short Arm by 2*([1]−[2]).

Figure 9:
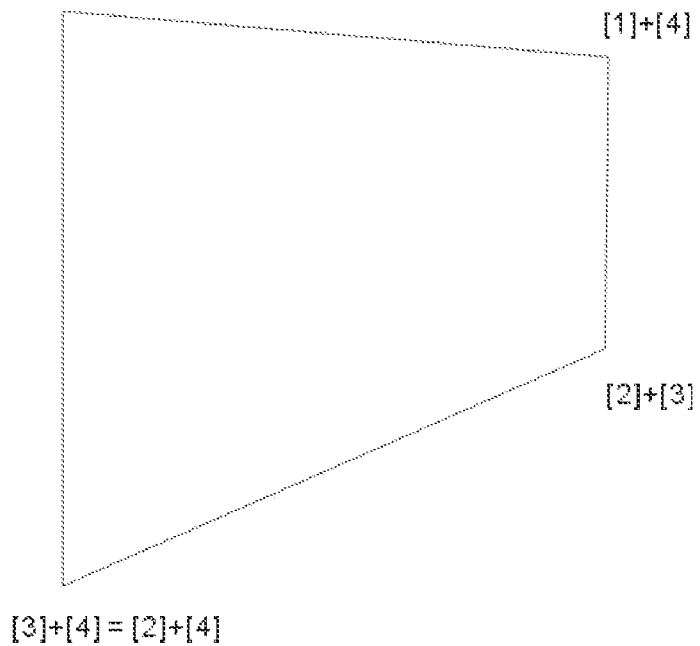

FIG. 9 shows CHAN TRAPEZIUM 3 or CHAN SQUARE 1

This is where the Middle Arm overlaps with the Long Arm with Upper Corner and Lower Corner of the Short Arm being [1]+[4] and [2]+[3] respectively. If the two arms therein are not equal in length, it is a trapezium, otherwise it is a square.

Figure 10:
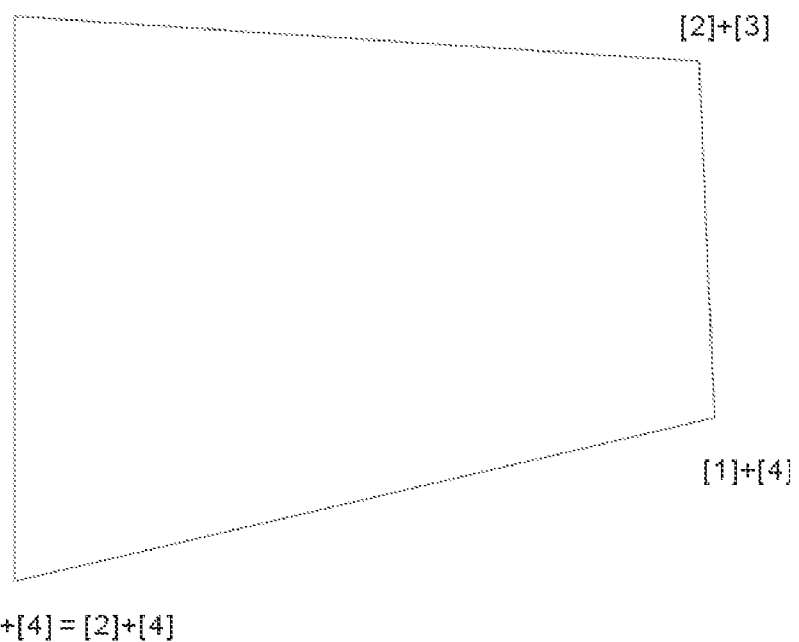

FIG. 10 shows CHAN TRAPEZIUM 4 or CHAN SQUARE 2

This is where the Middle Arm overlaps with the Long Arm with Upper Corner and Lower Corner of the Short Arm being [2]+[3] and [1]+[4] respectively. If the two arms therein are not equal in length, it is a trapezium, otherwise it is a square.

Figure 11:
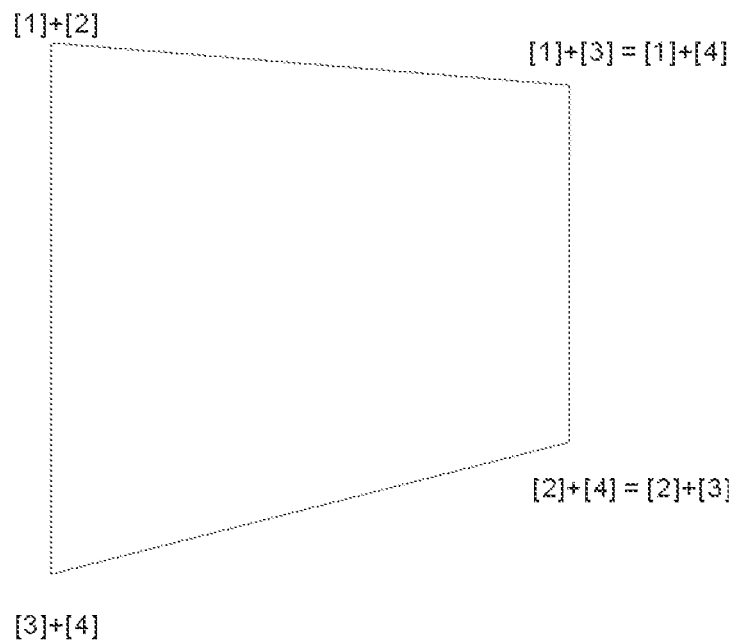

FIG. 11 shows CHAN TRAPEZIUM 5 or CHAN SQUARE 3

This is where the Short Arm overlaps with the Middle Arm with Upper Corner and Lower Corner of the Short Arm being [1]+[4] and [2]+[3] respectively. If the two arms therein are not equal in length, it is a trapezium, otherwise it is a square.

Figure 12:
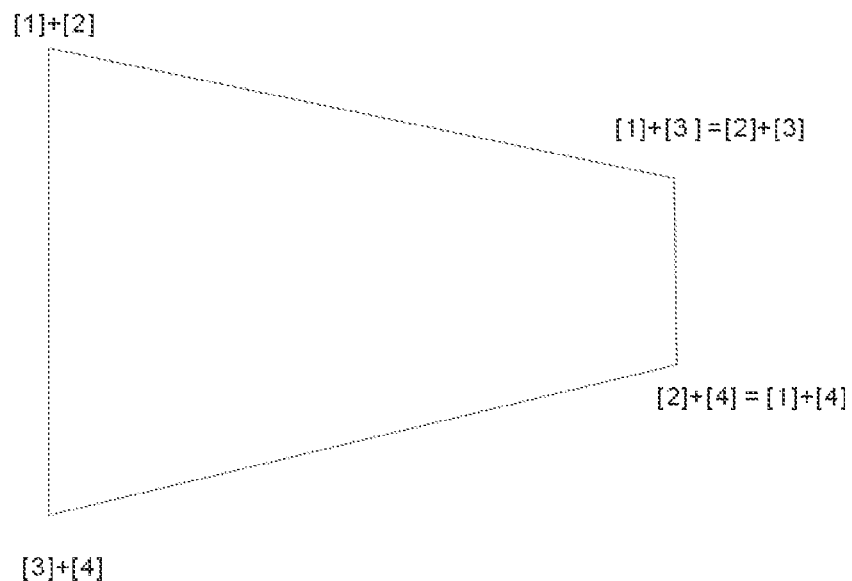

FIG. 12 shows CHAN TRAPEZIUM 6 or CHAN SQUARE 4.

This is where the Short Arm overlaps with the Middle Arm with Upper Corner and Lower Corner of the Short Arm being [2]+[3] and [1]+[4] respectively. If the two arms therein are not equal in length, it is a trapezium, otherwise it is a square.

To make possible data encoding and decoding in the present illustration, the four values of the four basic components have to be represented by 1 CV Pieces consisting of 4 sub-pieces of values (produced by the use of four formulae designed for such purpose; one could attempt to make use of three or less formulae, so far the efforts do not appear to show promising results; one however should not rule out such possibility as there are plenty opportunities to introduce new techniques to CHAN FRAMEWORK as the present invention will show in this Application) in addition to the RP Piece, which is used to indicate the relationship between the Position and Rank of the values of the 4 basic components as shown in the CHAN RECTANGLES in Diagram 8 of FIG. 13:

The CHAN RECTANGLES in Diagram 8 show details of the positions and ranking of the four incoming basic components and the resultant CHAN CODE CHAN RECTANGLE 3 shows the Ranking and Position of incoming stream of data values of 4 Code Units and the 64 bit size used CHAN RECTANGLE 4 shows CHAN CODE, the compressed code created by using CHAN CODING showing details of the RP Piece and CV Piece One very distinguishing characteristic of the present invention is the varying bit sizes of values of the 4 sub-pieces making up the CV Piece; and RP Piece itself varies between 4 bit and 5 bit; and despite their varying bit sizes, CHAN CODING techniques to be revealed later could be used to decode the relevant CHAN CODE and restore it losslessly and correctly back into the original incoming digital data codes. For the purpose of making compression, the varying bit sizes used is intended for further raising the compression ratio through using CHAN CODING techniques over the compression ratio that could be achieved using mathematical formulae.

The RP Piece is to be explained here first. RP Piece is used for indicating the relative positions of the 4 Ranked Values of the four basic components, the four Code Units, of a Processing Unit because the Ranking of the four basic components may vary with their positions, there is no fixed rule for determining the relationship between position and ranking of the values of the four basic components. There are altogether 24 combinations between Position and Ranking as shown in the following Diagram 9:

Diagram 9
Rank Position Code Table
Possible Combinations of Positions and Ranks of the 4 Basic Components

| RANK VALUES | A = [1] | B = [2] | C = [3] | D = [4] |
|---|---|---|---|---|
| In Positions 1, 2, 3 and 4 respectively as shown follows: | | | | |
| Rank Position Code | Position for A | Position for B | Position for C | Position for D |
| 01 | 1 | 2 | 3 | 4 |
| 02 | 1 | 2 | 4 | 3 |
| 03 | 1 | 3 | 2 | 4 |
| 04 | 1 | 3 | 4 | 2 |
| 05 | 1 | 4 | 2 | 3 |
| 06 | 1 | 4 | 3 | 2 |
| 07 | 2 | 1 | 3 | 4 |
| 08 | 2 | 1 | 4 | 3 |
| 09 | 2 | 3 | 1 | 4 |
| 10 | 2 | 3 | 4 | 1 |
| 11 | 2 | 4 | 1 | 3 |
| 12 | 2 | 4 | 3 | 1 |
| 13 | 3 | 1 | 2 | 4 |
| 14 | 3 | 1 | 4 | 2 |
| 15 | 3 | 2 | 1 | 4 |
| 16 | 3 | 2 | 4 | 1 |
| 17 | 3 | 4 | 1 | 2 |
| 18 | 3 | 4 | 2 | 1 |
| 19 | 4 | 1 | 2 | 3 |
| 20 | 4 | 1 | 3 | 2 |
| 21 | 4 | 2 | 1 | 3 |
| 22 | 4 | 2 | 3 | 1 |
| 23 | 4 | 3 | 1 | 2 |
| 24 | 4 | 3 | 2 | 1 |

As there are altogether 24 variations between Rank and Position of the values of the four basic components in combination, one normally would have to use 5 bits to house and indicate these 24 variations of Rank and Position Combination so that on decomposition, the correct Rank and Position of the values of the four basic components could be restored correctly, i.e. the four rank values of the basic components could be placed back into their correct positions corresponding to the positions of these values in the incoming digital data input. However, a technique called Absolute Address Branching could be used to avoid wasting in space for there are 32 seats for housing only 24 variations and 8 seats are left empty and wasted if Absolute Address Branching is not to be used.

To use the simplest case, one could have only 3 values, then normally 2 bits have to be use to provide 4 seats for the 3 variations of values. However, with Absolute Address Branching is used, for the case where value=1, only 1 bit is used and for the case where the value=2 or =3, 2 bits however have to be used. For instance, the retrieving process works as follows: (1) read 1 bit first; (2) if the value is 0, representing the value being 1, then there is no need to read the second bit; and if the value is 1, then the second bit has to be read, if the second bit is 0, it represents that the value is 2 and if the second bit is 1, then the value is 3. So this saves some space for housing the 3 values in question. ⅓ of the cases or variations uses 1 bit and the other ⅔ of the cases or variations has to use 2 bits for indication.

So using Absolute Address Branching, 8 variations out of the 24 variations require only 4 bits to house and the remaining 16 variations require 5 bits. That means, 4 bits provide only 16 seats and 5 bits provide 32 seats. And if there are 24 variations, there are 8 variations over the seats provided by 4 bits, so 8 seats of the 16 seats provided by 4 bits have to reserved for representing 2 variations. So one could read 4 bits first, if it is found that the value is between 1 to 8, then one could stop and does not have to read in anther bit. However, if after reading 4 bits and the value is between 9 to 16, for these 8 variations, one has to read in another bit to determine which value it represents, for instance after 9 is determined, it could represent 9 or another value such as 17, then one has to read in another bit, say if it is 0, that means it stays as 9 and if it is 1, then it is of the value of 17, representing a Rank Position Code having a value of 17, indicating the RP pattern that the values of [1], [2], [3] and [4] have to be put into the positions of 3, 4, 1 and 2 correspondingly by referring to and looking up the Rank Position Code Table in Diagram 9 above. Absolute Address Branching is therefore a design in which an address, instead of indicating one value as it normally does, now could branch to identify 2 or more values using extra one bit or more bits, depending on design. It is used when the range limit is known, i.e. the maximum possible combinations or options that a variable value is to choose from for its determination. For instance, in the above RP Table, it is known that there are only 24 combinations of Rank and Position, so the maximum possible combinations are only 24, because it is known it could be used as the range limit for indicating which particular value of the RP combination that a Processing Unit has, indicating how the values of [1], [2], [3] and [4] are to be put into the first, the second, the third and the fourth positions of the incoming digital data stream. Because this range limit is known and Absolute Address Branching is used, therefore on average, only four and a half bit is required instead of the normally five bits required for these 24 combinations.

It now comes to the determination of the ranked values of the four basic components, A=[1], B=[2], C=[3] and D=[4]. To determine the values of [1], [2], [3] and [4], one could use formulae with respect to the CHAN RECTANGLES AND CHAN TRAPEZIA to represent the essential relations and characteristics of the four basic components where the RP Piece as explained in Paragraph [29] above and the CV Piece altogether takes up a bit size less than the total bit size taken up by the 4 incoming basic components, a, b, c and d, i.e. 4 times the size of the Code Unit for a Processing Unit under the schema presented in the present invention using CHAN RECTANGLES AND CHAN TRAPEZIA as presented above.

After meticulous study of the characteristics and relations between the four basic components making up a Processing Unit represented in CHAN SHAPES, the following combinations of formulae represented in 3 sub-pieces of the CV Piece is the first attempt for illustrating the principle at work behind. There could be other similar formulae to be found and used. So there is no limit to, but including using the formulae presented below with reference to CHAN SHAPES. So this first attempt is:

$$=([4]-^{1/2}([3]-[4])) \tag{1}$$

$$=([1]-[4]) \tag{2}$$

$$=(([2]-[3])+^{1/2}([3]-[4])) \tag{3}$$

The above 3 values represented in the formulae of Step (1) to Step (3) are different from those presented in the PCT Application, PCT/IB2016/054732 filed on 5 Aug. 2016 mentioned earlier. In that PCT Application, the use of COMPLEMENTARY MATHEMATICS combining with the use of Rank and Position Processing is asserted to be able to put an end to the myth of Pigeonhole Principle in Information Theory. Upon more careful examination, it is found that the three formulae thus used are not good enough to achieve that end. So the right formulae and formulae design is very vital for the application of the techniques of CHAN CODING. In the aforesaid PCT Application, CHAN CODING is done using formulae designed using the characteristics and relations between the basic components, i.e. the Code Units of the Processing Unit, as expressed in CHAN SHAPES.

Formulae Design is more an art than a science. Because one could not exhaust all combinations of the characteristics and relations between different basic as well as derived components of the Processing Units, a novel mind will help to make a successful hunch of the right formulae to use. The 3 formulae used in the aforesaid PCT Application is designed in accordance to a positive thinking in order that using the 3 formulae, one is able to reproduce the associated CHAN SHAPES, including CHAN TRAPESIUM or CHAN SQUARE or CHAN TRIANGLE or CHAN DOT or CHAN LINE as the case may be. But it is found out that using this mind set, the basic components could not be separated out (or easily separated out because the combinations for calculation could scarcely be exhausted) from their derived components as expressed in the 3 formulae so designed using the techniques introduced in that PCT Application.

In order to meet the challenge of the Pigeonhole Principle in Information Theory, a novel mind set is lacking in the aforesaid PCT Application. And it is attempted here. When things do not work in the positive way, it might work in the reverse manner. This is also the mindset or paradigm associated with COMPLEMENTARY MATHEMATICS. So if the formulae designed to reproduce the correct CHAN SHAPE do not give a good result, one could try to introduce discrepancy into these 3 formulae. So the technique of Discrepancy Introduction (or called Exception Introduction) is revealed in this present invention in order to show the usefulness of COMPLEMENTARY CODING as well as the usefulness of the technique of Discrepancy Introduction itself during formula design phase by ending the myth of Pigeonhole Principle in Information Theory with the use of all the techniques of CHAN CODING, of which Discrepancy Introduction and COMPLEMENTARY CODING may be useful ones.

So during the design phase, the first step is that one would design the formulae for encoding as usual so that CHAN SHAPES could be reproduced using the formulae so designed. For instance, using the example given in the aforesaid PCT Application, the 3 formulae, from which the values and the encoded codes, of the 3 sub-pieces of CV Piece of CHAN CODE are derived and obtained, of Step (1) to Step (3) are:

$$=([1]-[4]); \tag{1}$$

$$=([2]-[3]); \text{ and} \tag{2}$$

$$=([3]+[4]). \tag{3}$$

Using normal mathematics, Step (4) to Step (9) in the aforesaid PCT Application, cited below, reproduce the associated CHAN SHAPE as follows:

$$=(1)+(2); \text{ i.e. Step }(1)+\text{Step }(2) \tag{4}$$

$=([1]-[4])+([2]-[3]);$ upon re-arrangement or re-distribution of these 4 ranked values, leading to;

$=([1]+[2])-([3]+[4]);$ the Long Arm obtained;

$=([1]-[3])+([2]-[4]);$ for comparing the difference in length with other arms;

$$=(1)-(2); \tag{5}$$

$=([1]-[4])-([2]-[3]);$ $=([1]+[3])-([2]+[4]);$ the Middle Arm obtained;

$$=([1]-[2])+([3]-[4]);$$

$$=(1)+(3); \tag{6}$$

$=([1]-[4])+([3]+[4]);$ $=([1]+[3]);$ the Upper Corner of the Middle Arm;

$$=(2)+(3); \tag{7}$$

$=([2]-[3])+([3]+[4]);$ $=([2]+[4]);$ the Lower Corner of the Middle Arm;

$$=(6)+(7); \tag{8}$$

$=([1]+[3])+([2]+[4]);$ being the sum of $[1]+[2]+[3]+[4]$, very useful for finding the Upper Corner of the Long Arm;

$=([1]+[2]+[3]+[4]);$ $$=(8)-(3); \tag{9}$$

$=([1]+[2]+[3]+[4])-([3]+[4]);$ where $[3]+[4]=$Step (3) given as the Lower Corner of the Long Arm;

$=([1]+[2]);$ the Upper Corner of the Long Arm;

It could be seen from the above steps that the two corners of the Long Arm and the Middle arms as well as the arms itself are properly reproduced using normal mathematics from Step (4) to Step (9). However, using the 3 proper formulae, the basic components are merged and bonded together so nicely in the derived components that the basic components could not be easily separated out from each other. So one could try to introduce discrepancy into the 3 properly designed formulae in order to carry on the processing further to see if a new world could be discovered. One should not introduce discrepancy in a random manner for the principle of garbage in garbage out. One should focus on what is required for providing useful information to the 3 properly formulae already designed.

In the above example, one could easily notice that two derived components are missing but important in providing additional information for solving the problem at hand, i.e. separating the 4 basic components out from the derived components. These two derived components are identified to be [1]−[2] and [3]−[4]. Having either of these two derived components, one could easily separate the basic components out through addition and subtraction between ([1]−[2]) with ([1]+[2]) obtained at Step (9) as well as between ([3]−[4]) with ([3]+[4]) obtained at Step (3). So one could try introducing either or both of [1]−[2] and [3]−[4] into the 3 properly formulae as mentioned above. And where necessary, further adjustment of formulae could be used.

After countless trials and errors, under the CHAN FRAMEWORK so far outlined, no successful formula design has come up for correct decoding using only 3 formulae in the schema of using 4 Code Units as a Processing Unit even when the feature of Discrepancy Introduction or Exception Introduction is attempted in the formula design as found in Paragraph [31]. So the fourth formula such as [1]−[2] or [3]−[4], i.e. Step (4)=[1]−[2] or Step (4)=[3]−[4], has to be introduced for correct decoding. Or a more wise soul may be able to come up with a solution of using only 3 formulae. So there is still hope in this respect. What is novel about CHAN FRAMEWORK is that it provides the opportunity of making possible different and numerous ways of ordering or organizing digital data, creating orders or structures out of digital data that could be described so that the nature of digital data of different data distribution could be investigated and their differences of characteristics be compared as well as the regularities (or rules or laws) of such data characteristics be discerned so that different techniques could be devised for encoding and decoding for the purposes of compression and encryption for protection of digital information. So as will be seen later, fruitful result could be obtained.

Even if 4 CV sub-pieces, resulting from using 4 formulae, together with the RP Piece have to be used for successfully separating out the values of the 4 basic components or Code Units of a Processing Unit upon decoding for correct recovery of the original digital information, it still provides opportunities for compression depending on the formula design and data distribution of the digital information. As will be seen later, with the introduction of another technique of using Super Processing Unit, using other CHAN CODING techniques, including the use of data coders defined under CHAN FRAMEWORK, and in particular, the use of Exception Introduction and the use of Absolute Address Branching Technique in the design, creation and implementation of DIGITAL DATA BLACKHOLES, yield fruitful result even in compressing digital data of all data distribution, including even random data. Nevertheless, formula design used in CHAN FRAMEWORK serves to provide limitless ways or algorithms of making encryption and decryption of digital data for the purpose of data protection. And this is an easy way of doing encryption and decryption that could easily be practised by even layman. To the less wise souls, the values of [1], [2], [3] and [4] are separated out from each other using the formulae as expressed in Steps (1) to (4) and other derivatives steps as outlined in Paragraphs [34] and [36]. Further formula adjustment and steps could be designed for space optimization, modeling on examples as outlined in Paragraphs [43] and [44] below where applicable.

The values of the data calculated from using the formulae stated in Step (I) to Step (IV) in Paragraph [37] are now put into the four sub-pieces of the CV Piece of CHAN CODE during the encoding process. These four values are stored into the CHAN CODE FILE as the four sub-pieces of the CV Piece together with the corresponding RP Piece upon encoding. The value range limit for each of the CV sub-piece should be large enough for accommodating all the possible values that could come up using the respective formula. During decoding, the RP Piece and the CV Piece are read out for decoding by using Absolute Address Branching technique and by looking up the retrieved value, the Rank Position Code of the corresponding Processing Unit against the relevant Rank Position Code Table used as in Diagram 9 to determine where the ranked values of [1], [2], [3] and [4] of the Processing Units are to be placed during decoding. The ranked values of [1], [2], [3] and [4] are determined as shown in the above steps outlined in Paragraph [38] using the values of the 4 sub-pieces of the corresponding CV Piece stored in Step (I) to Step (IV) in Paragraph [37]. The 4 sub-pieces of the CV Piece are to be placed using the techniques revealed in Paragraph [43] and [44], which elaborate on the value of COMPLEMENTARY MATHEMATICS AND COMPLEMENTARY CODING in determining the range limit for the placement of the CV sub-pieces for adjustment of design where appropriate. Absolute Address Branching technique is technique for optimizing the space saving here. Simple substitution of a, b, c, d, replacing [1], [2], [3] and [4] in the four formulae as described in Paragraph [37] also indicates that the RP Piece could also be dispensed with. This means that, through such substitution, the formulae outlined in Paragraph [37] and [38] also work without RP processing. But without RP processing, the advantage of the possible space saving resulting from the use of range limits is then lost. That could result in more space wasted than using RP processing.

Figure 14:
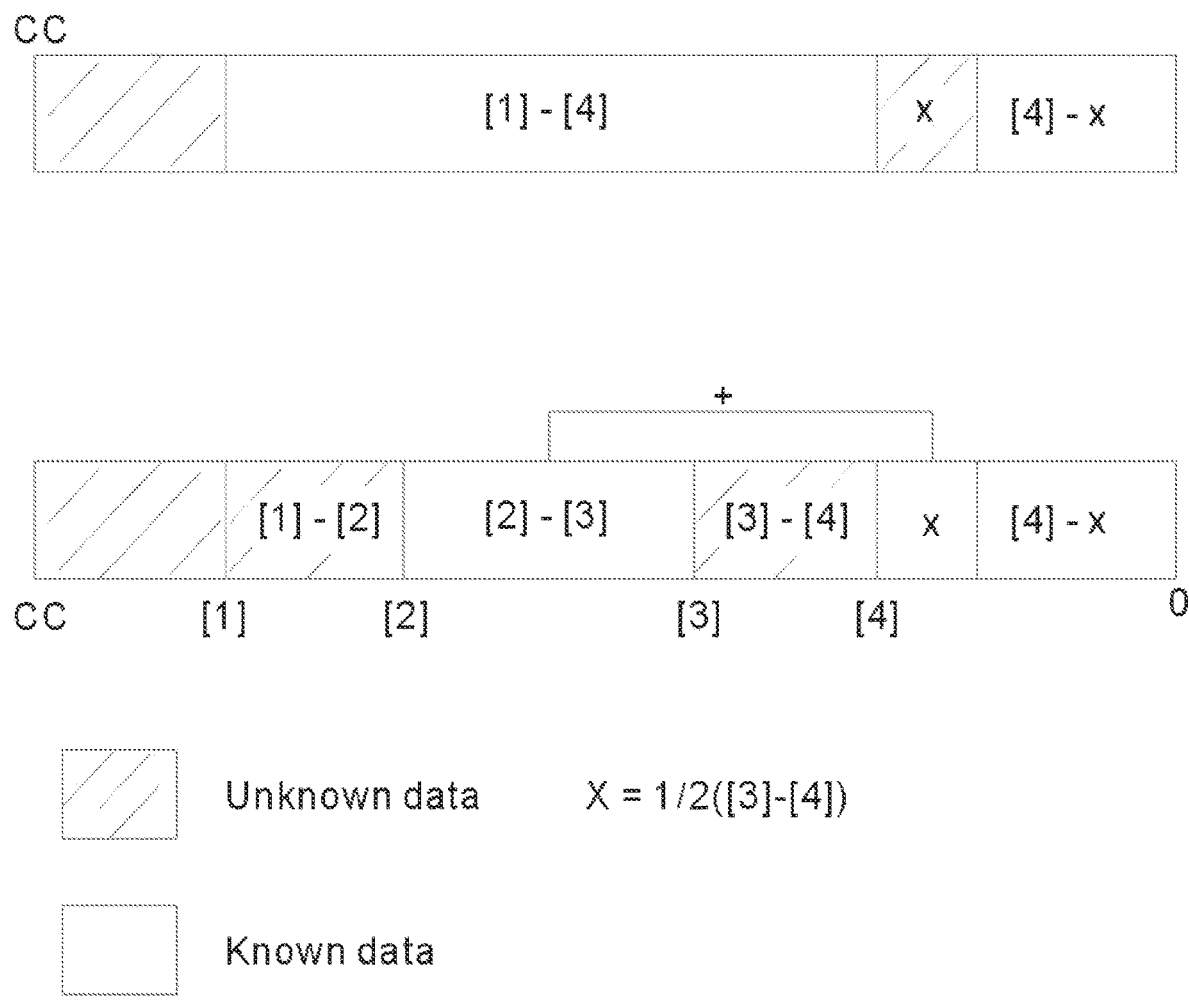
FIG. 14 is a diagram showing examples of CHAN BARS.

COMPLEMENTARY MATHEMATICS AND COMPLEMENTARY CODING helps very much during making the design for the placement of the CV sub-pieces for space saving which may result in adjustment of the original formula design where appropriate. Diagram 10 in FIG. 14 illustrates the contribution made by using COMPLEMENTARY MATHEMATICS AND COMPLEMENTARY CODING during the formula design phase in the present endeavor using the formula design in Paragraph [31] together with Diagram 10.

Diagram 10 shows CHAN BARS. CHAN BARS are a Visual Representation of Range Limits under the paradigm of COMPLEMENTARY MATHEMATICS using the Code Unit Size as the Complementary Constant CC.

From Diagram 10, ranges represented by the 3 formulae in Paragraph [31] expressing the values of the 3 CV sub-pieces are shown together with their Complementary range(s), the unknown data. X is not known by itself and merged as part of the formula: $([2]-[3])+^{1/2}([3]-[4])$. The anomaly or discrepancy or adjustment, $^{1/2}([3]-[4])$, being introduced into these formulae mainly are introduced to the properly designed formulae of [3]+[4] and [2]−[3] describing neatly the associated CHAN SHAPE. Because the average of [3]+[4] is either $([4]+^{1/2}([3]-[4]))$ or $([3]-^{1/2}([3]-[4]))$, one could use either of which to introduce the anomaly or discrepancy or adjustment into it. $([4]+^{1/2}([3]-[4]))$ is taken to be the modified formula after the introduction of formula discrepancy or adjustment into it, the one now used in the formula used in Step (1), and to make a balance of this discrepancy or adjustment, the third formula used in Step (3) is adjusted to be $(([2]-[3])+^{1/2}([3]-[4]))$ correspondingly. Because this is a brand new world that no one charters before, one has to learn from trial and error. As the formulae designed in Paragraph [31] are also not successful in providing the solution to the aforesaid challenge, more adjustment is required. People with wiser soul may also design other formulae suitable for use using CHAN CODING for separating merged data or basic components of Processing Unit out from derived (or combined with basic) components represented by the formulae so designed. The technique of introducing Formula Discrepancy or Formula Anomaly or Formula Adjustment includes the following steps: (i) designing formulae which could be used to reproduce the values or relations and characteristics of derived or basic components; (ii) finding what derived or basic components which are missing but essential for supplying additional values for the purpose of separating basic components out from the components represented by the formulae designed; (iii) designing formula anomaly or formula adjustment or formula discrepancy using formulae that could supply these missing components; such formula anomaly or formula adjustment or formula discrepancy is to be introduced into the formulae used to obtain values of the CV sub-piece(s) of CHAN CODE; (iv) incorporating the formula anomaly or formula adjustment or formula discrepancy into the previously designed formulae made in Step (i) above and making a new set of formulae suitable for use for the purpose of separating basic components out from the components represented by the formulae newly designed or adjusted.

Assuming using 4 formulae as described in Paragraph [38], after determining the ranked values of [1], [2], [3] and [4] and using the RP Piece, the original digital data input of the corresponding Processing Unit could now be decoded losslessly and restored correctly into the right positions. The placement and the bit size used for storing the code represented by the formulae for Step (I) to Step (IV) as the 4 sub-pieces of the CV Piece of the CHAN CODE could now be considered and further optimized for bit storage during the encoding process. It uses the concept of range limit.

To consider which sub-piece of the 4 sub-pieces of the CV Piece of the CHAN CODE to be put first, one could consider if placing one sub-piece could give information for the placement of the other ensuing sub-pieces so that storage space could be reduced. The following discussion uses the 3 formulae as described in Paragraph [31] for elucidation purpose. In order to appreciate the value of COMPLEMENTARY MATHEMATICS, by comparing the free formulae at Steps (1) to (3) in Paragraph [31]: $([4]+^{1/2}([3]-[4]))$, $([1]-[4])$, and $(([2]-[3])+^{1/2}([3]-[4]))$, it could be seen that the ranges represented by the first 2 formulae, $[4]-^{1/2}([3]-[4])$ and $([1]-[4])$ are out of range; that neither of them embraces the other. So apparently either of them could be placed first. However, using CC on $[4]-^{1/2}([3]-[4])$, it becomes obvious that the mirror value of $[4]-^{1/2}([3]-[4])$, that is $[4]^c+^{1/2}([3]-[4])$, should be able to embrace the range of $[1]-[4]$, so $[4]^c+^{1/2}([3]-[4])$, the mirror value of $[4]-^{1/2}([3]-[4])$, could be used as a range limit for placing the value of $[1]-[4]$. And thus the CC value of $[4]-1/2([3]-[4])$ is to be placed as the first CV sub-piece so that the second CV sub-piece represented by the formula of $[1]-[4]$ could use the mirror value of (by making the CC operation on) $[4]-^{1/2}([3]-[4])$ as the range limit for storing the value of $[1]-[4]$.

However as the value of $[4]-^{1/2}([3]-[4])$ in some rare cases could be a negative value, then the value of $[4]^c+^{1/2}([3]-[4])$ would be over the Code Unit Size, in those cases, one could revert to using the CC value, i.e. the Code Unit Size, as the range limit for the value of $[1]-[4]$. That is one is able to choose the shortest range out of the two ranges provided by $[4]^c+^{1/2}([3]-[4])$ and the CC value for use as the range limit of the value of $[1]-[4]$. In most other cases, the range limit as represented by $[4]^c+^{1/2}([3]-[4])$ would be less than the CC value, so bit storage saving could be achieved. $[1]-[4]$ could be used as the range limit for $([2]-[3])+^{1/2}([3]-[4])$, this is because the mirror value of $[2]-[3]$ using $[1]-[4]$ as the Complementary Variable is $[1]-[2]$ plus $[3]-[4]$ and $[3]-[4]$ should be more than $^{1/2}([3]-[4])$, so it is certain that $([2]-[3])+^{1/2}([3]-[4])$ lies within the range of $[1]-[4]$. Therefore $[1]-[4]$ could be put as the second CV sub-piece serving the range limit for the third CV sub-piece, $([2]-[3])+^{1/2}([3]-[4])$, for more bit storage saving. The range limit for placing the first CV sub-piece is the CC value as no other range limit is available before it as a reference. Also as for some rare cases where the value of $[4]-^{1/2}([3]-[4])$ could become negative, an extra sign bit has to be used for it. Also because the value could be with a fraction of 0.5 due to the halving operation, a fraction bit has also to be included for such indication. So altogether it is the CC bit size+2 bits. So if $[1]-[4]$ is of the value of 1,000 instead of the maximum value of 2^64, then 1000 could be used as the range limit for storing $([2]-[3])+^{1/2}([3]-[4])$. Absolute Address Branching could also be used so that the limit of 1,024 could be reduced exactly to 1,000 though in this case the saving is very small. The bit size used is either 10 bits or 9 bits instead of the 64 bits normally required for a 64 bit Code Unit. However as with the case for the first CV sub-piece, $[4]-^{1/2}([3]-[4])$, the third CV sub-piece, $([2]-[3])+^{1/2}([3]-[4])$, may also have a value fraction of 0.5 because of the halving operation, so one more fraction bit has to assign above onto the range limit set by the value of $[1]-[4]$. The placement of these 3 sub-pieces of CV Piece of the CHAN CODE could then be done for the Steps (1) to (3) in Paragraph [31] revealed above. So it is apparent that the 3 sub-pieces of the CV Piece and thus the whole CV Piece could vary in size from one Processing Unit to another if the concept and techniques of Range Limit and Absolute Address Branching are also used for optimization of storage space. It should be born in mind that one should make sure that the range limit used should be able to embrace all the possible values that could appear for which the relevant range limit is designed to be used. In certain cases, the range limit may require adjustment by adding the numerical value 1 to it; this is because the rank values are ranked according to the value itself and when being equal in value, they are ranked according to their positions in the incoming digital data stream. One therefore has to be careful and consider the range limit for a particular value case by case and make certain the range limit designed for a particular value is able to cover all the possible values that could come up.

For instance, the space or bit size required for placing the following three CV sub-pieces of CHAN CODE (not the ones in Paragraph [31] and assuming Formula (IV) as using the standard bit size of a Code Unit), represented by formulae as designed as follows for instance for encryption purpose:

$$=3*([1]-[2]+[3]-[4])+([2]-[3])+([1]+[3]); \quad \text{Formula (I)}$$

$$=3*([1]-[2]+[3]-[4])+([2]-[3])-([2]+[4]); \text{ and} \quad \text{Formula (II)}$$

$$=[3]-[4]; \quad \text{Formula (III)}$$

is estimated to be 5 Code Units, 3 Code Units and 1 Code Unit respectively. The RP Piece providing for 24 combinations uses up another 5 bits; if Absolute Address Branching is used, some combinations may just use up 4 bits. So if the Code Unit Size is taken to be 64 bits, then 68 bits, 66 bits and 64 bits are used for Formula (I), (II) and (III) respectively, without counting out the space optimization that could be achieved using Range Limiting. Using Range Limiting, it is obvious that the value of Formula (I) is bigger than that of Formula (II) and Formula (II) bigger than Formula (III). So Formula (I) should be placed first and then Formula (II) and then Formula (III). Using such placement technique, bit storage could be minimized.

Upon further reflection, it appears that COMPLEMENTARY MATHEMATICS provides very useful concept and more technical tools for saving storage space. However, its importance lies rather in the paradigm it provides, including range processing, mirror value, as well as base shifting, for instance, the base for indicating the mirror value of a value is using the CC value, i.e. the Code Unit Size, as the base for counting reversely instead of the base of Value 0 when doing normal mathematical processing.

Using the characteristics and relations as revealed in CHAN SHAPES, one may design formulae or other shapes with the use of different numbers of Code Units for a Processing Unit as the case may be that could perhaps meet the challenge of Pigeonhole Principle in Information Theory using CHAN CODING even with just normal mathematical processing. No one is for sure that it is never possible given the endless combinations of Code Units and formula designs (as well as the possibility of adding other techniques for use with it) that could be constructed under CHAN FRAMEWORK. And it will be revealed later that these other techniques are able to end the myth of Pigeonhole Principle in Information Theory even without using the feature of formula design.

COMPLEMENTARY MATHEMATICS AND COMPLEMENTARY CODING helps in the formula design phase and in encoding and decoding. So CHAN MATHEMATICS AND CHAN CODING is a super set of mathematical processing including normal mathematics and COMPLEMENTARY MATHEMATICS used in conjunction or alone separately with reference to CHAN SHAPES and the characteristics and relations so revealed in making encoding and decoding of digital information, whether in random or not.

Under further examination for optimization, it appears even the RP Piece and the related RP processing could be dispensed with by just substituting a, b, c, and d values of a Processing Unit for the values of [1], [2], [3] and [4] in the formulae outlined in Paragraph [37] and [38]. However, the placement of the CV sub-pieces would then require more space than that required by using RP Piece and RP processing. It should also be realized that the value of RP Processing lies in giving a clearer picture of the relationship between the four basic components (a, b, c and d) of a Processing Unit in the form of [1], [2], [3] and [4] so that these values could be put into perspective when using and being represented by CHAN SHAPES. This further paves the way for designing correct formulae for applying other encoding and decoding techniques outlined in the present invention. So whether using the RP Piece and RP processing for encoding and decoding or not is a matter of choice that could be decided case by case.

Using 4 CV sub-pieces represented by 4 formulae so designed could give one a very free hand for designing multivariate algorithms for encryption. And then such encrypted digital data could then be compressed using other techniques to be introduced. In this way, both highly easy and secure encryption/decryption and compression/decompression algorithms and process could be designed and implemented. The number of cycles of encryption/decryption and compression/decompression also has effects on the outcome code. And if such information, including the formulae designed and the number of cycles of the encryption/decryption and compression/decompression implemented, is sent separately from the data intended to be sent, data security could be enhanced and greatly protected on an unprecedented level. To enhance the data protection further, different types of CHAN CODE could be separately stored and sent out in the correct order for recovery of the original digital information; such as the sign bits for the CV sub-pieces being in one sign bit file, each CV sub-piece being in a separate CV sub-piece file, the RP Pieces being in a RP Piece file, and the header or footer containing additional information relating to the processing of the corresponding CHAN CODE being in a separate header or footer file.

Using 4 formulae producing 4 CV sub-pieces does not necessarily mean that compression could not be achieved. One could select the shortest range identified to make a formula for representing the shortest range for use for the $4^{th}$ value to be added for compression. For example, if [1] is very near the CC value, i.e. the biggest value of the Code Unit, then if CC minus ([1]+[2]) is the shortest range identified through the processing of the first three formulae in Step (1) to Step (3), then one could choose to make the fourth formula as [1] and place the value of [1] using the range limit of CC minus ([1]+[2]). Further research could be done in this respect about formula design and placement of CHAN CODE pieces.

Even if using 4 CV sub-pieces could not compress every piece of Processing Unit, one could design different sets of formulae that are suitable to different types of data distribution (including the frequency of the individual data values and the corresponding data value distribution, i.e. the frequency of each of the values present and the number and the identity of the corresponding values present) and break the whole digital input file of random data into Super Processing Units that are not random. The technique of using Super Processing Units that are not random will be illustrated later when other techniques much simpler than using formula design are added to it for implementation. In the course of such discussion, the relevant concept of Super Processing Unit would be revealed. Through using different sets of formula design for Super Processing Units of different data distribution, re-compression could be attempted and achieved likewise as in the case where these other techniques are used with Super Processing Units.

It could therefore be seen that using very simple logic of CHAN MATHEMATICS, including normal mathematical processing and COMPLEMENTARY MATHEMATICS, tremendous progress has been made in the field of Science and Art in respect of Compression and Decompression as well as Encryption and Decryption. The end to the myth of the Pigeonhole Principle in Information Theory as announced in PCT/IB2016/054562 and confirmed in PCT/IB2016/054732, other techniques however are required and revealed as follows:

Before revealing such techniques, CHAN FRAMEWORK has to be further fine tuned. Up to now, CHAN FRAMEWORK is characterized by the following structural features:
(a) Code Unit (including content codes and classification codes);
(b) Processing Unit;
(c) Super Processing Unit;

(d) Un-encoded Code Unit;
(e) Sections (of the whole set of digital data);
(f) Section Header or Footer;
(g) Main Header or Footer (of the whole set of digital data); and
(h) CHAN FILES (digital data files containing CHAN CODE made up of the digital code of the above (a) to (g) in combination or alone).

The schema and design of CHAN FRAMEWORK here refers to the definition chosen for any of the above structural elements, if used, in combination under different embodiments, where appropriate, for processing for the purpose of encoding and decoding a particular digital data set corresponding to the chosen techniques of CHAN CODING in use as revealed in the present invention.

Code Unit is the basic unit of CHAN FRAMEWORK. Up to now, its size, i.e. Code Unit Size, is measured in number of binary bits (bit size) and the maximum number of values (Code Content) that a Code Unit can represent is therefore limited by the bit size of the Code Unit under a conventional binary data coder (a data coder, especially data coder where all its unique values are having the same bit size, not having the features of data coder as designed under CHAN FRAMEWORK as revealed in the present invention). For example, if the Code Unit has only one bit in size, that it can only be used to represent two values, bit value 0 or bit value 1 at one instance. If the Code Unit has the bit size of 3, then it can represent at most 8 bit values, namely 000, 001, 010, 011, 100, 101, 110, and 111. This is the conventional way of using binary bits to represent data values. Code Unit is the basic unit of data that is read in one by one from the data input stream by the encoder for encoding purpose. It is this conventional way of reading and representing data which gives rise to the myth of Pigeonhole Principle in Information Theory, details of which could be found at:

https://en.wikipedia.org/wiki/Pigeonhole_principle

Its essence is expressed as:

"In mathematics, the pigeonhole principle states that if n items are put into m containers, with n>m, then at least one container must contain more than one item."

In other words, if one container can only take up one item, then the number of items that could be taken up by the containers is limited by the number of containers; i.e. the number of items that could be taken up cannot exceed the number of containers that are used to take up the items. This is a one one correspondence relationship between item and container.

Applying to the use of Code Unit for encoding here, if the Code Unit of bit size of 3 bits, it could only provide 8 addresses and so it could only be used to represent at most 8 unique values, one value at an instance of time. In the conventional way, the number of addresses that a Code Unit can have is measured in binary bit size, the bigger the number of binary bits used for a Code Unit, the more addresses that the Code Unit can have for representing Code Content values in one one correspondence. So the number of addresses that a Code Unit has is equal to 2 to the power of the bit size (the number of binary bits) of the Code Unit, i.e. the number of binary bits measuring the size of the Code Unit.

So encoding for making compression so far is possible only because of encoding method taking advantage of the uneven nature of data distribution. For a given bit size of Code Unit, such as 3 bit Code Unit for instance, if the data input stream contains only 3 different unique Code Values, such as 000, 001, and 100, then the data input stream could be compressed. Or if the data input stream contains all the 8 different unique Code Values, namely 000, 001, 010, 011, 100, 101, 110 and 111, it still could be compressed if the frequency distribution of these 8 Code Values are not even, i.e. the frequencies of these 8 unique Code Values are not the same to each other. Usually, the more the unevenness in data distribution the more compression saving could be achieved. Random data tends to be even in the ratio between the number bit 0 and bit 1 where bit 0 and bit 1 are appearing in a random way, i.e. without any regularity or predictable pattern revealed so far. So it is long held that random data could not be compressed, giving rise to the myth of Pigeonhole Principle in Information Theory. However, as CHAN FRAMEWORK provides a way of describing digital data of all types of distribution, including random distribution, more characteristics and their regularity of random data could be investigated and revealed, thus with the introduction of the concept and the use of the Super Processing Unit together with data coder holding unique code unit values not using the same bit size and other CHAN CODING techniques, such as Exception Introduction and especially DIGITAL DATA BLACKHOLING with the use of Absolute Address Branching or Address Address Multiple Branching under CHAN FRAMEWORK, such a long held myth is unmasked.

The Pigeonhole Principle in Information Theory is very true but only by itself! The myth of which however lies in the myth related to this Principle that random data could not be compressed or data could not be re-compressed time and again. So to end the myth, one possible way is to create unevenness out of random data. One fundamental technique is to create unevenness through fine-tuning the way of defining and measuring Code Unit and the respective Code Values that the Code Unit is used to represent. So this is a significant novel feature of the present invention: Redefining the notion of Code Unit used in CHAN FRAMEWORK, a structural change or improvement found in the very basic element of CHAN FRAMEWORK, the Code Unit and its definition. Unevenness could therefore be easily created in random data. Capitalizing on this structural change of CHAN FRAMEWORK, one could easily design schema that provides more addresses than the values that a Code Unit is supposed to accommodate. So the number of code addresses available for use to represent code values is not the limiting factor for compressing and re-compressing random data set in cycle. What is left out and being neglected by the Pigeonhole Principle in Information Theory is the frequency distribution characteristic of a digital data set. To be able to compress and re-compress a random data set in cycle, one has also to pay attention to the nature of data distribution in terms of the frequency distribution of code values present in the data set as well their corresponding bit lengths. These two issues defying previous efforts in making encoding and decoding for compressing and re-compressing random data set in cycle: the number of code addresses available to unique code values and the frequency distribution of the unique code values present in the digital data set will be addressed to one by one in the following discussion.

Firstly, about the issue of the number of code addresses available to unique code values in a data set, after the novel feature of re-defining Code Unit is introduced to CHAN FRAMEWORK, Code Unit under CODE FRAMEWORK is firstly measured by the maximum number of unique Code Values that a Code Unit is used to represent or hold, secondly by the number of binary bits of the whole Code Unit (affecting the bit size possible of individual unique Code Values), and thirdly by the Head Design of the Code Unit Definition, where appropriate, as will be seen in Diagram 14 of Paragraph [62] below. So the nomenclature for referring to Code Unit changes from 3-bit Code Unit to 8-value Code Unit (or Max8 Code Unit), using the maximum number of unique Code Values that a Code Unit is used to hold as the first or primary factor to name or represent (of course one at a time) the Code Unit rather than the number of bits, which could then be used as the secondary factor, for distinguishing the size of a Code Unit. This also means that the individual unique Code Values of a Code Unit could be different in bit size in addition to the conventional definition that all the unique Code Values of a Code Unit could only be represented in the same bit size. And this novel feature does not prevent one from designing a schema using a standard bit size for all the values of a Code Unit, it only provides the opportunity for designing schema using different bit sizes for different unique Code Values of a Code Unit in addition to the conventional definition. That means, the different unique Code Values of a Code Unit could have different bit sizes; and in addition, it also allows for giving each of the unique Code Values of a Code Unit the same number of bits in size, depending on the Code Value Definition and the related Code Unit Definition used at a certain time of encoding and decoding processes under a specific schema and design of encoding and decoding. For instance, for a 8-value Code Unit, all the 8 unique Code Values could be defined having the same bit size of 3 bits under a specific schema and design such as in Diagram 11:

Diagram 11
Definition of Code Values
of a 8-value Code Unit having the same bit size Max8 Class
24 bit Group

| Code Values | Number of Bits |
|---|---|
| 000 | 3 |
| 001 | 3 |
| 010 | 3 |
| 011 | 3 |
| 100 | 3 |
| 101 | 3 |
| 110 | 3 |
| 111 | 3 |

Or under another specific schema and design, these 8 values of the Code Unit could be redefined as having different bit sizes as in Diagram 12:

Diagram 12
Definition of Code Values of a 8-value
Code Unit having the different bit sizes Max8 Class
35 bit Group

| Code Values | Number of Bits |
|---|---|
| 0 | 1 |
| 10 | 2 |
| 110 | 3 |
| 1110 | 4 |
| 11110 | 5 |
| 111110 | 6 |
| 1111110 | 7 |
| 1111111 | 7 |

So Code Unit under CHAN FRAMEWORK is now measured firstly by the maximum number of unique Code Values that the Code Unit is used to hold or represent; the number of binary bits of a Code Unit becomes the secondary factor for size measurement. So the Code Values of a Code Unit could have the same bit size or have different bit sizes, such option depending on how it is defined under a specific schema and design used for encoding and decoding. Such Code Value Definition or Code Unit Definition could also change where necessary and appropriate in the course of encoding and decoding, using the code adjustment technique of CHAN CODING.

Using this novel feature of Code Unit Definition and Code Value Definition under CHAN FRAMEWORK, techniques for creating unevenness into data distribution, including random data, could be easily designed. It also makes it possible to investigate into the nature of random data and to allow ways of describing data distribution in terms of Code Values and their related frequencies of occurring in a specific digital data input stream so that appropriate techniques could be used for encoding and decoding such as for the purpose of making compression/decompression. Before demonstrating the technique for creating unevenness into any particular data set, the schema and design for 3-value Code Unit is introduced here to end the myth of Pigeonhole Principle in Information Theory, namely the number of Code Addresses being assumed to be no more than the number of unique Code Values. The number of Code Addresses being no more than the number of unique Code Values is true only when Code Unit Size is just measured in terms of bit size, such as 1 bit Code Unit, 2 bit Code Unit, so on and so forth. This is not true when Code Unit could be measured in terms of the maximum number of Code Values that a Code Unit is designed to hold. The conventional way of measuring Code Unit in terms of the number of binary bits puts up a restriction that the number of Code Values that a Code Unit could hold is determined by the number of binary bits used for a Code Unit; for instance, a 3-bit Code Unit could hold at maximum 8 unique Code Values, each using 3 bits to represent, no more and no less. A 3-bit Code Unit could not hold more than 8 unique Code Values. What is more, when reading data, using this conventional definition, the encoder or decoder could not avoid reading all the 8 unique Code Values if they are present there; that means, the encoder or decoder could not say just read 3 unique Code Values and disregard or discard the other 5 unique Code Values if they are present in the data set. That means using the conventional Code Unit Definition, the associated coder would always process data sets using Code Values of the same bit length or bit size, no shorter or no longer than the bit size used in the Code Unit Definition. This restriction is removed under CHAN FRAMEWORK. So because of the conventional design of reading and interpreting data, the number of Code Addresses available is by design exactly the same as the number of Code Values that the Code Unit is designed to hold. So if all the unique Code Values appear in the data set, all the Code Addresses are exhausted so that compression of a random data set could not be made possible by techniques only capitalizing on unevenness in the frequency distribution of the Code Values present in the data set (except for the use of CHAN CODING); as for a random data set, such frequency distribution for all the Code Values of the data set tends to be even, i.e. the ratio between bit 0 and 1 of the whole data set is 1 to 1, and the frequency of all the Code Values of the Code Unit is about the same. So no unevenness in frequency distribution of the Code Values of a Code Unit of a random data set could be utilized for making compression by techniques of prior art so far designed in addition to there being no more Code Addresses available than the number of unique Code Values present in the data set (as all unique Code Values also appearing in random data set). Diagram 13 shows the design for a 3-value Code Unit, Max3 Code Unit, using the novel feature (i.e. Code Unit being measured by the maximum number of Code Values; the number of binary bits is used as a secondary measurement for the Code Unit as a whole) just introduced into CHAN FRAMEWORK:

Diagram 13
Definition of Code Values of a 3-value Code Unit using 5 bits with 2 versions, one having bit 0 to bit 1 ratio as 2:3 and the other 3:2

| Max3 Class 5 bit Group 0 Head Design 2:3 (bit 0:bit 1 ratio) | 1 Head Design 3:2 (bit 0:bit 1 ratio) |
|---|---|
| 0 | 1 |
| 10 | 01 |
| 11 | 00 |

These two versions of design for 3-value Code Unit definition are meant for illustrating that more number of Code Addresses could be created for the number of unique Code Values that a Code Unit is designed for, thus providing more addresses than the number of unique values appearing in the data set. Suppose a schema of using a Processing Unit made up of three 3-value Code Units is designed for use for encoding and decoding a digital data input stream for making data compression. In this design, the Code Units of the digital data input stream is read one by one and 3 adjacent Code Units are encoded (or decoded for restoration afterward) as one Unit, the Processing Unit, using the definition of 0 Head Design; what the encoding or decoding does is reading three 3-value Code Units (reading three one by one) by using the Code Unit definition of 0 Head Design as Reader and then treat the code of the three Code Units as one piece of code (code of one Processing Unit) and change it with another piece of code, for instance, using the Code Unit definition of 1 Head Design as Writer to encode it or write it upon encoding; or restore it to the original code upon decoding by reading the encoded code with the 1 Head Design Code Unit definition and writing it back with the 0 Head Design Code Unit definition; or using mapping tables of other design for encoding or decoding. Because there are 3 unique Code Values of a Code Unit used here, a Processing Unit is designed to hold at maximum 27 unique values (3 values times 3 Code Units equal to 27 unique values) for representation. The number of addresses that is available could be calculated using the following mathematical formula:

2 to the power of (The average bit size of the Code Values of a Code Unit*The number of Code Units of a Processing Unit)

So for a Processing Unit consisting of three 3-value Code Units using the 0 Head Design, the number of addresses available for use is:

2 to the power of (5 bits/3 values*3 units)=2 to the power of 5=32

There are 32 unique addresses available for 27 unique values. This is the first sign that spells the end to the myth of Pigeonhole Principle in Information Theory. Using this design, there could be more addresses than the number of unique values that have to be represented. So one could in one way for instance use the Absolute Address Branching technique to reduce the number of bits that have to be used for representing the 27 unique values from absolutely 5 bit to 4 or 5 bits [for instance, using Absolute Address Single Branching, the value range of 4 bits is 16 (the lower value range) and the value range of 5 bits 32 (the upper value range), and the actual value range of the Processing Unit here is 27 (the actual value range); therefore 27−16=11, there are 11 values that have to be single-branched in the 4 bit range; therefore there should be 5 value addresses using 4 bits and 22 value addresses using 5 bits]. So some bit saving is achieved. What is more, in another design, one could reserve 1 or 2 or more addresses (up to 5) on top of the 27 unique addresses for use as special addresses for indicating special processing to be done. For example, the $28^{th}$ address, when present in the encoded code, could be used to indicate that the next two Processing Unit contains the same data values and thus same encoded code as the last Processing Unit. In this way, it provides more flexibility for encoding and decoding data for compression as well as for encryption. If 28 addresses are to be used, i.e. 27 unique value addresses and 1 special processing address, then there are 4 addresses [16−12 (reserved for single branching)=4] using 4 bits and 24 addresses [(28−16=12)*2=24] using 5 bits. The use of this schema and design of a Processing Unit of three 3-value Code Units and the respective encoding and decoding processes will be elaborated in greater detail later in providing a proof and an example of how a random data set could be compressed. For the time being, techniques of creating unevenness into a particular data set are to be discussed first as follows:

To understand the technique of changing the ratio between bit 0 and bit 1 of a data set for creating unevenness into the respective data distribution for the purpose of making compression possible, more examples of Code Value Definition and Code Unit Definition are illustrated below in Diagram 14 of 6-value Code Unit with different Code Value Definitions:

Diagram 14a
Definition of Code Values of a 6 value Code Unit using 20 bits (Max6 Class 20 bit Group): 1 Multiple Branching with 2 versions, one having bit 0 to bit 1 ratio as 5:15 and the other 15:5

| Max6 Class 20 bit Group 0 Head Design 5:15 (bit 0:bit 1 ratio) | 1 Head Design 15:5 (bit 0:bit 1 ratio) |
|---|---|
| 0 | 1 |
| 10 | 01 |
| 110 | 001 |
| 1110 | 0001 |
| 11110 | 00001 |
| 11111 | 00000 |

Diagram 14b
Definition of Code Values of a 6 value Code Unit using 16 bits (Max6 Class 16 bit Group): 3-pair Single Branching with 2 versions, one having bit 0 to bit 1 ratio as 7:9 and the other 9:7 (Skewed Distribution)

| Max6 Class 16 bit Group 0 Head Design 7:9 (bit 0:bit 1 ratio) | 1 Head Design 9:7 (bit 0:bit 1 ratio) |
|---|---|
| 00 | 11 |
| 01 | 10 |
| 100 | 011 |
| 101 | 010 |

Diagram 14b
Definition of Code Values of a 6 value Code Unit using 16 bits
(Max6 Class 16 bit Group): 3-pair Single Branching with 2
versions, one having bit 0 to bit 1 ratio as 7:9 and
the other 9:7 (Skewed Distribution)

| Max6 Class 16 bit Group | |
|---|---|
| 0 Head Design 7:9 (bit 0:bit 1 ratio) | 1 Head Design 9:7 (bit 0:bit 1 ratio) |
| 110 | 001 |
| 111 | 000 |

Diagram 14c
Definition of Code Values of a 6 value Code Unit
using 16 bits (Max6 Class 16 bit Group): 2-pair
No Skew Single Branching with 2 No Skew
versions of equal bit 0 to bit 1 ratio, both having
bit 0 to bit 1 ratio as 8:8 (No Skew Distribution)

| Max6 Class 16 bit Group | |
|---|---|
| Two 0 Head Design 8:8 (bit 0:bit 1 ratio) | Three 0 Head Design 8:8 (bit 0:bit 1 ratio) |
| 00 | 000 |
| 11 | 001 |
| 010 | 01 |
| 011 | 10 |
| 101 | 110 |
| 100 | 111 |

Diagram 14d
Definition of Code Values of a 6 value Code Unit using
17 bits (Max6 Class 17 bit Group): 1-pair Single and 1
Multiple Branching with 2 versions, one having bit 0 to
bit 1 ratio as 6:11 and the other 11:6

| Max6 Class 17 bit Group | |
|---|---|
| 0 Head Design 6:11 (bit 0:bit 1 ratio) | 1 Head Design 11:6 (bit 0:bit 1 ratio) |
| 00 | 11 |
| 01 | 10 |
| 10 | 01 |
| 110 | 001 |
| 1110 | 0001 |
| 1111 | 0000 |

Diagram 14e
Definition of Code Values of a 6 value Code Unit
using 18 bits (Max6 Class 18 bit Group): 1-pair
Single and 1 Multiple Branching with 2 versions,
one having bit 0 to bit 1 ratio as 6:12 and the other 12:6

| Max6 Class 18 bit Group | |
|---|---|
| 0 Head Design 6:12 (bit 0:bit 1 ratio) | 1 Head Design 12:6 (bit 0:bit 1 ratio) |
| 0 | 1 |
| 100 | 011 |
| 101 | 010 |
| 110 | 001 |
| 1110 | 0001 |
| 1111 | 0000 |

Diagram 14f
Definition of Code Values of a 6 value Code Unit using
19 bits (Max6 Class 19 bit Group): 2-pair Single
Branching with 2 versions, one having bit 0 to bit 1 ratio
as 6:13 and the other 13:6

| Max6 Class 19 bit Group | |
|---|---|
| 0 Head Design 6:13 (bit 0:bit 1 ratio) | 1 Head Design 13:6 (bit 0:bit 1 ratio) |
| 0 | 1 |
| 10 | 01 |
| 1100 | 0011 |
| 1101 | 0010 |
| 1110 | 0001 |
| 1111 | 0000 |

One can see from Diagram 14 that there could be more than one definition for a 6-value Code Unit, using from 16 bits to 20 bits with different bit 0 to bit 1 ratios. So Code Unit could be classified primarily by the maximum number of unique data values it holds and then by the number of bit size and then by which version of the Head Design, whether 0 Head or 1 Head. This schema of defining Code Unit allows great flexibility in using Code Unit as a basic unit for manipulating digital data in addition to using it as the basic unit of a language (CHAN FRAMEWORK LANGUAGE, using terminology as reveled in the present invention for describing the traits or characteristics of the structural elements of CHAN FRAMEWORK and the techniques of CHAN CODING) for describing the traits or characteristics of a digital data set. This differs from the conventional way of defining Code Unit just in terms of bit size, in which a Code Unit of a certain bit size could have only 1 version of code definition, which could not vary in the maximum number of unique values that are to be represented (for instance, for a 3-bit Code Unit defined in the conventional way, there are 8 unique values to represent and one could not just represent only 6 unique values out of the 8 possible combinations and ignore the other two unique values, leaving it not handled nor processed; i.e. one simply could not just handle only 6 unique values without handling the other two when they do appear in the data set with a 3-bit Code Unit defined in the conventional way) nor vary in Head Design; whereas the Code Definition schema under CHAN FRAMEWORK allows a Code Unit Definition having many different versions of definition, varying in Code Unit total bit size, varying in Code Unit values bit size, and varying in the number of unique values that the Code Unit is designed to hold, as well as varying in the 0 Head or 1 Head Design.

One could utilize the aforesaid differences between different schemas and definitions of Code Values for each of the different design types of 6-value Code Units to create unevenness into an existing digital data set, for instance changing the ratio of bit 0 to bit 1. For instance, Diagram 14c provides 2 No Skew versions (i.e. 0 Head Design and 1 Head Design) of 16-bit 6-value Code Unit. The 0 Head Design version is used for the discussion hereafter except where mentioned otherwise specifically. Comparing it with the corresponding 3-pair Skewed Single Branching version in Diagram 14b, the No Skew version and the 3-pair Skewed Single Branching version both use 16 bits for representing the 6 unique values of the 6-value Code Unit; they differ only in the pattern of bit codes used and the ratio between bit 0 and bit 1, with the No Skew version having the ratio as 8:8 and the 3-pair Skewed Single Branching version 7:9. So one could do a cross mapping between these 2 sets of 6 Code Values in order to increase, say, the number of bit 1 of the No Skew version, so that the ratio of bit 0 to bit 1 of the new data set after mapping translation from 8:8 to a ratio towards the 7:9 side. However, after doing some trial, the change of this ratio for a random data set is found to be possible but relatively small using one pass of encoding translation. This is because of the nature of the frequency distribution of the 6 unique Code Values found in a random data set. Diagram 15 gives one instance of result generated by running the autoit program given the PCT Application, PCT/IB2016/054732 filed on 22 Feb. 2017, (as such autoit programs have be listed in this PCT Application under priority claim, one could gain access to them by making reference to the aforesaid PCT Application, and thus will be not listed in the present PCT Application anymore; however the program serving as the final proof that random data set could be subject to compression will be listed when discussing its use together with the autoit program library help file so that people skilled in the art could see how data coder for making encoding and decoding could be constructed for use for the purposes of making encryption/decryption and compression/decompression in actual implementation of CHAN FRAMEWORK with the use of methods and techniques of CHAN CODING in making CHAN CODE and CHAN FILES) using 80,000 random binary bits as follows:

Diagram 15
Frequency Distribution of the 6 unique Code Values of a 6-value Code Unit for the Three 0 Head Design of No Skew Version

| Code Values | Frequency |
|---|---|
| 000 | 3995 |
| 001 | 4019 |
| 01 | 8074 |
| 10 | 7949 |
| 110 | 3980 |
| 111 | 3991 |

Diagram 15 is just one instance of such generations only. Running the autoit program generating it once will generate one such instance, each instance will differ from other instances a little. But in general, such instances of the frequency distribution of the 6-value Code Unit maintains roughly the same proportions each time for the 6 unique Code Values under concern. Cross mapping between the Code Values of the No Skew version and the 3-pair Single Branching version of the 6-value Code Unit and the related calculation is shown in Diagram 16:

Diagram 16
Cross Mapping between the 6 Code Values of the No Skew and 3-pair Single Branching version of 6-value Code Unit

| No Skew | | 3-pair Single Branching | |
|---|---|---|---|
| Code Values | Frequency | Code Values | Plus or Minus Bit 1 |
| 000 | 3995 | 101 | plus 3995*2 = 7990 bit 1 |
| 001 | 4019 | 100 | breakeven |
| 01 | 8074 | 01 | breakeven |
| 10 | 7949 | 00 | minus 7949 bit 1 |
| 110 | 3980 | 110 | breakeven |
| 111 | 3991 | 111 | breakeven |
| | | | net: plus 41 bit 1 |

So it could be seen that by such cross mapping, the number of bit 1 has been increased by 41 bits out of 80000 total binary bits. This is a relatively small figure. However, if such a trend of increasing bit 1 could be continued, then the data distribution would be skewed towards bit 1 with multiplier effects gradually. The more the skew is the greater the compression saving could be achieved. So more experiments should be tried to understand more about the patterns of cross mapping between Code Values of different design of a Code Unit. In this case, both the No Skew and the 3-pair Single Branching versions use 16 bits, and the mapping is done in such a way that 2 bit values are mapped to 2 bit values and 3 bit values to 3 bit values (i.e. using the same bit size coder for the respective code unit values), so there is no change in bit usage but only slight change in the bit 0 to bit 1 ratio. What is more, for all the above versions of 6-value Code Unit Design, using from 16 bits to 20 bits, each bit size does have in most cases 2 corresponding versions (i.e. 0 Head Design versus 1 Head Design). So cross mapping between the code values of those two versions (or even amongst one version itself as in Diagram 18) could be utilized from one cycle of encoding to another cycle of encoding for the purpose of changing the ratio between bit 0 and bit 1 in the data set without having to change the total bit usage. Say the first cycle of encoding could use cross mapping between the two versions using 16 bits as shown in Diagram 16, the next cycle could use the 20 bit versions, and the third the 18 bit versions, so on and so forth. Of course, in the course of doing such cross mapping, frequency distribution for Code Values read should be found out first and the best cross mapping table be designed so that the trend of increasing a particular bit, either bit 0 or bit 1, in terms of bit ratio between these 2 bit values is to be maintained from one cycle of encoding to another cycle of encoding. What is more, not only cross mapping between 2 versions of Code Unit Design using the same bit size could be used for this purpose. Cross Mapping using only just 1 version of Code Unit Design itself could also be used as illustrated in Diagram 17:

Diagram 17
Cross Mapping amongst the 6 Code Values of the No Skew version of 6-value Code Unit itself

| No Skew | | The same No Skew | |
|---|---|---|---|
| Code Values | Frequency | Code Values | Plus or Minus Bit 1 |
| 000 | 3995 | 110 | plus 3995*2 = 7990 bit 1 |
| 001 | 4019 | 111 | plus 4019*2 = 8038 bit 1 |
| 01 | 8074 | 01 | breakeven |
| 10 | 7949 | 10 | breakeven |
| 110 | 3980 | 000 | minus 3980*2 = 7960 bit 1 |
| 111 | 3991 | 001 | minus 3991*2 = 7982 bit 1 |
| | | | net: plus 86 bit 1 |

It could be seen using the cross mapping among the Code Values of any Code Unit Design itself could also change the ratio between bit 0 and bit 1. And the result in this case as shown in Diagram 17 is even better than the result of change using 2 versions of Code Unit Design in Diagram 16.

Furthermore, such cross mapping for the purpose of tilting the bit 0 to bit 1 ratio towards one side could be done not just using 6-value Code Unit Design, but could be done using Code Unit Design for any X-value Code Units, in different cycles of encoding. For instance, the first cycle could use the 6-value Code Unit Design and the next uses the 12-value Code Unit Design, etc. etc. This is so as long as the trend of tilting is maintained. So there is endless opportunity for changing the ratio between bit 0 and bit 1 for any specific data set starting with whatever point of bit 0 to bit 1 ratio in the data distribution spectrum. And as long as the pattern of such cross mapping is found and recorded, such logic of cross mapping and the path it follows for a data set starting with whatever point of bit 0 to bit 1 ratio in the data distribution spectrum could be embedded in the encoder and decoder. Or else such logic and path of cross mapping could be put as indicators into the header of the encoded code for each cycle of encoding so that the original code could be recovered correctly and losslessly upon decoding later. Of course, embedding such logic and path of cross mapping of code values in the encoder and decoder help to further minimize the bit usage for the purpose of making compression during the phase of compression encoding. So changing the data distribution by changing the ratio between bit 0 and bit 1 in the data set without changing the bit usage using cycles of encoding through cross mapping of Code Values of the same Code Unit Design alone or of different Code Unit Design could be used as an intermediate step for the purpose of creating unevenness in the data set so that compression of a specific digital data set could be made possible or enhanced later during the phase of encoding for compression using other techniques. What is more, whether changing the bit size of a data set during a particular phase or at any cycle of encoding is not that important, what is important is the end result. So changing the data distribution as well as the bit usage of any data set is always associated with the encoding step. The novel feature of this revelation here is that encoding should be designed in such a way that the change of data distribution of any data set should be tilted towards one direction in general in terms of changing the bit 0 and bit 1 ratio for the purpose of making data compression. Besides using Code Unit Definition as Reader and Writer for changing the bit 0:bit 1 ratio of a digital data set, the Processing Unit Definition could also serve the same purpose as demonstrated in Paragraph [115] and Diagram 55 as well as in Paragraph [116] and Diagram 56. The result is much better there. It is therefore apparent that using bigger size of Code Unit or bigger size of Processing Unit, greater differences are to be generated, captured and produced as unevenness in data distribution of a particular data set.

So after the intermediate phase of changing the data distribution of any data set in terms of tilting the bit 0:bit 1 ratio towards one direction in general (up to a certain point where appropriate), the digital data set could be compressed using technique(s) which is suitable for compressing data set of such distribution at that point of bit 0:bit 1 ratio. So if at first a random data set is given for making compression, the ratio of bit 0:bit 1 could be altered tilting towards one direction using the techniques outlined in Paragraphs [62] to [64] above or [115] and [116] below, then depending on the data distribution, one could use the cross mapping technique of code values for making compression, and this time using cross mapping of Code Values of Code Units of the same value size but of different bit sizes, for instance in the example now being used: 6-value Code Units, having different bit sizes, such as reading the data set using 6-value Code Unit of 20 bit size (or any other bit sizes where appropriate) and cross mapping such Code Values with those Code Values of 6-value Code Unit of 19 bit size (or any other bit sizes where appropriate) for encoding purpose, depending on the frequency distribution of the Code Values of the data set under processing. So in brief, in doing cross mapping of Code Values, for changing the data distribution in terms of bit 0:bit 1 ratio, same X-value Code Units with code addresses mapped to data values of the same bit size in one one correspondence are used; whereas for making data compression for reducing bit usage, same X-value Code Units with code addresses mapped to data values of the different bit sizes in one one correspondence are used instead. However, this does not preclude one from using Code Units of different Code Value Size for both changing the bit usage as well as for changing the ratio of bit 0 to bit 1 in one go. The same applies to using Processing Unit for such purpose.

So it could be seen from above that under the revised CHAN FRAMEWORK, Code Unit Size could now be measured by the number of Code Values as well as by the number of binary bits as illustrated by the examples given in Diagram 14 for 6-value Code Values having different bit sizes, other characteristics of the data set could also be investigated and found out, such as the ratio of bit 0 to bit 1 and the frequency distribution of the unique Code Values of Code Unit for any Code Unit Definition with a certain number of values and a certain bit size. This facilitates the description of any digital data set as well as the use of appropriate techniques for encoding and decoding for any purposes, including the purposes of making data encryption and data compression together with correct and lossless recovery of the original digital data.

With the change of the definition of Code Unit Size that a Code Unit could now be measured both in terms of the number of Code Codes that the Code Unit is designed to hold and in terms of the number of binary bits used for a Code Unit as a whole, Processing Unit (the unit for encoding or for writing of a piece of encoded code) could be made up by only 1 Code Unit as Diagram 14 shows that a Code Unit having the same number of Code Values could be designed to be having different bit sizes for each of the code values and for the Code Unit as a whole. So a Code Unit, i.e. the basic Read Unit, could by itself be used alone without having to combine with other Read Unit(s) to form a Processing Unit, the basic Write/Read Unit, for writing encoded code in the encoding process and for reading back during the decoding process.

As random data is long held to be incompressible. It is time to make it possible using CHAN FRAMEWORK as described above in terms of changing the ratio of bit 0 to bit 1 in the data set as well as other techniques to be revealed as follows:

These other techniques could be classified as coding techniques used in CHAN CODING under CHAN FRAMEWORK. Identifying and organizing traits or characteristics of Code Units, either in single or in combination, for producing Classification Code of CHAN CODE is one such technique, such as producing RP Code using the rank and position of Code Units or designing mathematical formulae that could be used to describe Code Values of Code Units either in single or in combination, and that could also be used in encoding and decoding purpose, for instance for creating Content Value Code, the CV sub-pieces, of CHAN CODE. So the basic part of CHAN CODE (the part that describes the traits or characteristics of Code Units) under CHAN FRAMEWORK could be divided into Classification Code and Content Value Code (or Content Code in short). Other parts that could be regarded belonging to CHAN CODE include other identification code or indicators (for instance included in main Header for CHAN CODE FILES or in section header for sections of a digital data file) for identifying the cross mapping table (Mapping Table Indicator) used for encoding and decoding the basic part of CHAN CODE, the number of cycles (Number of Cycle Indicator) of encoding and decoding for a particular digital data input, the checksum (Checksum Indicator) calculated for CHAN CODE FILES, the Un-encoded Code Unit of the digital data for any particular cycle of encoding and decoding if any, as well as other indicators which are designed by designer for use for the purposes of identifying as well encoding and decoding CHAN CODE where appropriate and necessary. One such indicator for instance could be the number of Processing Units making up a Super Processing Unit for use in encoding and decoding; others could be indicator for adjustment of Classification Code of CHAN CODE by frequency and indicator for adjustment of Content Code of CHAN CODE by frequency where appropriate and desirable (i.e. Frequency Indicators for adjustment of using 0 Head or 1 Head Design for Classification Code and for Content Code as appropriate to the pattern of Bit 0:Bit 1 ratio of the digital data set under processing, Frequency Indicators in short). The concept and usage of Super Processing Unit and of the adjustment of CHAN CODE by frequency will also be revealed later.

One essential technique, Absolute Address Branching, used in CHAN CODE has already been discussed in several places in the aforesaid discussion. It is worth to elaborate on how this technique is to be used in compressing random data set, i.e. reducing the bit storage usage of a random data set as a whole. This usage has been briefly touched upon in Paragraphs [60] and [61] in discussing the issue on the relation between number of code addresses and number of code values. To refresh memory, in that discussion, a Processing Unit made up of three 3-value Code Units is used to reveal that the number of code addresses could be made more than the number of code values that a Processing Unit for encoding and decoding is designed to hold. This is made possible by using a new definition for a Code Unit so that the size of a Code Unit could be designed to be measured by the number of Code Values the Code Unit holds and by the number of bits used for different unique Code Values of the Code Unit as well as of the Code Unit as a whole. This feature is shown in Diagram 14 using different design and definition for 6-value Code Unit. And this feature is made possible also because of the use of the technique of Absolute Address Branching.

In that discussion, it also briefly touches upon how the 27 unique code values of a Processing Unit could be represented by code addresses, as well as using some spare addresses as special processing addresses for encoding and decoding purposes. For instance, in one design the 27 unique code values could be represented by five 4-bit basic addresses and twenty two 5-bit single-branched addresses. So how the code values could be cross mapped with the code addresses is illustrated by the following examples.

Diagram 18
Classified Absolute Address Branching Code
Table (CAABCT) For 27 Values Example I

| Sorted PU | Bit Representation in CHAN CODE, including Class Bit, Normal Bits and Branch Bit | | | | |
|---|---|---|---|---|---|
| Sequence No. | Class No. | (Class Bit (Chan | Normal Bits | Branch Bit) Code) | Bit Size |
| 1 | 0 | 0 | 000 | | 4 |
| 2 | 0 | 0 | 001 | | 4 |
| 3 | 0 | 0 | 010 | | 4 |
| 4 | 0 | 0 | 011 | | 4 |
| 5 | 0 | 0 | 100 | | 4 |
| 6 | 0 | 0 | 101 | 0 | 5 |
| 7 | 0 | 0 | 101 | 1 | 5 |

Diagram 18
Classified Absolute Address Branching Code
Table (CAABCT) For 27 Values Example I

| Sorted PU | Bit Representation in CHAN CODE, including Class Bit, Normal Bits and Branch Bit | | | | |
|---|---|---|---|---|---|
| Sequence No. | Class No. | (Class Bit (Chan | Normal Bits | Branch Bit) Code) | Bit Size |
| 8 | 0 | 0 | 110 | 0 | 5 |
| 9 | 0 | 0 | 110 | 1 | 5 |
| 10 | 0 | 0 | 111 | 0 | 5 |
| 11 | 0 | 0 | 111 | 1 | 5 |
| 12 | 1 | 1 | 000 | 0 | 5 |
| 13 | 1 | 1 | 000 | 1 | 5 |
| 14 | 1 | 1 | 001 | 0 | 5 |
| 15 | 1 | 1 | 001 | 1 | 5 |
| 16 | 1 | 1 | 010 | 0 | 5 |
| 17 | 1 | 1 | 010 | 1 | 5 |
| 18 | 1 | 1 | 011 | 0 | 5 |
| 19 | 1 | 1 | 011 | 1 | 5 |
| 20 | 1 | 1 | 100 | 0 | 5 |
| 21 | 1 | 1 | 100 | 1 | 5 |
| 22 | 1 | 1 | 101 | 0 | 5 |
| 23 | 1 | 1 | 101 | 1 | 5 |
| 24 | 1 | 1 | 110 | 0 | 5 |
| 25 | 1 | 1 | 110 | 1 | 5 |
| 26 | 1 | 1 | 111 | 0 | 5 |
| 27 | 1 | 1 | 111 | 1 | 5 |

Total: 130 bits

Using the above Example I of Classified Absolute Address Branching Code Table (CAABCT), the 27 Code Values of three 3-value Code Units of a Processing Unit could be cross mapped one by one into CHAN CODE, including the Class Bit (Classification Code), and the Normal Bits & Branch Bit (Content Code). However, using this version, Example I, of CAABCT, a random data set could not be compressed because of the frequency distribution of a random data. It could however compress a digital data set of which the frequency of all the 27 unique code values is roughly the same or roughly even amongst all the 27 unique code values (for instance, if the frequency for all the 27 unique code values in a particular data set is 1, then all the 27 unique code values together use up a total of 135 bits as found in Diagram 20 below and if it is cross mapped with the code addresses in Diagram 18 above, which use a total of 130 bits only, there should be a 9 bits of compression saving). So not only the number of code addresses that matters but the frequency distribution of the unique code values presents another hurdle in the attempt of compressing a random data set, which is now to be addressed.

Because of the nature of the definition of a 3-value Code Unit shown in Diagram 19 that the ratio of bit 0:bit 1 of a Code Unit is 2:3, the frequency distribution of the 27 code values of a Processing Unit of three 3-value Code Units is not an even distribution as shown in Diagram 20:

Diagram 19
3-value Code Unit Definition: 0 Head Design
with Bit 0:Bit 1 Ratio = 2:3

| Code Value Number | Code Value Code |
|---|---|
| 1 | 0 |
| 2 | 10 |
| 3 | 11 |

Diagram 20
An instance of Unsorted Frequency Distribution of the 27 unique Code Values of a Processing Unit made up of three 3-value Code Units read from a random data set of 80,000 bits using the Code Unit Definition in Diagram 19

Processing Unit Code (unsorted)
Unsorted Sequence

| No. | Code Unit 1 | Code Unit 2 | Code Unit 3 | Bit used | Frequency |
|---|---|---|---|---|---|
| 1 | 0 | 0 | 0 | 3 | 2155 |
| 2 | 0 | 0 | 10 | 4 | 1101 |
| 3 | 0 | 0 | 11 | 4 | 1154 |
| 4 | 0 | 10 | 0 | 4 | 1078 |
| 5 | 0 | 10 | 10 | 5 | 587 |
| 6 | 0 | 10 | 11 | 5 | 506 |
| 7 | 0 | 11 | 0 | 4 | 1132 |
| 8 | 0 | 11 | 10 | 5 | 558 |
| 9 | 0 | 11 | 11 | 5 | 605 |
| 10 | 10 | 0 | 0 | 4 | 1074 |
| 11 | 10 | 0 | 10 | 5 | 574 |
| 12 | 10 | 0 | 11 | 5 | 566 |
| 13 | 10 | 10 | 0 | 5 | 552 |
| 14 | 10 | 10 | 10 | 6 | 279 |
| 15 | 10 | 10 | 11 | 6 | 290 |
| 16 | 10 | 11 | 0 | 5 | 564 |
| 17 | 10 | 11 | 10 | 6 | 263 |
| 18 | 10 | 11 | 11 | 6 | 292 |
| 19 | 11 | 0 | 0 | 4 | 1143 |
| 20 | 11 | 0 | 10 | 5 | 566 |
| 21 | 11 | 0 | 11 | 5 | 530 |
| 22 | 11 | 10 | 0 | 5 | 563 |
| 23 | 11 | 10 | 10 | 6 | 304 |
| 24 | 11 | 10 | 11 | 6 | 253 |
| 25 | 11 | 11 | 0 | 5 | 527 |
| 26 | 11 | 11 | 10 | 6 | 277 |
| 27 | 11 | 11 | 11 | 6 | 262 |

Total: 135 bits

By running another pass of the autoit programmes generating the frequency figures in Diagram 20, the result is listed in Diagram 21:

Diagram 21
Another Result generated using program generating Diagram 20
0-0-0: 2273
0-0-10: 1175
0-0-11: 1149
0-10-0: 1123
0-10-10: 531
0-10-11: 593
0-11-0: 1060
0-11-10: 548
0-11-11: 542
10-0-0: 1045
10-0-10: 542
10-0-11: 576
10-10-0: 551
10-10-10: 276
10-10-11: 288
10-11-0: 559
10-11-10: 266
10-11-11: 294
11-0-0: 1072
11-0-10: 508
11-0-11: 561
11-10-0: 540
11-10-10: 277
11-10-11: 279
11-11-0: 591
11-11-10: 262
11-11-11: 304

Freq: 2273 1175 1149 1123 1072 1060 1045 593 591 576 561 559 551 548 542 542 540 531 508 304 294 288 279 277 276 266 262

Original: 80001

Table 1 size: 82133

Table 2a size: 80001

Table 2b size: 84373

Table 3 size: 81444

It could be seen that the frequency distribution of the 27 unique code values of the Processing Unit of three 3-value Code Units being used in the present example is similar in proportion to the one listed in Diagram 20. Table 1 size is the bit size resulted from cross mapping between the 27 unique code values of Diagram 21 sorted in bit usage (such a sorting of the 27 unique code values is listed in Diagram 23 in Paragraph [78] below) and the 27 unique codes found in the Classified Absolute Address Branching Code Table (CAABCT) For 27 Values used in Example I as listed out in Diagram 18 of Paragraph [73]. Table 2a size in Diagram 21 is a result of a cross mapping using another CAABCT as found in Example II below in Diagram 22:

Diagram 22
Classified Absolute Address Branching Code Table (CAABCT) For 27 Values
Example II

| Sequence No. | Class No. | (Class Bit (Chan | Normal Bits | Branch Bit) Code) | Bit Size |
|---|---|---|---|---|---|
| 1 | 0 | 0 | 00 | | 3 |
| 2 | 0 | 0 | 01 | 0 | 4 |
| 3 | 0 | 0 | 01 | 1 | 4 |
| 4 | 0 | 0 | 10 | 0 | 4 |
| 5 | 0 | 0 | 10 | 1 | 4 |
| 6 | 0 | 0 | 11 | 0 | 4 |
| 7 | 0 | 0 | 11 | 1 | 4 |
| 8 | 1 | 1 | 0000 | | 5 |
| 9 | 1 | 1 | 0001 | | 5 |
| 10 | 1 | 1 | 0010 | | 5 |
| 11 | 1 | 1 | 0011 | | 5 |
| 12 | 1 | 1 | 0100 | | 5 |
| 13 | 1 | 1 | 0101 | | 5 |
| 14 | 1 | 1 | 0110 | | 5 |
| 15 | 1 | 1 | 0111 | | 5 |
| 16 | 1 | 1 | 1000 | | 5 |
| 17 | 1 | 1 | 1001 | | 5 |
| 18 | 1 | 1 | 1010 | | 5 |
| 19 | 1 | 1 | 1011 | | 5 |
| 20 | 1 | 1 | 1100 | 0 | 6 |
| 21 | 1 | 1 | 1100 | 1 | 6 |
| 22 | 1 | 1 | 1101 | 0 | 6 |
| 23 | 1 | 1 | 1101 | 1 | 6 |
| 24 | 1 | 1 | 1110 | 0 | 6 |
| 25 | 1 | 1 | 1110 | 1 | 6 |
| 26 | 1 | 1 | 1111 | 0 | 6 |
| 27 | 1 | 1 | 1111 | 1 | 6 |

Total: 135 bits

It could be seen that as Example II above uses the same bit usage for its 27 unique table codes as that used in the 27 unique code values (sorted in bit usage) produced out of a data set read using the 3-value Code Unit 0 Head Design (being value 1=0, value 2=10 and value 3=11) for three Code Units making up a Processing Unit, the bit usage result is the same as the instance of the original random data set generated and listed in Diagram 21. The random data set generated and listed in Diagram 21 and read up using the aforesaid 3 counts of 3-value Code Units of 0 Head Design takes up 80001 bits and the bit usage by encoding that random data set so read using cross mapping with table codes of the CAABCT in Example II (Table 2a in Diagram 23) is therefore the same: 80001 bits. The CAABCT in Example II uses up 135 bits for all its 27 unique table codes in 1 count each; the CAABCT in Example I uses up only 130 bits. But because of the uneven frequency distribution (made uneven under the 0 Head Design of the 3-value Code Unit used in reading rather than the conventional way of reading data in standard and same bit size designed for each value of a Code Unit of standard and uniform bit sizes) of the 27 unique code values in a random data set, the CAABCT in Example I (using 130 bits for an even frequency distribution of 1 count each for its 27 unique table codes) however uses more than the CAABCT in Example II (using 135 bits for an even frequency distribution of 1 count each for its 27 unique table codes) in terms of bit usage when encoding the original random data set of 8,0001 bits, producing an encoded code using 8, 1989 bits instead as seen in Diagram 23, an expansion rather than compression. The result of Table 2a to Table 3 (Table 2a being the cross mapping result using CAABCT 2, Table 2b CAABCT 1, and Table 3 CAABCT 0 as discussed in Paragraphs [85] to [93] and Diagram 29) is listed out in Diagram 21 and extracted as below:

Table 2a size: 80001
Table 2b size: 84373
Table 3 size: 81444

The above gives the bit usage result of the encoding after cross mapping the PU values (sorted in bit usage) read from the random data set with the table codes of other bit usage patterns as listed below:

global $MapTable1[27]=[4, 4, 4, 4, 4, 5, 5, 5, 5, 5, 5, 5, 5, 5, 5, 5, 5, 5, 5, 5, 5, 5, 5, 5, 5, 5, 5]

global $MapTable2a[27]=[3, 4, 4, 4, 4, 4, 4, 5, 5, 5, 5, 5, 5, 5, 5, 5, 5, 5, 5, 5, 5, 6, 6, 6, 6, 6, 6]

global $MapTable2b[27]=[3, 5, 5, 5, 5, 5, 5, 6, 6, 6, 6, 4, 4, 4, 4, 4, 6, 6, 4, 4, 4, 4, 6, 6, 6, 6]

global $MapTable3[27]=[3, 3, 4, 4, 4, 4, 4, 4, 5, 5, 5, 5, 5, 6, 6, 6, 6, 6, 6, 6, 6, 6, 6, 6, 6, 6, 6]

It could therefore be seen that there seems difficult to design a code table with 27 unique table codes that, when used in encoding the 27 unique code values read from a random data set, could achieve any saving or compression in bit usage. So in order to compress a random data set, additional techniques have to be designed, developed and used for such a purpose. One such design is through using Super Processing Units together with using specially designed Code Tables for mapping or encoding as revealed below.

The concept of using Super Processing Units arises from the understanding that random data set in fact could be considered being made up of a number of uneven data sub-sections and if a random data set could not be compressed on account of its nature of frequency distribution of data code values, one could perhaps divide the whole digital data input file of random data into sub-sections of uneven data, called Super Processing Units here, so that techniques which capitalize on uneven data distribution for making compression possible could be applied to such individual Super Processing Units one by one to make compression possible for the whole digital data input of random distribution. This is the Divide and Conquer strategy.

So the whole digital data input file could be regarded a Huge Processing Unit consisting of all the Processing Units of the digital data at a certain point of the data distribution spectrum, from random or even to wholly uneven at either extremes. In the field of Compression Science, compression techniques are possible just through taking advantage of the uneven nature of a data set. And a data set of random other purposes. The encoding and decoding of data for a Super Processing Unit may require some adjustment made to the encoding and decoding techniques or process that are used by encoding and decoding made for a Processing Unit. Therefore, a Super Processing Unit is a unit of data consisting of one or more Processing Units. It could be subject to some coding adjustment to the encoding and decoding made for a Processing Unit.

In order to understand how Super Processing Units are used for the purpose of compressing random data, the 27 unique code values of a Processing Unit made up of three 3-value Code Units of 0 Head Design in Diagram 20 are sorted and listed in Diagram 23 below first:

Diagram 23
An instance of Sorted/Unsorted Frequency Distribution of the 27 unique Code Values of a Processing Unit made up of three 3-value Code Units read from a random data set of 80,000 bits using the Code Unit Definition in Diagram 19

| Processing Unit Code (sorted/unsorted) Sorted/Unsorted Sequence No. | Code Values | | | Bit used | Frequency |
|---|---|---|---|---|---|
| | Code Unit 1 | Code Unit 2 | Code Unit 3 | | |
| 1/1   | 0  | 0  | 0  | 3 | 2155 |
| 2/3   | 0  | 0  | 11 | 4 | 1154 |
| 3/19  | 11 | 0  | 0  | 4 | 1143 |
| 4/7   | 0  | 11 | 0  | 4 | 1132 |
| 5/2   | 0  | 0  | 10 | 4 | 1101 |
| 6/4   | 0  | 10 | 0  | 4 | 1078 |
| 7/10  | 10 | 0  | 0  | 4 | 1074 |
| 8/9   | 0  | 11 | 11 | 5 | 605  |
| 9/5   | 0  | 10 | 10 | 5 | 587  |
| 10/11 | 10 | 0  | 10 | 5 | 574  |
| 11/12 | 10 | 0  | 11 | 5 | 566  |
| 12/20 | 11 | 0  | 10 | 5 | 566  |
| 13/16 | 10 | 11 | 0  | 5 | 564  |
| 14/22 | 11 | 10 | 0  | 5 | 563  |
| 15/8  | 0  | 11 | 10 | 5 | 558  |
| 16/13 | 10 | 10 | 0  | 5 | 552  |
| 17/21 | 11 | 0  | 11 | 5 | 530  |
| 18/25 | 11 | 11 | 0  | 5 | 527  |
| 19/6  | 0  | 10 | 11 | 5 | 506  |
| 20/23 | 11 | 10 | 10 | 6 | 304  |
| 21/18 | 10 | 11 | 11 | 6 | 292  |
| 22/15 | 10 | 10 | 11 | 6 | 290  |
| 23/14 | 10 | 10 | 10 | 6 | 279  |
| 24/26 | 11 | 11 | 10 | 6 | 277  |
| 25/17 | 10 | 11 | 10 | 6 | 263  |
| 26/27 | 11 | 11 | 11 | 6 | 262  |
| 27/24 | 11 | 10 | 11 | 6 | 253  |

Total: 135 bits distribution so far is considered incompressible. So a single Huge Processing Unit consisting of Processing Units of random data as a whole could be divided into sub-sections consisting of a certain number of Processing Units called Super Processing Units, so that techniques could be designed for compressing such data sub-sections. So Huge Processing Unit is defined as the whole unit consisting of all the data codes that are to be put into encoding and decoding, therefore excluding the Un-encoded Code Unit, which is made up by data codes that are not subject to the process of encoding and decoding, for instance, because of not making up to the size of one Processing Unit or one Super Processing Unit where appropriate. A Huge Processing Unit could be divided into a number of Super Processing Units for encoding and decoding for the sake of a certain purpose, such as compressing random data through such division or It should be noted that the sorted ranked values of the 27 unique code values in Diagram 23 above could be divided into 4 groups in terms of bit usage: Group 1 of 1 code value of 3 bits, Group 2 of 6 code values of 4 bits, Group 3 of 12 code values of 5 bits and Group 4 of 8 code values of 6 bits. The ranking of each of the code values within a particular group may slightly vary from one random data set to another random data set because of the slight variation in frequency distribution of random data generated from time to time. But code values will not move from one group to another in terms of their frequencies between one instance of random data to another instance. If they do change so wildly, the data distribution is not random at all.

Since random data has such similar frequency distributions of data code values, different versions of CAABCT could be designed for cross mapping with them and the result of bit usage after encoding using such CAABCTs has been mentioned and shown in Diagram 21. For cross mapping of table codes of CAABCT with data code values of a particular schema and design of Processing Unit and Code Unit under CHAN FRAMEWORK for processing a particular data set of a certain data distribution, the frequency ranking of the data code values of 27 unique code values under concern may be different from that of a random data set. So the order of such 27 unique code value frequencies must be known so that cross mapping of table codes of CAABCT and the 27 unique code values could be designed so as the best result for compression is to be attempted. So such an order of the unique code value frequencies should be obtained by parsing the data set under concern first and such information has to be made available to the encoder and decoder for their use in processing. Such information could vary from one data set to another data set so that it could be included in the Header of the encoded code for use later by decoder for correct recovery of the original data set. This is so for a data set in random distribution as well for the assignment of cross mapping of data code values and table code values for encoding and decoding. However, if slight variation of frequency ranking of the code values within group for a random data set is considered acceptable, such information could be spared from the Header. However, indicator to which CAABCT is to be used (or the content of the CAABCT as a whole) for processing has still be retained in the Header or made available to or built in into the encoder and decoder where appropriate. CAABCT is used here because AAB technique is used in designing the mapping code table for the 27 unique code values of the Processing Unit using three 3-value Code Unit of 0 Head Design. So other mapping code tables without using AAB technique could also be designed for use where appropriate. So the mentioning of CAABCT for use in the present case of discussion applies to the use of mapping code table in encoding and decoding in general.

It is time to see how CAABCT is used in encoding Super Processing Units for making compression for a random data set. Since the use of Super Processing Units is for the purpose of breaking a random data set into sub-sections of data, Super Processing Units therefore are designed to have a data distribution, which is different from a random data set so that techniques for compressing uneven data could be used for making compression. For example, Super Processing Units that have equal or less number of processing units than a full set of processing units (in the present example 27 unique entries of data values) are guaranteed to have an uneven data distribution. However, it does not mean that all uneven sub-sections of data are compressible. This is so since any compression technique or mapping code table that is useful in compressing data of a certain data distribution may not suit to data of another different data distribution. This means that more than one compression technique or one mapping code table has to be used in compressing Super Processing Units of different data distribution.

In adopting this approach and technique of dividing a random data set into sub-sections of data in the form of Super Processing Units, the first attempt is to classify the Super Processing Units into two groups, using one CAABCT for encoding and decoding the Processing Units of Super Processing Units of one group and another CAABCT for another group. In such as a way, one bit indicator about which CAABCT is used for either of the two groups has to be used for one Super Processing Unit. So additional bit usage has to be incurred for making compression using this approach. And the encoding implemented using the relevant CAABCTs for making compression should result in bit usage saving that is more than the bit usage that has to be incurred by using the CAABCT bit indicator for each Super Processing Unit in addition to other additional information such as those contained in the Header. This is a very challenging task ahead.

The techniques so far suggested to be used for this purpose are:

(a) use of Super Processing Units;

(b) dividing Super Processing Units into groups, two in the present case here first; and (c) use of CAABCT (two for the present case) for cross mapping between unique data code values and unique table code values (of the two groups of Super Processing Units) and use of CAABCT indicator.

Questions arise as to the size of the Super Processing Units to be sub-divided into for use and how the Super Processing Units are to be grouped or classified and what CAABCTs are to be used.

Answers to these questions have to be found in the example being used in the above case of discussion in Diagram 23, in which a Processing Unit is designed as comprising three 3-value Code Units of the 0 Head Design, having therefore 27 unique code values sorted in frequency ranking for a random data set of around 80000 bits. Diagram 21 shows that the two CAABCTs used for discussion in Paragraphs [73] to [75] could not make compression possible for a random data set. This is where subdividing the random data set into Super Processing Units for encoding is suggested as a solution in this relation. Therefore the Super Processing Units have to be divided in such a way that each of them do not have a random data distribution. So Super Processing Units having a fixed bit size or a fixed range of bit size or a fixed number of Processing Units which guarantee that the data distribution within each of Super Processing Unit is not random could be used. So the discussion in Paragraphs [73] to [75] suggests that it is certain that Super Processing Unit made up of 27 Processing Units or less should meet this criterion as 27 unique code values if all present or not do not constitute a random data set of Code Unit designed in conventional sense using fixed bit size. A random data set of Code Unit designed in conventional sense using fixed bit size when read using the schema and design of Processing Unit made up of three 3-value Code Units of 0 Head Design exhibits a characteristic data frequency distribution that is shown in Diagram 23 other than the one count for each of the 27 unique values shown in Diagram 18. Using a fixed size Super Processing Unit could be one way to accomplish subdivision. So for the time being a Super Processing Unit is considered having the size of 27 Processing Units first.

A Super Processing Unit having the size of 27 Processing Units here do not guarantee each of the unique 27 code values will be present in each of the Super Processing Units so divided. In these Super Processing Units, each may have a different data distribution, some having all the 27 unique code values present, some having some unique code values absent while other unique code values occurring more than once, all in different ways. So for simplicity, the example here divides such different data patterns into two groups for encoding and decoding purpose. The statistics of bit usage and frequency distribution of a random data set of 80000 bits in Diagram 23 is refined in Diagram 24 as follows:

Diagram 24
An instance of Statistics of the 27 unique Code
Values of a Processing Unit made up of three 3-value Code
Units read from a random data set of 80,003 bits using the Code Unit
Definition in Diagram 19

| Processing Unit Sorted Code No. | Code Values | Bit used | Frequency | Frequency % (~) | Category Frequency % (~) |
|---|---|---|---|---|---|
| Category 1 | | | | | 12.1 |
| 1 | 000 | 3 | 2155 | 12.1 | |
| Category 2 | | | | | 37.6 |
| 2 | 0011 | 4 | 1154 | 6.5 | |
| 3 | 1100 | 4 | 1143 | 6.4 | |
| 4 | 0110 | 4 | 1132 | 6.4 | |
| 5 | 0010 | 4 | 1101 | 6.2 | |
| 6 | 0100 | 4 | 1078 | 6.1 | |
| 7 | 1000 | 4 | 1074 | 6.0 | |
| Category 3 | | | | | 37.7 |
| 8 | 01111 | 5 | 605 | 3.4 | |
| 9 | 01010 | 5 | 587 | 3.3 | |
| 10 | 10010 | 5 | 574 | 3.2 | |
| 11 | 10011 | 5 | 566 | 3.2 | |
| 12 | 11010 | 5 | 566 | 3.2 | |
| 13 | 10110 | 5 | 564 | 3.2 | |
| 14 | 11100 | 5 | 563 | 3.2 | |
| 15 | 01110 | 5 | 558 | 3.1 | |
| 16 | 10100 | 5 | 552 | 3.1 | |
| 17 | 11011 | 5 | 530 | 3.0 | |
| 18 | 11110 | 5 | 527 | 3.0 | |
| 19 | 01011 | 5 | 506 | 2.8 | |
| Category 4 | | | | | 12.5 |
| 20 | 111010 | 6 | 304 | 1.7 | |
| 21 | 101111 | 6 | 292 | 1.6 | |
| 22 | 101011 | 6 | 290 | 1.6 | |
| 23 | 101010 | 6 | 279 | 1.6 | |
| 24 | 111110 | 6 | 277 | 1.6 | |
| 25 | 101110 | 6 | 263 | 1.5 | |
| 26 | 111111 | 6 | 262 | 1.5 | |
| 27 | 111011 | 6 | 253 | 1.4 | |

Total: 135 bits   Total: 17755   Total: ~100

From Diagram 24 above, it can be seen that the 27 unique values could be divided into 4 categories in terms of bit usage or frequency characteristics, If Category 1 and 2 form into one group (Group 0), it takes up about 49.7% in terms of frequency counts and Category 3 and 4 form into another group (Group 1), taking up about 50.2%. The frequency counts of these two groups are roughly the same. So by dividing a random data set into Super Processing Units (using 27 Processing Units) with uneven data distribution, it is expected that some Super Processing Units will have more unique code values coming from Group 0 and the other from Group 1. So if a mapping code table (CAABCT 0) could be so designed to have less bit usage given to unique table code values for cross mapping to unique data code values in Group 0 than those in Group 1 and another mapping code table (CAABCT 1) to have less bit usage given to unique table code values for cross mapping to unique data code values in Group 1 than those in Group 0. Then those Super Processing Units with more unique data code values from Group 0 will benefit from using CAABCT 0 for encoding for compression purpose and those Super Processing Units with more from Group 1 will benefit from using CCABCT 1 for the same purpose. However there is an issue about the additional expenditure on the use of one indicator bit for indicating which mapping code table is used for each of the Super Processing Unit. On the other hand, Group 0 Super Processing Units (i.e. those Super Processing Units having more data values from Group 0) will have sometimes more than 1 entry of data values from Group 0 than from Group 1. This is also true for Group 1 Super Processing Units. So this additional expenditure of the mapping table indicator bit for every Super Processing Units may still have a chance to be offset by the aforesaid mentioned pattern of code values occurrence. However, some other techniques could be used to help produce more bit usage saving for using this encoding and decoding technique of using Super Processing Units and Mapping Code Tables.

One of these other techniques is the use of Artificial Intelligence (AI) technique [or more actually Human Intelligence (HI) technique indeed] in dispensing with the use of the Mapping Code Table Bit Indicator for every Super Processing Unit in encoding and decoding. Artificial Intelligence technique used here is by setting up AI criteria by which to distinguish from the content of each of the encoded Super Processing Units which one of the two mapping code tables should be used for encoding the corresponding Super Processing Unit. In this way, if the AI criteria are set up appropriately, the Mapping Code Table Bit Indicator could be dispensed with. Below are some suggestions about the AI criteria that could be used:

(a) a code value (Identifying Code Value) present in the Super Processing Unit that could be used for identifying which CAABCT is used for its encoding; so taking into account of this criterion, such a code value should be encoded in different table code values by the two different CAABCTs; and this requirement has to be catered for during the stage of designing the two CAABCTs under concern; also because of this requirement, the Terminating Condition or Criterion for stopping the use of one mapping code table for encoding a Super Processing Unit is to be changed; for instance at first it is taken that the size of the Super Processing Unit is to be 27 processing unit code values, and as the Identifying Code Value may not always be found amongst the 27 code values present in a Super Processing Unit, so the Terminating Condition has to be modified to: either (i) using the Identifying Code Value as the Terminating Value by which the value codes before it and itself are to be encoded using one CAABCT, after this Identifying Code Value, a new assessment of which CAABCT is to be used for encoding is to be made for those code values ahead including the next Identifying Code Value; using this technique, the last section of the original code values without the Identifying Code Value could also be assessed and to be encoded using either of the two CAABCTs; however in such a way, an Identifying Code Value has to be added to the end of this section after encoding; and an indicator about whether this last Identifying Code Value is one that has been added or is one part of the original code values has to be added in the Header so that upon decoding, either the Identifying Code Value has to be decoded or removed from the recovered codes; and then following this section, there may be the Un-encoded Code Unit, containing code bit(s) that do not make up to one processing unit code value if there is any; or (ii) using the Super Processing Unit containing the Identifying Code Value as the Terminating Condition; this means that if from the head of the digital data input, only the third Super Processing Unit (of 27 code values in this case) contains the Identifying Code Value, then all the code values of the first 3 Super Processing Units are to be encoded using one CAABCT upon assessment, and a new assessment is to be made about using which CAABCT for encoding the code values ahead up to all the values of the Super Processing Unit containing the Identifying Code Value; and at the end, the last section of the original code values not making up to one Super Processing Unit with or without the Identifying Code Value could be processed in way like that in (i) above or just left as included in the Un-encoded Code Unit;

(b) unsuccessful decoding; code values encoded using one CAABCT sometimes may not be successfully decoded using another CAABCT; so the encoded code values have to be decoded using both CAABCTs, as one CAABCT must be the one selected for encoding; the decoding process should be successful for using it for decoding; this may not be the case for decoding using another CAABCT which was not used for encoding;

(c) shorter encoded code; because the encoding is used for the purpose of making compression, the CAABCT that produces the shortest encoded code will certainly be selected; so upon decoding, using CAABCT that is not used for encoding will certainly produce encoded code values that as a whole is longer in bit usage;

(d) unsuccessful re-encoding; so upon decoding using two different CAABCTs, two different sets of decoded codes are produced; these two sets of decoded codes are to be encoded again using the two CAABCTs again interchangeably, sometimes re-encoding using another CAABCT other than the one chosen may not be successful; it is so especially code values in trios using different Head Design is employed in the two different CAABCTs; for instance, one CAABCT using 0 Head Design such as:

0

10

11 as suffix to the code values of trios and another CAABCT using 1 Head Design such as:

1

01

00 as suffix to the code values of the trios (this point will be explained later); another evidence of unsuccessful encoding is that the last bits of the decoded code upon re-encoding does not form into one code value and that for using Super Processing Unit with fixed bit size or fixed number of Processing Units, the re-encoded code values do not make up to the designed fixed size, either more encoded code values or less than the fixed size of the Super Processing Unit are produced upon re-encoding;

(e) additional bit to be added after the encoded code where necessary; there may be chances that after assessing with the above AI criteria, it is still not possible to identify the CAABCT chosen for encoding, an additional bit has to be added to the end of the section or unit of encoded code for making such a distinction; this additional bit, if necessary, is only provided for use as a safe escape, which may seldom be required to be implemented and thus may not actually use up bit storage, from incorrect distinction and may have to be used only when all the above AI criteria could not provide a clear-cut answer in ambivalent cases; in view of this, such AI assessment should be done during the encoding process as well after each section or unit of encoding is finished; and (f) other criteria that are found and designed to be appropriate and valid for use.

To put the above revelation in picture, two such CAABCTs are designed for further elaboration in Diagram 25 and 26:

Diagram 25
Classified Absolute Address Branching
Code Table (CAABCT 0) For 27 Values
Example III

| Sorted PU | | Bit Representation in CHAN CODE, including Group No., Normal Bits and Branch Bit/Suffix | | |
|---|---|---|---|---|
| Sequence No. | Group No. | (Normal Bits (Chan | Branch Bit/Suffix) Code) | Bit Size |
| 1 | 0 | 000 | | 3 |
| 2 | 0 | 001 | | 3 |
| 3 | 0 | 1000 | | 4 |
| 4 | 0 | 1001 | | 4 |
| 5 | 0 | 1010 | | 4 |
| 6 | 0 | 1011 | | 4 |
| 7 | 0 | 0100 | | 4 |
| 8 | 0 | 0101 | | 4 |
| 9 | 0 | 01100 | | 5 |
| 10 | 0 | 01101 | | 5 |
| 11 | 0 | 01110 | | 5 |
| 12 | 1 | 01111 | | 5 |
| 13 | 1 | [1100] | 0 | 5 |
| 14 | 1 | [1100] | 10 | 6 |
| 15 | 1 | [1100] | 11 | 6 |
| 16 | 1 | 110100 | | 6 |
| 17 | 1 | 110101 | | 6 |
| 18 | 1 | 110110 | | 6 |
| 19 | 1 | 110111 | | 6 |
| 20 | 1 | 111000 | | 6 |
| 21 | 1 | 111001 | | 6 |
| 22 | 1 | 111010 | | 6 |
| 23 | 1 | 111011 | | 6 |
| 24 | 1 | 111100 | | 6 |
| 25 | 1 | 111101 | | 6 |
| 26 | 1 | 111110 | | 6 |
| 27 | 1 | 111111 | | 6 |

Total: 139 bits

Diagram 26
Classified Absolute Address Branching
Code Table (CAABCT 1) For 27 Values
Example IV

| Sorted PU | | Bit Representation in CHAN CODE, including Group No., Normal Bits and Branch Bit/Suffix | | |
|---|---|---|---|---|
| Sequence No. | Group No. | (Normal Bits (Chan | Branch Bit/Suffix) Code) | Bit Size |
| 1 | 0 | 011 | | 3 |
| 2 | 0 | 10000 | | 5 |
| 3 | 0 | 10001 | | 5 |
| 4 | 0 | 10010 | | 5 |
| 5 | 0 | 10011 | | 5 |
| 6 | 0 | [1010] | 1 | 5 |
| 7 | 0 | [1011] | 1 | 5 |
| 8 | 0 | [1010] | 01 | 6 |
| 9 | 0 | [1010] | 00 | 6 |
| 10 | 0 | [1011] | 01 | 6 |
| 11 | 0 | [1011] | 00 | 6 |
| 12 | 1 | 0000 | | 4 |
| 13 | 1 | 0001 | | 4 |
| 14 | 1 | [001] | 1 | 4 |
| 15 | 1 | [010] | 1 | 4 |
| 16 | 1 | 1100 | | 4 |
| 17 | 1 | 1101 | | 4 |
| 18 | 1 | [001] | 01 | 5 |
| 19 | 1 | [001] | 00 | 5 |
| 20 | 1 | [010] | 01 | 5 |
| 21 | 1 | [010] | 00 | 5 |
| 22 | 1 | [1110] | 1 | 5 |

Diagram 26
Classified Absolute Address Branching
Code Table (CAABCT 1) For 27 Values
Example IV

| Sorted PU | | Bit Representation in CHAN CODE, including Group No., Normal Bits and Branch Bit/Suffix | | |
|---|---|---|---|---|
| Sequence No. | Group No. | (Normal Bits (Chan | Branch Bit/Suffix Code) | Bit Size |
| 23 | 1 | [1111] | 1 | 5 |
| 24 | 1 | [1110] | 01 | 6 |
| 25 | 1 | [1110] | 00 | 6 |
| 26 | 1 | [1111] | 01 | 6 |
| 27 | 1 | [1111] | 00 | 6 |
| | | | Total: | 135 bits |

It could be seen from the above two CAABCTs, the grouping of table code values is adjusted a little bit as to grouping the first 11 table codes together into Group 0 and the remaining into Group 1. This adjustment of grouping is a result of the need for easier code arrangement. Those table code values in bracket are code values in trio. In CAABCT 0, there is only 1 trio whereas in CAABCT 1, there are 6. In CAABCT 0, the trio is in 0 Head Design, that is having suffix in the form of:
0
10
11 whereas in CAABCT 1, the trios is in 1 Head Design, having suffix in the form of:
1
01
00

The use of suffix of different design is meant for AI distinction as discussed in Paragraph [86](d). The suffix design is another usage that results from using the AAB technique.

Diagram 27 below gives a consolidated view of the cross mapping of the 27 unique data code values of the Processing Unit of three 3-value Code Units sorted according to bit size with the table code values of CAABCT 0 and CAABCT 1:

Diagram 27
Cross Mapping between Data Code Values (Diagram 24) and Table
Code Values of CAABCT 0 and CAABCT 1
Processing Unit
Sorted Code

| Code No. | Values | Bit used | Frequency | % | CAABCT 0 Values | +/−bit | CAABCT 1 Values | +/−bit |
|---|---|---|---|---|---|---|---|---|
| Group 0 | | | | | | | | |
| 1 | 000 | 3 | 2155 | 12.1 | 000 | 0 | 011 | 0 |
| 2 | 0011 | 4 | 1154 | 6.5 | 001 | −1 | 10000 | +1 |
| 3 | 1100 | 4 | 1143 | 6.4 | 1000 | 0 | 10001 | +1 |
| 4 | 0110 | 4 | 1132 | 6.4 | 1001 | 0 | 10010 | +1 |
| 5 | 0010 | 4 | 1101 | 6.2 | 1010 | 0 | 10011 | +1 |
| 6 | 0100 | 4 | 1078 | 6.1 | 1011 | 0 | [1010]1 | +1 |
| 7 | 1000 | 4 | 1074 | 6.0 | 0100 | 0 | [1011]1 | +1 |
| 8 | 01111 | 5 | 605 | 3.4 | 0101 | −1 | [1010]01 | +1 |
| 9 | 01010 | 5 | 587 | 3.3 | 01100 | 0 | [1010]00 | +1 |
| 10 | 10010 | 5 | 574 | 3.2 | 01101 | 0 | [1011]01 | +1 |
| 11 | 10011 | 5 | 566 | 3.2 | 01110 | 0 | [1011]00 | +1 |
| Group 1 | | | | | | | | |
| 12 | 11010 | 5 | 566 | 3.2 | 01111 | 0 | 0000 | −1 |
| 13 | 10110 | 5 | 564 | 3.2 | [1100]0 | 0 | 0001 | −1 |
| 14 | 11100 | 5 | 563 | 3.2 | [1100]10 | +1 | [001]1 | −1 |
| 15 | 01110 | 5 | 558 | 3.1 | [1100]11 | +1 | [010]1 | −1 |
| 16 | 10100 | 5 | 552 | 3.1 | 110100 | +1 | 1100 | −1 |
| 17 | 11011 | 5 | 530 | 3.0 | 110101 | +1 | 1101 | −1 |
| 18 | 11110 | 5 | 527 | 3.0 | 110110 | +1 | [001]01 | 0 |
| 19 | 01011 | 5 | 506 | 2.8 | 110111 | +1 | [001]00 | 0 |
| 20 | 111010 | 6 | 304 | 1.7 | 111000 | 0 | [010]01 | −1 |
| 21 | 101111 | 6 | 292 | 1.6 | 111001 | 0 | [010]00 | −1 |
| 22 | 101011 | 6 | 290 | 1.6 | 111010 | 0 | [1110]1 | −1 |
| 23 | 101010 | 6 | 279 | 1.6 | 111011 | 0 | [1111]1 | −1 |
| 24 | 111110 | 6 | 277 | 1.6 | 111100 | 0 | [1110]01 | 0 |
| 25 | 101110 | 6 | 263 | 1.5 | 111101 | 0 | [1110]00 | 0 |
| 26 | 111111 | 6 | 262 | 1.5 | 111110 | 0 | [1111]01 | 0 |
| 27 | 111011 | 6 | 253 | 1.4 | 111111 | 0 | [1111]00 | 0 |

When comparing the statistics above, it is not absolutely clear if random data set could be compressed using the above two CAABCTs as the mapping tables do not apply to the whole random data set but to appropriate Super Processing Units where either one of the CAABCTs is better in terms of bit usage. The pattern of distribution of data code values after dividing a random data set into Super Processing Units of uneven data distribution is yet to be ascertained. Selecting which CAABCT for encoding any particular Super Processing Unit is based upon the actual encoding result, not by counting the number of data code values of Group 0 and Group 1 found as the bit usage results produced by actually implementing the respective encoding is a more accurate indicator about which CAABCT is best for use for a particular Super Processing Unit.

According to embodiments, there could be enhancement to the above technique, for instance by using one CAABCT which has exactly the same bit usage distribution for all the 27 unique table code values as that for the 27 unique data code values that is characteristic of a random data set. One such a CAABCT is CAABCT 1. CAABCT 1 could be redistributed for cross mapping purpose as follows in Diagram 28:

the random data set with exactly the same bit size, i.e. 3 bit size table code value is mapped to 3 bit size data code value, and 4 bit to 4 bit, 5 bit to 5 bit and 6 bit to 6 bit; mapping in such a way results in the same bit usage after encoding, no compression nor expansion in data size of the random data set.

For encoding and decoding for compressing a random data set, the technique introduced in using Super Processing Units could be slightly adjusted as follows. Firstly, when a random data set is given for encoding, CAABCT 2 is used to cross map the data code values of the random data set for encoding; i.e. the random data set is read using the definition of the 3-value Code Unit of 0 Head Design one by one, three of such consecutive Read Units form one Processing Unit for using with CAABCT 2 as a mapping table for encoding. The Processing Unit is then encoded one by one as well as the Super Processing Units as described above. This is a cross the board translation for all the random data set except the few bits that are left in the Un-encoded Code Unit which do not make up to the size of 1 Processing Unit for encoding, resulting in translated code in accordance to CAABCT 2. For making compression of this translated data set (which is not as random as before now after the cross-mapping Diagram 28
Cross Mapping between Data Code Values (Diagram 24) and Table Code Values of CAABCT 2 and CAABCT 1
Processing Unit
Sorted Code

| No. | Code Values | Bit used | Frequency | % | CAABCT 2 Values | +/−bit | CAABCT 1 Values | +/−bit |
|---|---|---|---|---|---|---|---|---|
| Group 0 | | | | | | | | |
| 1 | 000 | 3 | 2155 | 12.1 | 010 | 0 | 011 | 0 |
| 2 | 0011 | 4 | 1154 | 6.5 | 0000 | 0 | 10000 | +1 |
| 3 | 1100 | 4 | 1143 | 6.4 | 0001 | 0 | 10001 | +1 |
| 4 | 0110 | 4 | 1132 | 6.4 | [001]0 | 0 | 10010 | +1 |
| 5 | 0010 | 4 | 1101 | 6.2 | [011]0 | 0 | 10011 | +1 |
| 6 | 0100 | 4 | 1078 | 6.1 | 1100 | 0 | [1010]1 | +1 |
| 7 | 1000 | 4 | 1074 | 6.0 | 1101 | 0 | [1011]1 | +1 |
| 8 | 01111 | 5 | 605 | 3.4 | [1010]0 | 0 | [1010]01 | +1 |
| 9 | 01010 | 5 | 587 | 3.3 | [1011]0 | 0 | [1010]00 | +1 |
| 10 | 10010 | 5 | 574 | 3.2 | [1110]0 | 0 | [1011]01 | +1 |
| 11 | 10011 | 5 | 566 | 3.2 | [1111]0 | 0 | [1011]00 | +1 |
| Group 1 | | | | | | | | |
| 12 | 11010 | 5 | 566 | 3.2 | 10000 | 0 | 0000 | −1 |
| 13 | 10110 | 5 | 564 | 3.2 | 10001 | 0 | 0001 | −1 |
| 14 | 11100 | 5 | 563 | 3.2 | 10010 | 0 | [001]1 | −1 |
| 15 | 01110 | 5 | 558 | 3.1 | [001]10 | 0 | [010]1 | −1 |
| 16 | 10100 | 5 | 552 | 3.1 | [001]11 | 0 | 1100 | −1 |
| 17 | 11011 | 5 | 530 | 3.0 | 10011 | 0 | 1101 | −1 |
| 18 | 11110 | 5 | 527 | 3.0 | [011]10 | 0 | [001]01 | 0 |
| 19 | 01011 | 5 | 506 | 2.8 | [011]11 | 0 | [001]00 | 0 |
| 20 | 111010 | 6 | 304 | 1.7 | [1010]10 | 0 | [010]01 | −1 |
| 21 | 101111 | 6 | 292 | 1.6 | [1010]11 | 0 | [010]00 | −1 |
| 22 | 101011 | 6 | 290 | 1.6 | [1011]10 | 0 | [1110]1 | −1 |
| 23 | 101010 | 6 | 279 | 1.6 | [1110]10 | 0 | [1111]1 | −1 |
| 24 | 111110 | 6 | 277 | 1.6 | [1110]11 | 0 | [1110]01 | 0 |
| 25 | 101110 | 6 | 263 | 1.5 | [1011]11 | 0 | [1110]00 | 0 |
| 26 | 111111 | 6 | 262 | 1.5 | [1111]10 | 0 | [1111]01 | 0 |
| 27 | 111011 | 6 | 253 | 1.4 | [1111]11 | 0 | [1111]00 | 0 |

CAABCT 2 is exactly the same as CAABCT 1 except that:

(a) CAABCT 2 uses the 0 Head Design for its 6 trios (i.e. 0, 10, 11) whereas CAABCT 1 uses the 1 Head Design (i.e. 1, 01, 00) for their respective suffix to the trios;

(b) when used in cross mapping, unique table code values of CAABCT2 are mapped to to unique data code values of translation using CAABCT2), CAABCT 1 is then used with Super Processing Units sub-divided from the translated data set using the chosen Terminating Condition, such as the original code value of 000, which is now translated into 010, the corresponding table code value of CAABCT 2. So wherever the Super Processing Unit under processing is susceptible to encoding using CAABCT1 for producing encoded code which is less in bit usage than the translated code of the same Super Processing Unit, it is encoded by using CAABCT 1. As the Terminating Condition includes the encoded CAABCT table code value of 010, if CAABCT 1 is used to encode it, 010 is encoded into 011. So the resultant encoded code after encoding using CAABCT 2 and CAABCT 1, the original data code value 000 is translated into 010 and then 011. If using CAABCT 1 could not reduce the size of the CAABCT 2 encoded code of the Super Processing Units, the CAABCT 2 encoded code values of those Super Processing Units are then left un-touched. So the original data code value 000 remains as 010. So this could also be used as one of the AI criteria used for distinguishing between CAABCT 2 code and CAABCT 1 code. As the suffix of the 6 trios of CAABCT 2 are different from those of CAABCT 1, many suffix indicators could be used for AI distinction purpose as well. All the AI operations mentioned in Paragraph [86] could be used as well for distinguishing CAABCT 1 code from CAABCT 2 code. As there is no need to translate it back to the original data code values for AI distinction, the decoding process should be successful without question. So for decoding the encoded code after the cross-the-board mapping using CAABCT 2 and then selective cross mapping using CAABCT 1, AI techniques for making AI distinction of Super Processing Units containing CAABCT 1 code mentioned in Paragraph [86] could be used. And after such Super Processing Units containing CAABCT 1 code are identified, the corresponding CAABCT 1 code is then decoded back into CAABCT 2 code for those Super Processing Units just identified. After all CAABCT 1 code is translated back into CAABCT 2 code, cross-the-board decoding of CAABCT 2 code to the original data code values could be achieved using the code table of CAABCT 2. In this way, it could be asserted that whenever there are Super Processing Units having code values that are subject to compression by using CAABCT 1, then the random data set containing such Super Processing Units could be compressed. Or one could use CAABCT 0 for cross mapping with CAABCT 2 instead of using CAABCT 1, or using CAABCT 0 and CAABCT 1 interchangeably for cross mapping with CAABCT 2 where appropriate; in these cases, the AI criteria may have to be duly adjusted or added to for determining which mapping code table is used for any particular Super Processing Unit. Diagram 29 below shows the cross mapping that could be done using all 3 CAABCTs:

Diagram 29
Cross Mapping between Data Code Values (Diagram 24) and Table Code Values of CAABCT 2, CAABCT 0 and CAABCT 1
Processing Unit
Sorted Code

| No. | CAABCT 2 Values | Bit used | Frequency | % | CAABCT 0 Values | +/−bit | CAABCT 1 Values | +/−bit |
|---|---|---|---|---|---|---|---|---|
| Group 0 | | | | | | | | |
| 1 | 010 | 3 | 2155 | 12.1 | 000 | 0 | 011 | 0 |
| 2 | 0000 | 4 | 1154 | 6.5 | 001 | −1 | 10000 | +1 |
| 3 | 0001 | 4 | 1143 | 6.4 | 1000 | 0 | 10001 | +1 |
| 4 | [001]0 | 4 | 1132 | 6.4 | 1001 | 0 | 10010 | +1 |
| 5 | [011]0 | 4 | 1101 | 6.2 | 1010 | 0 | 10011 | +1 |
| 6 | 1100 | 4 | 1078 | 6.1 | 1011 | 0 | [1010]1 | +1 |
| 7 | 1101 | 4 | 1074 | 6.0 | 0100 | 0 | [1011]1 | +1 |
| 8 | [1010]0 | 5 | 605 | 3.4 | 0101 | −1 | [1010]01 | +1 |
| 9 | [1011]0 | 5 | 587 | 3.3 | 01100 | 0 | [1010]00 | +1 |
| 10 | [1110]0 | 5 | 574 | 3.2 | 01101 | 0 | [1011]01 | +1 |
| 11 | [1111]0 | 5 | 566 | 3.2 | 01110 | 0 | [1011]00 | +1 |
| Group 1 | | | | | | | | |
| 12 | 10000 | 5 | 566 | 3.2 | 01111 | 0 | 0000 | −1 |
| 13 | 10001 | 5 | 564 | 3.2 | [1100]0 | 0 | 0001 | −1 |
| 14 | 10010 | 5 | 563 | 3.2 | [1100]10 | +1 | [001]1 | −1 |
| 15 | [001]10 | 5 | 558 | 3.1 | [1100]11 | +1 | [010]1 | −1 |
| 16 | [001]11 | 5 | 552 | 3.1 | 110100 | +1 | 1100 | −1 |
| 17 | 10011 | 5 | 530 | 3.0 | 110101 | +1 | 1101 | −1 |
| 18 | [011]10 | 5 | 527 | 3.0 | 110110 | +1 | [001]01 | 0 |
| 19 | [011]11 | 5 | 506 | 2.8 | 110111 | +1 | [001]00 | 0 |
| 20 | [1010]10 | 6 | 304 | 1.7 | 111000 | 0 | [010]01 | −1 |
| 21 | [1010]11 | 6 | 292 | 1.6 | 111001 | 0 | [010]00 | −1 |
| 22 | [1011]10 | 6 | 290 | 1.6 | 111010 | 0 | [1110]1 | −1 |
| 23 | [1110]10 | 6 | 279 | 1.6 | 111011 | 0 | [1111]1 | −1 |
| 24 | [1110]11 | 6 | 277 | 1.6 | 111100 | 0 | [1110]01 | 0 |
| 25 | [1011]11 | 6 | 263 | 1.5 | 111101 | 0 | [1110]00 | 0 |
| 26 | [1111]10 | 6 | 262 | 1.5 | 111110 | 0 | [1111]01 | 0 |
| 27 | [1111]11 | 6 | 253 | 1.4 | 111111 | 0 | [1111]00 | 0 |

And since the Terminating Condition for dividing Super Processing Units could be adjusted or fine tuned, such as changing the fixed size of the Super Processing Unit from 27 data code values to something less or something more, or changing the Terminating Value used from 000 to another code value, or using just a Terminating Value for determining the size of Super Processing Unit (in this way, the Super Processing Unit could be of varying sizes) instead of using a Terminating Value with fixed size Super Processing Unit; or one could attempt using other sizes of Code Units, (for instance using 6-value Code Units and the sets of CAABCTs designed for it) or other sizes of Processing Units as well, such as using four 6-value Code Units instead of three 6-value Code Units as a Processing Unit; there could be endless such variations under CHAN FRAMEWORK, therefore it could not be certain that random data set could never be compressed. The opposite is more certain instead. By the way, technique of changing the bit 0:bit 1 ratio mentioned in Paragraphs [62] to [66] could be used first to change the frequency distribution of the random data set to an uneven data set, which is then amenable to compression by techniques capitalizing on uneven data distribution.

The above inventive revelation discloses many novel techniques for encoding and decoding digital data set, whether random or not, for both the purposes of encryption/decryption and compression/decompression. Such techniques could be combined to achieve such purposes as intended by the designer, implementer and user. Other techniques could also be designed and implemented for use utilizing the structural traits and coding techniques introduced here under CHAN FRAMEWORK.

There is another technique, much simpler, and useful that could be used as well, either alone or in combination with the techniques introduced above. This is encoding and decoding using dynamic Processing Unit of different sizes together with dynamic adjustment of Code Value Definition using Artificial Intelligence Technique. In the above discussion of Super Processing Units, the use of the occurrence of just a Terminating Value for determining the size of a Super Processing Units results in of Super Processing Units varying in size, i.e. different number of Processing Units making up a Super Processing Unit at different positions of the digital data set. One could also encode and decode dynamically using different number of Code Units as a Processing Unit by designing an appropriate Terminating Condition for such division. In the course of encoding and decoding, there could also be dynamic adjustment to the size and therefore the definition of the code values under processing.

Let one turn to revealing the technique mentioned in Paragraph [96], i.e. the technique of using different sizes of Processing Units (in the present case, Processing Units of 3 Code Units and of 4 Code Units are used for illustration) dynamically in the context of changing data distribution, by using the design of 3-value Code Units of 0 Head Design as listed in Diagram 30 below:

Diagram 30
Processing Unit of One 3-value Code Unit

| PU Value No. | PU Code Value |
|---|---|
| Value 1 (v1) | 0 |
| Value 2 (v2) | 10 |
| Value 3 (v3) | 11 |

So the Processing Unit is either made up of three or four 3-value Code Units of 0 Head Design, depending on the changing context of the data distribution at any point under processing. This novel technique enriches the processing of encoding and decoding data of any type of data distribution whether in random or not.

Designing this technique is an outcome of using the concept of Terminating Condition. The Terminating Condition being conceived is that the Termination Point of a Processing Unit (using 3-value Code Unit of 0 Head Design here) is to be based on whether all the 3 unique Code Values of the 3-value Code Unit have come up. By logical deduction, if based on such a definition of Termination Condition, it is apparent that the Processing Unit should not be less than having the size of 3 Code Units for a 3-value Code Unit. So if all 3 unique code values have come up in three consecutive occurrence, the Processing Unit size is 3 Code Units, if not the size of Processing Unit should be more than 3 Code Units. It could be 4 or 5 or 6 and so on so forth. So it is simpler to use 4 Code Units as another Termination Point if the Termination Condition (all 3 unique Code Values of Max3 5 bit Code Unit having appeared) of the Processing Unit under the context of the data distribution is not met. That means, when 3 consecutive code values are read using the definition of 3-value Code Unit of 0 Head Design, not all the 3 unique data code values (i.e. v1, v2 and v3 as listed in Diagram 30) are present, then the Termination Point stops at the fourth code value read, so that this is a Processing Unit of 4 Code Units, whether all 3 unique Code Values have come up or not in this case; whereas if all 3 unique data code values are present upon reading 3 consecutive code values, the Termination Point is at the third code value read and the Processing Unit is made up of 3 Code Units. So the size of the Processing Unit measured in terms of the number of Code Units that it is made up of varies dynamically with the context of the data distribution of the digital data set under processing. According to the context of data distribution, if the Processing Unit should be of the size of 4 Code Units, then there are two scenarios for this:

(i) all the 3 unique code values are present; and
(ii) not all 3 unique code values are present.

So altogether there are 3 scenarios:

(a) Processing Unit of 3 Code Units where all 3 unique code values are present;
(b) Processing Unit of 4 Code Units where all 3 unique code values are present; and
(c) Processing Unit of 4 Code Units where not all 3 unique code values are present.

So one could assign Classification Code to these 3 scenarios as listed out in Diagram 31:

Diagram 31a
Scenario Classification Code (Part of CHAN CODE) for the 3 scenarios of Paragraph [98]

| Scenario Classification Code | Scenario |
|---|---|
| 0 | (a) |
| 10 | (b) |
| 11 | (c) |

Depending on the frequency distribution of these 3 scenarios, the scenario has the highest frequency could be adjusted to using the least number of binary bit. So assuming Scenario (c) has the highest frequency, the assignment of scenarios to Scenario Classification Code could be adjusted to Diagram 31b as listed below:

Diagram 31b
Scenario Classification Code (Part of CHAN CODE) for the 3 scenarios of Paragraph [98]

| Scenario Classification Code | Scenario |
|---|---|
| 0 | (c) |
| 10 | (b) |
| 11 | (a) |

So for encoding and decoding the whole digital data input file, one could first parse the whole digital data file and find out which scenario has the highest frequency and assign it to using the shortest Classification Code and push other scenarios downwards. So a Scenario Design Indicator (indicating which Scenario Classification Schema or Design is to be used) has to be included in the Header so that decoding could be done correctly.

After discussing how Classification Code of CHAN CODE could be used in the present example of illustration, it comes to see how Content Code of CHAN CODE could be designed and manipulated using another technique of CHAN CODING, i.e. dynamic code adjustment. For Scenario (a), one could use the following coding for use:

Scenario Classification Code+Rank and Position Code

Because Scenario (a) is a Processing Unit of 3 Code Units where all the 3 unique code values are present, using 2 or 3 bits [using AAB technique of CHAN CODING, for instance here the actual value range is 6, i.e. altogether there being 6 unique Processing Units of 3 Code Units meeting the Terminating Condition of Scenario (a), the lower value range is 2 bits equivalent to 4 values, and the upper value range is 3 bits equivalent to 8 values] for Rank and Position Code could be enough for covering all the 6 possible combinations of Processing Units with 3 Code Units having the 3 unique code values distinguished by their ranks and positions as follows in Diagram 32:

Diagram 32
RP Code assignment for 6 possible combinations of Processing Unit with 3 Code Units having 3 unique code values in terms of rank and position

| RP Code | Bit | +/− | Combination in terms of Rank and Position | Bit |
|---|---|---|---|---|
| 00 | 2 + 2 | −1 | v1v2v3 | 5 |
| 01 | 2 + 2 | −1 | v1v3v2 | 5 |
| 100 | 2 + 3 |  | v2v1v3 | 5 |
| 101 | 2 + 3 |  | v2v3v1 | 5 |
| 110 | 2 + 3 |  | v3v1v2 | 5 |
| 111 | 2 + 3 |  | v3v2v1 | 5 |

To do CHAN CODING for the Content Code of CHAN CODE for Scenario (b) and (c), one could use the value of the fourth data code value read, determined by the Terminating Condition. This fourth data code value, the Terminating Value, is to be represented by the original code exactly as it is read using the definition of 3-value Code Unit of 0 Head Design, i.e. without having to make any change to the original code. So the encoding for the Content Code part for Scenario (b) and (c) each includes the following steps [assuming Scenario (a) has been dealt with separately]:

(a) reading four consecutive data code values coming in using the definition of the Code Unit under concern;
(b) writing fourth data code value exactly as it is read;
(c) writing the first data code value using technique of code adjustment where appropriate;
(d) writing the second data code value using technique of code adjustment where appropriate;
(e) writing the third data code value using technique of code adjustment where appropriate; and
(f) looping back to Step (a) after finishing encoding the 4 consecutive code values read in Step (a) until it is up to the point where the Un-encoded Code Unit begins.

and the technique of code adjustment mentioned in the above Steps (c) to (e) includes content code rank and position coding, content code promotion and content code omission, content code demotion, and content code restoration where appropriate.

For Scenario (b), the fourth data code value could be one of the 3 data code values: v1, v2 or v3. So Under Scenario (b), the sub-scenarios are:

Diagram 33
3 Sub-Scenarios of Scenario (b) and RP Coding

| | Code Position | | | | |
|---|---|---|---|---|---|
| | $4^{th}$ | 1st | 2nd | 3rd | RP Code |
| (i) | v1 | v2 | v2 | v3 | 00 |
| | v1 | v2 | v3 | v2 | 01 |
| | v1 | v2 | v3 | v3 | 100 |
| | v1 | v3 | v2 | v2 | 101 |
| | v1 | v3 | v2 | v3 | 110 |
| | v1 | v3 | v3 | v2 | 111 |
| (ii) | v2 | v1 | v1 | v3 | 00 |
| | v2 | v1 | v3 | v1 | 01 |
| | v2 | v1 | v3 | v3 | 100 |
| | v2 | v3 | v1 | v1 | 101 |
| | v2 | v3 | v1 | v3 | 110 |
| | v2 | v3 | v3 | v1 | 111 |
| (iii) | v3 | v1 | v1 | v2 | 00 |
| | v3 | v1 | v2 | v1 | 01 |
| | v3 | v1 | v2 | v2 | 100 |
| | v3 | v2 | v1 | v1 | 101 |
| | v3 | v2 | v1 | v2 | 110 |
| | v3 | v2 | v2 | v1 | 111 |

For each of the 3 sub-scenarios of Scenario (b), there are also 6 possible combinations. One could use the technique of rank and position coding for each of these sub-scenarios as shown in Diagram 33 using 2 or 3 bits for each of their respective 6 possible combinations.

Or one could use the technique of code promotion as well as code omission where appropriate as follows in Diagram 34:

Diagram 34a
3 Sub-Scenarios of Scenario (b) and
Code Promotion & Code Omission

| | Code Position & Code Value | | | | Code Promotion & Code Omission | | |
|---|---|---|---|---|---|---|---|
| | $4^{th}$ | 1st | 2nd | 3rd | 1st | 2nd | 3rd |
| (i) | v1 | v2 | v2 | v3 | 0 | 0 | [omitted by logic] |
| | [as v1 will not appear in $1^{st}$, $2^{nd}$ and $3^{rd}$ position, there are 2 values, i.e. v2 and v3 to choose from; so in the first and second position, v2 is promoted to code 0, and v3 (code 1 if placed) in the third position is omitted because there must be all 3 unique values appearing in this Scenario.] | | | | | | |
| | v1 | v2 | v3 | v2 | 0 | 1 | 0 |
| | v1 | v2 | v3 | v3 | 0 | 1 | 1 |
| | v1 | v3 | v2 | v2 | 1 | 0 | 0 |
| | v1 | v3 | v2 | v3 | 1 | 0 | 1 |
| | v1 | v3 | v3 | v2 | 1 | 1 | [omitted by logic] |
| (ii) | v2 | v1 | v1 | v3 | 0 | 0 | [omitted by logic] |
| | v2 | v1 | v3 | v1 | 0 | 1 | 0 |
| | v2 | v1 | v3 | v3 | 0 | 1 | 1 |
| | v2 | v3 | v1 | v1 | 1 | 0 | 0 |
| | v2 | v3 | v1 | v3 | 1 | 0 | 1 |
| | v2 | v3 | v3 | v1 | 1 | 1 | [omitted by logic] |
| (iii) | v3 | v1 | v1 | v2 | 0 | 0 | [omitted by logic] |
| | v3 | v1 | v2 | v1 | 0 | 1 | 0 |
| | v3 | v1 | v2 | v2 | 0 | 1 | 1 |
| | v3 | v2 | v1 | v1 | 1 | 0 | 0 |
| | v3 | v2 | v1 | v2 | 1 | 0 | 1 |
| | v3 | v2 | v2 | v1 | 1 | 1 | [omitted by logic] |

Or the values that are to be placed after placing the $4^{th}$ code value could be re-arranged as in Diagram 34b as follows:

Diagram 34b
3 Sub-Scenarios of Scenario (b) and
Code Promotion & Code Omission

| | Code Position & Code Value | | | | | Code Promotion & Code Omission | | | | |
|---|---|---|---|---|---|---|---|---|---|---|
| | 4th | 1st | 2nd | 3rd | Bit | 4th | 3rd | 2nd | 1st | Bit | +/− |
| (i) | v1 | v2 | v2 | v3 | 7 | 0 | 1 | 0 | 0 | 2 + 4 | −1 |
| | v1 | v2 | v3 | v2 | 7 | 0 | 0 | 1 | 0 | 2 + 4 | −1 |
| | v1 | v2 | v3 | v3 | 7 | 0 | 1 | 1 | [ ] | 2 + 3 | −2 |
| | v1 | v3 | v2 | v2 | 7 | 0 | 0 | 0 | [ ] | 2 + 3 | −2 |
| | v1 | v3 | v2 | v3 | 7 | 0 | 1 | 0 | 1 | 2 + 4 | −1 |
| | v1 | v3 | v3 | v2 | 7 | 0 | 0 | 1 | 1 | 2 + 4 | −1 |
| (ii) | v2 | v1 | v1 | v3 | 6 | 10 | 1 | 0 | 0 | 2 + 5 | +1 |
| | v2 | v1 | v3 | v1 | 6 | 10 | 0 | 1 | 0 | 2 + 5 | +1 |
| | v2 | v1 | v3 | v3 | 7 | 10 | 1 | 1 | [ ] | 2 + 4 | −1 |
| | v2 | v3 | v1 | v1 | 6 | 10 | 0 | 0 | [ ] | 2 + 4 | |
| | v2 | v3 | v1 | v3 | 7 | 10 | 1 | 0 | 1 | 2 + 5 | |
| | v2 | v3 | v3 | v1 | 7 | 10 | 0 | 1 | 11 | 2 + 5 | |
| (iii) | v3 | v1 | v1 | v2 | 6 | 11 | 1 | 0 | 0 | 2 + 5 | +1 |
| | v3 | v1 | v2 | v1 | 6 | 11 | 0 | 1 | 0 | 2 + 5 | +1 |
| | v3 | v1 | v2 | v2 | 7 | 11 | 1 | 1 | [ ] | 2 + 4 | −1 |
| | v3 | v2 | v1 | v1 | 6 | 11 | 0 | 0 | [ ] | 2 + 4 | |
| | v3 | v2 | v1 | v2 | 7 | 11 | 1 | 0 | 1 | 2 + 5 | |
| | v3 | v2 | v2 | v1 | 7 | 11 | 0 | 1 | 1 | 2 + 5 | |

If the technique of code promotion and code omission is to be used, the placement of code values in Diagram 34b may be preferred to Diagram 34a for the sake of consistency as such a placement arrangement may be a better choice for Scenario (c) that is to be explained in Paragraph [103] below.

Taking the sub-scenario (i) Scenario (b) above, Code Promotion is a result of logical deduction for use in order to reduce bit usage. For instance, since Scenario (b) is a scenario whereby the 3 unique Code Values must all appear in the 4 consecutive code values read, after placing the Scenario Classification Code as used in Diagram 33b, and the fourth code value, for instance v1, the encoded code becomes as listed out in Diagram 35:

Diagram 35
Encoding for Scenario Classification and the 4$^{th}$ Code Value

| Scen. (b) | 4$^{th}$ code value v1 | 3$^{rd}$ code value | 2$^{nd}$ code value | 1$^{st}$ code value |
|---|---|---|---|---|
| 10 | 0 | | | | and the encoded code for the remaining 3 code values are to be filled out. Since it is Scenario (b), that means the first 3 code values, i.e. the first to the third, must be different from the 4$^{th}$ code value as it is the 4$^{th}$ code value that makes it meeting the Terminating Condition designed for Scenario (b). So the remaining 3 code values are either v2 or v3. And since there are only 2 choices, it only requires 1 bit, either bit 0 or bit 1, to represent these 2 different value occurrences. Originally v2 and v3 are represented by 10 and 11 respectively. So these code values are then promoted to using 0 and 1 respectively for saving bit usage. This is the technique of code promotion, a technique of CHAN CODING. And if the third and the second code values are all v2, then the first one must be v3, as it is so defined for Scenario (b), otherwise it could not meet Scenario (b)'s Terminating Condition. So v3 could be omitted by logical deduction because of the above reasoning. The whole piece of encoded code using the techniques of Code Promotion and Code Omission of CHAN CODING for the 4 Code Unit Processing Unit just mentioned is therefore represented in Diagram 36 as follows:

Diagram 36
Encoding using Code Promotion & Code Omission of CHAN CODING

| (b) | 4$^{th}$ code value v1 | 3$^{rd}$ code value v2 | 2$^{nd}$ code value v2 | 1$^{st}$ code value v3 |
|---|---|---|---|---|
| 10 | 0 | 0 [Code Promotion] | 0 | [ ] [Code Omission] |

It could be observed that using code promotion and code omission technique gives the same bit usage result (2*2 bits+4*3 bits as listed out in Diagram 34a and 34b) as that using rank and position coding technique in Diagram 33, these two techniques differ only in the resulting bit pattern arrangement.

Likewise for Scenario (c), the fourth data code value could be one of the 3 data code values: v1, v2 or v3. So under Scenario (c), the sub-scenarios are listed in Diagram 37:

Diagram 37
3 Sub-Scenarios of Scenario (c) and RP Coding

| | Code Position | | | | | | | |
|---|---|---|---|---|---|---|---|---|
| | 4th | 1st | 2nd | 3rd | Bit | 4th | RP Code | Bit | +/− |
| (i) | v1 | v1 | v1 | v1 | 4 | 0 | 000 | 1 + 4 | +1 |
| | v1 | v1 | v1 | v2 | 5 | 0 | 0010 | 1 + 5 | +1 |
| | v1 | v1 | v2 | v1 | 5 | 0 | 0011 | 1 + 5 | +1 |
| | v1 | v1 | v2 | v2 | 6 | 0 | 0100 | 1 + 5 | |
| | v1 | v1 | v1 | v3 | 5 | 0 | 0101 | 1 + 5 | +1 |
| | v1 | v1 | v3 | v1 | 5 | 0 | 0110 | 1 + 5 | +1 |
| | v1 | v1 | v3 | v3 | 6 | 0 | 0111 | 1 + 5 | |
| | v1 | v2 | v2 | v2 | 7 | 0 | 1000 | 1 + 5 | −1 |
| | v1 | v2 | v2 | v1 | 6 | 0 | 1001 | 1 + 5 | |
| | v1 | v2 | v1 | v2 | 6 | 0 | 1010 | 1 + 5 | |
| | v1 | v2 | v1 | v1 | 5 | 0 | 1011 | 1 + 5 | +1 |
| | v1 | v3 | v3 | v3 | 7 | 0 | 1100 | 1 + 5 | −1 |
| | v1 | v3 | v3 | v1 | 6 | 0 | 1101 | 1 + 5 | |
| | v1 | v3 | v1 | v3 | 6 | 0 | 1110 | 1 + 5 | |
| | v1 | v3 | v1 | v1 | 5 | 0 | 1111 | 1 + 5 | +1 |
| (ii) | v2 | v2 | v2 | v2 | 8 | 10 | 000 | 1 + 5 | −2 |
| | v2 | v2 | v2 | v1 | 7 | 10 | 0010 | 1 + 6 | |
| | v2 | v2 | v1 | v2 | 7 | 10 | 0011 | 1 + 6 | |
| | v2 | v2 | v1 | v1 | 6 | 10 | 0100 | 1 + 6 | +1 |
| | v2 | v2 | v2 | v3 | 8 | 10 | 0101 | 1 + 6 | −1 |
| | v2 | v2 | v3 | v2 | 8 | 10 | 0110 | 1 + 6 | −1 |
| | v2 | v2 | v3 | v3 | 8 | 10 | 0111 | 1 + 6 | −1 |
| | v2 | v1 | v1 | v1 | 5 | 10 | 1000 | 1 + 6 | +2 |
| | v2 | v1 | v1 | v2 | 6 | 10 | 1001 | 1 + 6 | +1 |
| | v2 | v1 | v2 | v1 | 6 | 10 | 1010 | 1 + 6 | +1 |
| | v2 | v1 | v2 | v2 | 7 | 10 | 1011 | 1 + 6 | |
| | v2 | v3 | v3 | v3 | 8 | 10 | 1100 | 1 + 6 | −1 |
| | v2 | v3 | v3 | v2 | 8 | 10 | 1101 | 1 + 6 | −1 |
| | v2 | v3 | v2 | v3 | 8 | 10 | 1110 | 1 + 6 | −1 |
| | v2 | v3 | v2 | v2 | 8 | 10 | 1111 | 1 + 6 | −1 |
| (iii) | v3 | v3 | v3 | v3 | 8 | 11 | 000 | 1 + 5 | −2 |
| | v3 | v3 | v3 | v2 | 8 | 11 | 0010 | 1 + 6 | −1 |
| | v3 | v3 | v2 | v3 | 8 | 11 | 0011 | 1 + 6 | −1 |
| | v3 | v3 | v2 | v2 | 8 | 11 | 0100 | 1 + 6 | −1 |
| | v3 | v3 | v1 | v3 | 7 | 11 | 0101 | 1 + 6 | |
| | v3 | v3 | v1 | v3 | 7 | 11 | 0110 | 1 + 6 | |
| | v3 | v3 | v1 | v1 | 6 | 11 | 0111 | 1 + 6 | +1 |
| | v3 | v2 | v2 | v2 | 8 | 11 | 1000 | 1 + 6 | −1 |
| | v3 | v2 | v2 | v3 | 8 | 11 | 1001 | 1 + 6 | −1 |
| | v3 | v2 | v3 | v2 | 8 | 11 | 1010 | 1 + 6 | −1 |
| | v3 | v2 | v3 | v3 | 8 | 11 | 1011 | 1 + 6 | −1 |
| | v3 | v1 | v1 | v1 | 5 | 11 | 1100 | 1 + 6 | +2 |
| | v3 | v1 | v1 | v3 | 6 | 11 | 1101 | 1 + 6 | +1 |
| | v3 | v1 | v3 | v1 | 6 | 11 | 1110 | 1 + 6 | +1 |
| | v3 | v1 | v3 | v3 | 7 | 11 | 1111 | 1 + 6 | |

For each of the 3 sub-scenarios of Scenario (c), there are also 15 possible combinations. One could use the technique of rank and position coding for each of these sub-scenarios as shown in Diagram 35 using 3 or 4 bits for each of their respective 15 possible combinations as in Diagram 37 above.

Or one could use the technique of code promotion, code omission as well as other forms of code adjustment where appropriate. Diagram 38 shows one way of code adjustment by encoding the remaining 3 code values in the order of $3^{rd}$ code value, $2^{nd}$ code value and $1^{st}$ code value after placing the $4^{th}$ code value first. Because in Scenario (c), where only 2 unique code values are present, the $4^{th}$ code value already counts one; so the remaining 3 positions have to be filled up by the one same as the $4^{th}$ code value and another one out of the remaining 2 unique code values. However, because there are then 2 choices out of 3 options, to eliminate uncertainty for reducing bit usage, the one that is other than the $4^{th}$ code value better be determined first. So for directly encoding the remaining 3 code values, encoding the code value of the $3^{rd}$ position of the Processing Unit under processing in the incoming digital data input may be the preferred choice. This is based on the conventional assumption that the chance of having 2 or more same code values going one after another is lower than that of having 2 different code values. Of course, if there is information available about the pattern of frequency distribution amongst the 3 unique code values in the digital data input under processing, such placement choice could be adjusted where such information available warrants the change. However, Diagram 38 adopts the placement arrangement in the order of $4^{th}$, $1^{st}$, $2^{nd}$ and $3^{rd}$ positions first for convenience first.

Let it be assumed that the $4^{th}$ code value is v3, so the values of the other 3 positions could be any of v1, v2 or v3. The earlier that the other one present is known, the more bit saving it could be by using the technique of code promotion. But because one of the two code values present could be any of the 3 values, v1, v2 and v3 and one of which could be v3. So it is logical to promote v3. i.e. 11 to 0 first, and v1 is then demoted to v2 and v2 to v3. And if the another one code values turns up, the choices could be limited to the 2 unique code values that already turn up. Since the fourth code value already takes the rank of v1 using the code value of bit 0, then the second unique code value that turns up could take the code value of bit 10. Using this logic, Diagram 38 is produced as follows:

Diagram 38
3 Sub-Scenarios of Scenario (c) and Code Adjustment with
Scenario Classification Code using 1 bit (bit 0)

| Code Position | | | | | | Code Adjustment | | | | | |
|---|---|---|---|---|---|---|---|---|---|---|---|
| | | | | | Scen. | | | | | | |
| 4th | 1st | 2nd | 3rd | Bit | Code | 4th | 1st | 2nd | 3rd | Bit | +/− |
| v1 | v1 | v1 | v1 | 4 | 0 | 0 | 0 | 0 | 0 | 1 + 4 | +1 |
| v1 | v1 | v1 | v2 | 5 | 0 | 0 | 0 | 0 | 10 | 1 + 5 | +1 |
| v1 | v1 | v2 | v1 | 5 | 0 | 0 | 0 | 10 | 0 | 1 + 5 | +1 |
| v1 | v1 | v2 | v2 | 6 | 0 | 0 | 0 | 10 | 1 | 1 + 5 | |
| v1 | v1 | v1 | v3 | 5 | 0 | 0 | 0 | 0 | 11 | 1 + 5 | +1 |
| v1 | v1 | v3 | v1 | 5 | 0 | 0 | 0 | 11 | 0 | 1 + 5 | +1 |
| v1 | v1 | v3 | v3 | 6 | 0 | 0 | 0 | 11 | 1 | 1 + 5 | |
| v1 | v2 | v2 | v2 | 7 | 0 | 0 | 10 | 1 | 1 | 1 + 5 | −1 |
| v1 | v2 | v2 | v1 | 6 | 0 | 0 | 10 | 1 | 0 | 1 + 5 | |
| v1 | v2 | v1 | v2 | 6 | 0 | 0 | 10 | 0 | 1 | 1 + 5 | |
| v1 | v2 | v1 | v1 | 5 | 0 | 0 | 10 | 0 | 0 | 1 + 5 | +1 |
| v1 | v3 | v3 | v3 | 7 | 0 | 0 | 11 | 1 | 1 | 1 + 5 | −1 |
| v1 | v3 | v3 | v1 | 6 | 0 | 0 | 11 | 1 | 0 | 1 + 5 | |
| v1 | v3 | v1 | v3 | 6 | 0 | 0 | 11 | 0 | 1 | 1 + 5 | |
| v1 | v3 | v1 | v1 | 5 | 0 | 0 | 11 | 0 | 0 | 1 + 5 | +1 |

Diagram 38
3 Sub-Scenarios of Scenario (c) and Code Adjustment with
Scenario Classification Code using 1 bit (bit 0)

| Code Position | | | | | | Code Adjustment | | | | | |
|---|---|---|---|---|---|---|---|---|---|---|---|
| | | | | | Scen. | | | | | | |
| 4th | 1st | 2nd | 3rd | Bit | Code | 4th | 1st | 2nd | 3rd | Bit | +/− |
| v2 | v2 | v2 | v2 | 8 | 0 | 10 | 0 | 0 | 0 | 1 + 5 | −2 |
| v2 | v2 | v2 | v1 | 7 | 0 | 10 | 0 | 0 | 10 | 1 + 6 | |
| v2 | v2 | v1 | v2 | 7 | 0 | 10 | 0 | 10 | 0 | 1 + 6 | |
| v2 | v2 | v1 | v1 | 6 | 0 | 10 | 0 | 10 | 1 | 1 + 6 | +1 |
| v2 | v2 | v2 | v3 | 8 | 0 | 10 | 0 | 0 | 11 | 1 + 6 | −1 |
| v2 | v2 | v3 | v2 | 8 | 0 | 10 | 0 | 11 | 0 | 1 + 6 | −1 |
| v2 | v2 | v3 | v3 | 8 | 0 | 10 | 0 | 11 | 1 | 1 + 6 | −1 |
| v2 | v1 | v1 | v1 | 5 | 0 | 10 | 10 | 1 | 1 | 1 + 6 | +2 |
| v2 | v1 | v1 | v2 | 6 | 0 | 10 | 10 | 1 | 0 | 1 + 6 | +1 |
| v2 | v1 | v2 | v1 | 6 | 0 | 10 | 10 | 0 | 1 | 1 + 6 | +1 |
| v2 | v1 | v2 | v2 | 7 | 0 | 10 | 10 | 0 | 0 | 1 + 6 | |
| v2 | v3 | v3 | v3 | 8 | 0 | 10 | 11 | 1 | 1 | 1 + 6 | −1 |
| v2 | v3 | v3 | v2 | 8 | 0 | 10 | 11 | 1 | 0 | 1 + 6 | −1 |
| v2 | v3 | v2 | v3 | 8 | 0 | 10 | 11 | 0 | 1 | 1 + 6 | −1 |
| v2 | v3 | v2 | v2 | 8 | 0 | 10 | 11 | 0 | 0 | 1 + 6 | −1 |
| v3 | v3 | v3 | v3 | 8 | 0 | 11 | 0 | 0 | 0 | 1 + 5 | −2 |
| v3 | v3 | v3 | v2 | 8 | 0 | 11 | 0 | 0 | 11 | 1 + 6 | −1 |
| v3 | v3 | v2 | v3 | 8 | 0 | 11 | 0 | 11 | 0 | 1 + 6 | −1 |
| v3 | v3 | v2 | v2 | 8 | 0 | 11 | 0 | 11 | 1 | 1 + 6 | −1 |
| v3 | v3 | v3 | v1 | 7 | 0 | 11 | 0 | 0 | 10 | 1 + 6 | |
| v3 | v3 | v1 | v3 | 7 | 0 | 11 | 0 | 10 | 0 | 1 + 6 | |
| v3 | v3 | v1 | v1 | 6 | 0 | 11 | 0 | 10 | 1 | 1 + 6 | +1 |
| v3 | v2 | v2 | v2 | 8 | 0 | 11 | 11 | 1 | 1 | 1 + 6 | −1 |
| v3 | v2 | v2 | v3 | 8 | 0 | 11 | 11 | 1 | 0 | 1 + 6 | −1 |
| v3 | v2 | v3 | v2 | 8 | 0 | 11 | 11 | 0 | 1 | 1 + 6 | −1 |
| v3 | v2 | v3 | v3 | 8 | 0 | 11 | 11 | 0 | 0 | 1 + 6 | −1 |
| v3 | v1 | v1 | v1 | 5 | 0 | 11 | 10 | 1 | 1 | 1 + 6 | +2 |
| v3 | v1 | v1 | v3 | 6 | 0 | 11 | 10 | 1 | 0 | 1 + 6 | +1 |
| v3 | v1 | v3 | v1 | 6 | 0 | 11 | 10 | 0 | 1 | 1 + 6 | +1 |
| v3 | v1 | v3 | v3 | 7 | 0 | 11 | 10 | 0 | 0 | 1 + 6 | |

It could be observed for Scenario (c) here that using code promotion and code omission technique gives roughly the same bit usage result (using code promotion technique here apparently slightly better) as that using rank and position coding technique.

From the above result, another observation is that those code value entries which after encoding results in expansion are those entries having more v1 code value. So if the data distribution of the data set is having more bit 0 than bit 1, it would be better to use the 1 Head Design as the definition of the Code Unit for reading the digital data set for encoding using the techniques introduced above; the three unique code values then become:

1
01
00

In this way, bit 0 will be sampled upon reading as v2 and v3 only instead of going into v1. So it is apparent that using the technique of making dynamic adjustment to the size of Processing Unit corresponding to the changing data distribution pattern of the digital data input as outlined above allows more flexibility of dynamic code adjustment during encoding. What is more, during the data parsing stage, information could be collected for arranging and assigning the three Scenarios (a), (b) and (c) with Scenario Classification Code, giving the most frequent scenario the least number of bit. And the use of 0 Head Design or 1 Head Design of Code Unit could also be selected for use in accordance with the frequency distribution of bit 0 and bit 1. And the technique of changing the ratio of bit 0 and bit 1 in the data set has been introduced in Paragraph [62] and onwards and could be applied to the random set when it is to be compressed using together with other techniques introduced as revealed above.

Through examining the bit usage results of Scenarios (a) and (b) in Diagram 32 and 34b, it is noted that where the Processing Unit has all 3 unique code values present, it is easier to make the encoding because of less patterns of varying data distribution and requiring less bit usage for use for representing those patterns, be it using RP Coding or the technique of code adjustment through code promotion and code omission. So the aforesaid mentioned design of using Processing Units of varying sizes in terms of number of Code Units used could be further improved on by changing the Terminating Condition that:

any Processing Unit used should contain all the 3 unique codes values of v1, v2 and v3 (i.e. 0, 10 and 11).

So Scenario (c) discussed above has to be eliminated by replacing it with a Processing Unit of size of 5 Code Units, or 6 Code Units, so on and so forth until 3 unique code values of v1, v2 and v3 have come up and the Termination Point stops at the Code Unit which contains the last appearing unique code value of the trio: v1, v2 and v3. And the Scenario Classification Code therefore is changed to:

Diagram 39a
Scenario Classification Code (a) for Processing Units of varying sizes based on the appearance of the last unique code values

| Scenario Classification Code | Processing Unit Size | |
|---|---|---|
| 0 | 3 consecutive Code Units | (only the last one of which has the last appearing unique code value of the trio: v1, v2 and v3) |
| 10 | 4 consecutive Code Units | |
| 110 | 5 consecutive Code Units | |
| 1110 | 6 consecutive Code Units | |
| 11110 | so on and so forth | |

Diagram 39b
Scenario Classification Code (b) for Processing Units of varying sizes based on the appearance of the last unique code values

| Scenario Classification Code | Processing Unit Size | |
|---|---|---|
| 0 | 4 consecutive Code Units | (only the last one of which has the last appearing unique code value of the trio: v1, v2 and v3, swapped here for minimizing bit usage in case frequency distribution of these scenarios warrant doing so) |
| 10 | 3 consecutive Code Units | |
| 110 | 5 consecutive Code Units | |
| 1110 | 6 consecutive Code Units | |
| 11110 | so on and so forth | |

The above Scenario Classification Codes all end on bit 0 and there will not be Scenario Classification Code ends on bit 1 if so designed. Or else the Scenario Classification Code ends on bit 1 will be just similar to Scenario (c) which is fixed in the number of Processing Units containing only one or two unique values up to that point, i.e. instead of Scenario (c): 4 Code Unit containing less than 3 unique values, it is 5 Code Unit containing less than 3 unique values, or 6 or 7, so on and so forth, depending on the number of binary bits the Scenario Code has.

So the bit usage diagrams for Scenarios (a) and (b) could be revised as follows:

Diagram 40
RP Code assignment for 6 possible combinations of 3 unique code values in terms of rank and position

| Scenario Code | RP Code | Bit | +/− | Combination in terms of Rank and Position | Bit |
|---|---|---|---|---|---|
| 0/10 | 00 | 1/2 + 2 | −1/−2 | v1v2v3 | 5 |
| 0/10 | 01 | 1/2 + 2 | −1/−2 | v1v3v2 | 5 |
| 0/10 | 100 | 1/2 + 3 | −1/−1 | v2v1v3 | 5 |
| 0/10 | 101 | 1/2 + 3 | 0/−1 | v2v3v1 | 5 |
| 0/10 | 110 | 1/2 + 3 | 0/−1 | v3v1v2 | 5 |
| 0/10 | 111 | 1/2 + 3 | 0/−1 | v3v2v1 | 5 |

Diagram 41
3 Sub-Scenarios of Scenario (b) and Code Promotion & Code Omission

| Code Position & Code Value | | | | | Promotion & Code Omission Scenario | | | | | |
|---|---|---|---|---|---|---|---|---|---|---|
| 4th | 1st | 2nd | 3rd | Bit | Code | 4th | 3rd | 2nd | 1st | Bit | +/− |
| v1 | v2 | v2 | v3 | 7 | 0/10 | 0 | 1 | 0 | 0 | 1/2 + 4 | −2/−1 |
| v1 | v2 | v3 | v2 | 7 | 0/10 | 0 | 0 | 1 | 0 | 1/2 + 4 | −2/−1 |
| v1 | v2 | v3 | v3 | 7 | 0/10 | 0 | 1 | 1 | [ ] | 1/2 + 3 | −3/−2 |
| v1 | v3 | v2 | v2 | 7 | 0/10 | 0 | 0 | 0 | [ ] | 1/2 + 3 | −3/−2 |
| v1 | v3 | v2 | v3 | 7 | 0/10 | 0 | 1 | 0 | 1 | 1/2 + 4 | −2/−1 |
| v1 | v3 | v3 | v2 | 7 | 0/10 | 0 | 0 | 1 | 1 | 1/2 + 4 | −2/−1 |
| v2 | v1 | v1 | v3 | 6 | 0/10 | 10 | 1 | 0 | 0 | 1/2 + 5 | 0/+1 |
| v2 | v1 | v3 | v1 | 6 | 0/10 | 10 | 0 | 1 | 0 | 1/2 + 5 | 0/+1 |
| v2 | v1 | v3 | v3 | 7 | 0/10 | 10 | 1 | 1 | [ ] | 1/2 + 4 | −2/−1 |
| v2 | v3 | v1 | v1 | 6 | 0/10 | 10 | 0 | 0 | [ ] | 1/2 + 4 | −1/0 |
| v2 | v3 | v1 | v3 | 7 | 0/10 | 10 | 1 | 0 | 1 | 1/2 + 5 | −1/0 |
| v2 | v3 | v3 | v1 | 7 | 0/10 | 10 | 0 | 1 | 11 | 1/2 + 5 | −1/0 |
| v3 | v1 | v1 | v2 | 6 | 0/10 | 11 | 1 | 0 | 0 | 1/2 + 5 | 0/+1 |
| v3 | v1 | v2 | v1 | 6 | 0/10 | 11 | 0 | 1 | 0 | 1/2 + 5 | 0/+1 |
| v3 | v1 | v2 | v2 | 7 | 0/10 | 11 | 1 | 1 | [ ] | 1/2 + 4 | −2/−1 |
| v3 | v2 | v1 | v1 | 6 | 0/10 | 11 | 0 | 0 | [ ] | 1/2 + 4 | −1/0 |
| v3 | v2 | v1 | v2 | 7 | 0/10 | 11 | 1 | 0 | 1 | 1/2 + 5 | −1/0 |
| v3 | v2 | v2 | v1 | 7 | 0/10 | 11 | 0 | 1 | 1 | 1/2 + 5 | −1/0 |

It is noted from Diagram 40, because of the use of one bit 0 for the Scenario (a), now renamed as Scenario 3 Code Units, the encoding result is even better for this scenario. The bit usage result for Scenario 4 Code Units in Diagram 41 is just the same as before. However considering that there might be many different (or even infinite for the worse cases) varying sizes of Processing Units, there must be a simpler logic so that programming for catering for such infinite number of scenarios that may occur. So the logic for encoding all such scenarios could change to:

(a) reading 3 consecutive data code values coming in using the definition of the Code Unit under concern and determining if the Terminating Condition is met; the Terminating Condition being the consecutive data code values so far read containing all the unique data code values of the Code Unit according to design [i.e. in this case when the code units read so far do not contain all 3 unique code values, going to Step (b) afterwards; otherwise going to Step (c)];

(b) reading 1 more data code value [i.e. when the code units read in front so far do not contain all 3 unique code values] and evaluating each time if the Terminating Condition is met until the code units read contain all 3 unique code values [i.e. the Terminating Condition in this case]; and going to Step (c) if the Terminating Condition is met;

(c) when the data code values so read contains all unique data code values [3 in this case of 3-value Code Unit], counting the number of data code values so read and determining the corresponding Scenario Classification Code Value and writing it and then writing the last data code value read exactly as it is read;

(d) using and writing 1 bit code for identifying which one of the other two unique code values that are present [for this case of 3-value Code Unit; bit 0 for the unique data code value with the higher ranking of the remaining two unique data code values discounting the unique data code value of the last one read and written in Step (c), and bit 1 for the lower ranking one; or vice versa depending on design where appropriate] starting from writing [i.e. replacing or encoding it with either bit 0 or bit 1 mentioned in this Step (d)] the one read up in the first position to the one in the last but one position, using technique of content code adjustment [including content code rank and position coding, content code promotion, content code omission, content code demotion or content code restoration where appropriate] where appropriate;

(e) looping back to Step (a) after finishing encoding the last but one data code value read in Step (a) for the Processing Unit under processing until it is up to the point where the Un-encoded Code Unit begins.

Following the above revised encoding steps, one could revise the bit usage diagrams starting from Scenario 3 Code Units as follows:

Diagram 42
Encoding and Bit Usage for Scenario 3 Code Units

| Code Position & Code Value | | | | Scenario | Content Code | | | | |
|---|---|---|---|---|---|---|---|---|---|
| 3rd | 1st | 2nd | Bit | Code | 3rd | 1st | Code Adjustment 2nd | Bit | +/− |
| v1 | v2 | v3 | 5 | 0/10 | 0 | 0 | [ ] | 1/2 + 2 | −2/−1 |
| v1 | v3 | v2 | 5 | 0/10 | 0 | 1 | [ ] | 1/2 + 2 | −2/−1 |
| v2 | v1 | v3 | 5 | 0/10 | 10 | 0 | [ ] | 1/2 + 3 | −1/0 |
| v2 | v3 | v1 | 5 | 0/10 | 10 | 1 | [ ] | 1/2 + 3 | −1/0 |
| v3 | v1 | v2 | 5 | 0/10 | 11 | 0 | [ ] | 1/2 + 3 | −1/0 |
| v3 | v2 | v1 | 5 | 0/10 | 11 | 1 | [ ] | 1/2 + 3 | −1/0 | where [ ] stands for code omission by logical deduction; and bit 0 and bit 1 encoding for the first position data code value is a code adjustment using code promotion where appropriate.

Diagram 43
Encoding and Bit Usage for Scenario 4 Code Units

| Code Position & Code Value | | | | Scenario | Code Promotion & Code Omission Content Code | | | | | |
|---|---|---|---|---|---|---|---|---|---|---|
| 4th | 1st | 2nd | 3rd | Bit | Code | 4th | 1st | 2nd | 3rd | Bit | +/− |
| v1 | v2 | v2 | v3 | 7 | 0/11 | 0 | 0 | 0 | [ ] | 1/2 + 3 | −3/−2 |
| v1 | v2 | v3 | v2 | 7 | 0/11 | 0 | 0 | 1 | 0 | 1/2 + 4 | −2/−1 |
| v1 | v2 | v3 | v3 | 7 | 0/11 | 0 | 0 | 1 | 1 | 1/2 + 4 | −2/−1 |
| v1 | v3 | v2 | v2 | 7 | 0/11 | 0 | 1 | 0 | 0 | 1/2 + 4 | −2/−1 |
| v1 | v3 | v2 | v3 | 7 | 0/11 | 0 | 1 | 0 | 1 | 1/2 + 4 | −2/−1 |
| v1 | v3 | v3 | v2 | 7 | 0/11 | 0 | 1 | 1 | [ ] | 1/2 + 3 | −3/−2 |
| v2 | v1 | v1 | v3 | 6 | 0/11 | 10 | 0 | 0 | [ ] | 1/2 + 4 | −1/0 |
| v2 | v1 | v3 | v1 | 6 | 0/11 | 10 | 0 | 1 | 0 | 1/2 + 5 | 0/+1 |
| v2 | v1 | v3 | v3 | 7 | 0/11 | 10 | 0 | 1 | 1 | 1/2 + 5 | −1/0 |
| v2 | v3 | v1 | v1 | 6 | 0/11 | 10 | 1 | 0 | 0 | 1/2 + 5 | 0/+1 |
| v2 | v3 | v1 | v3 | 7 | 0/11 | 10 | 1 | 0 | 1 | 1/2 + 5 | −1/0 |
| v2 | v3 | v3 | v1 | 7 | 0/11 | 10 | 1 | 1 | [ ] | 1/2 + 4 | −2/−1 |
| v3 | v1 | v1 | v2 | 6 | 0/11 | 11 | 0 | 0 | [ ] | 1/2 + 4 | −1/0 |
| v3 | v1 | v2 | v1 | 6 | 0/10 | 11 | 0 | 1 | 0 | 1/2 + 5 | 0/+1 |
| v3 | v1 | v2 | v2 | 7 | 0/10 | 11 | 0 | 1 | 1 | 1/2 + 5 | −1/0 |
| v3 | v2 | v1 | v1 | 6 | 0/11 | 11 | 1 | 0 | 0 | 1/2 + 5 | 0/+1 |
| v3 | v2 | v1 | v2 | 7 | 0/11 | 11 | 1 | 0 | 1 | 1/2 + 5 | −1/0 |
| v3 | v2 | v2 | v1 | 7 | 0/11 | 11 | 1 | 1 | [ ] | 1/2 + 4 | −2/−1 |

It could be seen from the above figures that if Scenario 3 Code Units, using 10 and Scenario 4 Code Units using 0 as the scenario classification codes, all entries have either breakeven or bit usage saving results.

The encoding and bit usage for Scenario 5 Code Units is a bit longer and complex to list it out. However, the encoding follows the same logic and the bit usage result could be briefly discussed as follows.

Scenario 4 Code Units using Scenario Code 10 is used as a basis for discussion. For 18 encoded entries, bit usage is reduced by 6 bits (i.e. 10 bits saved minus 4 bits lost on average). If Scenario 5 Code Units using Scenario Code 110, that means it will spend one more bit on the Scenario Code used for every encoded entry, but it will have the chance of encoding another additional data code value.

The frequency distribution in Diagram 44 of the 3 unique data code values of the 3-value Code Unit of 0 Head Design is produced by running the autoit program mentioned in the the aforesaid PCT Application under priority claim:

Diagram 44

Frequency Distribution of 3-value Code Unit using 80000 random bits

0: 26536
10: 13156
11: 13576

It could be seen that the frequency of v2 and v3 counts for slightly more than 50%, i.e. around half, and v1 slightly less than 50% just around half as well. So about half of the chance that the data code value comes up is v1 and another half of which 25% is v2 and 25% is v3. So when v1 is the $5^{th}$ data code value, then the additional data code value that comes up must be either v2 or v3, so half of the chance that 1 bit is saved; whereas if v2 or v3 is the $5^{th}$ data code value, then either v1 or v3 comes up for the case of v2 being the $5^{th}$ data code value and v1 or v2 for the case of v3 being the $5^{th}$ data code value, so that is half of the half chance that 1 bit will be saved. So on average, about 3 quarters of the chance that 1 bit is saved, i.e. ¾ bit saved. Also by logical deduction, if the first, the second and the third values are the same unique data code value, then the fourth value could be deduced; so the bit usage used for those cases will be either 2 bits or 1 bit. So overall speaking, there is not much that is lost when the number of Scenario counts up from 4 Code Units to 5 Code Units and so on. Given that if Scenario 4 Code Units using 10 (2 bits) produces a bit usage saving of 6 bits on average of the 18 encoded entries. The chance of having overall bit usage saving for the whole random data set is very likely given that fact that the frequency distribution of these Scenarios for 80000 random bits is decreasing when the Scenario number increases from 3 Code Units onwards. What is more, one could attempt to reshuffle the assignment of the first 3 most frequent Scenarios in a manner that produces the best result of bit usage saving.

Re-examination of Diagram 42 [i.e. Scenario 3 Code Units or (a)], 43 [i.e. Scenario 4 Code Units or (b)] and 38 [i.e. Scenario (c)] with a Scenario Code assignment arrangement of 2 bits (10), 2 bits (11) and 1 bit (bit 0) according to the ordering of (a), (b) and (c), it could be seen that for Scenario (a), it saves 2 bits out of 6 encoded entries (2 bits saved versus 0 bit lost, for Scenario (b), it saves 6 bits out of 18 entries (10 bits saved versus 4 bits lost), and it saves 3 bits out of 45 entries (i.e. 20 bits saved versus 17 bits lost). It appears that all 3 Scenarios (a), (b) and (c) have bit usage saving. However, the result is still subject to the frequency distribution of each encoded entries under each of these three Scenarios. The frequency distribution in Diagram 45 of these 3 scenarios using 80000 random bits however could be produced by running autoit programmes listed out in the aforesaid PCT Application under priority claim.

Diagram 45 so produced is listed as follows:

Diagram 45

Frequency Distribution of Scenarios using 80000 random bits case 10000
all: 8449
cu3: 1606
cu4: 1578
cu5: 1292
cu6: 953
cu7: 774
cu8: 575
cu9: 422
cu10: 311
cu11: 238
cu12: 191
cu13: 143
cu14: 94
cu15: 56
cu16: 49
cu17: 42
cu18: 33
cu19: 18
cu20: 16
cu21: 6
cu22: 13
cu23: 7
cu24: 7
cu25: 10
cu26: 4
cu27: 1
cu28: 3
cu29: 2
cu30: 1
cu31: 2
cu32: 0
cu33: 0
cu34: 0
cu35: 0
cu36: 0
cu37: 0
cu38: 1
rest: 1

It could be seen from the above Diagram 45 that the 80000 bits generated at random when read using the 3-value Code Unit of 0 Head Design with the Terminating Condition that 3 unique data code values should be present in the Processing Unit, once the last appearing unique data code value (the Terminating Value) comes up, these 80000 random bits produce Processing Units of varying sizes starting from 3 Code Units to 38 Code Units with the rest being the Un-encoded Code Unit. These Processing Units of varying Code Unit sizes, from 3 to 38, are listed in Diagram 45 with their frequency of occurrences in the 80000 random bits so generated at one instance.

It could be seen that the frequency of the Processing Units decreases with increasing Processing Unit sizes in general, and quite steadily from 3 Code Units to 20 Code Units. The frequency for Scenario 3 Code Units or (a) and 4 Code Units or (b) is 1606 and 1578 respectively out of 8449 processing units. So the frequency for Scenario (c) is 8449−(1606+1578=3184 or 37.68%)=5265 or 62.32%.

Given the above piece of information generated out of a data set of 80000 random bits, one could do another improvement on the encoding design. For instance, if one wishes to increase bit 1 ratio in the data set as against bit 0 ratio. One could use the following codes as Scenario Classification Codes (or Scenario Codes in short) for Scenario (a), (b) and (c) in Diagram 46:

Diagram 46
Scenario Code Assignment for Scenario (a), (b) and (c)

| Scenario Code | Scenario | % |
| --- | --- | --- |
| 1 | (c) | 62.32 |
| 01 | (a) | 19.01 |
| 00 | (b) | 18.67 |

As Scenario (c) accounts for most of the processing units, it should be given the shortest Scenario Code bit 1, and because it is intended to increase the bit 1 ratio, so the 1 Head Design of Scenario Code is adopted. For the same reasons, Scenario (a) and (b) are assigned with Scenario Code bit 01 and 00 respectively.

Another improvement is to use a reverse placement of encoded data codes in the order of $4^{th}$, $3^{rd}$, $2^{nd}$, and $1^{st}$ position on the assumption that there is less chance of two same data code values adjacent to each other, it is good for Scenario (c), increasing the chance of the appearance of the next unique data code value in addition to the $4^{th}$ data code value. What is more, upon further analysis, the reverse placement of encoded data codes in accordance with their relative position could create another trait or characteristic (the trait being whether the last data code value is different from the last but one data code value) in the ordering of data codes that could be capitalized upon in making compression for bit storage saving. This characteristic is related to the design of the Terminating Condition. For simplicity, another similar Termination Condition could be used first for illustration. Now the Termination Condition stops at 3 Code Units, the data code values are divided in just two groups or two classes, one being 3 Code Units having all the unique data code values of the 3-value Code Unit, the other being 3 Code Units NOT having all the unique data code values. So that means, the first class has 3 unique code values present and the second 2 unique code values present with 1 unique code value missing.

So these two classes have the following frequency (as listed in Diagram 47) according to the result of Diagram 45:

Diagram 47
Frequency Distribution of Processing Units of two classes in a random data set of 80000 bits: one having all 3 unique data code values (Class A), the other having less than 3 (Class B)

| Class | Frequency | % |
|---|---|---|
| A | 1606 | 19 |
| B | 6843 | 81 |
| Overall | 8449 | 100 |

Class B has overwhelming majority of data code values. One could however divide these Processing Units according to the trait that is related to the reverse placement of data code values with respective to their relative positions. For reverse placement of these data code values, one schema and design is placing the $3^{rd}$ data code value first, then the $2^{nd}$ data code value, and then the $1^{st}$ one. So for the Processing Units having all three unique data code values, the $3^{rd}$ and the $2^{nd}$ data code values must be different, for those Processing Units NOT having all three unique data code values, the $3^{rd}$ and the $2^{nd}$ data code values could either be the same or different in value. It appears that using this trait as another classifying criterion could produce better results in saving bit storage. So Scenario Code could be assigned likewise accordingly. So sub-Scenario Code bit 1 could be assigned to those Processing Units where the $3^{rd}$ and the $2^{nd}$ data code values are the same and bit 0 to those where they are different. For the Scenario Class 0 here, additional sub-scenario code bit may be assigned or such sub-scenario code bit could be combined with Content Code Bit using another novel feature of CHAN CODING, namely the use of Posterior Classification or the placement of Posterior Classification Code within Content Code of CHAN CODE. This encoding technique of CHAN CODING is better explained using actual encoding of a Processing Unit of three 3-value Code Unit using the Terminating Condition as used in Diagram 47, as listed out in Diagram 48 as follows:

Diagram 48
Encoding and Bit Usage and Bit 1/Bit 0 change with Scenario Code assigned to Scenario Class 0 and Scenario Class 1

| Data Code | | Content Code | | | | Code Adjustment | | |
|---|---|---|---|---|---|---|---|---|
| 3rd2nd1st Code Value | Bit | Scen. Code | 3rd | 2nd | 1st | Bit | +/− | Bit 1/Bit 0 |
| Class B | | | | | | | | |
| v1v1v1 000 | 3 | 1 | 0 | [ ] | 0 | 1 + 2 | 0 | +1/−1 |
| v1v1v2 0010 | 4 | 1 | 0 | [ ] | 10 | 1 + 3 | 0 | +1/−1 |
| v1v1v3 0011 | 4 | 1 | 0 | [ ] | 11 | 1 + 3 | 0 | +1/−1 |
| v2v2v2 101010 | 6 | 1 | 10 | [ ] | 10 | 1 + 5 | −1 | 0/−1 |
| v2v2v1 10100 | 5 | 1 | 10 | [ ] | 0 | 1 + 3 | −1 | 0/−1 |

-continued

Diagram 48
Encoding and Bit Usage and Bit 1/Bit 0 change with Scenario Code assigned to Scenario Class 0 and Scenario Class 1

| Data Code | | Content Code | | | | Code Adjustment | | |
|---|---|---|---|---|---|---|---|---|
| 3rd2nd1st Code Value | Bit | Scen. Code | 3rd | 2nd | 1st | Bit | +/− | Bit 1/Bit 0 |
| v2v2v3 101011 | 6 | 1 | 10 | [ ] | 11 | 1 + 4 | −1 | 0/−1 |
| v3v3v3 111111 | 6 | 1 | 11 | [ ] | 11 | 1 + 4 | −1 | −1/0 |
| v3v3v1 11110 | 5 | 1 | 11 | [ ] | 0 | 1 + 3 | −1 | −1/0 |
| v3v3v2 111110 | 6 | 1 | 11 | [ ] | 10 | 1 + 4 | −1 | −1/0 |
| | | | | | | −6 bit | 0/−6 | |
| | | | | | | out of 9 entry combinations | | |
| v1v2v1 0100 | 4 | 01 | 0 | 0 | 0 | 2 + 2 | +1 | 0/+1 |
| v1v2v2 01010 | 5 | 01 | 0 | 0 | 1 | 2 + 3 | 0 | 0/0 |
| v1v3v1 0110 | 4 | 01 | 0 | 1 | 0 | 2 + 3 | +1 | 0/+1 |
| v1v3v3 01111 | 5 | 01 | 0 | 1 | 1 | 2 + 3 | 0 | −1/+1 |
| v2v1v1 1000 | 4 | 01 | 10 | 0 | 0 | 2 + 4 | +2 | +1/+1 |
| v2v1v2 10010 | 5 | 01 | 10 | 0 | 1 | 2 + 4 | +1 | +1/0 |
| v2v3v2 101110 | 6 | 01 | 10 | 1 | 0 | 2 + 4 | 0 | −1/+1 |
| v2v3v3 101111 | 6 | 01 | 10 | 1 | 1 | 2 + 4 | 0 | −1/+1 |
| v3v1v1 1100 | 4 | 01 | 11 | 0 | 0 | 2 + 4 | +2 | +1/+1 |
| v3v1v3 11011 | 5 | 01 | 11 | 0 | 1 | 2 + 4 | +1 | 0/+1 |
| v3v2v2 111010 | 6 | 01 | 11 | 1 | 0 | 2 + 4 | 0 | 0/0 |
| v3v2v3 111011 | 6 | 01 | 11 | 1 | 1 | 2 + 4 | 0 | 0/0 |
| | | | | | | +8 bit | 0/+8 | |
| | | | | | | out of 12 entry combinations | | |
| Class A | | | | | | | | |
| v1v2v3 01011 | 5 | 00 | 0 | 0 | [ ] | 2 + 2 | −1 | −3/+2 |
| v1v3v2 01110 | 5 | 00 | 0 | 1 | [ ] | 2 + 2 | −1 | −2/+1 |
| v2v1v3 10011 | 5 | 00 | 10 | 0 | [ ] | 2 + 3 | 0 | −2/+2 |
| v2v3v1 10110 | 5 | 00 | 10 | 1 | [ ] | 2 + 3 | 0 | −1/+1 |
| v3v1v2 11010 | 5 | 00 | 11 | 0 | [ ] | 2 + 3 | 0 | −1/+1 |
| v3v2v1 11100 | 5 | 00 | 11 | 1 | [ ] | 2 + 3 | 0 | 0/0 |
| | | | | | | −2 | −9/+7 | |
| | | | | | | out of 6 entry combinations | | |

It could be seen from the above that the result is very close. The logic for encoding Processing Units assigned with Scenario Code 1 in Diagram 48 is as follows:

(a) after reading the data code values from the digital data input, and after determining the nature of data distribution of the Processing Unit under processing, if the Processing Unit belongs to the Class where the $3^{rd}$ and the $2^{nd}$ data code values are the same, writing the Scenario Code bit 1;

(b) writing the $3^{rd}$ data code value as it is;

(c) omitting the $2^{nd}$ data code value by logic; since the $2^{nd}$ data code value is to be the same as the $3^{rd}$ one, it could be omitted by logical deduction; and (d) writing the $1^{st}$ data code value using the original data code value as read using the design of the Code Unit; as the Processing Unit is one which does not have all 3 unique data code values, it could have one or two data code values only. Since one data code value has appeared as the $3^{rd}$ one already, but there could also have 3 choices to select from, so the $1^{st}$ position value could only be written as it is read directly (or the code value present in the $3^{rd}$ position is promoted to bit 0, and the other two remaining values adjusted to bit 10 or bit 11 depending on their relative rank and the $1^{st}$ position value then uses such adjusted code).

In encoding the Processing Units assigned with Scenario Code 0 in Diagram 48 is as follows:

(i) after reading the data code values from the digital data input, and after determining the nature of data distribution of the Processing Unit under processing, if the Processing Unit belongs to the Class where the $3^{rd}$ and the $2^{nd}$ data code values are NOT the same and where all unique data code values are present, writing Scenario Code Bit 00 for it; if the Processing Unit belongs to the Class where the $3^{rd}$ and the $2^{nd}$ data code values are NOT the same but where all unique data code values are NOT present, writing Scenario Code Bit 01 for it;

(ii) writing the $3^{rd}$ data code value as it is;

(iii) writing the $2^{nd}$ data code value for Processing Unit with Scenario Code 00 using the encoding logic that: as it has all unique data code values and as one data code value has appeared as the $3^{rd}$ one, there remain two choices to be selected from, so using one bit for indicating which one appears as the $2^{nd}$ data code value (bit 0 for the smaller value, bit 1 for the bigger value, where in the 0 Head Design, one could design as that v1 is the smallest value and v3 is the biggest value as where appropriate); or writing the $2^{nd}$ data code value for Processing Unit with Scenario Code 01 using the encoding logic that: as it does not have all unique data code values, and as one data code value has appeared as the $3^{rd}$ one, there still could only 2 choices (two unique values not yet present) to be selected from because of Scenario Class 0 here being defined as the class where the $3^{rd}$ and the $2^{nd}$ data code values are NOT the same, so using one bit for indicating which one appears as the $2^{nd}$ data code value (bit 0 for the smaller value v1 and bit 1 for the bigger value v3); and (iv) for Processing Unit assigned with Scenario Code 00, the $1^{st}$ data code value could be omitted; for Processing Unit assigned with Scenario Code 01, the $1^{st}$ data code value could be encoded and written using the encoding logic that: as two different data code values have appeared in the $3^{rd}$ and the $2^{nd}$ position, and Scenario Class 01 is where Not all 3 unique data code values are present, that means the data code value in the $1^{st}$ position must be one out of the two values in the $3^{rd}$ and the $2^{nd}$ position, so encoding and writing the $1^{st}$ position data code value using another bit (bit 0 for the smaller value v1 and bit 1 for the bigger value v3).

The use of Posterior Classification in one form may help to further reduce the bit storage a little bit. In the present example, the placement of Posterior Classification Code could be done in two ways:

(a) for Processing Units assigned with Scenario Code 00 and 01, the second bit is for distinguishing if it belongs to Class A (the class with all unique data code values) or Class B (the class not having all unique data code values). The second bit of the Scenario Code could be dispensed with through combining the following content codes:

combining the bit for encoding the second data code value in Class A and with the bit for the second data code value and the bit for the first data code value of Class B; as there are 6 combinations of these encoded codes to be represented; 2 or 3 bits are to be used after writing the encoded code values of these 6 combinations in the following assignment in Diagram 49:

---
Diagram 49
Scenario Code combined with Content Code

| | |
|---|---|
| 00 | for Class A Processing Units under Scenario Code 0 where bit 0 is assigned to the $2^{nd}$ data code value; |
| 01 | for Class A Processing Units under Scenario Code 0 where bit 1 is assigned to the $2^{nd}$ data code value; |
| 100 | for Class B Processing Units under Scenario Code 0 where bit 0 is assigned to the $2^{nd}$ data code value and bit 0 assigned to the $1^{st}$ data code value; |
| 101 | for Class B Processing Units under Scenario Code 0 where bit 0 is assigned to the $2^{nd}$ data code value and bit 1 assigned to the $1^{st}$ data code value; |
| 110 | for Class B Processing Units under Scenario Code 0 where bit 1 is assigned to the $2^{nd}$ data code value and bit 0 assigned to the $1^{st}$ data code value; and |
| 111 | for Class B Processing Units under Scenario Code 0 where bit 1 is assigned to the $2^{nd}$ data code value and bit 1 assigned to the $1^{st}$ data code value. |
---

Using the above assignment, the second bit of Scenario Codes 00 and 01 could be taken away, and the first encoded code written for these Processing Units is Scenario Code 0, and then it is followed by the $3^{rd}$ data code value written as it is read and then followed by the above combined Scenario and Content Code using 2 to 3 bits. The result of bit usage is exactly the same as the result produced in Diagram 48 in terms of bit usage; and (b) however, there is another novel way of combining Scenario Code with Content Code, using the following logic:

(i) upon encoding and writing the Scenario Code 0, the $3^{rd}$ data code value and the $2^{nd}$ data code value for those Processing Units under Scenario Code 0 (the second bit of which is designed to be done away with), an exiting code combined out of the second bit of the Scenario Code 0 and the Content Code of the $1^{st}$ data code value of Class B under Scenario Code 0 could be created as follows in Diagram 50:

---
Diagram 50
Posterior Hybrid Classification and Content Code as Exiting Code

| | |
|---|---|
| 1 | existing code for and representing Class B Processing Unit under Scenario Code 0 where the $1^{st}$ data code value is bit 0; |
| 01 | existing code for and representing Class B Processing Unit under Scenario Code 0 where the $1^{st}$ data code value is bit 1; |
| 00 | existing code for and representing Class A Processing Unit under Scenario Code 0 where no processing is to be done upon exiting after the $3^{rd}$ and the $2^{nd}$ data code value have been encoded and written; | and such exiting codes are to be used upon decoding for correct restoration of the original digital data information.
--- and such exiting codes are to be used upon decoding for correct restoration of the original digital data information.

Depending on the frequency distribution of the Processing Units involved in the data distribution. The above technique could be used for better bit storage saving. For a random data set used in the aforesaid example of 80000 bits, the frequency of Class B Processing Units is 6843 out of a total number of Processing Units: 8449 as listed out in Diagram 45. About half of this 6843 goes to Scenario 01, and half of these having the $1^{st}$ data code value using bit 0 upon encoding, which now is represented by exiting code bit 1 and the second bit of the Scenario Code 01 is stripped off, so saving 1 bit for this half of the 6843 Processing Units, equivalent to saving about 3422/2, i.e. about 1711 bits. And the exiting code for the other half of these 6843 Processing Units uses the exiting code of bit 01, so using 2 bits of the existing code to replace the original $2^{nd}$ bit of the Scenario Code 01 and the bit 0/1 used for the encoded code representing the original 1 data code value. So there is no loss in bit usage for this half of the Class B Processing Units. For Class A Processing Units under Scenario Code 00, it uses the exiting code of bit 00, the original second bit of the Scenario Code 00 now being stripped off could only account for 1 bit of the 2 bits of the exiting code; as its $1^{st}$ data code value is omitted by logic, the other bit of the exiting code for it could not be accounted for but represents a bit usage loss. And the frequency for these Class A Processing Units is 1606. Against the 1711 bits saved above for the Class B Processing Units, the balance is 1711 minus 1606=105 bits of bit usage saving. Out of the 80000 random bits, it novel feature alone could help to save around 105 bits. The technique so far presented also could be applied to using other Scenarios such as Scenarios (a), (b) and (c) or Scenarios 3 Code Units, 4 Code Units and the rest.

The previous example of Processing Units of Class A and B being divided into two Scenarios 0 and 1 shows how data code values could be classified in hybrid Classification and Content Code in combination and placed in a posterior manner as contrary to the conventional placement in anterior position. Another novel feature of data classification could only be used with embedded or interior Classification Code. Diagram 51 shows the result using this novel feature:

Diagram 51a
Anterior Classification Code and Class A Processing Units

| Data Code | | Content Code | | | | | |
|---|---|---|---|---|---|---|---|
| | | | Code Adjustment | | | | |
| 3rd2nd1st Code Value | Bit | Scen. Code | 3rd | 2nd | 1st | Bit | +/− | Bit 1/Bit 0 |
| Class A | | | | | | | | |
| v1v2v3 01011 | 5 | 00 | 0 | 0 | [ ] | 2 + 2 | −1 | −3/+2 |
| v1v3v2 01110 | 5 | 00 | 0 | 1 | [ ] | 2 + 2 | −1 | −2/+1 |
| v2v1v3 10011 | 5 | 00 | 10 | 0 | [ ] | 2 + 3 | 0 | −2/+2 |
| v2v3v1 10110 | 5 | 00 | 10 | 1 | [ ] | 2 + 3 | 0 | −1/+1 |
| v3v1v2 11010 | 5 | 00 | 11 | 0 | [ ] | 2 + 3 | 0 | −1/+1 |
| v3v2v1 11100 | 5 | 00 | 11 | 1 | [ ] | 2 + 3 | 0 | 0/0 |
| | | | | | | | −2 | −9/+7 |
| | | | | | | | | out of 6 entry combinations |

This exactly is the Class A part of Diagram 48;

Diagram 51b
Interior or Embedded Classification Code for Class B Processing Units sub-divided using the criterion of whether the $3^{rd}$ and the $2^{nd}$ data code values are the same value or not

| Data Code | | Content Code | | | | |
|---|---|---|---|---|---|---|
| | | | Code Adjustment | | | |
| 3rd2nd1st Code Value | Bit | 3rd | Scen. Code | 2nd | 1st | Bit +/− | Bit 1/Bit 0 |
| Class B (where the $3^{rd}$ and the $2^{nd}$ are different) | | | | | | | |
| v1v2v1 0100 | 4 | 01 | 0 | 0 | 0 | 2 + 1 + 2 + 1 | 0/+1 |
| v1v2v2 01010 | 5 | 01 | 0 | 0 | 1 | 2 + 1 + 2 0 | 0/0 |
| v1v3v1 0110 | 4 | 01 | 0 | 1 | 0 | 2 + 1 + 2 + 1 | 0/+1 |
| v1v3v3 01111 | 5 | 01 | 0 | 1 | 1 | 2 + 1 + 2 0 | −1/+1 |
| v2v1v1 1000 | 4 | 10 | 0 | 0 | 0 | 2 + 1 + 2 + 1 | 0/+1 |
| v2v1v2 10010 | 5 | 10 | 0 | 0 | 1 | 2 + 1 + 2 0 | 0/0 |
| v2v3v2 101110 | 6 | 10 | 0 | 1 | 0 | 2 + 1 + 2 − 1 | −2/+1 |
| v2v3v3 101111 | 6 | 10 | 0 | 1 | 1 | 2 + 1 + 2 − 1 | −2/+1 |
| v3v1v1 1100 | 4 | 11 | 0 | 0 | 0 | 2 + 1 + 2 + 1 | 0/+1 |
| v3v1v3 11011 | 5 | 11 | 0 | 0 | 1 | 2 + 1 + 2 0 | −1/+1 |
| v3v2v2 111010 | 6 | 11 | 0 | 1 | 0 | 2 + 1 + 2 − 1 | −1/0 |
| v3v2v3 111011 | 6 | 11 | 0 | 1 | 1 | 2 + 1 + 2 − 1 | −1/0 |
| | | | | | | === | === |
| | | | | | | 0 bit | 0/+8 |
| | | | | | | | out of 12 entry combinations |

-continued

Diagram 51b
Interior or Embedded Classification Code for Class B Processing Units sub-divided using
the criterion of whether the $3^{rd}$ and the $2^{nd}$ data code values are the same value or not

| Data Code 3rd2nd1st Code Value | Bit | Content Code | | | | Code Adjustment | |
|---|---|---|---|---|---|---|---|
| | | 3rd | Scen. Code | 2nd | 1st | Bit +/− | Bit 1/Bit 0 |
| Class B (where the $3^{rd}$ and the $2^{nd}$ are the same) | | | | | | | |
| v1v1v1 000 | 3 | 01 | 1 | [] | 0 [written as 0, no need to write 01 as it is used inside Content Code, not as head] | 2 + 1 + 1 + 1 | +2/−1 |
| v1v1v2 0010 | 4 | 01 | 1 | [] | 10 [10 written as it is as before] | 2 + 1 + 2 + 1 | +2/−1 |
| v1v1v3 0011 | 4 | 01 | 1 | [] 11 | [11 written as it is as before] | 2 + 1 + 2 + 1 | + 2/−1 |
| v2v2v2 101010 | 6 | 10 | 1 | [] | 10 | 2 + 1 + 2 − 1 | 0/−1 |
| v2v2v1 10100 | 5 | 10 | 1 | [] | 0 | 2 + 1 + 1 − 1 | 0/−1 |
| v2v2v3 101011 | 6 | 10 | 1 | [] | 11 | 2 + 1 + 2 − 1 | 0/−1 |
| v3v3v3 111111 | 6 | 11 | 1 | [] | 11 | 2 + 1 + 2 − 1 | −1/0 |
| v3v3v1 11110 | 5 | 11 | 1 | [] | 0 | 2 + 1 + 1 − 1 | −1/0 |
| v3v3v2 111110 | 6 | 11 | 1 | [] | 10 | 2 + 1 + 2 − 1 | −1/0 |
| | | | | | | === −3 bit out of 9 entry combinations | === +3/−6 |

As for Class A, there are 2 bits saving out of 6 entry combinations; and for Class B with different values for the $3^{rd}$ and the $2^{nd}$ data code values, there is no saving or loss apparently out of 12 combinations; and for Class B with the same value for the $3^{rd}$ and the $2^{nd}$ data code values, there are 3 bits saving out of 9 entry combinations apparently. As said before, one could use other techniques, such as the technique of changing ratio of bit 0:bit 1 or using Super Processing Units having uneven data for the whole random data set first before carrying out using the techniques in this example. And this is only an example out of many many possible scenarios to be designed for using the techniques mentioned in this example.

The above example of classification is based on four classes using Classification Code: 00 for Class A Processing Units, however what is novel is about the use of 01, 10 and 11 which are actually Content Codes by itself with a slight modification for v1, from bit 0 to bit 01 so that these Content Codes are qualified to be used as Classification Codes; whereas when being used in the encoding processing as part of the content codes, the encoded code value of v1, i.e. 01, is reverted to the shorter form as 0 only as this will not be mistaken inside the content code part, not being used as Classification Code at the head of the encoded Processing Unit. In the above example, it therefore also demonstrates vividly the usefulness of this technique of using Content Code as Classification Code, albeit with modification. This is another technique of CHAN CODING used in producing CHAN CODE.

Diagram 52 shows that Classification Code could use Content Code (with slight modification) as a substitute as follows:

Diagram 52
Modified Content Code used as Classification Code for
Class B Processing Units sub-divided using the criterion
of whether the $3^{rd}$ and the $2^{nd}$ data code values are the same
value or not

| Data Code 3rd2nd1st Code Value | Bit | Content Code | | | | Code Adjustment | |
|---|---|---|---|---|---|---|---|
| | | 3rd | 2nd | 1st | Bit | +/− | Bit 1/Bit 0 |
| Class B (where the $3^{rd}$ and the $2^{nd}$ are different) | | | | | | | |
| v1v2v1 0100 | 4 | 01 | 10 | 0 | 5 | +1 | 0/+1 |
| v1v2v2 01010 | 5 | 01 | 10 | 1 | 5 | 0 | 0/0 |
| v1v3v1 0110 | 4 | 01 | 11 | 0 | 5 | +1 | 0/+1 |
| v1v3v3 01111 | 5 | 01 | 11 | 1 | 5 | 0 | −1/+1 |
| v2v1v1 1000 | 4 | 10 | 0 | 0 | 4 | 0 | 0/+1 |
| v2v1v2 10010 | 5 | 10 | 0 | 1 | 4 | −1 | 0/0 |
| v2v3v2 101110 | 6 | 10 | 11 | 0 | 5 | −1 | −2/+1 |
| v2v3v3 101111 | 6 | 10 | 11 | 1 | 5 | −1 | −2/+1 |
| v3v1v1 1100 | 4 | 11 | 0 | 0 | 4 | 0 | 0/+1 |
| v3v1v3 11011 | 5 | 11 | 0 | 1 | 4 | −1 | −1/+1 |
| v3v2v2 111010 | 6 | 11 | 10 | 0 | 5 | −1 | −1/0 |

Diagram 52
Modified Content Code used as Classification Code for
Class B Processing Units sub-divided using the criterion
of whether the $3^{rd}$ and the $2^{nd}$ data code values are the same
value or not

| Data Code 3rd2nd1st Code Value | Bit | Content Code 3rd | Code Adjustment 2nd | 1st | Bit | +/− | Bit 1/Bit 0 |
|---|---|---|---|---|---|---|---|
| v3v2v3 111011 | 6 | 11 | 10 | 1 | 5 | −1 | −1/0 |
| | | | | | === | === | |
| | | | | | −4 bit | 0/+8 | |
| | | | | out of 12 entry combinations | | | |

Class B
(where the $3^{rd}$ and the $2^{nd}$ are the same)

| | | | | | | | |
|---|---|---|---|---|---|---|---|
| v1v1v1 000 | 3 | 01 | 0 | 0 | 4 | +1 | +2/−1 |
| | | [written as 0, no need to write 01 as it is used inside Content Code, not as head] | | | | | |
| v1v1v2 0010 | 4 | 01 | 0 | 10 | 5 | +1 | +2/−1 |
| | | [10 written as it is as before] | | | | | |
| v1v1v3 0011 | 4 | 01 | 0 | 11 | 5 | +1 | +2/−1 |
| | | [11 written as it is as before] | | | | | |
| v2v2v2 101010 | 6 | 10 | 10 | 10 | 6 | 0 | 0/−1 |
| v2v2v1 10100 | 5 | 10 | 10 | 0 | 5 | 0 | 0/−1 |
| v2v2v3 101011 | 6 | 10 | 10 | 11 | 6 | 0 | 0/−1 |
| v3v3v3 111111 | 6 | 11 | 11 | 11 | 6 | 0 | −1/0 |
| v3v3v1 11110 | 5 | 11 | 11 | 0 | 5 | 0 | −1/0 |
| v3v3v2 111110 | 6 | 11 | 11 | 10 | 6 | 0 | −1/0 |
| | | | | | === | === | |
| | | | | | +3 bit | +3/−6 | |
| | | | | out of 9 entry combinations | | | |

After revealing the aforesaid various classification techniques, one could evaluate which techniques are most useful for the digital data set under processing. And according to the selection of classification techniques for use, a re-classification and re-distribution of data code values for encoding and decoding may be found to be necessary and appropriate for the intended purpose. Diagram 53 is a result upon such deliberation: the most useful technique is to make correct identification of the trait that could be used to make the right classification of data code values. Under the present design and schema being discussed, many techniques have been developed, designed and implemented for use in the diagrams presented in the preceding paragraphs. It could be observed that while some code entry combinations make bit saving, the saving is far more than offset by others which produce bit loss. So this trait or characteristic is the one that has to be investigated; that is to find out the offending entry combinations that used to make bit loss on encoding using the various techniques of CHAN CODING discussed above. It is apparent that if the offending entry combinations making losses are grouped together and those friendly entry combinations making savings grouped likewise, then this could enhance the chance of success. Diagram 53 uses this as the primary criterion for data classification here and other techniques of CHAN CODING, such as code adjustment through code promotion, code omission, code replacement and after all the most essential technique of Absolute Address Branching with the use of range, for the subsequent encoding:

Diagram 53
Data Classification based on Compressible and Incompressible data value entries before
code re-distribution, with Frequency using Diagram 21 in Paragraph [75]

| 3rd2nd1st Code Value | Bit | Scen. Code | 3rd2nd1st | Bit | +/− | Bit 1/Bit 0 | Frequency |
|---|---|---|---|---|---|---|---|
| Class Incompressible: using AAB technique for encoding with range (actual value range: 7, lower value range: 2 bits for 4; upper value range: 3 bits for 8) | | | | | | | |
| v1v1v1 000 | 3 | 0 | 00 | 4 | 0 | 0/0 | 2273 |
| v1v1v2 0010 | 4 | 0 | 010 | 4 | 0 | 0/0 | 1175 |
| v1v1v3 0011 | 4 | 0 | 011 | 4 | 0 | 0/0 | 1149 |
| v1v2v1 0100 | 4 | 0 | 100 | 4 | 0 | 0/0 | 1123 |
| v1v3v1 0110 | 4 | 0 | 101 | 4 | 0 | 0/0 | 1060 |
| v2v1v1 1000 | 4 | 0 | 110 | 4 | 0 | +1/−1 | 1045 |
| v3v1v1 1100 | 4 | 0 | 111 | 4 | 0 | +1/−1 | 1072 |
| | | | | | === | === | |
| | | | | | 0 | +2/−2 | |
| | | | | out of 7 entry combinations | | | |

-continued

Diagram 53
Data Classification based on Compressible and Incompressible data value entries before
code re-distribution, with Frequency using Diagram 21 in Paragraph [75]

| 3rd2nd1st Code Value | Bit | Scen. Code | 3rd2nd1st | Bit | +/− | Bit 1/Bit 0 | Frequency |
|---|---|---|---|---|---|---|---|
| Class Compressible; where the $3^{rd}$ and the $2^{nd}$ position values are different and encoding using code adjustment techniques ||||||||
| [v1v2v1] [vacant code seat to be filled] [re-grouped under Class Incompressible] | | 10 | 0 0 0 | 5 | | | |
| v1v2v2 01010 | 5 | 10 | 0 0 1 | 5 | 0 | 0/0 | 531 |
| [v1v3v1] [vacant code seat to be filled] [re-grouped under Class Incompressible] | | 10 | 0 1 0 | 5 | | | |
| v1v3v3 01111 | 5 | 10 | 0 1 1 | 5 | 0 | −1/+1 | 542 |
| [v2v1v1] [vacant code seat to be filled] [re-grouped under Class Incompressible] | | 10 | 10 0 0 | 6 | | | |
| v2v1v2 10010 | 5 | 10 | 10 0 1 | 6 | +1 | 0/0 | 542 |
| v2v3v2 101110 | 6 | 10 | 10 1 0 | 6 | 0 | −1/+1 | 266 |
| v2v3v3 101111 | 6 | 10 | 10 11 | 6 | 0 | −1/+1 | 294 |
| [v3v1v1] [vacant code seat to be filled] [re-grouped under Class Incompressible] | | 10 | 11 0 0 | 6 | | | |
| v3v1v3 11011 | 5 | 10 | 11 0 1 | 6 | +1 | 0/+1 | 561 |
| v3v2v2 111010 | 6 | 10 | 11 1 0 | 6 | 0 | 0/0 | 277 |
| v3v2v3 111011 | 6 | 10 | 11 1 1 | 6 | 0 | 0/0 | 279 |
| | | | | | === +2 bit | === −3/+4 | |
| | | | | | out of 12 entry combinations | | |
| Class Compressible: where the $3^{rd}$ and the $2^{nd}$ position values are the same and encoding using code adjustment techniques ||||||||
| [v1v1v2] [vacant code seat to be filled] [re-grouped under Class Incompressible] | | 11 | 0 [] 0 | 4 | | | |
| [v1v1v3] [vacant code seat to be filled] [re-grouped under Class Incompressible] | | 11 | 0 [] 1 | 4 | | | |
| v2v2v1 10100 | 5 | 11 | 10 [] 0 | 5 | 0 | +1/−1 | 551 |
| v2v2v3 101011 | 6 | 11 | 10 [] 1 | 5 | −1 | 0/−1 | 288 |
| v3v3v1 11110 | 5 | 11 | 11 [] 0 | 5 | 0 | 0/0 | 591 |
| v3v3v2 111110 | 6 | 11 | 11 [] 1 | 5 | −1 | 0/−1 | 262 |
| | | | | | === +2 bit | === +1/−3 | |
| | | | | | out of 6 entry combinations | | |
| Class Compressible: where the following 2 entry combinations are exception for re-distribution to two preceding entry combinations as appropriate ||||||||
| v2v2v2 101010 (for code re-distribution by code re-filling) | 6 | | | | | | 276 |
| v3v3v3 111111 (for code re-distribution by code re-filling) | 6 | | | | | | 304 |
| | | | | | | === 2 entry combinations | |
| Class Compressible: where all 3 code values are unique, encoded code to be re-assigned ||||||||
| v1v2v3 01011 | 5 | | | | | | 593 |
| v1v3v2 01110 | 5 | | | | | | 548 |

Diagram 53
Data Classification based on Compressible and Incompressible data value entries before code re-distribution, with Frequency using Diagram 21 in Paragraph [75]

| 3rd2nd1st Code Value | Bit | Scen. Code | 3rd2nd1st | Bit | +/− | Bit 1/Bit 0 | Frequency |
|---|---|---|---|---|---|---|---|
| v2v1v3 10011 | 5 | | | | | | 576 |
| v2v3v1 10110 | 5 | | | | | | 559 |
| v3v1v2 11010 | 5 | | | | | | 508 |
| v3v2v1 11100 | 5 | | | | | | 540 |
| | | | | | | === ==== | |
| | | | | | | out of 6 entry combinations | |

It could be seen from the above Diagram 53 that there are 2 types of code adjustment that have to be made:

(a) code swapping; v2v1v2 and v3v1v3, the encoded code each of which uses 6 bits instead of the 5 bit used by the original code, resulting in bit loss; so their encoded codes have to be swapped with v2v2v3 and v3v3v2, each of which uses 5 bits instead of the 6 bits used by the original code, resulting in bit gain; so swapping the encoded codes between these pairs makes a balance of bit usage, resulting in no bit loss nor bit gain; (b) code re-assignment or re-distribution or re-filling; there are 2 vacant code seats or addresses in the Class Incompressible with same $3^{rd}$ and $2^{nd}$ values: the encoded codes for these two vacant code addresses of v1v1v2 and v1v1v3 are 1100 and 1101, each of these 2 encoded codes uses 4 bits; and there are 4 vacant code seats or addresses in the Class Incompressible with different $3^{rd}$ and $2^{nd}$ values, the encoded codes for these four vacant code addresses are as follows: v1v2v1 with encoded code as 10000 using 5 bits, v1v3v1 with encoded code as 10010 using 5 bits, v2v1v1 with encoded code as 101000 using 6 bits and v3v1v1 with encoded code as 101100 using 6 bits. So there are now 6 vacant code addresses to be re-filled. The two vacant code seats could be filled up first by using up the two exception entry combinations: v2v2v2 and v3v3v3. So there remains only 4 vacant code seats: 2 using 4 bits and 2 using 5 bits for accommodating 6 entry combinations of Class Compressible with Processing Units having 3 unique data code values using 5 bits. So the first two using 5 bits un-accommodated Processing Units with all 3 unique data code values could be used to re-fill the two vacant code seats first; remaining 4 un-accommodated 5-bit Processing Units are left behind to be placed into the remaining 2 4-bit code vacant addresses. And Diagram 54 shows the situation upon such code re-distribution as follows:

Diagram 54
Data Classification based on Compressible and Incompressible data value entries upon code re-distribution, with Frequency using Diagram 21 in Paragraph [75]

| 3rd2nd1st Code Value | Bit | Scen. Code | 3rd2nd1st | Bit | +/− | Bit 1/Bit 0 | Frequency |
|---|---|---|---|---|---|---|---|
| Class Incompressible: using AAB technique for encoding with range | | | | | | | |
| v1v1v1 000 | 3 | 0 | 00 | 4 | 0 | 0/0 | 2273 |
| v1v1v2 0010 | 4 | 0 | 010 | 4 | 0 | 0/0 | 1175 |
| v1v1v3 0011 | 4 | 0 | 011 | 4 | 0 | 0/0 | 1149 |
| v1v2v1 0100 | 4 | 0 | 100 | 4 | 0 | 0/0 | 1123 |
| v1v3v1 0110 | 4 | 0 | 101 | 4 | 0 | 0/0 | 1060 |
| v2v1v1 1000 | 4 | 0 | 110 | 4 | 0 | −1/+1 | 1045 |
| v3v1v1 1100 | 4 | 0 | 111 | 4 | 0 | −1/+1 | 1072 |
| | | | | | | === === | |
| | | | | | | 0 −2/+2 | |
| | | | | | | out of 7 entry combinations | |
| Class Compressible; where the $3^{rd}$ and the $2^{nd}$ position values are different and encoding using code adjustment techniques | | | | | | | |
| [v1v2v1] [re-filled as below] | | 10 | 0 0 0 | 5 | 0 | −2/+2 | |
| v1v2v3 01011 | 5 | | | | | | 593 |
| v1v2v2 01010 | 5 | 10 | 0 0 1 | 5 | 0 | 0/0 | 531 |

Diagram 54
Data Classification based on Compressible and Incompressible data value entries upon code re-distribution, with Frequency using Diagram 21 in Paragraph [75]

| 3rd2nd1st Code Value | Bit | Scen. Code | 3rd2nd1st | Bit | +/− | Bit 1/Bit 0 | Frequency |
|---|---|---|---|---|---|---|---|
| [v1v3v1] [re-filled as below] | | 10 | 0 1 0 | 5 | 0 | −1/+1 | |
| v1v3v2 01110 | 5 | | | | | | 548 |
| v1v3v3 01111 | 5 | 10 | 0 1 1 | 5 | 0 | −1/+1 | 542 |
| [v2v1v1] [re-filled as below] | | 10 | 10 0 0 | 6 | 0 | −1/+1 | |
| v2v2v2 101010 | 6 | | | | | | 276 |
| v2v1v2 10010 swapped with using | 5 | [10 11 | 10 0 1 10 [] 1 | 6 5 | +1 0 | 0/0] +2/−2 | 542 |
| v2v3v2 101110 | 6 | 10 | 10 1 0 | 6 | 0 | −1/+1 | 266 |
| v2v3v3 101111 | 6 | 10 | 10 1 1 | 6 | 0 | −1/+1 | 294 |
| [v3v1v1] [re-filled as below] | | 10 | 11 0 0 | 6 | 0 | −3/+3 | |
| v3v3v3 111111 | 6 | | | | | | 304 |
| v3v1v3 11011 swapped with using | 5 | [10 11 | 11 0 1 11 [] 1 | 6 5 | +1 0 | 0/+1] +1/−1 | 561 |
| v3v2v2 111010 | 6 | 10 | 11 1 0 | 6 | 0 | 0/0 | 277 |
| v3v2v3 111011 | 6 | 10 | 11 1 1 | 6 | 0 | 0/0 | 279 |
| | | | | | === +2 bit | === −7/+7 | |
| | | | | out of 8 entry combinations | | | |

Class Compressible: where the $3^{rd}$ and the $2^{nd}$ position values are the same and encoding using code adjustment techniques

| 3rd2nd1st Code Value | Bit | Scen. Code | 3rd2nd1st | Bit | +/− | Bit 1/Bit 0 | Frequency |
|---|---|---|---|---|---|---|---|
| [v1v1v2] [vacant code seat to be filled] [re-grouped under Class Incompressible] | | 11 | 0 [] 0 | 4 | | | |
| [v1v1v3] [vacant code seat to be filled] [re-grouped under Class Incompressible] | | 11 | 0 [] 1 | 4 | | | |
| v2v2v1 10100 | 5 | 11 | 10 [] 0 | 5 | 0 | +1/−1 | 551 |
| v2v2v3 101011 swapped with using | 6 | [11 10 | 10 [] 1 10 0 1 | 5 6 | −1 0 | 0/−1] −1/+1 | 288 |
| v3v3v1 11110 | 5 | 11 | 11 [] 0 | 5 | 0 | 0/0 | 591 |
| v3v3v2 111110 swapped with using | 6 | [11 10 | 11 [] 1 11 0 1 | 5 6 | −1 0 | 0/−1] −1/+1 | 262 |
| | | | | | === −2 bit | === −1/+1 | |
| | | | | out of 6 entry combinations | | | |

So up to here, it seems two of the remaining 4 5-bit Processing Units have to be used to re-fill the remaining two 4-bit vacant code addresses, resulting in 1 bit saving for each seat; and the yet remaining two un-accommodated 5-bit Processing Units have to use AAB technique to double them with 2 6-bit code addresses (choosing the entry combinations with the lowest frequency) already taken up by other two entry combinations, resulting in 4 7-bit entry combinations and a loss of 2*(7−5+7−6)=6 bits. However, it is an appropriate use of the AAB technique, which could be used in a novel way for the purpose of creating new code addresses. So using the AAB technique, by adding one more bit to the 2 4-bit vacant code addresses, one could get 2*2 5-bit vacant code addresses, making up 4 5-bit vacant code addresses available, enough for holding up the 4 5-bit un-accommodated Processing Units with all 3 unique data code values, without having to incur any bit loss. The final result, all breakeven in terms of bit usage: without bit gain or bit loss for this example is then listed out in Diagram 55 as follows:

Diagram 55
Breakeven upon re-distribution of code addresses and code entry values listed out in Diagram 53

| 3rd2nd1st Code Value | Bit | Scen. Code | 3rd2nd1st | Bit | +/− | Bit 1/Bit 0 | Frequency |
|---|---|---|---|---|---|---|---|
| \multicolumn{8}{c}{Class Incompressible: using AAB technique for encoding with range} | | | | | | | |

| 3rd2nd1st Code Value | Bit | Scen. Code | 3rd2nd1st | Bit | +/− | Bit 1/Bit 0 | Frequency |
|---|---|---|---|---|---|---|---|
| v1v1v1 000 | 3 | 0 | 0 0 0 | 4 | 0 | 0/0 | 2273 |
| v1v1v2 0010 | 4 | 0 | 0 0 1 0 | 4 | 0 | 0/0 | 1175 |
| v1v1v3 0011 | 4 | 0 | 0 0 1 1 | 4 | 0 | 0/0 | 1149 |
| v1v2v1 0100 | 4 | 0 | 0 1 0 0 | 4 | 0 | 0/0 | 1123 |
| v1v3v1 0110 | 4 | 0 | 0 1 0 1 | 4 | 0 | 0/0 | 1060 |
| v2v1v1 1000 | 4 | 0 | 1 1 0 | 4 | 0 | +1/−1 | 1045 +1045/−1045 |
| v3v1v1 1100 | 4 | 0 | 1 1 1 | 4 | 0 | +1/−1 | 1072 +1072/−1072 |
|  |  |  |  |  | === 0 | === +2/−2 | ==== 8897 +2117/−2117 |
|  |  |  |  |  |  |  | out of 7 entry combinations |

Class Compressible; where the 3$^{rd}$ and the 2$^{nd}$ position values are different and encoding using code adjustment techniques

| 3rd2nd1st Code Value | Bit | Scen. Code | 3rd2nd1st | Bit | +/− | Bit 1/Bit 0 | Frequency |
|---|---|---|---|---|---|---|---|
| [v1v2v1] [re-filled as below] |  | 10 | 0 0 0 | 5 | 0 | −2/+2 |  |
| v1v2v3 01011 | 5 |  |  |  |  |  | 593 −1186/+1186 |
| v1v2v2 01010 | 5 | 10 | 0 0 1 | 5 | 0 | 0/0 | 531 0/0 |
| [v1v3v1] [re-filled as below] |  | 10 | 0 1 0 | 5 | 0 | −1/+1 |  |
| v1v3v2 01110 | 5 |  |  |  |  |  | 548 −548/+548 |
| v1v3v3 01111 | 5 | 10 | 0 1 1 | 5 | 0 | −1/+1 | 542 −542/+542 |
| [v2v1v1] [re-filled as below] |  | 10 | 10 0 0 | 6 | 0 | −1/+1 |  |
| v2v2v2 101010 | 6 |  |  |  |  |  | 276 −276/+276 |
| v2v1v2 10010 | 5 | [10 | 10 0 1 | 6 | +1 | 0/0] | 542 |
| swapped with using |  | 11 | 10 [] 1 | 5 | 0 | +2/−2 | +1084/−1084 |
| v2v3v2 101110 | 6 | 10 | 10 1 0 | 6 | 0 | −1/+1 | 266 −266/+266 |
| v2v3v3 101111 | 6 | 10 | 10 1 1 | 6 | 0 | −1/+1 | 294 −294/+294 |
| [v3v1v1] [re-filled as below] |  | 10 | 11 0 0 | 6 | 0 | −3/+3 |  |
| v3v3v3 111111 | 6 |  |  |  |  |  | 304 −912/+912 |
| v3v1v3 11011 | 5 | [10 | 11 0 1 | 6 | +1 | 0/+1] | 561 |
| swapped with using |  | 11 | 11 [] 1 | 5 | 0 | +1/−1 | +561/−561 |
| v3v2v2 111010 | 6 | 10 | 11 1 0 | 6 | 0 | 0/0 | 277 0/0 |
| v3v2v3 111011 | 6 | 10 | 11 1 1 | 6 | 0 | 0/0 | 279 0/0 |
|  |  |  |  |  | === 0 bit | === −7/+7 | === 5013 −2379/+2379 |
|  |  |  |  |  |  |  | out of 12 entry combinations |

Class Compressible: where the 3$^{rd}$ and the 2$^{nd}$ position values are the same and encoding using code adjustment techniques

| 3rd2nd1st Code Value | Bit | Scen. Code | 3rd2nd1st | Bit | +/− | Bit 1/Bit 0 | Frequency |
|---|---|---|---|---|---|---|---|
| [v1v1v2] [split into 2 using AAB] |  | [11 | 0 [] 0 | 4] |  |  |  |
| v2v1v3 10011 | 5 | 11 | 0 [] 0 0 | 5 | 0 | −1/+1 | 576 −576/+576 |
| v2v3v1 10110 | 5 | 11 | 0 [] 0 1 | 5 | 0 | 0/0 | 559 0/0 |
| [v1v1v3] [split into 2 using AAB] |  | 11 | 0 [] 1 | 4 |  |  |  |
| v3v1v2 11010 | 5 | 11 | 0 [] 1 0 | 5 | 0 | 0/0 | 508 0/0 |

Diagram 55
Breakeven upon re-distribution of code addresses and code entry values listed out in Diagram 53

| 3rd2nd1st Code Value | Bit | Scen. Code | 3rd2nd1st | Bit | +/− | Bit 1/Bit 0 | Frequency |
|---|---|---|---|---|---|---|---|
| v3v2v1 11100 | 5 | 11 | 0 [] 1 1 | 5 | 0 | +1/−1 | 540 +540/−540 |
| v2v2v1 10100 | 5 | 11 | 10 [] 0 | 5 | 0 | +1/−1 | 551 +551/−551 |
| v2v2v3 101011 swapped with using | 6 | [11 10 | 10 [] 1 10 0 1 | 5 6 | −1 0 | 0/−1] −1/+1 | 288 −288/+288 |
| v3v3v1 11110 | 5 | 11 | 11 [] 0 | 5 | 0 | 0/0 | 591 0/0 |
| v3v3v2 111110 swapped with using | 6 | [11 10 | 11 [] 1 11 0 1 | 5 6 | −1 0 | 0/−1] −1/+1 | 262 −262/+262 |
| | | | | === 0 bit | === −1/+1 | | === 3875 −35/+35 ========= −297/+297 out of 8 entry combinations |

The frequency of the Class Incompressible and the Class Compressible above differs only slightly, with 8897 Processing Units for the first class and 8888 for the second. However, as the second class being assigned with Scenario 10 and 11, the skew is intended towards increasing the bit 1 ratio as against bit 0 ratio. The result however is quite surprising, it turns out that after encoding 1 cycle, bit 1 decreases by 297 bits whereas bit 0 increases by 297 bits as shown in Diagram 55 above. So even there is no bit gain or bit loss after the encoding, the way of bit 0:bit 1 ratio changes makes it quite possible to make the data compressible, now encoded and turned much uneven in terms of the ratio distribution between bit 0 and bit 1. If adopting the assignment of Scenario Code in the opposite way, the bit 0:bit 1 gain or loss is shown in the next Diagram 56:

Diagram 56a
Using the opposite assignment of Scenario Code, different from that used in Diagram 55

| 3rd2nd1st Code Value | Bit | Scen. Code | 3rd2nd1st | Bit | +/− | Bit 1/Bit 0 | Frequency |
|---|---|---|---|---|---|---|---|
| Class Incompressible: using AAB technique for encoding with range | | | | | | | |
| v1v1v1 000 | 3 | 1 | 00 | 4 | 0 | +1/−1 | 2273 +2273/−2273 |
| v1v1v2 0010 | 4 | 1 | 010 | 4 | 0 | +1/−1 | 1175 +1175/−1175 |
| v1v1v3 0011 | 4 | 1 | 011 | 4 | 0 | +1/−1 | 1149 +1149/−1149 |
| v1v2v1 0100 | 4 | 1 | 100 | 4 | 0 | +1/−1 | 1123 +1123/−1123 |
| v1v3v1 0110 | 4 | 1 | 101 | 4 | 0 | +1/−1 | 1060 +1060/−1060 |
| v2v1v1 1000 | 4 | 1 | 110 | 4 | 0 | +2/−2 | 1045 +2095/−2095 |
| v3v1v1 1100 | 4 | 1 | 111 | 4 | 0 | +2/−2 | 1072 +2144/−2144 |
| | | | | === 0 | === +9/−9 | | ==== 8897 +11019/−11019 out of 7 entry combinations |
| Class Compressible; where the 3$^{rd}$ and the 2$^{nd}$ position values are different and encoding using code adjustment techniques | | | | | | | |
| [v1v2v1] [re-filled as below] | | | 01 | 0 0 0 | 5 | 0 | −2/+2 |
| v1v2v3 01011 | 5 | | | | | | 593 −1186/+1186 |
| v1v2v2 01010 | 5 | 01 | 0 0 1 | 5 | 0 | 0/0 | 531 |
| [v1v3v1] [re-filled as below] | | | 01 | 0 1 0 | 5 | 0 | −1/+1 | |

Diagram 56a
Using the opposite assignment of Scenario Code, different from that used in Diagram 55

| 3rd2nd1st Code Value | Bit | Scen. Code | 3rd2nd1st | Bit | +/− | Bit 1/Bit 0 | Frequency |
|---|---|---|---|---|---|---|---|
| v1v3v2 01110 | 5 | | | | | | 548 −548/+548 |
| v1v3v3 01111 | 5 | 01 | 0 1 1 | 5 | 0 | −1/+1 | 542 −542/+542 |
| [v2v1v1] [re-filled as below] | | 01 | 10 0 0 | 6 | 0 | −1/+1 | |
| v2v2v2 101010 | 6 | | | | | | 276 −276/+276 |
| v2v1v2 10010 | 5 | [01 | 10 0 1 | 6 | +1 | +1/0] | 542 |
| swapped with using | | 00 | 10 [] 1 | 5 | 0 | 0/0 | 0/0 |
| v2v3v2 101110 | 6 | 01 | 10 1 0 | 6 | 0 | −1/+1 | 266 −266/+266 |
| v2v3v3 101111 | 6 | 01 | 10 1 1 | 6 | 0 | −1/+1 | 294 −294/+294 |
| [v3v1v1] [re-filled as below] | | 01 | 11 0 0 | 6 | 0 | −3/+3 | |
| v3v3v3 111111 | 6 | | | | | | 304 −912/+912 |
| v3v1v3 11011 | 5 | [01 | 11 0 1 | 6 | +1 | 0/+1] | 561 |
| swapped with using | | 00 | 11 [] 1 | 5 | 0 | −1/+1 | −561/+561 |
| v3v2v2 111010 | 6 | 01 | 11 1 0 | 6 | 0 | 0/0 | 277 |
| v3v2v3 111011 | 6 | 01 | 11 1 1 | 6 | 0 | 0/0 | 279 |
| | | | | | === | === | === |
| | | | | 0 bit | −11/+11 | | 5013 −4585/+4585 |
| | | | | | | | out of 12 entry combinations |

Class Compressible: where the 3$^{rd}$ and the 2$^{nd}$ position values are the same and encoding using code adjustment techniques

| 3rd2nd1st Code Value | Bit | Scen. Code | 3rd2nd1st | Bit | +/− | Bit 1/Bit 0 | Frequency |
|---|---|---|---|---|---|---|---|
| [v1v1v2] [split into 2 using AAB] | | [00 | 0 [] 0 | 4] | | | |
| v2v1v3 10011 | 5 | 00 | 0 [] 0 0 | 5 | 0 | −3/+3 | 576 −1728/+1728 |
| v2v3v1 10110 | 5 | 00 | 0 [] 0 1 | 5 | 0 | −2/+2 | 559 −1118/+1118 |
| [v1v1v3] [split into 2 using AAB] | | 00 | 0 [] 1 | 4 | | | |
| v3v1v2 11010 | 5 | 00 | 0 [] 1 0 | 5 | 0 | −2/+2 | 508 −1016/+1016 |
| v3v2v1 11100 | 5 | 00 | 0 [] 1 1 | 5 | 0 | −1/+1 | 540 −540/+540 |
| v2v2v1 10100 | 5 | 00 | 10 [] 0 | 5 | 0 | −1/+1 | 551 −551/+551 |
| v2v2v3 101011 | 6 | [00 | 10 [] 1 | 5 | −1 | 0/−1] | 288 −288/+288 |
| swapped with using | | 01 | 10 0 1 | 6 | 0 | −1/+1 | |
| v3v3v1 11110 | 5 | 00 | 11 [] 0 | 5 | 0 | −2/+2 | 591 −1182/+1182 |
| v3v3v2 111110 | 6 | [00 | 11 [] 1 | 5 | −1 | 0/−1] | 262 −262/+262 |
| swapped with using | | 01 | 11 0 1 | 6 | 0 | −1/+1 | |
| | | | | === | === | === | |
| | | | | 0 bit | −13/+13 | | 3875 −6685/+6685 |
| | | | | | | | ======== |
| | | | | | | | −251/+251 |
| | | | | | | | out of 8 entry combinations |

It turns out that the skew is decreased, decreasing bit 1 only by 251 and increasing bit 0 by the same amount for a random data set of 80000 bits.

From the above, it could be seen that an indicator in the Header could be reserved for indicating how the Scenario Code is to be assigned and also whether 0 Head Design of the Code Unit or 1 Head Design of the Code Unit is being used to read the digital data as well as which Head Design is being used to encode the data values after being read as they may not have to be the same. Such variations could affect the ratio of bit 0:bit 1 in the resulting encoded CHAN CODE. Such indicators are used for selecting the best scenario that serves the purpose of the encoding required.

To further changing the ratio of bit 0:bit 1, one could further alter Diagram 56a into one using 1 Head Design of the Code Unit as follows:

Diagram 56b
Using the opposite assignment of Content Code of the Code Unit using 1 Head Design,
different from 0 Head Design used in Diagram 59a

| 3rd2nd1st Code Value | Bit | Scen. Code | 3rd2nd1st | Bit | +/− | Bit 1/Bit 0 | Frequency |
|---|---|---|---|---|---|---|---|
| Class Incompressible: using AAB technique for encoding with range ||||||||
| v1v1v1 000 | 3 | 1 | 11 | 4 | 0 | +3/−3 | 2273 +6819/−6819 |
| v1v1v2 0010 | 4 | 1 | 101 | 4 | 0 | +2/−2 | 1175 +2350/−2350 |
| v1v1v3 0011 | 4 | 1 | 100 | 4 | 0 | 0/0 | 1149 0/0 |
| v1v2v1 0100 | 4 | 1 | 011 | 4 | 0 | +2/−2 | 1123 +2246/−2246 |
| v1v3v1 0110 | 4 | 1 | 010 | 4 | 0 | 0/0 | 1060 0/0 |
| v2v1v1 1000 | 4 | 1 | 001 | 4 | 0 | +1/−1 | 1045 +1045/−1045 |
| v3v1v1 1100 | 4 | 1 | 000 | 4 | 0 | −1/+1 | 1072 −1072/+1072 |
|  |  |  |  |  | === | === | ==== |
|  |  |  |  |  | 0 | +7/−7 | 8897 +11388/−11388 |
|  |  |  |  |  |  |  | out of 7 entry combinations |
| Class Compressible; where the 3$^{rd}$ and the 2$^{nd}$ position values are different and encoding using code adjustment techniques ||||||||
| [v1v2v1] [re-filled as below] |  | 01 | 1 1 1 | 5 | 0 | +1/−1 |  |
| v1v2v3 01011 | 5 |  |  |  |  |  | 593 +593/−593 |
| v1v2v2 01010 | 5 | 01 | 1 1 0 | 5 | 0 | +1/−1 | 531 +531/−531 |
| [v1v3v1] [re-filled as below] |  | 01 | 1 0 1 | 5 | 0 | 0/0 |  |
| v1v3v2 01110 | 5 |  |  |  |  |  | 548 0/0 |
| v1v3v3 01111 | 5 | 01 | 1 0 0 | 5 | 0 | −2/+2 | 542 −1084/+1084 |
| [v2v1v1] [re-filled as below] |  | 01 | 01 1 1 | 6 | 0 | +1/−1 |  |
| v2v2v2 101010 | 6 |  |  |  |  |  | 276 +276/−276 |
| v2v1v2 10010 | 5 | [01 | 10 0 1 | 6 | +1 | 0/0] | 542 |
| swapped with using |  | 00 | 01 [] 0 | 5 | 0 | −1/+1 | −542/+542 |
| v2v3v2 101110 | 6 | 01 | 01 0 1 | 6 | 0 | −1/+1 | 266 −266/+266 |
| v2v3v3 101111 | 6 | 01 | 01 0 0 | 6 | 0 | −3/+3 | 294 −882/+882 |
| [v3v1v1] [re-filled as below] |  | 01 | 00 1 1 | 6 | 0 | −3/+3 |  |
| v3v3v3 111111 | 6 |  |  |  |  |  | 304 −912/+912 |
| v3v1v3 11011 | 5 | [01 | 11 0 1 | 6 | +1 | 0/+1] | 561 |
| swapped with using |  | 00 | 00 [] 0 | 5 | 0 | −4/+4 | −2244/+2244 |
| v3v2v2 111010 | 6 | 01 | 00 0 1 | 6 | 0 | −2/+2 | 277 −554/+554 |
| v3v2v3 111011 | 6 | 01 | 00 0 0 | 6 | 0 | −4/+4 | 279 −1116/+1116 |
|  |  |  |  |  | === | === | === |
|  |  |  |  |  | 0 bit | −17/+17 | 5013 −6200/+6200 |
|  |  |  |  |  |  |  | out of 12 entry combinations |
| Class Compressible: where the 3$^{rd}$ and the 2$^{nd}$ position values are the same and encoding using code adjustment techniques ||||||||
| [v1v1v2] [split into 2 using AAB] |  | [00 | 0 [] 0 | 4] |  |  |  |
| v2v1v3 10011 | 5 | 00 | 1 [] 1 1 | 5 | 0 | 0/0 | 576 0/0 |
| v2v3v1 10110 | 5 | 00 | 1 [] 1 0 | 5 | 0 | −1/+1 | 559 −559/+559 |
| [v1v1v3] [split into 2 using AAB] |  | 00 | 0 [] 1 | 4 |  |  |  |
| v3v1v2 11010 | 5 | 00 | 1 [] 0 1 | 5 | 0 | −1/+1 | 508 −508/+508 |

Diagram 56b
Using the opposite assignment of Content Code of the Code Unit using 1 Head Design, different from 0 Head Design used in Diagram 59a

| 3rd2nd1st Code Value | Bit | Scen. Code | 3rd2nd1st | Bit | +/− | Bit 1/Bit 0 | Frequency |
|---|---|---|---|---|---|---|---|
| v3v2v1 11100 | 5 | 00 | 1 [] 0 0 | 5 | 0 | −2/+2 | 540 −1080/+1080 |
| v2v2v1 10100 | 5 | 00 | 01 [] 1 | 5 | 0 | 0/0 | 551 0/0 |
| v2v2v3 101011 | 6 | [00 | 10 [] 1 | 5 | −1 | 0/−1] | 288 −288/+288 |
| swapped with using | | 01 | 01 1 0 | 6 | 0 | −1/+1 | |
| v3v3v1 11110 | 5 | 00 | 00 [] 1 | 5 | 0 | −3/+3 | 591 −1773/+1773 |
| v3v3v2 111110 | 6 | [00 | 11 [] 1 | 5 | −1 | 0/−1] | 262 −786/+786 |
| swapped with using | | 01 | 00 1 0 | 6 | 0 | −3/+3 | |
| | | | | 0 bit | −11/+11 | | 3875 −4994/+4994 |
| | | | | | | | +194/−194 |
| | | | | out of 8 entry combinations | | | |

To alter the Head Design of the Content Code of the Code Unit, the simplest way is to change bit 0 to bit 1 and vice versa of the Content Code as done in Diagram 56b, changed from Diagram 56a. The above examples show how CHAN CODING is used for creating an unevener encoder for decreasing bit 1 and increasing bit 0 by 251 in Diagram 56a or increasing bit 1 and decreasing bit 0 by 194 in Diagram 56b. It shows that the trend towards more bit 1 in the bit 0:bit 1 ratio is reversed. For completeness, Diagram 56c is used to show the result of using 0 Head Scenario Code and 1 Head Content Code to encode the original random data set of 80000 bits as follows:

Diagram 56c
Using the opposite assignment using 0 Head Design Scenario Code, different from 1 Head Design used in Diagram 56b

| 3rd2nd1st Code Value | Bit | Scen. Code | 3rd2nd1st | Bit | +/− | Bit 1/Bit 0 | Frequency |
|---|---|---|---|---|---|---|---|
| Class Incompressible: using AAB technique for encoding with range | | | | | | | |
| v1v1v1 000 | 3 | 0 | 11 | 4 | 0 | +2/−2 | 2273 +4546/−4546 |
| v1v1v2 0010 | 4 | 0 | 101 | 4 | 0 | +1/−1 | 1175 +1175/−1175 |
| v1v1v3 0011 | 4 | 0 | 100 | 4 | 0 | −1/+1 | 1149 −1149/+1149 |
| v1v2v1 0100 | 4 | 0 | 011 | 4 | 0 | +1/−1 | 1123 +1123/−1123 |
| v1v3v1 0110 | 4 | 0 | 010 | 4 | 0 | −1/+1 | 1060 −1060/+1060 |
| v2v1v1 1000 | 4 | 0 | 001 | 4 | 0 | 0/0 | 1045 0/0 |
| v3v1v1 1100 | 4 | 0 | 000 | 4 | 0 | −2/+2 | 1072 −2144/+2144 |
| | | | | | 0 | 0/0 | 8897 +2491/−2491 |
| | | | | | | out of 7 entry combinations | |
| Class Compressible; where the 3rd and the 2nd position values are different and encoding using code adjustment techniques | | | | | | | |
| [v1v2v1] [re-filled as below] | | 10 | 1 1 1 | 5 | 0 | +1/−1 | |
| v1v2v3 01011 | 5 | | | | | | 593 +593/−593 |
| v1v2v2 01010 | 5 | 10 | 1 1 0 | 5 | 0 | +1/−1 | 531 +531/−531 |
| [v1v3v1] [re-filled as below] | | 10 | 1 0 1 | 5 | 0 | 0/0 | |
| v1v3v2 01110 | 5 | | | | | | 548 0/0 |
| v1v3v3 01111 | 5 | 10 | 1 0 0 | 5 | 0 | −2/+2 | 542 −1084/+1084 |

-continued

Diagram 56c
Using the opposite assignment using 0 Head Design Scenario Code, different from 1 Head Design used in Diagram 56b

| 3rd2nd1st Code Value | Bit | Scen. Code | 3rd2nd1st | Bit | +/− | Bit 1/Bit 0 | Frequency |
|---|---|---|---|---|---|---|---|
| [v2v1v1] | | 10 | 01 1 1 | 6 | 0 | +1/−1 | |
| [re-filled as below] | | | | | | | |
| v2v2v2 | 6 | | | | | | 276 |
| 101010 | | | | | | | +276/−276 |
| v2v1v2 | 5 | [01 | 10 0 1 | 6 | +1 | 0/0] | 542 |
| 10010 | | | | | | | |
| swapped with using | | 11 | 01 [] 0 | 5 | 0 | +1/−1 | +542/−542 |
| v2v3v2 | 6 | 10 | 01 0 1 | 6 | 0 | −1/+1 | 266 |
| 101110 | | | | | | | −266/+266 |
| v2v3v3 | 6 | 10 | 01 0 0 | 6 | 0 | −3/+3 | 294 |
| 101111 | | | | | | | −882/+882 |
| [v3v1v1] | | 10 | 00 1 1 | 6 | 0 | −3/+3 | |
| [re-filled as below] | | | | | | | |
| v3v3v3 | 6 | | | | | | 304 |
| 111111 | | | | | | | −912/+912 |
| v3v1v3 | 5 | [01 | 11 0 1 | 6 | +1 | 0/+1] | 561 |
| 11011 | | | | | | | |
| swapped with using | | 11 | 00 [] 0 | 5 | 0 | −2/+2 | −1122/+1122 |
| v3v2v2 | 6 | 10 | 00 0 1 | 6 | 0 | −2/+2 | 277 |
| 111010 | | | | | | | −554/+554 |
| v3v2v3 | 6 | 10 | 00 0 0 | 6 | 0 | −4/+4 | 279 |
| 111011 | | | | | | | −1116/+1116 |
| | | | | | === | === | === |
| | | | | | 0 bit | −13/+13 | 5013 |
| | | | | | | | −3994/+3994 |
| | | | | | | | out of 12 entry combinations |

Class Compressible: where the 3$^{rd}$ and the 2$^{nd}$ position values are the same and encoding using code adjustment techniques

| 3rd2nd1st Code Value | Bit | Scen. Code | 3rd2nd1st | Bit | +/− | Bit 1/Bit 0 | Frequency |
|---|---|---|---|---|---|---|---|
| [v1v1v2] | | [00 | 0 [] 0 | 4] | | | |
| [split into 2 using AAB] | | | | | | | |
| v2v1v3 | 5 | 11 | 1 [] 1 1 | 5 | 0 | +2/−2 | 576 |
| 10011 | | | | | | | +1152/−1152 |
| v2v3v1 | 5 | 11 | 1 [] 1 0 | 5 | 0 | +1/−1 | 559 |
| 10110 | | | | | | | +559/−559 |
| [v1v1v3] | | 11 | 0 [] 1 | 4 | | | |
| [split into 2 using AAB] | | | | | | | |
| v3v1v2 | 5 | 11 | 1 [] 0 1 | 5 | 0 | +1/−1 | 508 |
| 11010 | | | | | | | +508/−508 |
| v3v2v1 | 5 | 11 | 1 [] 0 0 | 5 | 0 | 0/0 | 540 |
| 11100 | | | | | | | 0/0 |
| v2v2v1 | 5 | 11 | 01 [] 1 | 5 | 0 | +2/−2 | 551 |
| 10100 | | | | | | | +1102/−1102 |
| v2v2v3 | 6 | [00 | 10 [] 1 | 5 | −1 | 0/−1] | 288 |
| 101011 | | | | | | | −288/+288 |
| swapped with using | | 10 | 01 1 0 | 6 | 0 | −1/+1 | |
| v3v3v1 | 5 | 11 | 00 [] 1 | 5 | 0 | −1/+1 | 591 |
| 11110 | | | | | | | −591/+591 |
| v3v3v2 | 6 | [00 | 11 [] 1 | 5 | −1 | 0/−1] | 262 |
| 111110 | | | | | | | −786/+786 |
| swapped with using | | 10 | 00 1 0 | 6 | 0 | −3/+3 | |
| | | | | | === | === | === |
| | | | | | 0 bit | +1/−1 | 3875 |
| | | | | | | | +1656/−1656 |
| | | | | | | | ========= |
| | | | | | | | +153/−153 |
| | | | | | | | out of 8 entry combinations |

So the results of changing bit 0 and bit 1 of Diagram 55, 56a, 56b and 56c are +297/−297, −251/+251, −194/+194 and −153/+153 respectively. So it is apparent that Diagram 55 gives the biggest skew towards more bit 0. It is shown above that for the same data distribution, using different Head Design and assignment of Classification Code and Content Code could affect the ratio distribution of bit 0:bit 1. And such assignment could be adjusted to different ratio distribution of bit 0:bit 1 of any particular data set and when one assignment arrangement is not effective in continuing the skew towards a certain direction, one could attempt to change it so that the skew direction could be maintained or could design another schema for doing so until such a point that such uneven distribution could be compressed by using other techniques of CHAN CODING.

For instance, one could use the Super Processing Unit with AI Distinction technique for making further compression. Or the different Code Unit Definitions for 6-value Code Units introduced in Paragraph [62] could be used, one Definition for reading the data and the other for encoding and writing the data; for instance, if bit 1 being more than bit 0, then 17-bit 6-value Code Unit Definition of 1 Head Design could be used to read the data, whereas for encoding and writing it could be done by 18-bit 6-value Code Unit Definition of the same Head Design. Since 17-bit Definition uses 2 bits of bit code 11 for the value of v1, and 18-bit Definition uses 1 bit of bit code 1 for representing v1, then upon writing using 18-bit Definition, 2 bits of bit code 11 read are encoded into 1 bit of bit code 1 for the v1 read by the 17-bit Definition, thus reducing 2 bits into 1 bit. If the frequency of bit 1 is higher than bit 0, this may help in making compression.

For instance, the 17-bit to 19-bit 6-value Code Unit of 1 Head Design is shown in Diagram 57:

Diagram 57
Definition of Code Values of a 6 value Code Unit of 1 Head Design using 17, 18 and 19 bits

| Data Value | 17 bit Read | 18 bit Write | 19 bit Write |
|---|---|---|---|
| v1 | 11 | 1 | 1 |
| v2 | 10 | 011 | 01 |
| v3 | 01 | 010 | 0011 |
| v4 | 001 | 001 | 0010 |
| v5 | 0001 | 0001 | 0001 |
| v6 | 0000 | 0000 | 0000 |

As discussed before, if a digital data set is having more bit 1 than bit 0, using 1 Head Design Code Unit Reader, v1 would have much higher frequency than other values individually. Comparing the above 3 6-value Code Unit Definition, it could be seen that if v1 has higher frequency than others, using 17-bit as Reader, writing it with 18-bit Writer, on every count of v1 read, it saves 1 bit and on every count of v2 and v3 read, it loses 1 bit each; for v4, v5 and v6 the bit usage is breakeven; so as long as the frequency of v1 is higher than the frequency of v2 and v3 added up together, bit saving could be achieved. 19-bit Writer could also be used depending on the frequency distribution between the pair of v2 and v3 and the of v3 and v4 as compared to the frequency of v1.

So in order to take advantage of the slight differences of the bit 0:bit 1 patterns in the data sets for making compression in an easy way, one could construct the pair of 0 Head Design and 1 Head Design Code Unit Definitions of varying bit sizes for Code Units of other value sizes. For instance, the Reader and the Writer or the Encoder used in Paragraph [117] are based on 6-value Code Unit, one however could construct for use such Readers and Writers basing on other value sizes, such as 7-value, 8-value, 9-value, 10-value, so on and so forth. The bigger the value size of the Code Unit Definition, the finer bit 0:bit 1 difference the Reader and the Writer could pick up and turn into bit storage saving. One could also do several times of unevening process (i.e. using Unevener to do several cycles of changing the bit 0:bit 1 ratio in the digital data set skewed towards one direction first) before making encoding for compression. If one unevener could not always skew the data distribution pattern towards one direction, one could change the assignment pattern of the Classification Code from 0 Head to 1 Head or vice versa, or change or interchange the Head Design of the Reader and Writer from one Head Design to another Head Design, or use different design of Code Unit Definition of varying bit size as well as varying value size as long as the path of making such changes is well recorded in the Header of CHAN CODE or built into the encoder and decoder for use. What is more, the Unevener could be built with different Content Code. For instance, the Unevener discussed in Paragraph [114] and Diagram 54 uses Content Code classified into 2 Classes, one Class Incompressible and the other Class Compressible before slight modification due to code redistribution optimization. This Unevener maps every unique code addresses to unique data values one by one with the same bit size so that every encoded code for any data value under processing is exactly the same bit size as that of the original corresponding data value, resulting in no bit gain nor bit loss. Diagram 55 and 56 shows two different arrangement of Classification Code Assignment to the same set of Content Code, but using 0 Head and 1 Head Design, resulting in different ratio changes in terms of bit 0:bit 1 distribution pattern. One could however design other Unevener with different Content Code in similar way, using techniques introduced in Paragraph [114], including selecting a Terminating Condition for defining the nature of the Processing Unit to be processed, classifying the unique value entries of the Processing Unit according to their characteristics or traits identified, making code adjustment, code swapping and code redistribution so that another Unevener Encoder similar to the one made in Diagram 54 to 56 could be created. Another example of this is that found in the discussion of Super Processing Unit in Paragraph [91] and Diagram 28. Using the Unevener in Diagram 28, the way that the ratio of bit 0:bit of a data set is changed differently from that using the Unevener in Diagram 55 or 56. So as discussed before, when one Unevener could not change the ratio of bit 1 to bit 0 towards one constant direction anymore, such unidirectional change could be further taken up by using another Unevener appropriately designed, so on and so forth. So the role of an Unevener Encoder is to un-even the distribution pattern of bit 0 and bit 1 of a digital data set. Unevener encoder, resulting in more Bit 1 than Bit 0 (as compared with the even distribution of bit 0:bit 1 in 1:1 ratio) could be called Bit 1 Unevener, as against the unevener encoder making the data distribution (as compared with the even distribution of bit 0:bit 1 in 1:1 ratio) skewed towards making Bit 0 more, which could then be called Bit 0 Unevener. On the other hand, those encoders which tend to make the bit 0:bit 1 ratio more even than before encoding (i.e. making the bit 0:bit 1 ratio more towards 1:1 direction) could be called Evener Encoder, or just Evener.

In such a way, the technique of using Code Unit Definition as Reader and Writer for making compression as outlined in Paragraph [115] to [117], could be used together with Unevener(s) mentioned in Paragraph [118] as a definite proof to the end of the myth of Pigeonhole Principle in Information Theory and that any data set whether random or not are subject to compression in cycles up to a limit as explained previously in this invention.

Compressor in the course of compressing a digital data set is apparently performing the role of an evener, otherwise any data set could be made compressible in cycle (of course up to a certain limit as this invention reveals). The fact that before this invention, methods in the Compression Field do not seem to achieve the long desired goal of making data set of any pattern of data distribution, whether random or not, compressible in cycle speaks for itself. With the revelation of this invention in ways discussed in Paragraph [118], i.e. using Unevener and Evener in alternation or other ways as discussed in Paragraph [124], the aforesaid goal is in sight definitely.

For encoding and decoding using Unevener and Evener in alternation, the Header of the resultant encoded CHAN CODE FILE basically includes the following indicators for use:

(a) Check-sum Indicator; present if appropriate, the decoder using it to identify if the file to be decoded is a valid CHAN CODE FILE, so including the Signature Indicator designed by the designer for the corresponding CHAN CODE FILE so produced by the encoder and if the file is a valid file for use;

(b) Recycle Bit or Indicator; being a bit written by the encoder for use by the decoder indicating if the decoder has to stop after decoding the current cycle of processing; and (c) The Mapping Table or Code Unit Definition Indicator used (by the encoder in encoding or) for decoding the layer of digital data of the current cycle of encoding; one could use another Indicator Bit (the Unevener/Evener Indicator) for distinguish if the current layer of encoded CHAN CODE has been done by using Unevener Mapping Table or Evener Mapping Table.

Besides, the Header, the resultant CHAN CODE FILE also includes two other units:

(A) The CHAN CODE Unit; containing the encoded CHAN CODE, using the Reader of the chosen Code Unit Definition for reading the input digital data and using the Writer writing or encoding the digital data read, the Writer being the encoder using either the Code Unit Definition or the Mapping Table as indicated in the Header for writing or containing the programming logic for implementing the Code Unit Definition or the Mapping Table for use in encoding; the encoded CHAN CODE here containing Classification and Content Code where appropriate; and (B) The Un-encoded Code Unit; this is the section of binary bits representing the part of input digital data which is left un-encoded as it is read, usually placed at the end of the resultant CHAN CODE FILE; this is designed as the section of code the number of bits of which is not enough to make up to one Processing Unit or one Super Processing Unit so that it could not be encoded by the encoding techniques being used.

As mentioned previously, such separate pieces of digital information identified in Paragraph [121] and [122] could be separately placed into different CHAN CODE FILES as separate entities for storage. The corresponding design should enable the decoder to gain access to and correctly identify them for use in decoding. Upon decoding, the decoder uses either the Code Unit Definition or the Mapping Table as indicated in the Header of the respective resultant CHAN CODE FILE for reading the input encoded CHAN CODE FILE(S) or contains the programming logic for implementing the Code Unit Definition or the Mapping Table for use in decoding (i.e. using the corresponding Code Unit Definition or Mapping Table or the corresponding built in programming logic for translating the encoded code back to the input digital data code and writing it out); the resultant decoded code being the input digital data code before that cycle of encoding.

If not used with evener in alternation, unevener could also be used for compressing digital data when carried to extreme that all the digital incoming binary bits are reduced to either bit 0 or bit 1 through cycles of unevening processing by unevener. So the resultant CHAN CODE FILE (of unevening path) being produced is just the information relating to the path of unevener encoder takes, including the bit size of the original digital data input, the number of unevening made where necessary or appropriate, and the Code Unit Definitions or Mapping Tables being used in each cycle of unevening. The unevener decoder could therefore rely on such information on unevening path the unevener encoder takes to restore correctly and losslessly the original digital data. In this way, the encoding process could include one or more than 1 cycle of unevener encoding but without evener encoding or compressor encoding.

Another variant way of using unevener is to use it a number of cycles before the last cycle of processing in which the encoding is done by compressor (or evener used for compression). In this way, the encoding process includes one or more than one cycle of unevener encoding before the last one cycle of compressor encoding. The structure of the resultant CHAN CODE and CHAN CODE FILE(S) of this variant is similar to that described in Paragraphs [121] to [123]. As evener is a compressor which tends to make the ratio of bit 0:bit 1 of the data set become more even, when used as the encoder for the last cycle or last layer of encoding, the direction towards which the data distribution is skewed as a result of the use of such evener or compressor is not important anymore, the skew could be either way as long as it could compress the data as it is intended. The term Evener or Evener Encoder is taken to be the same as Compressor or Compressor Encoder in the present invention.

CHAN FRAMEWORK and CHAN CODING so far revealed above at least demonstrates that the number of code addresses as against the number of unique data values is not the factor (as misguided by the myth of Pigeonhole Principle in Information Theory in the past) that imposes the limit for making data compression. What matters is the frequency distribution of the data values of the input data set. CHAN CODING method implemented using the techniques introduced in the above paragraphs does the feat that in encoding the input data set, whether random or not, it puts into the encoded code the information of the input data plus the information of Classification Code representing the traits of the input data as well as altering the data distribution so that upon decoding the encoded code using the corresponding techniques of CHAN CODING, the input data could be correctly restored losslessly; and up to a certain limit, the corresponding digital data could be encrypted and compressed in cycles; the limit, subject to the design and schema being used or implemented, being the code bits representing the Header and the relevant Indicators used, the CHAN CODE being fitted into the size of one Processing Unit or one Super Processing Unit, and the Un-encoded Code Unit, if any (as there may not be any such un-encoded binary bits left behind), which is the un-encoded binary bits the number of which being less than the size of one Processing Unit or one Super Processing Unit but more than 0. In this paragraph, the CHAN CODE thus mentioned is the CHAN CODE CORE, being the encoded code for content or data value part of the original input data, other additional information as contained in Header and the indicators it contains (as well as that part of information and programming logic built into the Encoder and Decoder) and Un-encoded Code Unit belongs also to CHAN CODE, being CHAN CODE PERIPHERAL, used together with CHAN CODE CORE in the encoding and decoding process so that the original input data could be perfectly encoded and encoded code be perfectly decoded and restored to the original input data correctly and losslessly.

The method and techniques so used could be used for compressing non-random digital data. Encryption and decryption could also be done at the same time if so designed. To do encryption and decryption without expansion and contraction of data, the simplest way is to use the technique of using Same Bit Size Coder for any code unit values. For instance, Paragraph [62] has revealed there could be several designs of Max6 16 bit Coder as listed in Diagram 14b and 14c. Each of the four designs revealed could serve as a Same Bit Size Coder for encryption and decryption purpose by translating the original code using one design to read and another design to write. The result is an encrypted code having the same size as that of the original code. Since similar designs could be created for other Max Classes, there could be endless variations for encryption and decryption. Without knowing which Max Class (as well as which Bit Group under a particular Max Class) one has used for encoding, one could not easily decode the encoded code. Same Bit Size Coder which does not encrypt could also be used, and it is simply using the same coder that reads the digital data on one hand and write it back on the other. Of course without using together with other techniques, it does nothing at all except as an exact data copier. The techniques so far revealed could be regarded techniques that could be used for making encryption/decryption at least and making compression/decompression where the data distribution of the digital information to be processed is appropriate. Ways have also been suggested how random data could be possibly compressed and restored correctly using techniques of CHAN CODING under different design and schema. The following proof that random data could be compressed and restored correctly and losslessly is made possible by the invention of some more techniques as further revealed below.

Lastly, here is the time to present an apparent proof that random data could be subject to compression and restoration through decompression correctly and losslessly. One such technique is Digital Data Blackholing, by which a Code Unit Value or a Processing Unit Value is identified to act as a Digital Data Blackhole. For revealing how Digital Data Blackhole could be created, the example of Max3 5 bit 0 Head Design Code Unit Coder is used again and the Processing Unit is defined as consisting 3 such Code units read by the Max3 5 bit 0 Head Design Code Unit Coder. So there are 27 unique Processing Unit Code Values (PUCVs), the same as that found in Diagram 20 under Paragraph [74]. Diagram 20 shows the frequency distribution of each single one of these 27 unique PUCVs, it could be seen that the shortest PUCV is 000, having 3 bits, there are also 4 bit PUCVs, 5 bit PUCVs and 6 bit PUCVs. So these 27 PUCVs could be divided into Bit Class as well. And it could be seen that the frequency of these single PUCVs decreases by roughly one half with increasing bit size by 1 bit; it is a general regularity (or law of randomness) that could be observed in the frequency distribution of random data when read using Max3 5 bit 0 Head Design Code Unit Coder using a Processing Unit consisting of 3 single Code Units. Upon further investigation, one could discover another frequency distribution law or regularity about random data using the same schema (i.e. using Max3 5 bit 0 Head Design Code Unit Coder with a Processing Unit consisting of 3 single Code Units) developed under CHAN FRAMEWORK. This another characteristic regularity or law of frequency distribution of random data is illustrated in Diagram 58 below:

Diagram 58a
Frequency Distribution of a Processing Unit of Random Data Set of 80000 bits read using Max3 5 bit 0 Head Design Code Unit Coder with a Processing Unit consisting of 3 single Code Units
Processing Unit Code Value

| PUCV | Frequency | Special Code |
|---|---|---|
| 3 Bit Class | | |
| 000 | 2311 | only one in class |
| 4 Bit Class | | |
| 1100 | 1151 | highest in class |
| 0010 | 1121 | |
| 0100 | 1119 | |
| 0011 | 1103 | |
| 1000 | 1086 | |
| 0110 | 1036 | lowest in class |
| 5 Bit Class | | |
| 11100 | 579 | highest in class |
| 01111 | 574 | |
| 11010 | 569 | |
| 10011 | 562 | |
| 10110 | 561 | |
| 10100 | 556 | |
| 01011 | 555 | |
| 10010 | 551 | |
| 01010 | 539 | |
| 11110 | 524 | |
| 11011 | 524 | |
| 01110 | 523 | lowest in class |
| 6 Bit Class | | |
| 111111 | 315 | highest in class |
| 101010 | 293 | |
| 101011 | 289 | |
| 111011 | 288 | |
| 101110 | 288 | |
| 101111 | 264 | |
| 111110 | 262 | |
| 111010 | 254 | lowest in class |

Diagram 58b
Frequency Distribution of a Super Processing Unit of Random Data Set of 80000 bits read using Max3 5 bit 0 Head Design Code Unit Coder with a Processing Unit consisting of 3 single Code Units-The Super Processing Unit consisting of 2 Processing Units in succession (with selected SPUCVs shown)
Super Processing Unit Code Value

| SPUCV | Frequency | Special Code |
|---|---|---|
| 6 Bit Class | | |
| 000-000 | 264 | only one in class |
| 7 Bit Class | | |
| 000-0100 | 160 | highest in class |
| 000-1000 | 156 | second in class |
| ... | | |
| 000-0110 | 141 | lowest but one in class |
| 000-1100 | 140 | lowest in class |

Diagram 58b
Frequency Distribution of a Super Processing Unit of Random Data Set of 80000 bits read using Max3 5 bit 0 Head Design Code Unit Coder with a Processing Unit consisting of 3 single Code Units-The Super Processing Unit consisting of 2 Processing Units in succession (with selected SPUCVs shown)
Super Processing Unit Code Value

| SPUCV | Frequency | | Special Code |
|---|---|---|---|
| 8 Bit Class | | | |
| 0010-1100 | 91 | highest in class | Blackhole 0 |
| 01011-000 | 86 | second in class | |
| . . . | | | |
| 0100-0100 | 51 | lowest but one in class | |
| 000-11110 | 50 | lowest in class | |
| 9 Bit Class | | | |
| 0100-10110 | 48 | highest in class | |
| 111110-000 | 48 | highest in class | |
| . . . | | | |
| 10110-0011 | 21 | lowest but one in class | |
| . . . | | | |
| 0011-11011 | 19 | lowest in class | Blackhole 1, Surrogate Code 0 (Scode 0) surrogating as Blackhole 1 |
| 10 Bit Class | | | |
| 01111-01111 | 31 | highest in class | |
| . . . | | | |
| 01111-01010 | 28 | second in class | |
| . . . | | | |
| 10011-11100 | 8 | lowest but one in class | |
| . . . | | | |
| 01111-01110 | 6 | lowest in class | Surrogate Code 1 (Scode 1) surrogating Scode 0 |
| 11 Bit Class | | | |
| 111111-10110 | 17 | highest in class | |
| . . . | | | |
| 10010-111110 | 15 | second in class | |
| . . . | | | |
| 01011-101011 | 3 | lowest but one in class | Surrogate Code 3a (Scode 3) split into 2: 01011-101011-0 surrogating itself and 01011-101011-1 surrogating Scode 2 |
| . . . | | | |
| 101111-11110 | 2 | lowest in class | Surrogate Code 2 (Scode 2) surrogating Scode 1 |
| 12 Bit Class | | | |
| 111111-101011 | 14 | highest in class (could be another Blackhole 0, see Paragraph [131]) | |
| . . . | | | |
| 101111-101010 | 10 | second in class | |
| . . . | | | |
| 111110-101110 | 1 | lowest but one in class | |
| 111111-111110 | 0 | lowest in class | Surrogate Code 3b (Scode 3) surrogating Scode 2 |

The instance of the frequency distribution statistics of Diagram 58a and 58b is generated by using the autoit 3 programs as listed in Diagram 58c and 59d below:

Diagram 58c

Autoit Program generating the frequency statistics shown in Diagram 58a and 58b

```
;;;;;;
#include "helper2b.au3"
Func writeln($vVar1=0, $vVar2=0, $vVar3=0, $vVar4=0, $vVar5=0, $vVar6=0,
  $vVar7=0, $vVar8=0, $vVar9=0,_
  $vVar10=0, $vVar11=0, $vVar12=0, $vVar13=0,
  $vVar14=0, $vVar15=0, $vVar16=0, $vVar17=0,
  $vVar18=0, $vVar19=0)
    #forceref $vVar1, $vVar2, $vVar3, $vVar4, $vVar5, $vVar6, $vVar7, $vVar8, $vVar9, $vVar10
    #forceref $vVar11, $vVar12, $vVar13, $vVar14, $vVar15, $vVar16, $vVar17, $vVar18, $vVar19
    Local $sVal=" "
    For $i=1 To @NumParams
        $sVal &=Eval("vVar" & $i) & " "
    Next
    ConsoleWrite($sVal & @CRLF)
EndFunc
Func AABBits1Base($range, $value)
    if $value<1 then PrintError('Invalid input 0')
    if $value>$range then PrintError('Invalid range')
```

```
Local $max=1
local $bits=0
while $max<=$range
    $max=$max*2
    $bits=$bits+1
Wend
$max=$max/2
$bits=$bits-1
local $sub=$range-$max
If $value<=$max-$sub Then
    Return $bits
Else
    Return $bits+1
EndIf
EndFunc
Func AABBits0Base($range, $value)
return AABBits1Base($range+1, $value+1)
EndFunc
local $data[1]
if not FileExists('ff') then GenerateRandomFile('ff', 10000)
ReadDataFile('ff', $data)
local $map[27]
$map[0]='000'
$map[1]='11100'
$map[2]='0100'
$map[3]='0011'
$map[4]='1000'
$map[5]='0010'
$map[6]='0110'
$map[7]='1100'
$map[8]='01011'
$map[9]='01010'
$map[10]='11010'
$map[11]='01111'
$map[12]='10110'
$map[13]='10010'
$map[14]='01110'
$map[15]='10011'
$map[16]='10100'
$map[17]='11011'
$map[18]='101110'
$map[19]='101010'
$map[20]='101111'
$map[21]='101011'
$map[22]='11110'
$map[23]='111010'
$map[24]='111110'
$map[25]='111011'
$map[26]='111111'
local $obj[1]
MapInit($obj, $map)
local $input[1]
InputInit($input, $data)
local $count[27][2]
for $i=0 to 26
$count[$i][0]=0
$count[$i][1]=$i
next
local $nums[8000000]
local $numc=0
while not InputEnded($input)
$v=MapRead($input, $obj)
$nums[$numc]=$v
$numc=$numc+1
$count[$v][0]=$count[$v][0]+1
wend
_ArraySort($count, 1)
$t=0
$bits=0
for $i=0 to 26
$aab=StringLen($map[$count[$i][1]])-AABBits0Base(26, $i)
$bits=$bits+$count[$i][0]    *StringLen($map[$count[$i][1]])
$t=$t+$count[$i][0]*$aab
writeln($map[$count[$i][1]], $count[$i][0], '(', $aab, ')')
next
writeln('total bits:', $bits)
writeln('aab delta:', $t)
writeln( )
writeln('27×27')
local $count2[27*27][2]
for $i=0 to 27*27-1
$count2[$i][0]=0
$count2[$i][1]=$i
next
for $i=0 to 26
for $j=0 to 26
    $p=0
    while $p<$numc-1
    if $nums[$p]=$i and $nums[$p+1]=$j then
        $count2[$i*27+$j][0]=$count2[$i*27+$j][0]+1
        $p=$p+1
    endif
    $p=$p+1
    wend
next
next
_ArraySort($count2, 1)
for $i=0 to 27*27-1
$b=Mod($count2[$i][1], 27)
$a=($count2[$i][1]-$b)/27
writeln($map[$a] & '-' & $map[$b], $count2[$i][0])
next
;;;;;;
Diagram 58d
Autoit Programming Library used by Autoit Program listed in Diagram 58c
;;;;;;
#include<Array.au3>
#include<FileConstants.au3>
global const $Mask[8]=[128, 64, 32, 16, 8, 4, 2, 1]
global const $BitLen=8
global const $MaxNum=256
func PrintError($msg)
ConsoleWrite($msg & @CRLF)
exit
endfunc
; Input function
func InputInit(byref $obj, byref $data)
redim $obj[5]
$obj[0]=$data
$obj[1]=UBound($data); size
$obj[2]=0; byte pos
$obj[3]=0; bit pos
$obj[4]=false; is ended
endfunc
func InputEnded(byref $obj)
return $obj[4]
endfunc
func InputReadBit(byref $obj)
if $obj[4] then return 0
local $r
if BitAND(($obj[0])[$obj[2]], $Mask[$obj[3]])< >0 then
```

```
    $r=1
else
    $r=0
endif
$obj[3]=$obj[3]+1
if $obj[3]>=$BitLen then
    $obj[3]=0
    $obj[2]=$obj[2]+1
    if $obj[2]>=$obj[1] then $obj[4]=true
endif
return $r
endfunc
; Internal array function
func ArrayCreate($size)
local $arr[$size]
$arr[0]=0
return $arr
endfunc
func ArraySetData(byref $arr, $index, $v)
$arr[$index]=$v
endfunc
func ArrayRedim(byref $arr, $size)
redim $arr[$size]
endfunc
; Output function
func OutputInit(byref $obj)
redim $obj[4]
$obj[0]=ArrayCreate(1000)
$obj[1]=UBound($obj[0]); size
$obj[2]=0; byte pos
$obj[3]=0; bit pos
endfunc
func OutputWriteBit(byref $obj, $r)
if $r<0 then ArraySetData($obj[0], $obj[2], BitOr(($obj
    [0])[$obj[2]],
$Mask[$obj[3]]))
$obj[3]=$obj[3]+1
if $obj[3]>=$BitLen then
    $obj[3]=0
    $obj[2]=$obj[2]+1
    if $obj[2]>=$obj[1] then
        $obj[1]=$obj[1]+1000
        ArrayRedim($obj[0], $obj[1])
    endif
    ArraySetData($obj[0], $obj[2], 0)
endif
endfunc
func OutputGetData(byref $obj)
$obj[1]=$obj[2]
if $obj[3]< >0 then $obj[1]=$obj[1]+1
if $obj[1]=0 then PrintError('No output data')
ArrayRedim($obj[0], $obj[1])
return $obj[0]
endfunc
; Random data function
func GenerateRandomFile($name, $size)
local $fh=FileOpen($name, BitOr($FO_OVERWRITE,
    $FO_BINARY))
if $fh=-1 then PrintError('File open fails')
local $i
for $i=0 to $size-1
    FileWrite($fh, BinaryMid(Binary(Random(0, $Max-
        Num-1, 1)), 1, 1))
next
FileClose($fh)
endfunc
func GenerateRandomData(byref $arr, $size)
redim $arr[$size]
local $i
for $i=0 to UBound($arr)-1
    $arr[$i]=Random(0, $MaxNum-1, 1)
next
endfunc
; File reader/writer
func ReadDataFile($name, byref $array)
local $fh=FileOpen($name, BitOr($FO_READ, $FO_BI-
    NARY))
if $fh=-1 then PrintError('File open fails')
local $data=FileRead($fh)
local $len=BinaryLen($data)
redim $array[$len]
local $i
for $i=1 to $len
    $array[$i-1]=Int(BinaryMid($data, $i, 1))
next
FileClose($fh)
endfunc
; File Writer
func WriteDataFile($name, byref $array)
local $fh=FileOpen($name, BitOr($FO_OVERWRITE,
    $FO_BINARY))
if $fh=-1 then PrintError('File open fails')
for $i=0 to UBound($array)-1
    FileWrite($fh, BinaryMid(Binary($array[$i]), 1, 1))
next
FileClose($fh)
endfunc
; Array helpers
func DumpArray(byref $arr)
local $i
for $i=0 to UBound($arr)-1
    ConsoleWrite($arr[$i] &" ")
next
ConsoleWrite(@CRLF)
endfunc
func ZeroArray(byref $arr)
local $i
for $i=0 to UBound($arr)-1
    $arr[$i]=0
next
endfunc
func DumpBinaryArray(byref $data)
local $input[1]
InputInit($input, $data)
local $pos=0
while not InputEnded($input)
    ConsoleWrite(InputReadBit($input))
    $pos=$pos+1
    if $pos=8 then
        ConsoleWrite(' ')
        $pos=0
    endif
wend
ConsoleWrite(@CRLF)
endfunc
; Map function
func MapInit(byref $obj, byref $map, $title='')
redim $obj[5]
$obj[0]=ArrayCreate(10); 0 branch
$obj[1]=ArrayCreate(10); 1 branch
$obj[2]=0; index
$obj[3]=$map
$obj[4]=ArrayCreate(UBound($map)); freq
ZeroArray($obj[4])
```

```
local $i, $j, Sc, $pos, $branch, $v, $len
for $i=0 to UBound($map)-1
    $pos=0
    $len=StringLen($map[$i])
    for $j=1 to $len
        $c=StringMid($map[$i], $j, 1)
        if Sc='0' then
            $branch=0
        elseif $c='1' then
            $branch=1
        else
            PrintError('invalid char in map')
        endif
        $v=($obj[$branch])[$pos]
        if $v<0 then
PrintError($title & 'duplicate prefix at line' & ($i+1)
    &':'& $map[$i])
        elseif $v>0 then
            $pos=$v
        elseif $j<$len then
            $obj[2]=$obj[2]+1
            if $obj[2]>=UBound($obj[0]) then
                ArrayRedim($obj[0], $obj[2]+10)
                ArrayRedim($obj[1], $obj[2]+10)
            endif
            ArraySetData($obj[0], $obj[2], 0)
            ArraySetData($obj[1], $obj[2], 0)
            ArraySetData($obj[$branch], $pos, $obj[2])
            $pos=$obj[2]
        endif
    next
    if $v< >0 then PrintError($title & 'duplicate prefix at
        line' & ($i+1) &':'& $map[$i])
    ArraySetData($obj[$branch], $pos, -1 -$i)
next
for $i=0 to $obj[2]
    if ($obj[0])[$i]=0 or ($obj[1])[$i]=0 then PrintError
        ($title & 'incomplete')
next
endfunc
func MapRead(byref $input, byref $obj)
local $bit, $pos
$pos=0
while $pos>=0
    $bit=InputReadBit($input)
    $pos=($obj[$bit])[$pos]
wend
return-$pos-1
endfunc
func MapClearFreq(byref $obj)
ZeroArray($obj[4])
endfunc
func MapPrintFreq(byref $obj, byref $data, $detail=false)
local $input[1]
local $index, $i, $j
InputInit($input, $data)
MapClearFreq($obj)
while not InputEnded($input)
    $index=MapRead($input, $obj)
    if $detail then ConsoleWrite(($obj[3])[$index] &")
    ArraySetData($obj[4], $index, ($obj[4])[$index]+1)
wend
if $detail then ConsoleWrite(@CRLF)
local $c0=0
local $c1=0
for $i=0 to UBound($obj[3])-1
    ConsoleWrite(($obj[3])[$i] & ':' & ($obj[4])[$i] &
        @CRLF)
    for $j=1 to StringLen(($obj[3])[$i])
        if StringMid(($obj[3])[$i], $j, 1)='0' then
            $c0=$c0+($obj[4])[$i]
        else
            Sc=Sc+($obj[4])[$i]
        endif
    next
next
ConsoleWrite('0:1=' & $c0 & ':' & Sc & @CRLF)
endfunc
func MapOutput(byref $obj, byref $data, byref $outmap,
$outfile=")
local $input[1]
local $index, $i, $j
InputInit($input, $data)
MapClearFreq($obj)
if UBound($outmap)< >UBound($obj[3]) then PrintError
    ('map size not match')
local $output[1]
OutputInit($output)
local $00=0
local Sol=0
while not InputEnded($input)
    $index=MapRead($input, $obj)
    $str=$outmap[$index]
    for $i=1 to StringLen($str)
        if StringMid($str, $i, 1)='0' then
            OutputWriteBit($output, 0)
            $00=$00+1
        else
            OutputWriteBit($output, 1)
            $o1=$o1+1
        endif
    next
    ArraySetData($obj[4], $index, ($obj[4])[$index]+1)
wend
local $c0=0
local $c1=0
for $i=0 to UBound($obj[3])-1
    ConsoleWrite(($obj[3])[$i] & '→' & $outmap[$i] &'
        '& ($obj[4])[$i] & @CRLF)
    for $j=1 to StringLen(($obj[3])[$i])
        if StringMid(($obj[3])[$i], $j, 1)='0' then
            $c0=$c0+($obj[4])[$i]
        else
            $c1=$c1+($obj[4])[$i]
        endif
    next
next
ConsoleWrite('old 0:1=' & $c0 & ':' & $c1 & @CRLF)
ConsoleWrite('new 0:1=' & $o0 & ':' & Sol & @CRLF)
if $outfile< >"then
    local $out=OutputGetData($output)
    WriteDataFile($outfile, $out)
endif
endfunc
;;;;;;
```

Diagram 58a lists out the frequency distribution of the 27 unique PUCVs of a random data set of 80,000 bits and Diagram 58b the frequency distribution of the 27×27 unique SPUCVs of the same random data set. For the sake of brevity, only 2 most frequent and 2 least frequent SPUCVs of each Bit Class are listed out in Diagram 58b. This is sufficient for one to discern other frequency distribution laws or regularities of random data set of 80,000 bits when read and sampled by Max3 5 bit 0 Head Design Code Unit Coder with a Processing Unit consisting of 3 single Code Units and a Super Processing Unit with 2 Processing Units in succession, a coder developed using CHAN FRAMEWORK. As mentioned before, CHAN FRAMEWORK provides a framework for describing and investigating the characteristics or traits of digital data of any data distribution including random data. So far the characteristics of random data has not been clearly revealed in greater detail than knowing that it is random in the sense that the values it represents comes up in random in an unpredictable manner and it tends to be approaching even distribution in terms of bit 0:bit 1 ratio in the long run but without regularity. Now with the use of CHAN FRAMEWORK, for instance under a coder of one design—Max3 5 bit 0 Head Design Code Unit Coder with a Processing Unit consisting of 3 single Code Units and a Super Processing Unit with 2 Processing Units in succession—one is able to find out certain regularities or laws that could be used to describe random data. With such regularities or laws as about frequency distribution of a random data set, one could use it as a reference for making rules for processing random data as well as non-random data. There are some regularities discernible in Diagram 58a and 58b, for instance, for the 27 unique Processing Units and the 27×27 unique Super Processing Units separately, the frequency of any particular code value is a measure of its bit length or bit size or Bit Class, the one of a higher Bit Class, i.e. shorter in bit length or size by 1 bit, its frequency will by and large double. For instance, in Diagram 58a the frequency of PUCV 000 of the 3 Bit Class is 2, 311 and the next one PUCV 1100 in the 4 Bit Class becomes 1151. The regularity is found also in Diagram 58b for the 27×27 SPUCVs as well.

However, when one compare the frequency ranges between the code values in both Diagram 58a and Diagram 58b, one is able to find that such regularities vary. One could compare the frequency ranges between the most frequent code values in one bit class with the least frequent code values in the adjacent bit class. Diagram 58e below lists out the frequency ranges of codes values in different bit classes:

Diagram 58e
Frequency Ranges between Bit Classes

| Bit Class | Highest Frequency | Lowest Frequency | Frequency Range Ratio between Most Frequent in Upper Class: Least Frequent in Lower Class |
|---|---|---|---|
| PU | | | |
| 3 | 2311 | | |
| 4 | 1151 | 1036 | 2.23:1 (2311/1036) |
| 5 | 579 | 523 | 2.20:1 (1151/523) |
| 6 | 315 | 254 | 2.80:1 (579/254) |
| SPU | | | |
| 6 | 264 | | |
| 7 | 160 | 140 | 1.88:1 (264/140) |
|  |  |  | 2.25:1 (315/140) |
| 8 | 91 | 50 | 3.2:1 (160/50) |
| 9 | 48 | 19 | 4.79:1 (91/19) |
| 10 | 31 | 6 | 8:1 (48/6) |
| 11 | 17 | 2 | 15.5:1 (31/2) |
| 12 | 14 | 0 | 17:0 |

So it reveals that bit length is not the only factor in determining the frequency of a value, values in different groupings also have their own frequency regularity characteristic of their own groups. For instance, the ratio between the most frequent code value in an upper bit class and the least frequent code value in the lower bit class tends to increase in the SPUCV group when bit classes become lower and lower.

With this in mind, one could design ways and corresponding rules of processing data, whether random or not, suitable for the target purposes. Now the instant disclosure reveals how this finding could be used for making digital data compression, including random data in particular.

For compressing random data, with the finding revealed in Paragraph [128], one could develop a technique of Digital Blackholing (DBh) using Absolute Address Branching Coding (AABC) together with Successive Code Surrogating (SCS). In the physical world, Blackhole is a spot into which matter is absorbed. By analogy, some embodiments revealed in the present invention use digital binary code representing that spot into which other binary code is absorbed. This involves identifying some digital binary codes which are good for performing that role. The criterion that is used for selecting such spots depends on the purpose one is going to achieve. So the criterion set up is purpose-related. For making data compression, the obvious criterion is about the frequency of the digital binary code. So the more frequent the piece of digital binary code turns up, the more frequent it would be absorbing other digital binary codes, so more saving of bits could be achieved. So one could therefore identify the most frequent values present for each Bit Class in the group of PUCVs and of SPUCVs as shown in the Diagram 58a and 58b.

The invention of a Digital Blackhole uses the technique of AABC. The group of 27 unique PUCVs could be divided into 2 sub-groups with roughly half half in frequency as illustrated in Diagram 55 with description found in Paragraph [115]. And Paragraph [116] summarizes that the frequency of the Class Incompressible and the Class Compressible above differs only slightly, with 8897 Processing Units for the first class and 8888 for the second. The Class Incompressible includes 7 PUCVs and Class Compressible 20 PUCVs. The Class Incompressible carries a Classification Code or Scenario Code 0 as its head and Class Compressible uses 1 as its head. If one could save the use of Classification Code or Scenario Code, then data compression is achievable for random data of a certain frequency distribution, i.e. with a certain regularity of frequency distribution. This is done by the invention of Digital Blackhole revealed here. Any PUCV or SPUCV in any random data set is preceded and followed by another PUCV, which could be in 3/4/5/6 Bit Class. The Class Incompressible in Diagram 55 are PUCVs in 3 Bit Class and 4 Bit Class, whereas Class Compressible in 5 Bit Class and 6 Bit Class. If not using the Classification Code Bit 0/1, One could use the following AAB Codes for the PUCVs of Class Incompressible and Class Compressible as follows in Diagram 59:

Diagram 59a
AAB Codes for PUCVs of Class Incompressible 3/4 Bit Class

| 7 unique PUCVs | Assignment |
|---|---|
| 00-1 | 3 Bit Class PUCV |
| 010-1 | 4 Bit Class PUCV |
| 011-1 | 4 Bit Class PUCV |
| 100-1 | 4 Bit Class PUCV |
| 101-1 | 4 Bit Class PUCV |
| 110-1 | 4 Bit Class PUCV |
| 111-1 | 4 Bit Class PUCV |

Diagram 59b
AAB Codes for PUCVs of Class Incompressible 5/6 Bit Class

| 20 unique PUCVs | Assignment |
|---|---|
| 0000-1 | 5 Bit Class PUCV |
| 0001-1 | 5 Bit Class PUCV |
| 0010-1 | 5 Bit Class PUCV |
| 0011-1 | 5 Bit Class PUCV |
| 0100-1 | 5 Bit Class PUCV |
| 0101-1 | 5 Bit Class PUCV |
| 0110-1 | 5 Bit Class PUCV |
| 0111-1 | 5 Bit Class PUCV |
| 1000-1 | 5 Bit Class PUCV |
| 1001-1 | 5 Bit Class PUCV |
| 1010-1 | 5 Bit Class PUCV |
| 1011-1 | 5 Bit Class PUCV |
| 11000-1 | 6 Bit Class PUCV |
| 11001-1 | 6 Bit Class PUCV |
| 11010-1 | 6 Bit Class PUCV |
| 11011-1 | 6 Bit Class PUCV |
| 11100-1 | 6 Bit Class PUCV |
| 11101-1 | 6 Bit Class PUCV |
| 11110-1 | 6 Bit Class PUCV |
| 11111-1 | 6 Bit Class PUCV |

It could be seen in both Diagram 59a and 59b that each of the PUCV assigned in the above manner helps saving 1 bit by using the technique of AABC. But one could not just use these AAB Codes to represent the 27 unique PUCVs as the Classification or Scenario Code is missing. So the technique of creating Digital Blackhole has to come to play. This is as described before to designate a digital binary code as the Blackhole which absorbs the preceding PUCV or the ensuing PUCV, and this digital binary code once detected upon decoding represents a code that uses AAB Codes as listed out in Diagram 59a and 59b to represent the PUCVs assigned to them. But as there are two Classes, Class Incompressible and Class Compressible, so there should be two Blackholes, one responsible for using AAB Codes to represent (thus absorb) 3 Bit Class and 4 Bit Class PUCVs and the other 5 Bit Class and 6 Bit Class PUCVs. So there should be a partner Blackhole 1 (SPUCV 0011-11011, being 19 in frequency, the lowest in the 9 Bit Class), pairing up with Blackhole 0 (SPUCV 0010-1100 with a frequency of 91, the highest one in the 8 Bit Class in the SPUCV group) for absorbing the two halves of code values (one half being 3 Bit and 4 Bit Class code values and another being 5 Bit and 6 Bit Class code values) preceding or following Blackhole 0 and Blackhole 1 respectively. SPUCV 0010-1100 and SPUCV 0011-11011 are chosen here as Blackhole 0 and 1 because together they exhibit a frequency range (a ratio greater than 4:1 as shown in Diagram 58c), a characteristic that is appropriate for use in one form of Digital Data Blackholing technique.

The discovery of the frequency regularity or law of the SPUCV group therefore helps to pave way for using this Blackholing technique for data compression of random data. And because of the frequency regularity pattern of PUCV group and SPUCV group could now be ascertained, this pattern, including its frequency magnitude and frequency range for any particular Bit Class or Bit Class values, one could use this as a reference for making up rules for making compression for other types of data distribution as will be revealed later.

Digital Data Blackhole could use AABC to absorb the value in front or the next value in the upcoming queue or both values in front or at the back. So the technique of Digital Data Blackholing is defined as using a code value of a coder defined under CHAN FRAMEWORK to absorb or represent other code value(s) by using AAB Coding, i.e. the AAB Code associated with the Blackhole code value representing the absorbed code value, and the Blackhole code value therefore being the index or pointer to the AAB Code representing the code value being absorbed by the corresponding Blackhole. For instance, Blackhole 0 uses AAB Codes in Diagram 59a to absorb 3 Bit and 4 Bit PUCVs when they come up at the back (for backward absorption), thus saving 1 bit for about half of the occurrences of Blackhole 0, SPUCV 0010-1100 in the example used here. This saves about 46 (91/2) bits for instance, depending on the ratio between the frequency of 3 Bit & 4 Bit PUCVs and the frequency of 5 Bit & 6 Bit PUCVs. Using SPUCV 0011-11011 to act as Blackhole 1 using AAB Codes in Diagram 59b, representing the pattern of SPUCV 0011-11011 followed by 5 Bit or 6 Bit PUCVs, this saves on the one hand 45 (91/2) bits but on the other hand loses also 45 bits because SPUCV 0011-11011, Blackhole 1, is 9 bit, one bit longer than Blackhole 0, SPUCV 0010-1100. The result of using Blackhole 1 is therefore breakeven. Altogether, using this technique it could save about 1 bit times about one half of the frequency of SPUCV 0010-1100, i.e. 46 (91/2) bits. However, it is not finished yet. Because SPUCV 0011-11011 (Surrogate Code 0, Scode 0) is borrowed to surrogate SPUCV 0010-1100 (followed by 5/6 Bit PUCVs) and become Blackhole 1. So Blackhole 1 should not be longer than Blackhole 0 by 1 bit in bit length and its frequency should be less than one quarter or so than that of Blackhole 0. Otherwise, data compression may not be achievable. And the place of Blackhole 1 has to be surrogated by another code. The criteria or rules for selecting surrogate codes for making Successive Code Surrogating for the purpose of making data compression are (1) the shorter the bit length of the code the best, (2) the lower the frequency of the code the best, and (3) Surrogate Code causing code conflicts not to be chosen (for instance, if SPUCV 0010-1100 is chosen as Blackhole 0, then the parts making up it should be avoided as the constituting parts of Blackhole 1 wherever possible. The chosen Scode should therefore be less frequent (the less frequent the better) than the code to be surrogated (surrogated code) and also should not be longer than the code to be surrogated by 1 bit in bit length (the shorter the surrogating code the better). The rules above should be taken as generalized rules for compressing random data. More will be discussed in Paragraph [134] (2) when discussing Compressing and Decompressing Non-Random Data. One could also formulate other rules suitable for their own purpose where appropriate. As seen in Diagram 58b, such code surrogating begins with SPUCV 0011-11011 surrogating SPUCV 0010-1100 (followed by 5/6 Bit PUCVs), SPUCV 0011-11011 (Blackhole 1 and Scode 0) has to be surrogated by Scode 1 and so on. It stops at the lowest Bit Class of the SPUCV group, the 12 Bit Class. In this Bit Class, there are code values that never occur. So the SPUCV with missing occurrence could be used as the last Scode without having another code to surrogate it. But upon decoding, one has to know what code values have been used for such surrogating, so Scode Indicators have to be used and recorded in Main Header or Section Header. This results in some bit expenditure. So the surrogating could also stop at a certain Bit Class of the SPUVC group where such bit expenditure would exceed the bit saving resulting from further surrogating. When it stops at a particular Bit Class, the next one SPUCV with the lowest frequency could use AAB Code to divide itself into 2 Scodes, one Scode (Scode last but one) surrogates the preceding Scode in chain and then the other (Scode last) surrogates itself. For instance using the Surrogate Codes listed out in Diagram 58b, if the surrogating stops at 11 Bit Class, then SPUCV 101111-11110 (Scode 2) has to be surrogated using SPUCV 01011-101011 (Scode 3a) with the next lowest frequency in class, which is divided into SPUCV 01011-101011-0 (surrogating SPUCV 01011-101011 itself) and SPUCV 01011-101011-1 (surrogating Scode 2, SPUCV 101111-11110). However, since Scode 3b is code value missing, no code splitting is required if using it to surrogate Scode 2. So depending on the bit expenditure required for using these Special Codes, one could decide on which Bit Class such Successive Code Surrogating should stop. However, using random data set of 80,000 bits in this example, the bit saving achieved by the techniques of Digital Data Blackholing, AAB Coding and Successive Code Surrogating is not enough to cover the bit expenditure for the Special Code used if using the frequency range ratio of 4:1 as the selection criterion for determining which code values are to be used as Blackhole 0 and Blackhole 1. Increasing the random data set to 800,000 bits apparently narrows the frequency range (i.e. 4: 1) to a lower ratio that makes it not possible to compress such random data set by this form of Digital Data Blackholing.

Using a higher frequency range ratio with less random bits of digital data could however make bit saving sufficient to cover the bit expenditure for the Special Code Indicators used. For instance, one could use 12-bit SPUCV 111111-101011 with a frequency of 14, highest in the 12 Bit Class as Blackhole 0 for pairing up with the missing SPUCV 111111-111110, to absorb the PUCV preceding it (for instance, using forward absorption). Using this pair of DDBs is quite straight forward. There are 64 unique code values of 12 Bit Class, requiring 6 bits for each of the two DDBs as their respective Special Code Indicators for identifying them. This takes up 12 bits. Because Blackhole 1 is a missing code value and thus does not require Scode to surrogate it anymore. Therefore bit saving is 14 minus 12 bits equivalent to 2 bits for this random data set of 80,000 bits.

This is a definite sign and example that under certain situation, random data could be compressed, thus breaking the myth of Pigeonhole Principle in Information Theory that random data could never be compressed. With more exploration, regular patterns could certainly be discovered for compressing random data of any sizes under all situations. And another example will also be shown in discussion below Diagram 60 in Paragraph [134] that how another technique could be used to increase the chances of compressing random data. The above combination of techniques could therefore be used to compress data set which qualifies to be compressed, i.e. meeting the frequency range requirement that is greater than the frequency range ratio of 4:1, the higher this ratio, the lower could be the size of the random data set for making successful compression. Since there are limitless coders that could be designed under CHAN FRAMEWORK using limitless sizes of random data set, one could try using the above techniques (or together with other additional techniques, such as the technique of unevening data introduced above as well as other newly invented techniques, such as that to be introduced below Diagram 60 in Paragraph [134] or those other wise souls would design) for making compression wherever the respective frequency range ratio pattern is identified for a particular random data set of a certain size. So the size of the data set used (or divided into sections of a specific size so defined for processing) as well as the frequency range ratio between the Most Frequent Code Value in an Upper Bit Class:the Least Frequent Code Value in a Lower Bit Class (for instance as shown in Diagram 58c) are the two characteristics of digital data set, whether random or not, that could be used for identifying the patterns or regularities of digital data set so that the aforesaid combination of techniques could be used for its successful compression.

What is revealed in Paragraph [131] above is a technique of CHAN CODE, namely successive surrogating, when used together with Digital Data Blackholing, it helps to squash the myth of Pigeonhole Principle in Information Theory where random data set meets the requirement of the respective frequency range characteristic under appropriate coder designed under CHAN FRAMEWORK. Therefore, one could do it using the same method as outlined here in similar manner with coders of other design using different Max number and Bit Number of different PUCV and SPUCV groups where appropriate. Additional embodiments may also include other different solutions employing different techniques or methods in different combination using coders of CHAN FRAMEWORK.

Digital Data Blackhole (DDB) introduced here could have many forms. It could use AAB Code to absorb (i.e. represent) code values in the front or at the back or in both directions or even side-way (for instance the Surrogate Code splitting into two using bit 0 or bit 1 to represent two code values could be regarded a form of side-way absorption or representation of code values where the code values to be represented by the split Surrogate Codes could appear anywhere in the data set). It is simpler to use DDB to absorb code values at the back. Absorbing code values in the front has to take care of the situation that when two or more DDBs coming in succession. When there are codes designated to be DDB coming together in a chain, the AAB Codes corresponding to each of the DDBs have to be stored in sequential order first, and after the AAB Code of the last DDB is processed, such AAB Codes have to be placed in reverse order (i.e. using the technique of reverse placement of AAB Codes, thus checking if the preceding code value after decoding could form into another DDB and doing further corresponding code decoding if necessary) so that upon decoding, the AAB Codes could be interpreted in the right order for decoding the code values being absorbed. And one would also have to use a bit code, i.e. Bit 0 or Bit 1 (the relevant distinction bit) to make distinction about whether a DDB appearing as the first encoded code value of the encoded code output stream is a DDB having absorbed a code value in the front or not (if yes, the above distinction bit has also to be followed by the AAB Code representing the code value absorbed; if no, the aforesaid distinction bit is enough). For blackhole absorbing code values in both direction, the bit saving could be more, it could use 2 AAB Codes, one for each absorbed code value in the front and at the back. It is more complicated when several DDBs are coming together. So one should make further analysis about each possible situation or scenario of DDB Collision and then set up rules of handling how coding is to be done. For instance, if one does not want to use reverse placement of AAB Codes for whatever reason, one could set up exception rule that when two DDBs coming in succession, one of which could stop doing AAB Coding for absorbing the relevant code value (i.e. the other DDB) corresponding to the direction of absorption being used. Such exception rule(s) could be designed for uni-directional or bi-directional absorption. To use DDB for absorbing code value in the front or at the back or in both directions, one could also include a DDB Type Indicator in the relevant header(s), so that how AAB Codes associated to which could be decoded correctly. Also the code values to be represented in the front or at the back could also be designed to be at a certain distance from the corresponding DDBs; usually the code value immediately in the front or at the back is to be absorbed or represented by AAB Coding, however one could also designate a fixed number of positions in the front or at the back of the corresponding DDB for the code value to be absorbed or represented by AAB Coding. In such ways, more finer rules would have to be designed for use for representing such situations when the first DDB is encountered in the original digital data input stream for making such absorption or representation so that there would not be any misinterpretation during decoding process.

With the above revelation, one could generalize on the method or techniques used in combination for compressing digital data, including random data and non-random data as follows:

(1) Compressing and Decompressing Random Data (1a) Data Parsing using coder designed using CHAN FRAMEWORK, producing frequency statistics of the random data set:

This step uses a coder designed using CHAN FRAMEWORK; for instance, the frequency statistics presented in Diagram 58 is produced by using Max3 5 bit 0 Head Design Code Unit Coder with a Processing Unit consisting of 3 single Code Units and with a Super Processing Unit consisting of 2 Processing Units;

(1b) Designating code values as Special Code (or Exception Code) for special processing, including Digital Data Blackholing using AAB Coding and successive Surrogating with or without code splitting for making new Surrogate Code for use: According to the frequency statistics of the random data set, PUCVs and SPUCVs are selected as Special Codes, such as Blackhole Codes and Surrogate Codes wherever appropriate frequency patterns are identified; such selection is based on the criteria that serve the purpose of the encoding and decoding, for instance in this case, this is for compression and decompression of digital data, and in particular random data; the revelation above has been given on how codes are selected for this purpose, for instance, in short, the Special Codes are selected on the basis of their frequencies according to Bit Class in the PUCV and SPUCV group; for instance code values with highest frequencies for each Bit Class are candidates of Blackhole 0; code values with lowest frequencies for each Bit Class are candidates of Surrogate Codes, where one of which (for instance, Surrogate Code 0) is used as Blackhole 1 pairing it with the code of Blackhole 0 for using AAB Coding to represent (or absorb) the code values either in front or at the back or in both directions; so the special processing includes Digital Data Blackholing using AAB Coding and successive Surrogating with or without code splitting for making new Surrogate Code for use; AAB Codes associated with Blackhole codes could be put after Blackholes codes and merged into the main encoded code output file instead of using a separate AAB Code File for storing such AAB Codes, and one could also decide using a separate AAB Code File for storing the AAB Codes where appropriate; Indicators for Special Codes mentioned above (Special Code Indicators) includes Blackhole indicators and Surrogate Code Indicators; Special Code Indicators and Section Size Indicators (see below) have to be written into relevant header(s); for convenience of encoding, the whole digital data input could be divided into sections made up a small amount of binary bits, a certain fixed number of binary bits, such as using 80000 bits as a section, for processing as long as the sections are big enough for such special processing to yield bit savings (for instance bit saving could not be achieved if a section is only made up of 1 binary bit, so no such non-sense assumption is to be raised again); the smaller the section the less bit saving could be achieved, so using a bigger bit size section would mean more bit saving for the section could be achieved, however the speed of data parsing may be slowed down as well, so a balance has to be struck between bit saving and speed of encoding, therefore one may use a Section Size Indicator (to be written in the respective section header) to indicate the bit size of the section under processing; if using sections, the PUCV or SPUCV crossing the sectional boundary (for instance 80,000 bits) could be processed as part of the section before the section boundary or as a new section and the section boundary is adjusted accordingly;

(1c) Encoding process for compressing Random Data:

So the encoding process for compressing random data includes:

(i) Reading and Parsing the digital data input using coder designed using CHAN FRAMEWORK, producing frequency statistics of the random data set;

(ii) Designating code values as Special Code for special processing, including Digital Data Blackholing using AAB Coding and successive Surrogating with or without code splitting for making new Surrogate Code for use;

(iii) Reading code values, distinguishing whether the code is normal code or Special Codes (including Blackhole 0 and other Scodes), encoding codes values thus read, applying Special Processing where appropriate (Special Processing here includes Digital Data Blackholing using AAB Coding when DDBs are encountered or substituting code mapping table for other Special Codes, i.e. surrogate codes, for Successive Code Surrogating where appropriate) and writing the encoded code into output files where appropriate, according to the Designation above in step (1cii), the designed rules of Successive Surrogating with or without code splitting and the AAB Code Table rules, producing AAB Codes for code values absorbed by Blackholes; AAB Codes could be written as separate AAB Code output file or written merged into the main encoded code output file where appropriate;

(iv) writing Indicators into main header and section headers where appropriate if not already embedded in the encoder, such indicators including, where appropriate, Checksum Indicator, Signature for CHAN CODE FILES, Mapping Table Indicator, Number of Cycle Indicator, Code Unit, Definition Indicator, Processing Unit Definition Indicator, Super Processing Unit Definition Indicator, Last Identifying Code Indicator, Scenario Design Indicator, Unevener/Evener Indicator, Recycle Indicator, Frequency Indicator, Special Code Indicators, Section Size Indicator, Digital Data Blackhole Type Indicator;

(1d) Decoding process for compressing Random Data:

Decoding process for decompressing random data includes:

(i) Reading and Parsing the encoded code file using coder designed using CHAN FRAMEWORK;

(ii) decoding codes values (i.e. substituting code mapping table for code values where appropriate) and writing the decoded code into decoded code file where appropriate, according to the Designation above in step (1cii), the designed rules of Successive Surrogating with or without code splitting and the AAB Code Table rules, retrieving AAB Codes and Indicators recorded in headers (or embedded in the decoder) for decoding code values absorbed by Blackholes and writing them in the appropriate position into the decoded code file;

Here is another proof that random data is compressible, using one instance of frequency distribution of random data of 72,003 bits generated by the program listed out in Diagram 58c by changing the line from:

if not FileExists('ff') then GenerateRandomFile('ff', 10000)

to if not FileExists('ff') then GenerateRandomFile('ff', 9000)

Such instance of frequency distribution is listed below in Diagram 60a:

Diagram 60a
Frequency Distribution of Code Values of Random Data Set of 72,003 bits read using Max3 5 bit 0 Head Design Code Unit Coder 000 2004 (−1)
1100 1059 (0)
0011 1034 (0)
0110 1023 (0)
0010 987 (0)
1000 982 (−1)
0100 914 (−1)
10011 546 (0)
11100 541 (0)
11010 523 (0)
10110 517 (0)
01110 506 (0)
01111 502 (0)
01011 499 (0)
10010 484 (0)
01010 477 (0)
11110 476 (0)
11011 470 (0)
10100 470 (0)
111011 264 (1)
101010 261 (1)
111110 259 (1)
111010 250 (1)
101111 248 (1)
101011 244 (1)
111111 237 (1)
101110 227 (1)

total bits: 72003
aab delta: −1910
27 × 27
000-000 199
000-1100 148
000-0100 142
. . .                  (skipping irrelevant code values because the listing is too long)

11011-10100 17
111111-1100 17
101010-10100 17       Highest in Frequency in 11 Bit Class
101111-0100 17
10110-10100 17
0011-111110 17
10010-11100 17
0110-111011 17
10100-10011 17
0010-111110 17
10100-01010 17
1000-111010 17
01110-10011 17
111110-0011 17
01010-10110 17
111110-0110 17
10011-01110 17
01111-01011 17
111110-1100 17
01011-01111 17
01010-10011 17
01011-10110 17
11110-10010 17
11100-10010 16
11110-01110 16
10110-10011 16

Diagram 60a
Frequency Distribution of Code Values of Random Data Set of 72,003 bits read using Max3 5 bit 0 Head Design Code Unit Coder 0100-111010 16
01110-11110 16
11010-10100 16
11100-10100 16
0110-101110 16
101011-1000 16
101111-0110 16
1100-111011 16
111010-0011 16
0011-101011 16
01110-11011 16
101011-11010 16     Second Highest in Frequency in 11 Bit Class
10100-10100 16
01110-10010 16
111011-0011 16
01111-11110 16
11100-01011 15
01010-11010 15
1000-111110 15
11010-11010 15
11010-01111 15
11011-11110 15
101111-0010 15
10011-11010 15
11100-11010 15
11010-01110 15
11011-11010 15
111111-0010 15
101011-1100 15
0011-111011 15
101010-0010 15
1100-111110 15
0100-111011 15
01111-10010 15
1100-101010 15
01110-11010 15
11100-11011 15
101110-10011 15     Third Highest in Frequency in 11 Bit Class
11100-10011 15
10011-11011 15
101110-0110 14
01110-11100 14
10100-10110 14
01110-10110 14
11011-01111 14
101010-1000 14
10011-101010 14
111010-11110 14
111010-01111 14
01010-11011 14
01011-11110 14
111110-0100 14
11110-01011 14
01111-11100 14
11010-111011 14
11110-10100 14
11110-01111 14
111011-11100 14
0100-101010 14
0100-101111 14
111111-0011 14
11100-01110 14
111111-1000 14
0010-111011 14
11011-1100 14
0010-111010 14
1000-101110 14
0010-101010 14
10110-10110 14
10110-01010 14
10110-01011 14
10110-101011 13
10100-11100 13
10011-10100 13
01011-01011 13

Diagram 60a
Frequency Distribution of Code Values of Random Data Set of 72,003
bits read using Max3 5 bit 0 Head Design Code Unit Coder

| Code | Freq | Note |
|---|---|---|
| 01011-10010 | 13 | |
| 111110-01010 | 13 | |
| 101011-0110 | 13 | |
| 0011-111111 | 13 | |
| 10010-10100 | 13 | |
| 0100-101011 | 13 | |
| 11011-11100 | 13 | |
| 101111-0011 | 13 | |
| 101111-10110 | 13 | |
| 0110-101010 | 13 | |
| 0010-101011 | 13 | |
| 10100-10010 | 13 | |
| 10010-10011 | 13 | |
| 01011-111111 | 13 | |
| 101010-0011 | 13 | |
| 111010-10010 | 13 | |
| 111010-1100 | 13 | |
| 01111-10110 | 13 | |
| 111010-0010 | 13 | |
| 01010-11100 | 13 | |
| 01010-10010 | 13 | |
| 11110-01010 | 12 | |
| 01111-11010 | 12 | |
| 111011-10100 | 12 | |
| 111111-10011 | 12 | |
| 11010-11110 | 12 | |
| 111011-01110 | 12 | |
| 1000-111111 | 12 | |
| 01110-101011 | 12 | |
| 11100-111010 | 12 | |
| 11100-101110 | 12 | |
| 111111-10110 | 12 | |
| 11011-01010 | 12 | |
| 10100-11110 | 12 | |
| 11100-01111 | 12 | |
| 10010-101010 | 12 | |
| 101010-01010 | 12 | |
| 1100-101111 | 12 | |
| 01110-01111 | 12 | |
| 111110-10011 | 12 | |
| 10011-111110 | 12 | |
| 101110-0100 | 12 | |
| 01010-11110 | 12 | |
| 01110-01011 | 12 | |
| 01111-01111 | 12 | |
| 111011-01010 | 12 | |
| 0110-101011 | 12 | |
| 0110-111111 | 12 | |
| 101110-0011 | 11 | |
| 101011-01010 | 11 | |
| 101110-1000 | 11 | |
| 111110-11100 | 11 | |
| 111111-0110 | 11 | |
| 111011-101010 | 11 | Highest in Frequency in 12 Bit Class Blackhole 0 |
| 11011-101110 | 11 | |
| 111011-10110 | 11 | |
| 101010-11100 | 11 | |
| 101010-10110 | 11 | |
| 101010-10011 | 11 | |
| 111010-101011 | 11 | Second Highest in Frequency in 12 Bit Class |
| 10010-01111 | 11 | |
| 10010-10010 | 11 | |
| 10010-01110 | 11 | |
| 01010-101011 | 11 | |
| 10100-01011 | 11 | |
| 01010-101010 | 11 | |
| 01110-111110 | 11 | |
| 11100-111111 | 11 | |
| 0100-111111 | 11 | |
| 01011-11100 | 11 | |
| 1100-111111 | 11 | |
| 1100-111010 | 11 | |
| 11010-10110 | 11 | |
| 11100-01010 | 11 | |
| 11010-01010 | 11 | |
| 11010-11011 | 11 | |
| 101011-10110 | 10 | |
| 11110-11011 | 10 | |
| 111011-0110 | 10 | |
| 01110-101111 | 10 | |
| 0110-101111 | 10 | |
| 0011-101110 | 10 | |
| 11010-111111 | 10 | |
| 1000-101010 | 10 | |
| 101011-10010 | 10 | |
| 0010-101111 | 10 | |
| 11110-111111 | 10 | |
| 101111-11100 | 10 | |
| 111010-0100 | 10 | |
| 111010-1000 | 10 | |
| 111010-11011 | 10 | |
| 10010-101011 | 10 | |
| 101010-01110 | 10 | |
| 11110-11110 | 10 | |
| 111110-11110 | 10 | |
| 11110-01111 | 10 | |
| 111110-10110 | 10 | |
| 11011-11011 | 10 | |
| 111111-0100 | 10 | |
| 11100-111011 | 10 | |
| 11100-101111 | 10 | |
| 11011-01011 | 10 | |
| 111111-11100 | 10 | |
| 101110-10100 | 10 | |
| 0100-101110 | 10 | |
| 11110-10011 | 9 | |
| 111010-01011 | 9 | |
| 10110-101010 | 9 | |
| 10010-111110 | 9 | |
| 10011-101111 | 9 | |
| 11010-101010 | 9 | |
| 11010-101111 | 9 | |
| 11100-101010 | 9 | |
| 11011-111011 | 9 | |
| 10100-101110 | 9 | |
| 111111-10010 | 9 | |
| 101110-11100 | 9 | |
| 01011-111011 | 9 | |
| 111111-01010 | 9 | |
| 10010-101111 | 9 | |
| 101110-01111 | 9 | |
| 101110-01010 | 9 | |
| 11100-111110 | 9 | |
| 101110-10110 | 9 | |
| 101011-11110 | 9 | |
| 111011-01111 | 9 | |
| 111011-11010 | 9 | |
| 10100-111011 | 9 | |
| 01011-11011 | 9 | |
| 10010-111011 | 9 | |
| 11010-111110 | 9 | |
| 101010-10010 | 9 | |
| 111011-0100 | 9 | |
| 111010-11100 | 8 | |
| 11011-101010 | 8 | |
| 111010-01010 | 8 | |
| 101111-101111 | 8 | Third Highest in Frequency in 12 Bit Class |
| 101011-111010 | 8 | |
| 11010-101110 | 8 | |
| 101011-11100 | 8 | |
| 101011-11011 | 8 | |
| 111111-11110 | 8 | |
| 11011-10110 | 8 | |
| 11110-101011 | 8 | |
| 111111-11011 | 8 | |
| 01111-111110 | 8 | |
| 111111-101111 | 8 | |
| 11010-111010 | 8 | |
| 01010-111010 | 8 | |

Diagram 60a
Frequency Distribution of Code Values of Random Data Set of 72,003 bits read using Max3 5 bit 0 Head Design Code Unit Coder 111110-11011 8
11100-101011 8
01011-01010 8
01011-111010 8
01011-101011 8
10011-111011 8
101010-01011 8
111011-01011 8
101110-11110 8
111011-101111 8
10011-101110 8
01110-01110 8
01110-111111 8
111010-10100 8
10010-01011 8
111111-01111 8
111111-01110 8
101111-10010 8
101111-01111 8
10011-111111 8
111110-1000 8
11110-101111 7
01111-101011 7
111010-01110 7
01111-111011 7
11110-101110 7
01111-01010 7
111111-10100 7
111110-111010 7
01010-10100 7
01010-01110 7
111111-111011 7
01011-101010 7
01111-111111 7
01110-111011 7
101010-11110 7
11011-111110 7
101011-10011 7
101110-111010 7
11011-111010 7
101110-11011 7
101111-01011 7
101011-01011 7
101010-0100 7
101110-01011 7
101010-11010 7
101010-11011 7
10011-101011 7
101111-10011 7
01110-101110 7
10011-111010 7
111010-10011 6
101111-01110 6
111010-11110 6
111010-11010 6
01010-111011 6
101111-10100 6
01110-01010 6
101010-101110 6
10010-111010 6
01011-101110 6
111110-111110 6
111110-01110 6
101110-101010 6
101111-11010 6
101110-111111 6
111110-10010 6
01110-111010 6
10110-111011 6
11110-101010 6
10100-111111 6
01111-101010 6
101011-01110 6
10110-10010 6
10110-111110 6
01111-101110 6

11110-111010 6
101011-10100 6
11011-111111 6
01111-101111 6
101010-111110 5
10100-101111 5
10100-101010 5
111110-101010 5
10010-101110 5
101010-111111 5
101011-01111 5
101010-101010 5
01111-111010 5
01110-101010 5
101010-111010 5
111110-10100 5
111110-01011 5
111111-111111 5
01010-111110 5
10110-101111 5
11110-111110 5
111111-01011 5
101111-101011 5
11110-111011 5
101110-11010 5
101111-01010 5
111011-11110 5
101011-111111 5
10010-111111 5
11010-101011 5
111011-111011 5
111010-101110 5
11011-101111 5
10100-101011 5
10100-111010 4
101110-01110 4
111011-111111 4
101110-10010 4
111111-11010 4
111011-10011 4
111011-10010 4
111011-111010 4
111011-11011 4
101111-111110 4
01010-101110 4
101111-111111 4
01011-111110 4
101011-0011 4
01010-111111 4
111010-111010 4
111010-111011 4
101111-11110 4
101111-101010 4
111110-101111 4
111110-101011 4
111110-11010 4
01011-101111 4
10110-111111 3
101111-11011 3
10100-111110 3
111010-101111 3
111010-101010 3
111111-111010 3
101011-111110 3
111111-101010 3
111111-101110 3
101111-111011 3
101011-101010 3
10110-101110 3
101111-111010 3
101010-111011 3
101110-101011 3
101110-101111 3
101110-111110 3
111110-111111 3

Diagram 60a
Frequency Distribution of Code Values of Random Data Set of 72,003
bits read using Max3 5 bit 0 Head Design Code Unit Coder

| | | |
|---|---|---|
| 111110-111011 | 3 | |
| 101010-01111 | 3 | |
| 111011-111110 | 3 | |
| 111010-111110 | 2 | |
| 111111-101011 | 2 | |
| 101011-101110 | 2 | |
| 101010-101111 | 2 | |
| 111110-101110 | 2 | |
| 111010-10110 | 2 | |
| 111111-111110 | 2 | |
| 111010-111111 | 2 | |
| 01010-101111 | 2 | |
| 101011-101011 | 1 | |
| 101011-101111 | 1 | |
| 111011-101011 | 1 | |
| 101110-111010 | 1 | |
| 111011-101110 | 1 | |
| 101111-101110 | 1 | |
| 101011-111011 | 1 | |
| 101010-101011 | 1 | |
| 11011-101011 | 1 | |
| 101110-111011 | 1 | |
| 101110-101110 | 0 | Blackhole 1 |

Diagram 60b
Distribution of Frequency Count of 12 Bit Class SPUCVs
using Frequency Statistics of Diagram 60a

| Frequency Count | No. of Unique SPUCVs of 12 Bit Class | |
|---|---|---|
| 0 | 1 | SPUCV 101110-101110 as Blackhole 1 |
| 1 | 9 | |
| 2 | 7 | |
| 3 | 16 | |
| 4 | 9 | |
| 5 | 10 | |
| 6 | 4 | |
| 7 | 2 | |
| 8 | 4 | |
| 9 | 0 | |
| 10 | 0 | |
| 11 | 2 | SPUCV 111011-101010 and 111010-101011 either one as Blackhole 0 |

Total: 64 unique code values

Diagram 60a is produced by adjusting the random data set size to a smaller value of ff=9000 as described above and Diagram 60b is the distribution of frequency count of the SPUCVs in the 12 Bit Class using the frequency statistics of Diagram 60a. As seen from Diagram 60b, there are two code values of the highest frequency of 11 counts. One could choose either the first or the second one (i.e. SPUCV 111011-101010 and 111010-101011) as Blackhole 0 to pair up with the missing SPUCV 101110-101110 as Blackhole 1 with zero frequency count. Using either one, the bit saving is only 11 bits and the bit expenditure for two Blackhole Indicators calculated using the normal method is 12 bits.

It apparently is not an appropriate method. So another new technique could be designed to shorten the bit length required for the Blackhole Indicators. This uses the concept of range again.

Using the code value of 12 Bit Class, SPUCV 111011-101010, being Blackhole 0 with the highest frequency count as Blackhole 0, is to give a floor to the highest frequency of the 12 Bit Class SPUCVs. One could use 2 bits (the number of binary bits used here being adjustable according to the frequency pattern or regularity being ascertained of the digital data set being processed) for indicating how far away in terms of bit length that the 12-bit code value of the second highest frequency count is next to it. A two bit indicator could give a bit length span of 4 bits. This is sufficient for most cases. If it is not adequate for this purpose and the 12-bit code value of the highest frequency lies outside the bit length span designed and chosen, one could regard it as Incompressible Random Data. So bit 00 for 11 bit, 01 for 12 bit, 10 for 13 bit and 11 for 14 bit SPUCV. Since SPUCV 111011-101010 is of 11 bit, the indicator for this is bit 00.

If one select the code value with highest frequency for Blackhole 0 and the missing code value as Blackhole 1, after encoding, parsing the encoded code, the distribution of the frequency count of the 12 Bit SPUCVs will change to one as in Diagram 60c below:

Diagram 60c
Distribution of Frequency Count of 12 Bit Class SPUCVs in Encoded
Code using Frequency Statistics of Diagram 60a

| Frequency Count | No. of Unique SPUCVs of 12 Bit Class | |
|---|---|---|
| 0 | 0 | |
| 1 | 9 | |
| 2 | 7 | |
| 3 | 16 | |
| 4 | 9 | |
| 5 | 10 + 1 | SPUCV 111011-101010 being Blackhole 0 |
| 6 | 4 + 1 | SPUCV 101110-101110 as Blackhole 1 |
| 7 | 2 | |
| 8 | 4 | |
| 9 | 0 | |
| 10 | 0 | |
| 11 | 2 − 1 | SPUCV 111010-101011 |

Total: 64 unique code values

This is based on the assumption that the distribution of frequency counts of 3/4 bit PUCVs and 5/6 bits PUCVs for Blackhole 0 and Blackhole 1 maintains its proportion for the original 12-bit SPUCV 111011-101010.

Assuming the above is correct, one could use a fixed design of Blackhole 0 absorbing 3/4 bit PUCVs and Blackhole 1 absorbing 5/6 bit PUCVs. If there is no fluctuation, one could parse the encoded code and have the idea about whether the half of 3/4 bit PUCVs is greater or the half of 5/6 bit PUCVs is greater. If one allows for a change, one could use 1 bit to indicate which 12-bit code value is Blackhole 0 (for instance, the one appearing first in the natural number ordering), then by default Blackhole 1 is known after ascertaining which one code value from each of the groups of 5 Frequency Count and the 6 Frequency Count is identified. To identify these two DDBs from the 5 and 6 Frequency Count Group, there are altogether 55 options (i.e. 10+1=11 and 4+1=5, and 11*5=55) to select from. So it uses 5/6 bits (using AAB Coding) for such identification. So altogether, one uses 2 bits indicating the frequency count of Blackhole 0, 1 bit indicating which DDB code value is the missing code value, and 5/6 bits for identifying the two DDBs, amounting to 8/9 bits. So bit saving of 11 bit minus 8/9 bits, equivalent to 2/3 bits, is obtained.

One however could give some latitude of fluctuation about where (i.e. which Frequency Count Groups) the two DDBs are found to fall into in the encoded code. The possible grouping is 5 and 6 Frequency Count Groups, 4 and 7, 3 and 8, 2 and 9, 1 and 10, altogether 5 possible groupings. However, it is quite certain that 2/9 group and 1/10 group is exclusive, so there remains 4 possible groups. So one could give 2 more bits for indicating such possibility. However, giving 2 bits may not be necessary, as the chance of the two DDBs falling into groupings beyond 5/6 and 6/7 of Frequency Count is rare. And they could be again classified as Incompressible Random Data. So one could use 1 bit for allowing such fluctuation of frequency count grouping into which the two DDBs are falling.

The bit expenditure for the two Special Code Indicators for Blackhole 0 and Blackhole 1, falling into different groups are: 5/6 bits for 5/6 Frequency Count Grouping, 4/5 bits (10*3) for the 4/7 grouping.

So the bit saving is reduced by 1 bit from 2/3 to 1/2 bits if the Frequency Count Grouping for the two DDBs. If the grouping is 4/7, then the bit saving is no change, as 2/3 bits minus 1 bit for indicating Frequency Count Grouping for DDBs and plus 1 bit resulting from the reduction for bit expenditure for Special Code Indicator for the two DDBs remains the same. So the bit saving is either 1/2 bits or 2/3 bits.

So this is the technique of Shortening Indicator Bit Expenditure, such as Special Code Indicators for DDBs, by using information (i.e. statistics about frequency count groupings), gathered from digital data set being processed.

Giving 1 bit for using as the Indicator for distinguishing Compressible or Incompressible Data, the result is either breakeven or with 1 to 2 bit saving. Given the regularity of the frequency distribution of the PUCVs as sampled by the coder being used, it is very unlikely or having a much lower chance of the two DDBs falling into the 3/8 grouping, so the order of chances for the two DDBs falling is to the 5/6 grouping first, and then 4/7 grouping, and then less likely 3/8 grouping and even less to 2/9 or 1/10 grouping. And as said before, if DDBs are not falling into groupings of 5/6 and 4/7 Frequency Count Groups, the random data set is classified as Incompressible Data. Such data uses the above Compressible/Incompressible Data Bit.

It has also been found by generating instances of the above frequency distribution using ff=9,000 that about 8 instances generated, there is only 1 without missing 12-bit code value. So this means that there is higher chance of having bit saving using the techniques introduced so far above.

In another embodiment, one could also use the code value, SPUCV 101010-10100, of the highest frequency in the 11 Bit Class as Blackhole 0 to pair with Blackhole 1, SPUCV 101110-101110, using also the technique of Shortening Indicator Bit Expenditure in similar manner where appropriate.

More regular patterns about frequency distribution of random data of different sizes sampled under different coders designed under CHAN FRAMEWORK are expected to merge and finer rules and new techniques developed for such regularities ascertained. The use of such bit indicators and their respective sizes could be adjusted in different embodiments as well according to the particular frequency patterns or regularities of digital data set, whether random or non-random, of different sizes being ascertained by using different different coders designed using CHAN FRAMEWORK.

As such, the techniques introduced in the present invention have illustrated their usefulness in compressing random data. And these techniques could also be applied to compressing and decompressing non-random data using the information about the regular patterns discerned from random data sets as a reference.

(2) Compressing and Decompressing Non-Random Data

As random data could be compressed using the method revealed in (1) above, the same method could also be used for compressing non-random data. What is required is some consideration be given to the nature of non-random data when deciding on the designation of special codes. Basically the logic for designation of special codes is the same in this case as in the case of compressing random data as the purpose is the same, i.e. to achieve bit usage saving. However, since random data follows certain regularities that non-random data does not follow, and the data distribution of non-random data set could vary wildly from one to another, that is why some such variations should be catered for when designating special codes and the use of more appropriate techniques for such variations is more desirable. So for designating special codes, the following rules could be formulated and observed where appropriate:

(2a) Possibility of Missing PUCV(s) in a Non-Random Data Set:

Processing a section of very small number of random or non-random binary bits could not have bit saving that could compensate for the bit expenditure used for Indicators to be recorded in headers. So in the same way, the section size of a non-random data should not be very small. However, even with a very big size, a non-random data set could have one or more PUCVs missing in the data set. And this phenomenon of missing PUCV could be capitalized on where appropriate so that such missing PUCVs could be designated as special codes, either Blackhole 1 or other Scodes. To act as Blackhole 1, the criterion is that the code value to be chosen should not be 1 bit length longer than the chosen Blackhole 0 as Blackhole 1 using AAB Code to absorb code values in the front or at the back could only save 1 bit (the present discussion assuming a uni-directional absorption of code values by Blackholes; rules for bi-directional absorption by Blackholes could be adjusted accordingly). So that using a Scode 0 as Blackhole 1 with bit length longer by 1 bit mean data expansion, and that is not towards the direction of achieving the purpose of data compression. So the rule for doing data compression for both random and non-random data (assuming that other code values not affected by the use of Blackholing and Successive Code Surrogating techniques are encoded using Same Bit Size Coder, the Read Coder itself being used as Write Coder being in the class of Same Bit Size Coder; as mentioned before using Same Bit Size Coder for encoding other than the Read Coder itself represents a form of encryption without data expansion nor shrinkage) is:

Bit Gain resulting from using Blackholes should be more than Bit Loss resulting from using Surrogate Codes plus Bit Expenditure used in header(s)

So under this top level rule, other rules could be relaxed as appropriate to the real situation about the data distribution of the digital data set to be compressed and decompressed and the purpose of the activity for which the data processing is used to serve. More is to be discussed about the techniques that could be used for compressing non-random data set where there is missing PUCV after discussing the case where there is no missing PUCV;

(2b) No Missing PUCV in Non-Random Data Set:

As Digital Data Blackholing and Successive Code Surrogating as revealed above could be used to compress random data, such techniques could also be used for compressing non-random data. Non-random data varies wildly and also not predictable but when viewed and compared using the frequency distribution statistics (obtained using the coder defined using CHAN FRAMEWORK as demonstrated above) of a random data set of the same bit size, such as 80,000 binary bits as used in our examples, as a reference, then it is logical to conclude that the method of using techniques of Digital Data Blackholing and Successive Code Surrogating could also be used for compressing non-random data set without missing PUCV. Without missing PUCV, Successive Code Surrogating with or without code splitting has to be used for providing an additional code value to act as Blackhole 1, partnering with Blackhole 0 in absorbing other code values using AAB Coding. It is expected that the frequency of the code value with the highest frequency in any Bit Class in a non-random data set could be much higher than that of the corresponding code value in the same Bit Class of a random data set. If it is not so for one Bit Class, such phenomenon would be found in another Bit Class. The same is true for those code values with the lowest frequency. And one could observe the following rules using the reference deduced from using a random data set:

(i) the range of frequency difference between Blackhole 0 and Blackhole 1 in a pair for non-random data set should be bigger than that of the corresponding pair for random data set of the same size or at least in the random data set the frequency of Blackhole 0 should be 4 times or above the frequency of Blackhole 1 and Blackhole 1 should not be longer than 1 bit in bit length than that of Blackhole 0; that means, Blackhole 1 could be less frequently occurring in the data set under processing and shorter in bit length as stipulated here; that also means, if other code values that are found to satisfy such requirements, such code values could also be used as Blackhole 1:

Frequency of Blackhole 0>=4 times Frequency of Blackhole 1 plus

Bit Length of Blackhole 0 no shorter than Bit Length of Blackhole 1 by 1 bit (ii) as there is no missing code in the data set under processing under this scenario, the code value of Blackhole 1 is a code value borrowed for use (i.e. Scode 0 in itself) for surrogating Blackhole 0 with one half of absorbed code values represented by the respective AAB Codes, one has to surrogate it with another code value. This is where Successive Code Surrogating should come to help as explained above. The rule for such Succesive Code Surrogating could be as follows:

Total Frequency of all the Scodes added up=<Frequency of Scode 0 plus

Frequency of each successive Sode should be =<half of Frequency of the code to be surrogated plus each successive Scode should not be longer by 1 bit in bit length than that of the code to be surrogated; if it is longer and increases by 1 bit, the frequency of such successive Scode should be further reduced by one half for every bit increased;

The lower the Total Frequency of all the Scodes and their shorter the bit length than the specified rule above the better. One could also use other code values as Scodes if they satisfy the above rules.

It is rare that the non-random data set under concern is not compressible using the method of Digital Data Blackholing and Successive Code Surrogating as outlined above. One could make reference to PCT/IB2017/050985 filed on 22 Feb. 2017 under the Priority Claim of this invention in this connection where appropriate.

After using the above rules, no pair of Blackholes could be identified satisfying the requirements, one could be quite certain that occurring code values are quite concentrated into a particular Bit Class, such as into the 3 Bit Class and into one single code value, i.e. 000. Under this scenario, one could then consider using the following AAB Code Tables for selection for use for compressing the PUCV 000:

Diagram 61a

AAB Code Table for Occurring Code Values Highly Concentrated into PUCV 000

0
1000
1001
1010
10110
11000
11010
110110
110111
111000
111001
1111000
1111001
11110100
11110101
11110110
11110111
11111000
11111001
11111010
11111011
11111100
11111101
11111110
11111111

Diagram 61b

AAB Code Table for Occurring Code Values Concentrated into PUCV 000 where deficit is found in 4 Bit PUCVs when occurring, suitable for data set with less 4 Bit PUCVs 00
01000
01001
01010
01011
01100
01101
01110
01111
10000
10001
10010
10011
10100
10101
10110
10111
11000
11001
11010
11011
11100
11101
111100
111101

111110
111111
Diagram 61c
AAB Code Table for Occurring Code Values Concentrated into PUCV 000
where deficit is found in 5 Bit PUCVs when occurring, suitable for data set with less 5 Bit PUCVs
00
0100
0101
0110
0111
1000
1001
101000
101001
101010
101011
1011000
1011001
1011010
1011011
1011100
1011101
1011110
1011111
111000
111001
111010
111011
111100
111101
111110
111111
Diagram 61d
AAB Code Table for Occurring Code Values Concentrated into PUCV 000
where deficit is found in 6 Bit PUCVs when occurring, suitable for data set with less 6 Bit PUCVs
00
0100
0101
0110
0111
1000
1001
10100
10101
10110
10111
11000
11001
11010
11011
11100
11101
11111000
11111001
11111010
11111011
11111100
11111101
11111110
11111111
Diagram 61e
AAB Code Table for Occurring Code Values Concentrated into PUCV 000
where the remaining PUCVs are assigned in descending order according to decreasing frequency
00
0100
0101
0110
0111
10000
10001
10010
10011
10100
10101
10110
10111
11000
11001
110100
110101
110110
110111
111000
111001
111010
111011
111100
111101
111110
111111

The above 5 versions of AAB Code Table design shows that one could divide the code values into sections (here for example, classified in terms of code value bit size in Diagram 61b, 61c and 61d) for limiting the application of range for achieving the type of AAB Code one requires according to data distribution of code values. One could therefore design more such AAB Code Tables supplementing the above mentioned rules and the AAB Code Tables listed in Diagram 61 when found desirable and appropriate. The above rules and Diagram 61 are formulated for demonstrating how the techniques of Digital Data Blackholing and Successive Code Surrogating together with AAB Coding could be designed and developed for compressing non-random data, and it is not meant to be exhaustive and supplementation to them could be designed and developed all the time for optimization purpose. The technique of adjusting AAB Code Tables used here also applies to the AAB Code Tables associated with DDBs for maximizing the bit usage gain that is to be obtained by DDBs. Depending on which DDB, according to design, gains more in bit usage, the half (or portion) of the code values with higher frequency being absorbed should be assigned to it. That means for a non-random data set, due to the uneven distribution of code values, the two halves assigned to each of the DDB pair should have to be adjusted according to the current frequency distribution of code values of the data set being processed. So the AAB Code Tables should also be adjusted accordingly. It is therefore apparent that the above rules and AAB Code Tables with appropriate adjustment according to data distribution of the non random data set being processed are sufficient to cover nearly all cases of non-random data without missing PUCV. And one could also adjust the section size, such as increasing it from 80,000 binary bits to ten folds or hundred folds, and that will certainly provide better opportunity for bit saving. Also for non-random data if compressing the data of one section using the best of the above options results in bit usage loss does not mean there could not be bit usage gain for the whole digital data input.

So the method just outlined should be sufficient to compress non-random data without missing PUCV given the opportunity for supplementation of rules and AAB Code Tables for further optimization.

(2c) Non-Random Data Set with Missing PUCV:

Compressing non random data set with missing PUCV is relatively easy and is always achievable using the following techniques:

(i) using a code value missing in the non random data set being processed to act as Blackhole 1 partnering with the most frequent code value as Blackhole 0 in the same Bit Class or even in a Bit Class with 1 less bit; as the frequency of occurrence of this missing code value is zero, it does not require any surrogate code to stand in for it; and (ii) substituting a PUCV missing in the non random data set being processed for another code value of a longer bit length, such another code value being present in the data set being processed.

Furthermore, one could also consider using more than 1 pair of DDBs for compressing random data as well as non-random data where appropriate. Using the above methods and techniques, one has to add the relevant Indicators for the Special Codes used in the relevant headers or embedded them in the encoder and decoder used where appropriate as already discussed. Other Indicators such as Scenario Indicators could also be used in the same manner, for indicating if the data set being encoded or decoded is a random or non random data set, and also which pair of DDBs has been used or which AAB Code Table is used.

The above examples used Max3 coder designed using CHAN FRAMEWORK, coder design using other Max Number could also be attempted. So inter alia, the most distinguishing criterion for making distinction between coder designed using CHAN FRAMEWORK and other coders is that the unique code values of the Code Units, Processing Units and Super Processing Units have more than one bit size or bit length or have different bit sizes or bit lengths according to the design used.

So the methods and techniques outlined above together could compress all types of digital data whether random or non random in cycles (excluding random data fewer than a few thousand binary bits, the exact limit is not a concern here). As such, combined the above, a Universal Coder is invented.

All in all, the conclusion is again:

Let him that hath understanding count the number . . . .

Advantageous Effects

As there is no assumption about the incoming digital information, any numbers, including random numbers or numbers in even distribution or not, could be encrypted or compressed in cycle subject to the limit described above. In the present days of the era of information explosion, method that enables encryption and compression of digital data, random or not in distribution, in cycle makes a great contribution to the whole mankind making use of and relying on exchange and storage of digital data in every aspect of life. It surely could also contribute to the effort of man-space exploration or resettlement.

BEST MODE

The best of the embodiments introduced so far in the present invention is the use of Digital Data Blackholing together with Code Surrogating (Successive or not) for compressing random and non random data where appropriate. And for non-random data, further rules and AAB Code Tables could be designed and developed to suit the type of data distribution of digital data set under processing. This provides a definite proof that any digital data set could be encoded and decoded in cycle up to a limit described, a proof that puts an end to the myth of Pigeonhole Principle in Information Theory and now Pigeonhole meets Blackhole. That does not mean that other techniques of CHAN CODING in other modes could not produce the same result or the same proof. It is predicted that same result and same proof could also be provided using other modes.

MODE FOR INVENTION

Other modes include the use of Unevener and Evener in alternation for encoding and decoding, the use of Super Processing Units for breaking down random data set into sub-sections or sub-units of uneven data that is susceptible to compression, especially through the technique of setting criteria for using AI distinction of such sub-sections, and the use of Processing Units of varying sizes with appropriate use of Terminating Condition and criteria of classification according traits or characteristics of the content of the digital data values for encoding and decoding, as well as the use of mathematical formula(e) and the placement of their corresponding values for encoding and decoding, especially for easy design of encrypting schema.

What is of the most importance is that CHAN FRAMEWORK as seen from the above discussion provides a framework that could be used to create order from data whether random or not, allowing statistics be generated from it in terms of the schema and design one chooses for describing the particular data set under processing [the schema and design including the design of Code Unit, Processing Unit, Super Processing Unit (Sections being a bigger size Super Processing Unit), Un-encoded Code Unit, Header containing essential indicators designed for the use or such information and programming logic built into the Encoder and Decoder, resulting in CHAN CODE to be represented in digital binary bits in the form of CHAN CODE FILES], and allowing the use of techniques of CHAN CODING for encoding and decoding for the purposes of compression and encryption where appropriate. Such aforesaid statistics include the sizes of the Code Unit, Processing unit, Super Processing Unit, their frequency distribution, the rank and position of the data code values, and other characteristic information such as the relations between different data code values as expressed in mathematical formula, the terminating value and terminating condition, ratio between bit 0 and bit 1, the data ranges, etc etc as discussed above. Because such characteristics or traits of the data set could be described under CHAN FRAMEWORK so that relations or derived traits could be created for encoding and decoding purposes. For instance, one particular useful trait is the Absolute Address Branching Code, which could also be used, for example, as a Code Unit Definition by itself, or as the Content Code, or as the Scenario Classification Code as well as as suffix to trios of Content Code for use as criterion in making AI Distinction, and in particular teaming up with the use of Digital Data Blackholing and Successive Code Surrogating, making possible compressing and decompressing random data correctly and losslessly. So CHAN FRAMEWORK is a rich framework allowing great flexibility during the design stage when used in creating order out of any data set of whatever data distribution, which is made describable under the Framework so that techniques be developed for seizing differences between data values, which could then be conscientiously manipulated, such as through cycles of altering the ratio between bit 0 and bit 1 of a data set so that the unevenness of the data distribution could be multiplied for the purpose of making re-cycling data compression possible, or through the design of mathematical formula(e) expressing the relationship between different components of a Processing Unit for the purpose of encrypting the corresponding digital data set either in itself or before making further compression for it again.

Which mode to use is a matter of choice, depending on the primary purpose of encoding and encoding, be it for encryption or for compression or both. However, as re-compression in cycle could easily be made, it is insignificant to make the distinction.

In essence, embodiments of the present invention are characterized by:

(1) CHAN FRAMEWORK, method of creating order out of digital data information, whether random or not, being characterized by an order of data or a data order or a data structure or a data organization created from any digital data set, whether random or not, consisting of Code Unit as the basic unit of bit container containing binary bits of a digital data set for use; according to the design and schema chosen for processing for the purpose of encoding and decoding, Code Unit being classified primarily by the maximum possible number of data values a Code Unit is defined to hold or to represent, i.e. the value size of a Code Unit, where each of the possible unique values of a Code Unit could have the same bit size or different bit sizes; and Code Unit then being classified by the number of bits all the possible unique data values altogether of a Code Unit occupy, i.e. the sum of the bit size of each of the possible unique data values of a Code Unit takes up; and Code Unit being further classified by the Head Design, i.e. whether it is of 0 Head Design or 1 Head Design; whereby Code Unit of a certain value size under CHAN FRAMEWORK having different definitions and versions according to embodiments;

(2) CHAN FRAMEWORK, method of creating order out of digital data information, whether random or not, being characterized by an order of data or a data order or a data structure or a data organization created from any digital data set, whether random or not, consisting of Processing Unit(s) which is made up by a certain number of Code Units as sub-units according to the design and schema chosen for processing for the purpose of encoding and decoding;

(3) CHAN FRAMEWORK, method of creating order out of digital data information, whether random or not, being characterized by an order of data or a data order or a data structure or a data organization created from any digital data set, whether random or not, consisting of Super Processing Unit(s) which is made up by a certain number of Processing Unit(s) as sub-units according to the design and schema chosen for processing for the purpose of encoding and decoding;

(4) CHAN FRAMEWORK, method of creating order out of digital data information, whether random or not, being characterized by an order of data or a data order or a data structure or a data organization created from any digital data set, whether random or not, consisting of Un-encoded Code Unit which is made up by a certain number of binary bits, which do not make up to the size of one Processing Unit, thus left as un-encoded or left as it is according to the design and schema chosen for processing for the purpose of encoding and decoding;

(5) CHAN FRAMEWORK, method of creating order out of digital data information, whether random or not, being characterized by an order of data or a data order or a data structure or a data organization created from any digital data set, whether random or not, consisting of Un-encoded Code Unit which is made up by a certain number of binary bits, which do not make up to the size of one Processing Unit, thus left as un-encoded or left as it is according to the design and schema chosen for processing for the purpose of encoding and decoding;

(6) CHAN FRAMEWORK, method of creating order out of digital data information, whether random or not, being characterized by an order of data or a data order or a data structure or a data organization created from any digital data set, whether random or not, consisting of traits or characteristics or relations that are derived from Code Unit(s), Processing Unit(s), Super Processing Unit(s) and Un-encoded Code Unit as well as their combination in use according to the design and schema chosen for processing for the purpose of encoding and decoding;

(7) CHAN FRAMEWORK, method of creating order out of digital data information, whether random or not, being characterized by a descriptive language that is used to describe the traits or characteristics or relations of any digital data set using the terminology for describing the traits or characteristics or relations of Code Unit, Processing Unit, Super Processing Unit and Un-encoded Code Unit;

(8) CHAN CODING, method of encoding and decoding, being characterized by techniques for processing data for the purpose of encoding and decoding under CHAN FRAMEWORK;

(9) CHAN CODING, method of encoding and decoding, being characterized by the resultant CHAN CODE created out of any digital data set using techniques of CHAN CODING;

(10) CHAN CODING, method of encoding and decoding, being characterized by the technique using Absolute Address Branching Technique with range;

(11) CHAN CODING, method of encoding and decoding, being characterized by the technique using mathematical formula(e) for representing the relations between Code Units of a Processing Unit of the data order created under CHAN FRAMEWORK;

(12) CHAN CODING, method of encoding and decoding, being characterized by the technique of placement, placing the values or encoded codes as represented by mathematical formula(e) as well as those values or encoded codes of Code Unit, Processing Unit, Super Processing Unit and Un-encoded Code Unit in different position order;

(13) CHAN CODING, method of encoding and decoding, being characterized by a technique of classification, i.e. the assignment of 0 Head Design or 1 Head Design or both, represent by the associated bit pattern, to trait(s) or characteristic(s) of the digital data under processing that is/are used to classify or group data values for processing for the purpose of encoding and decoding;

(14) CHAN CODING, method of encoding and decoding, being characterized by a technique of classification, i.e. the use of trait(s) or characteristic(s) in terms of Rank and Position of the data values of the digital data under processing for classifying or grouping data values for processing for the purpose of encoding and decoding;

(15) CHAN CODING, method of encoding and decoding, being characterized by a technique of classification, i.e. the use of code re-distribution, including re-distribution of unique data values as well as unique address codes from one class to another class of the classification scheme by use of any one of the following techniques including code swapping, code re-assignment and code re-filling for processing digital data set for the purpose of encoding and decoding;

(16) CHAN CODING, method of encoding and decoding, being characterized by techniques of code adjustment, including any one of the following techniques including code promotion, code demotion, code omission as well as code restoration for processing for the purpose of encoding and decoding;

(17) CHAN CODING, method of encoding and decoding, being characterized by technique of using Terminating Condition or Terminating Value for defining the size of a Processing Unit or a Super Processing Unit for processing for the purpose of encoding and decoding;

(18) CHAN CODING, method of encoding and decoding, being characterized by technique of using Code Unit Definition as Reader of digital data values or encoded code values;

(19) CHAN CODING, method of encoding and decoding, being characterized by technique of using Code Unit Definition as Writer of digital data values or encoded code values;

(20) CHAN CODING, method of encoding and decoding, being characterized by technique of using Super Processing Unit for sub-dividing a digital data set into sub-sections of data of which at least one sub-section is not in random for processing for the purpose of encoding and decoding;

(21) A method of Claim [20] being characterized by further classifying the Super Processing Units of the digital data set into classes, two or more, using a classifying condition, such as the number of value entries appearing in the Super Processing Unit for a particular class; and by designing mapping tables which are appropriate to the data distribution of each of these classes for encoding and decoding; and by encoding and decoding the data values of each of these Super Processing Units with the use of their respective mapping table appropriate to the data distribution of the data values of each of these Super Processing Units; and using indicators to make distinction between these classes of Super Processing Units for the use in decoding, such indicators being kept at the head of each of these Super Processing Units or elsewhere as in separate CHAN CODE FILES;

(22) A method of Claim [20] being characterized by further classifying the Super Processing Units of the digital data set into classes, two or more, using a classifying condition, such as the number of value entries appearing in the Super Processing Unit for a particular class; and by designing mapping tables which are appropriate to the data distribution of each of these classes for encoding and decoding; and by encoding and decoding the data values of each of these Super Processing Units with the use of their respective mapping table appropriate to the data distribution of the data values of each of these Super Processing Units; and by setting criteria appropriate to the data distribution of the classes of Super Processing Units and the corresponding mapping tables used for encoding and decoding for use in assessing the encoded code for making Artificial Intelligence distinction between the classes of Super Processing Units so that the use of indicators could be dispensed with;

(23) A method of Claim [20] being characterized by further classifying the Super Processing Units of the digital data set into two classes, using a classifying condition, such as the number of value entries appearing in the Super Processing Unit for a particular class; and by designing mapping tables which are appropriate to the data distribution of each of these classes for encoding and decoding, whereby at least one of these mapping tables could serve and thus be chosen to serve as an unevener and such an unevener could also be adjusted through the use of code re-distribution that it could take advantage of the data distribution of the data values of at least one class of Super Processing Units so that the unevener mapping table after code adjustment through code re-distribution could serve and thus be chosen as the mapping table of a compressor for at least one class of Super Processing Units; and by encoding all the Super Processing Units using the unevener in the first cycle; and then by encoding at least one class of the Super Processing Units using the compressor where compression of data of the respective Super Processing Unit under processing is feasible in the second cycle, i.e. encoded with the use of the unevener in the first cycle and the compressor in the second cycle, leaving those Super Processing Unit with data incompressible as it is, i.e. encoded with the use of the unevener only; and decoding the data values of each of these Super Processing Units with the use of their respective mapping table(s) appropriate to the data distribution of the data values of each of these Super Processing Units, whereby in the first cycle of decoding, the encoded code formed out of unevener encoding and compressor encoding is decoded so that the layer of compressor encoding is removed, and in the second cycle of decoding, the encoded code, consisting of only unevener encoded code, of all the Super Processing Units is decoded by the unevener decoder; and by setting criteria appropriate to the data distribution of the classes of Super Processing Units and the corresponding mapping tables used for encoding and decoding for use in assessing the encoded code for making Artificial Intelligence distinction between the classes of Super Processing Units so that the use of indicators could be dispensed with;

(24) CHAN CODING, method of encoding and decoding, being characterized by the technique of creating Unevener Encoder and Unevener Decoder by building a mapping table and using the unique code addresses of the said mapping table for mapping the unique data values of the digital data input in one to one mapping whereby the number of bit(s) used by the unique data values and that used by the corresponding mapped unique table code addresses of the corresponding mapped pair is the same; by using the said mapping table for encoding and decoding;

(25) CHAN CODING, method of encoding and decoding, being characterized by the technique of using Unevener Encoder and Unevener Decoder for processing for the purpose of encoding and decoding;

(26) CHAN CODING, method of encoding and decoding, being characterized by the technique of using Unevener Encoder and Unevener Decoder together with an Evener Encoder and Decoder or a Compressor and Decompressor for processing for the purpose of encoding and decoding;

(27) CHAN CODING, method of encoding and decoding, being characterized by technique of dynamic adjustment of the size of Processing Unit or Super Processing Unit in the context of changing data distribution and in accordance with the Terminating Condition used under processing;

(28) CHAN CODING, method of encoding and decoding, being characterized by technique of dynamic adjustment of Code Unit Definition in accordance with the data distribution pattern of the data values under processing;

(29) CHAN CODE being characterized by Classification Code and Content Code, which are created out of any digital data set using techniques of CHAN CODING for processing for the purpose of encoding and decoding;

(30) CHAN CODE being characterized by Classification Code, Content Code and Un-encoded Code Unit, which are created out of any digital data set using techniques of CHAN CODING for processing for the purpose of encoding and decoding;

(31) CHAN CODE being characterized by Header, Classification Code and Content Code, which are created out of any digital data set using techniques of CHAN CODING for processing for the purpose of encoding and decoding, whereby the said Header contains indicator(s) resulting from the use of CHAN CODING technique(s) for processing for the purpose of encoding and decoding;

(32) CHAN CODE being characterized by Header, Classification Code, Content Code and Un-encoded Code Unit, which are created out of any digital data set using techniques of CHAN CODING for processing for the purpose of encoding and decoding, whereby the said Header contains indicator(s) resulting from the use of CHAN CODING technique(s) for processing for the purpose of encoding and decoding, such indicator(s) including any of the following: Checksum Indicator, Signature for CHAN CODE FILES, Mapping Table Indicator, Number of Cycle Indicator, Code Unit, Definition Indicator, Processing Unit Definition Indicator, Super Processing Unit Definition Indicator, Last Identifying Code Indicator, Scenario Design Indicator, Unevener/Evener Indicator, Recycle Indicator, Frequency Indicator, Special Code Indicators, Section Size Indicator, Digital Data Blackhole Type Indicator, and Compressible/Incompressible Data Indicator;

(33) Encoder and Decoder, coders designed using CHAN FRAMEWORK, being characterized by being embedded with techniques of CHAN CODING for processing;

(34) Encoder and Decoder, coders designed using CHAN FRAMEWORK, being characterized by being embedded with techniques of CHAN CODING and Header Indicator(s) for processing, such indicator(s) including any of the following: Checksum Indicator, Signature for CHAN CODE FILES, Mapping Table Indicator, Number of Cycle Indicator, Code Unit, Definition Indicator, Processing Unit Definition Indicator, Super Processing Unit Definition Indicator, Last Identifying Code Indicator, Scenario Design Indicator, Unevener/Evener Indicator, Recycle Indicator, Frequency Indicator, Special Code Indicators, Section Size Indicator, Digital Data Blackhole Type Indicator, and Compressible/Incompressible Data Indicator;

(35) CHAN CODE FILES, being digital information files containing CHAN CODE;

(36) CHAN CODE FILES, being digital information files containing additional information for the use by CHAN CODING techniques, including Header and the indicator(s) contained therein, such indicator(s) including any of the following: Checksum Indicator, Signature for CHAN CODE FILES, Mapping Table Indicator, Number of Cycle Indicator, Code Unit, Definition Indicator, Processing Unit Definition Indicator, Super Processing Unit Definition Indicator, Last Identifying Code Indicator, Scenario Design Indicator, Unevener/Evener Indicator, Recycle Indicator, Frequency Indicator, Special Code Indicators, Section Size Indicator, Digital Data Blackhole Type Indicator, and Compressible/Incompressible Data Indicator;

(37) CHAN MATHEMATICS, used under CHAN FRAMEWORK, being characterized by mathematical method using techniques whereby data values are put into an order that is being able to be described in mathematical formula(e) corresponding to the respective CHAN SHAPE, including the associated mathematical calculation logic and techniques used in merging and separating digital information, such digital information including values of Code Units of a Processing Unit in processing digital information, whether at random or not, for the purpose of encoding and decoding;

(38) CHAN FORMULA(E) being formula(e), used under CHAN FRAMEWORK, being characterized by method of describing the characteristics and relations between basic components, the Code Units and derived components such RP Piece of CHAN CODE and other derived components, such as the Combined Values or sums or differences of values of basics components of a Processing Unit for processing digital information, whether at random or not, for the purpose of encoding and decoding;

(39) CHAN SHAPES including CHAN DOT, CHAN LINES, CHAN TRIANGLE, CHAN RECTANGLES, CHAN TRAPEZIA AND CHAN SQUARES AND CHAN BARS representing the characteristics and relations of the basic components of a Processing Unit as described using CHAN FORMULA(E);

(40) COMPLEMENTARY MATHEMATICS being characterized by using a constant value or a variable containing a value as a COMPLEMENTARY CONSTANT or COMPLEMENTARY VARIABLE for mathematical processing, making the mirror value of a value or a range or ranges of values being obtainable for use in CHAN FORMULA(E);

(41) CHAN MATHEMATICS using COMPLEMENTARY MATHEMATICS and normal mathematics or either of them alone for processing using coders designed under CHAN FRAMEWORK;

(42) Use of CHAN FRAMEWORK for the purpose of encryption/decryption or compression/decompression or both;

(43) Use of CHAN CODING for the purpose of encryption/decryption or compression/decompression or both;

(44) Use of CHAN CODE for the purpose of encryption/decryption or compression/decompression or both;

(45) Use of CHAN CODE FILE(S) for the purpose of encryption/decryption or compression/decompression or both;

(46) Use of CHAN MATHEMATICS for the purpose of encryption/decryption or compression/decompression or both;

(47) Use of COMPLEMENTARY MATHEMATICS for the purpose of encryption/decryption or compression/decompression or both;

(48) Use of CHAN SHAPE(S) for the purpose of encryption/decryption or compression/decompression or both;

(49) A method of parsing digital data set, whether random or not, for collecting statistics about digital data set for the purpose of encoding and decoding, characterized by using design and schema of data order defined under CHAN FRAMEWORK;

(50) A method of describing digital data set, whether random or not, characterized by using CHAN FRAMEWORK LANGUAGE;

(51) CHAN CODING, method of encoding and decoding, being characterized by technique of using Posterior Classification Code or Interior Classification Code or Modified Content Code as Classification Code;

(52) CHAN CODING, method of encoding and decoding, being characterized by technique of Digital Data Blackholing, using a code value of a coder defined under CHAN FRAMEWORK to absorb or represent other code value(s) by using Absolute Address Branching Coding, i.e. the Absolute Address Branching Code associated with the Blackhole code representing the absorbed code value;

(53) CHAN CODING, method of encoding and decoding, being characterized by technique of Successive Code Surrogating, successive steps of using a code value of a coder defined under CHAN FRAMEWORK to surrogate or represent another code value in succession;

(54) CHAN CODING, method of encoding and decoding, being characterized by technique of Reverse Placement of Absolute Address Branching Codes;

(55) CHAN CODING, method of encoding and decoding, being characterized by technique of using a code value missing in the data set being processed of a coder defined under CHAN FRAMEWORK to act as a Blackhole code;

(56) CHAN CODING, method of encoding and decoding, being characterized by technique of substituting a code value missing in the data set being processed of a coder defined under CHAN FRAMEWORK for another code value of a longer bit length, such another code value being present in the data set being processed;

(57) CHAN CODING, method of encoding and decoding for compressing and decompressing digital data, whether random or non random data with or without missing unique code value(s), being characterized by using coders defined under CHAN FRAMEWORK for encoding and decoding, using the technique of Digital Data Blackholing, Absolute Address Coding, Shortening Indicator Bit Expenditure, and Code Surrogating, whether successive or not, as well as using the technique of substituting a code value missing in the data set being processed for another code value of the same or a longer bit length, such another code value being present in the data set being processed where appropriate;

(58) CHAN CODING, method of encoding and decoding, being characterized by technique of Shortening Indicator Bit Expenditure based on frequency distribution characteristics generated from digital data set being processed; and

(59) Coders designed using CHAN FRAMEWORK, being characterized by that the unique code values of the Code Units, Processing Units and Super Processing Units have more than one bit size or bit length or have different bit sizes or bit lengths according to the design used.

INDUSTRIAL APPLICABILITY

There are numerous industrial applications that could use CHAN FRAMEWORK and CHAN CODING and its related design and schema at an advantage, including all computer applications that process digital information, including all types of digital data, whether in random distribution or not.

Embodiments described herein may be implemented into a system using any suitably configured computer hardware and/or software. For example, certain embodiments may be implemented into a system using computer languages and compilers for making executable code and operating systems as well as applications or programs; the hardware of any device(s), whether networked or standalone, including computer system(s) or computer-controlled device(s) or operating-system-controlled device(s) or system(s), capable of running executable code; and computer-executable or operating-system-executable instructions or programs that help perform the steps for the methods described herein. In combination with the use of the technical features stated above, embodiments disclosed herein make possible the implementation of CHAN FRAMEWORK using CHAN CODING for the processing of digital information, whether at random or not, through encoding and decoding losslessly and correctly the relevant digital data, including digital data and digital executable codes, for the purpose of encryption/decryption or compression/decompression or both; and in this relation, is characterized by the following claims:

The invention claimed is:

1. A computer-implemented data encoding method of creating order out of digital data information, whether random or not, the method being characterized by:
reading, by at least one hardware processor, a digital data set, whether random or not, from a memory; and
producing, by the at least hardware processor from the digital dataset, one or more of an encoded order of data, an encoded data order, an encoded data structure, and an encoded data organization including a Code Unit as a basic unit of bit container containing binary bits of the digital data set for use;
storing, in same or different memory, the Code Unit and a Code Unit definition, the Code Unit definition including:
a variable code value size of the Code Unit that is a maximum possible number of data values the Code Unit is defined to hold or to represent, wherein each of the possible unique values of the code value size of a Code Unit could have the same bit size or different bit sizes;
a number of bits all the possible unique data values altogether the Code Unit occupies, wherein the number of bits is a sum of the bit size of each of the possible unique data values that the Code Unit takes up; and
a Head Design type used to encode the digital data set wherein the Head Design type determines a ratio of one bits and zero bits in the Code Unit.

2. The method of claim 1, being characterized by an order of data or a data order or a data structure or a data organization created from any digital data set, whether random or not, consisting of one or more Processing Units which include a number of Code Units as sub-units.

3. The method of claim 2 being characterized by an order of data or a data order or a data structure or a data organization created from any digital data set, whether random or not, consisting of one or more Super Processing Units which include a number of Processing Unit(s) as sub-units.

4. The method of claim 3, being characterized by an order of data or a data order or a data structure or a data organization created from any digital data set, whether random or not, including an Un-encoded Code Unit which is made up of a certain number of binary bits, which is less than the size of one Processing Unit, and is left un-encoded as it is.

5. The method of claim 4, being characterized by an order of data or a data order or a data structure or a data organization created from any digital data set, whether random or not, consisting of traits or characteristics or relations that are derived from Code Unit(s), Processing Unit(s), Super Processing Unit(s) and Un-encoded Code Unit as well as their combination in use according to the design and schema chosen for processing for the purpose of encoding and decoding.

6. The method of claim 4, being characterized by a descriptive language that is used to describe the traits or characteristics or relations of any digital data set using a Code Unit, a Processing Unit, a Super Processing Unit and an Un-encoded Code Unit.

7. The method of claim 1, wherein the method includes using one or more Code Units for one or more of encryption, decryption, compression, and decompression.

8. The method of claim 1, including parsing a digital data set, whether random or not, for collecting statistics about digital data set for the purpose of encoding and decoding, characterized by using the data order consisting of one or more Code Units.

9. A non-transitory computer readable storage medium including instructions that, when executed by at least one hardware processor of a computer, cause the computer to perform data coder operations, being characterized by encoding a digital data set to a coded data state, the coded data state including unique code values of Code Units, Processing Units and Super Processing Units having more than one bit size or bit length or have different bit sizes or bit lengths storing, in same or different memory, the Code Unit and a Code Unit definition, wherein the Code Unit definition includes:
- a variable code value size of the Code Unit that is a maximum possible number of data values the Code Unit is defined to hold or to represent wherein each of the possible unique values of the code value size of a Code Unit could have the same bit size or different bit sizes;
- a number of bits all the possible unique data values altogether the Code Unit occupies, wherein the number of bits is a sum of the bit size of each of the possible unique data values that the Code Unit takes up; and
- a Head Design type identifier wherein the Head Design type identifier identifies the Head Design used to encode the digital data set and determines a ratio of one bits and zero bits in the Code Unit.

* * * * *